(12) United States Patent
Kato et al.

(10) Patent No.: US 8,759,840 B2
(45) Date of Patent: *Jun. 24, 2014

(54) SEMICONDUCTOR LIGHT EMITTING DEVICE MEMBER, METHOD FOR MANUFACTURING SUCH SEMICONDUCTOR LIGHT EMITTING DEVICE MEMBER AND SEMICONDUCTOR LIGHT EMITTING DEVICE USING SUCH SEMICONDUCTOR LIGHT EMITTING DEVICE MEMBER

(75) Inventors: Hanako Kato, Kitakyushu (JP); Yutaka Mori, Kitakyushu (JP); Hiroshi Kobayashi, Kitakyushu (JP); Tsubasa Tomura, Kitakyushu (JP)

(73) Assignee: Mitsubishi Chemical Corporation, Tokyo (JP)

( * ) Notice: Subject to any disclaimer, the term of this patent is extended or adjusted under 35 U.S.C. 154(b) by 783 days.

This patent is subject to a terminal disclaimer.

(21) Appl. No.: 12/950,128

(22) Filed: Nov. 19, 2010

(65) Prior Publication Data
US 2011/0121321 A1  May 26, 2011

Related U.S. Application Data

(62) Division of application No. 11/816,640, filed as application No. PCT/JP2006/303328 on Feb. 23, 2006, now Pat. No. 7,859,006.

(30) Foreign Application Priority Data

| Feb. 23, 2005 | (JP) | 2005-047742 |
| Mar. 24, 2005 | (JP) | 2005-086305 |
| Jun. 6, 2005 | (JP) | 2005-165921 |
| Sep. 22, 2005 | (JP) | 2005-276754 |
| Sep. 22, 2005 | (JP) | 2005-276755 |
| Sep. 22, 2005 | (JP) | 2005-276783 |

(51) Int. Cl.
*H01L 27/15* (2006.01)
(52) U.S. Cl.
USPC ............ 257/79; 257/E25.032
(58) Field of Classification Search
USPC .......... 257/79, 80, 98, 40, E33.059, E25.032; 438/26
See application file for complete search history.

(56) References Cited

U.S. PATENT DOCUMENTS

| 6,632,892 B2 | 10/2003 | Rubinsztajn et al. |
| 6,710,377 B2 | 3/2004 | Shimomura |

(Continued)

FOREIGN PATENT DOCUMENTS

| CN | 1497034 A | 5/2004 |
| JP | 4-89871 | 3/1992 |

(Continued)

OTHER PUBLICATIONS

Notice of Rejection issued Apr. 16, 2013 in Japanese Patent Application No. 2011-161290 (with English translation).

(Continued)

*Primary Examiner* — Brook Kebede
(74) *Attorney, Agent, or Firm* — Oblon, Spivak, McClelland, Maier & Neustadt, L.L.P.

(57) ABSTRACT

A semiconductor light-emitting device member excellent in transparency, light resistance, and heat resistance and capable of sealing a semiconductor light-emitting device without causing cracks and peeling even after a long-time use is provided wherein the semiconductor light-emitting device member contains (A) in a solid state Si-nuclear magnetic resonance spectrum, at least one peak selected from (a) peaks whose peak top position is in an area of a chemical shift of −40 ppm to 0 ppm inclusive, and whose full width at half maximum is 0.3 ppm to 3.0 ppm inclusive, and (b) peaks whose peak top position is in an area of the chemical shift of −80 ppm or more and less than −40 ppm, and whose full width at half maximum is 0.3 ppm to 5.0 ppm inclusive, wherein (B) silicon content is 20 weight % or more and (C) silanol content is 0.1 weight % to 10 weight % inclusive.

23 Claims, 24 Drawing Sheets

(56) References Cited

U.S. PATENT DOCUMENTS

| | | |
|---|---|---|
| 6,916,889 B2 | 7/2005 | Rubinsztajn et al. |
| 6,992,440 B2 | 1/2006 | Ishida |
| 7,859,006 B2 * | 12/2010 | Kato et al. ............ 257/100 |
| 2002/0145152 A1 | 10/2002 | Shimomura |
| 2003/0071366 A1 | 4/2003 | Rubinsztajn et al. |
| 2004/0104391 A1 | 6/2004 | Maeda et al. |
| 2005/0022697 A1 * | 2/2005 | Benrashid et al. ....... 106/287.13 |
| 2005/0189877 A1 | 9/2005 | Ishida |
| 2009/0045422 A1 | 2/2009 | Kato et al. |
| 2009/0309116 A1 | 12/2009 | Kato et al. |

FOREIGN PATENT DOCUMENTS

| | | |
|---|---|---|
| JP | 7-263722 | 10/1995 |
| JP | 09-71654 | 3/1997 |
| JP | 2002-33517 | 1/2002 |
| JP | 3275308 | 2/2002 |
| JP | 2002-203989 | 7/2002 |
| JP | 2002-314139 | 10/2002 |
| JP | 2003-197976 | 7/2003 |
| JP | 2004-71908 | 3/2004 |
| JP | 2004-161807 | 6/2004 |
| JP | 2004-162039 | 6/2004 |
| JP | 2004-221186 | 8/2004 |
| JP | 2004-231947 | 8/2004 |
| JP | 2004-288827 | 10/2004 |
| JP | 2004-359756 | 12/2004 |
| JP | 2005-22899 | 1/2005 |
| JP | 2005-150484 | 6/2005 |
| JP | 2005-523349 A | 8/2005 |
| JP | 2006-519896 | 8/2006 |

OTHER PUBLICATIONS

Brennan, et al. "Fluorescence and NMR Characterization and Biomolecule Entrapment Studies of Sol-Gel-Derived Organic-Inorganic Composite Materials Formed by Sonication of Precursors", Chem. Mater., 1999, 11 (7), pp. 1853-1864.

Japanese Office Action issued Jul. 23, 2013 in Patent Application No. 2011-161290 with English Translation.

U.S. Appl. No. 12/935,116, filed Dec. 16, 2010, Takizawa, et al.

* cited by examiner

SEMICONDUCTOR LIGHT EMITTING DEVICE MEMBER, METHOD FOR MANUFACTURING SUCH SEMICONDUCTOR LIGHT EMITTING DEVICE MEMBER AND SEMICONDUCTOR LIGHT EMITTING DEVICE USING SUCH SEMICONDUCTOR LIGHT EMITTING DEVICE MEMBER

TECHNICAL FIELD

The present invention relates to a novel semiconductor light-emitting device member, a manufacturing method therefor, and a semiconductor light-emitting device using thereof. More particularly, the present invention relates to a semiconductor light-emitting device member having high ultraviolet ray and heat resistance and excellent in transparency, a manufacturing method therefor, and a semiconductor light-emitting device using thereof.

BACKGROUND ART

In a semiconductor light-emitting device such as a light-emitting diode (hereinafter called "LED" when appropriate) and semiconductor laser, a semiconductor luminous element is generally sealed by a member (semiconductor light-emitting device member) such as transparent resin.

Epoxy resin, for example, is used as a semiconductor light-emitting device member. It is also known that a luminous wavelength from a semiconductor luminous element is converted by making the sealing resin contain a pigment such as a phosphor.

However, due to high hygroscopicity of epoxy resin, there have been problems of cracks caused by heat from a semiconductor luminous element when the semiconductor light-emitting device is used for a long time and degradation of the phosphor and luminous element caused by moisture infiltration.

Also in recent years, as the luminous wavelength is shortened, there has been a problem of dramatic decrease in luminance of a semiconductor light-emitting device because epoxy resin degrades and colors when the device is turned on for a long time or used at a high output level.

In view of these problems, silicone resin, which is superior in heat resistance and ultraviolet ray resistance, has been used as a substitute for epoxy resin. However, silicone resin does not yet have sufficient adhesion, transparency, and weather resistance. Meanwhile, inorganic sealants and semiconductor light-emitting devices using such sealants have been proposed as materials that excel in heat resistance and ultraviolet ray resistance (Refer, for example, to Patent Documents 1 to 5).

Patent Document 1: Japanese Patent No. 3275308
Patent Document 2: Japanese Patent Application Laid-Open No. 2003-197976
Patent Document 3: Japanese Patent Application Laid-Open No. 2004-231947
Patent Document 4: Japanese Patent Application Laid-Open No. 2002-33517
Patent Document 5: Japanese Patent Application Laid-Open No. 2002-203989

DISCLOSURE OF THE INVENTION

Problems to be Solved by the Invention

However, inorganic material such as molten glass has not been industrially realized because the treatment temperature is as high as 350° C. or more and thus luminous elements may be damaged.

Also, glass produced by a sol gel method has a problem of crack generation and peeling due to shrinkage on curing when formed as a semiconductor light-emitting device member and no such glass whose thick film state is stable for a long period of time has not yet been obtained.

Patent Documents 1 and 2 describe a technology for forming a glass material using tetrafunctional alkoxysilane. However, as regards inorganic material obtained from the technology described in Patent Documents 1 and 2, a glass material obtained by coating a semiconductor light-emitting device with a hydrolyzing liquid of tetrafunctional alkoxysilane and curing for several hours at a mild cure temperature of about 150° C. that does not damage performance of the semiconductor light-emitting device was an incomplete glass body that usually contains more than 10 weight % of silanol. Thus, it has been impossible to obtain a glass body consisting entirely of the siloxane bond like molten glass from the technology described in Patent Documents 1 and 2.

The reason is considered that, in contrast to general organic resin, inorganic material used in Patent Documents 1 and 2 has quite a lot of crosslinking points and therefore, constraints by structure are considerable and reactive ends cannot be condensed due to isolation. Since such a glass body is not fine and a surface thereof is in a very highly hydrophilic state like silica gel, the glass body does not have sufficient sealing properties.

Such less reactive silanol generally starts to decrease very slightly when heated up to 250° C. or higher and, by burning inorganic material at a high temperature of normally 350° C. or higher and preferably 400° C. or higher, the amount of silanol can actively be reduced. However, even if an attempt is made to remove silanol from the inorganic material described in Patent Documents 1 and 2 using the above process, its realization is difficult to achieve because the heat-resistant temperature of a semiconductor light-emitting device is normally 260° C. or lower.

Further, since tetrafunctional alkoxysilane eliminates a large amount of components during dehydration/dealcoholization condensation, the shrinkage factor during curing is substantially large. Moreover, because of a high degree of crosslinking of tetrafunctional alkoxysilane, at the drying process, curing starts from a surface portion from which part of a diluent solvent has evaporated and there is a tendency of forming a hard gel body including a solvent before discharging the internal solvent, leading to a large shrinkage amount accompanying solvent evaporation. Thus, inorganic material described in Patent Documents 1 and 2 results in frequent cracks due to large internal stress caused by shrinkage. Therefore, it has been difficult to obtain a large bulk body or thick film that is useful as a semiconductor light-emitting device member using only tetrafunctional alkoxysilane as its material.

Also, for example, Patent Document 3 describes a technology for producing a three-dimensional phosphor layer with good dimensional accuracy by the sol gel method using a silane compound containing organic groups as a material. However, there is no detailed description of the degree of crosslinking and existence of cyclic compound in Patent Document 3, and high-concentration phosphor particles are required to obtain an inorganic material described in Patent Document 3. Moreover, if no phosphor is contained in the inorganic material, no thick-film glass coated article that is transparent and contains no cracks has been obtainable because these phosphor particles act as an aggregate to maintain a three-dimensional shape.

Further, acetic acid is used as a catalyst in the technology in Patent Document 3, but because acetic acid is not removed from resultant inorganic material, acetic acid affects a semiconductor luminous element adversely. Also, when forming an inorganic material described in Patent Document 3, it is practically impossible to heat the inorganic material together with a semiconductor light-emitting device because a high temperature of 400° C. is needed for curing, and also distortion in its structure is accumulated due to impractical condensation at high temperature and thus crack generation is not suppressed.

Also, for example, Patent Document 4 describes a technology for obtaining a semiconductor light-emitting device member by coating of an inorganic coating agent obtained by mixing an inorganic sol having silica or siloxane as its main component with an inorganic light scattering agent. However, the inorganic material described in Patent Document 4 requires an inorganic light scattering agent and further, Patent Document 4 provides no detailed description of the material and manufacturing method thereof and thus it is impossible to correctly reproduce the technology.

Further, for example, Patent Document 5 describes a technology for obtaining a semiconductor light-emitting device member by coating of a sol gel method glass. However, as in Patent Document 3, a phosphor is required to obtain an inorganic material described in Patent Document 5. This phosphor acts as an aggregate and a resultant inorganic material is a thick film, but the film thickness does not exceed 100 μm. Further, Patent Document 5 provides no detailed description of the material and manufacturing method thereof and thus it is impossible to steadily reproduce the technology using general alkoxysilane.

With circumstances described above as a background, a semiconductor light-emitting device member whose curing conditions are mild and which is superior in transparency, light resistance, and heat resistance and capable of sealing a semiconductor light-emitting device and holding a phosphor without causing cracks and peeling even after using the semiconductor light-emitting device for a long period of time has been demanded.

The present invention has been made in view of the above problems. Namely, an object of the present invention is to provide a novel semiconductor light-emitting device member that is superior in transparency, light resistance, and heat resistance and capable of sealing a semiconductor light-emitting device and holding a phosphor without causing cracks and peeling even after using the semiconductor light-emitting device for a long period of time.

Means for Solving the Problem

As a result of intensive investigation to achieve the above object, the inventors made the following findings.

That is, the inventors made a finding that a polymer that has a specific peak in a solid Si-nuclear magnetic resonance (hereinafter called "NMR" when appropriate) spectrum and whose silicon content is equal to or greater than a specific value and whose silanol content is within a predetermined range can be, when used as a semiconductor light-emitting device member, a thick film that can suppress crack generation also in a thick film portion and is superior in adhesion, heat resistance, and transparency.

The inventors also made a finding that a polymer that has a plurality of specific peaks in a solid Si-NMR spectrum and contains a $D^2$ cyclic compound of concentration in a specific range and whose silicon content is equal to or greater than a specific value and whose volatile component amount is equal to or less than a predetermined amount can be, when used as a semiconductor light-emitting device member, a thick film that can suppress crack generation also in a thick film portion and is superior in adhesion, heat resistance, and transparency.

The inventors further made a finding that a polymer that, in a solid Si-NMR spectrum, contains a $D^n$ compound and $D^2$ cyclic compound in specific ranges obtained through predetermined manufacturing processes and whose silicon content is equal to or greater than a specific value can be, when used as a semiconductor light-emitting device member, a thick film that can suppress crack generation also in a thick film portion and is superior in adhesion, heat resistance, and transparency.

Based on the above findings, the inventors have completed the present invention.

That is, a gist of the present invention includes a semiconductor light-emitting device member characterized in that (1) in a solid Si-nuclear magnetic resonance spectrum, the semiconductor light-emitting device member comprises at least one peak selected from, a group consisting of (i) peaks whose peak top position is in an area of a chemical shift of −40 ppm or more and 0 ppm or less, and whose full width at half maximum is 0.3 ppm or more and 3.0 ppm or less, and (ii) peaks whose peak top position is in an area of the chemical shift of −80 ppm or more and less than −40 ppm, and whose full width at half maximum is 0.3 ppm or more and 5.0 ppm or less, (2) silicon content is 20 weight % or more, and (3) silanol content is 0.1 weight % or more and 10 weight % or less.

In this case, the semiconductor light-emitting device member preferably has (4) a hardness measured value (Shore A) by a durometer type A of 5 or more and 90 or less.

Also, the semiconductor light-emitting device member preferably has a ratio of (total area of peaks of the chemical shift of −40 ppm or more and 0 ppm or less)/(total area of peaks of the chemical shift of less than −40 ppm) of 3 or more and 200 or less in the solid Si-nuclear magnetic resonance spectrum.

Further, the semiconductor light-emitting device member preferably comprises a plurality of peaks selected from the group of (i) and (ii).

Another gist of the present invention includes a semiconductor light-emitting device member characterized in that (5) in a solid Si-nuclear magnetic resonance spectrum, (iii) the semiconductor light-emitting device member comprises a plurality of peaks whose peak top position is in an area of a chemical shift of −80 ppm or more, and (iv) a molar ratio of silicon corresponding to $D^2$ cyclic compound in trimers and tetramers to a total of silicon is 5% or more and 30% or less, (2) silicon content is 20 weight % or more, and (6) a weight loss rate when 150° C. and a degree of vacuum 6.0 Pa are reached is 3% or less.

Still another gist of the present invention includes a semiconductor light-emitting device member obtained through a process of drying a condensation polymer obtained by performing hydrolysis and polycondensation of a compound represented by at least one of the following formula (1) and the following formula (2) and/or an oligomer thereof wherein (7) a molar ratio of silicon corresponding to $D^n$ compounds to a total of silicon is 30% or more in a solid Si-nuclear magnetic resonance spectrum, (8) a total molar ratio of silicon corresponding to $D^2$ cyclic compound in trimers or tetramers to a total of silicon is 0.1% or more and 15% or less in the solid Si-nuclear magnetic resonance spectrum, and (2) silicon content is 20 weight % or more.

[Chemical Formula 1]

$$M^{m+}X_nY^1{}_{m-n} \quad (1)$$

wherein

M represents at least one element selected from silicon, aluminum, zirconium, and titanium, X represents a hydrolyzable group, $Y^1$ represents a monovalent organic group, m represents an integer of 1 or greater representing a valence of M, and n represents an integer of 1 or greater representing a number of X groups, where m≥n.

[Chemical Formula 2]

$$(M^{s+}X_tY^1_{s-t-1})_uY^2 \qquad (2)$$

wherein

M represents at least one element selected from silicon, aluminum, zirconium, and titanium, X represents a hydrolyzable group, $Y^1$ represents a monovalent organic group, $Y^2$ represents a u-valent organic group, represents an integer of 2 or greater representing the valence of M, t represents an integer of 1 or greater and s−1 or smaller, and u represents an integer of 2 or greater.

Also, the semiconductor light-emitting device member preferably has light transmittance of 80% or more on a luminous wavelength of the semiconductor light-emitting device with a film thickness of 0.5 mm.

Further, the semiconductor light-emitting device member preferably further comprises inorganic oxide particles.

Still another gist of the present invention includes a manufacturing method of the semiconductor light-emitting device member that comprises a process of drying a condensation polymer obtained by performing hydrolysis and polycondensation of a compound represented by the above formula (1) and/or an oligomer thereof.

Still another gist of the present invention includes a manufacturing method of the semiconductor light-emitting device member that comprises a process of drying a condensation polymer obtained by performing hydrolysis and polycondensation of a compound represented by the above formula (2) and/or an oligomer thereof.

Still another gist of the present invention includes a manufacturing method of a semiconductor light-emitting device member in which (7) a molar ratio of silicon corresponding to $D^n$ compounds to a total of silicon is 30% or more in a solid Si-nuclear magnetic resonance spectrum, (8) a total molar ratio of silicon corresponding to $D^2$ cyclic compound in trimers and tetramers to a total of silicon is 0.1% or more and 15% or less in the solid Si-nuclear magnetic resonance spectrum, and (2) silicon content is 20 weight % or more, the method comprising a process of drying a condensation polymer obtained by performing hydrolysis and polycondensation of a compound represented by at least one of the following formulas (1) and (2) and/or an oligomer thereof.

In this case, it is preferable that the hydrolysis and polycondensation are performed in the presence of a solvent and the process of drying the resultant condensation polymer has a first drying process in which a liquid condensation polymer is obtained by substantially removing the solvent at a temperature equal to or below a boiling point of the solvent and a second drying process in which the condensation polymer is dried at the temperature equal to or above the boiling point of the solvent.

It is also preferable that the hydrolysis and polycondensation are performed in the presence of a solvent and a process of distilling off the solvent from the condensation polymer before the condensation polymer is dried is provided.

Further, it is also preferable that the hydrolysis and polycondensation are performed in the presence of a solvent and the process of drying the resultant condensation polymer has a first drying process in which the solvent is substantially removed at a temperature below a boiling point of the solvent and a second drying process in which the condensation polymer is dried at the temperature equal to or above the boiling point of the solvent.

Also, a ratio of hydrolysis is preferably 80% or more and 500% or less.

Further, the hydrolysis and polycondensation are preferably performed in the presence of an organometallic compound catalyst.

Still another gist of the present invention includes a semiconductor light-emitting device that comprises at least the semiconductor light-emitting device member.

Still another gist of the present invention includes a semiconductor light-emitting device member that comprises a functional group capable of forming a hydrogen bond with a hydroxyl group or oxygen in metalloxane bond present on a ceramic or metal surface, wherein a maintenance rate of transmittance of light on a wavelength of 405 nm before and after leaving alone at temperature 200° C. for about 500 hours is 80% or more and 110% or less, and the maintenance rate of transmittance of light on the wavelength of 405 nm before and after irradiation with light having a center wavelength of 380 nm and radiant intensity of 0.4 kW/m² for about 72 hours is 80% or more and 110% or less.

Effect of the Invention

A semiconductor light-emitting device member according to the present invention can be coated as a thick film compared with a conventional inorganic member for semiconductor light-emitting device, and is capable of easily sealing a semiconductor light-emitting device and holding a phosphor only by coating on the semiconductor light-emitting device and drying. The semiconductor light-emitting device member is also superior in transparency, light resistance, and heat resistance and no crack or peeling is caused even after a long-time use.

BRIEF DESCRIPTION OF THE DRAWINGS

FIG. 3 shows an embodiment B-1.

FIG. 37 shows an embodiment B-30.

Figure 1:
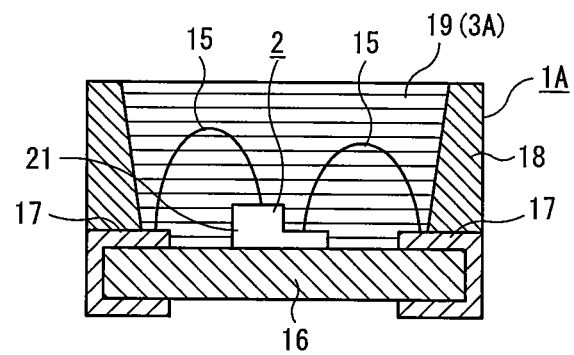
FIG. 1 is a schematic sectional view showing an embodiment A-1.

EXPLANATIONS OF NUMERALS 1, 1A, 1B Luminescent device (semiconductor light-emitting device)
2 Luminous element
3A Transparent member (semiconductor light-emitting device member)
3B Phosphor part (semiconductor light-emitting device member)
4a, 4b Part of light emitted from a luminous element
5 Light of wavelengths specific to fluorescent components such as fluorescent particles, fluorescent ions, and fluorescent dyes contained in a phosphor part
11 Mold part
12, 13 Lead terminal
14 Mirror (cup part)
15 Conductive wire
16 Insulating substrate
16a Hollow
17 Printed wiring
18 Frame
19 Sealing part
19a Sealing function part
19b Lens function part
19c Recess
19d Through-hole
21 Luminous layer part
23 Reflecting layer
24 Bump
33, 34 Phosphor part
35 Solid medium

BEST MODE FOR CARRYING OUT THE INVENTION

The present invention will be described in detail below, but the present invention is not limited to embodiments shown below and can be carried out in various modifications without departing from the scope of the present invention.

[I. First Semiconductor Light-Emitting Device Member]

[I-1. Configuration of a First Semiconductor Light-Emitting Device Member]

A first semiconductor light-emitting device member in the present invention has features (1) to (3) shown below:

(1) In a solid Si-nuclear magnetic resonance spectrum, the semiconductor light-emitting device member comprises at least one peak selected from a group consisting of (i) peaks whose peak top position is in an area of a chemical shift of −40 ppm or more and 0 ppm or less, and whose full width at half maximum is 0.3 ppm or more and 3.0 ppm or less, and (ii) peaks whose peak top position is in an area of the chemical shift of −80 ppm or more and less than −40 ppm, and whose full width at half maximum is 0.3 ppm or more and 5.0 ppm or less.

(2) Silicon content is 20 weight % or more.

(3) Silanol content is 0.1 weight % or more and 10 weight % or less.

First, these features (1) to (3) will be described below.

[I-1-1. Solid Si-NMR Spectrum]

A compound having silicon as its main component is represented by a rational formula of $SiO_2 \cdot nH_2O$ and has a structure in which an oxygen atom O is bound to each vertex of a tetrahedron of a silicon atom Si and further a silicon atom Si is bound to each of these oxygen atoms O to spread like a network. Pattern views shown below represent a network structure of Si—O without showing the above tetrahedron structure and part of oxygen atoms O is substituted by other components (for example, —H and —$CH_3$) in a repetitive unit of Si—O—Si—O—. If focused on one silicon atom Si, there is a silicon atom Si ($Q^4$) having four —OSi as shown in the pattern view (A), a silicon atom Si ($Q^3$) having three —OSi as shown in the pattern view (B) and the like. Then, in solid Si-NMR measurement, peaks based on each of the above silicon atoms Si are in order called a $Q^4$ peak, $Q^3$ peak, ...

[Chemical Formula 3]

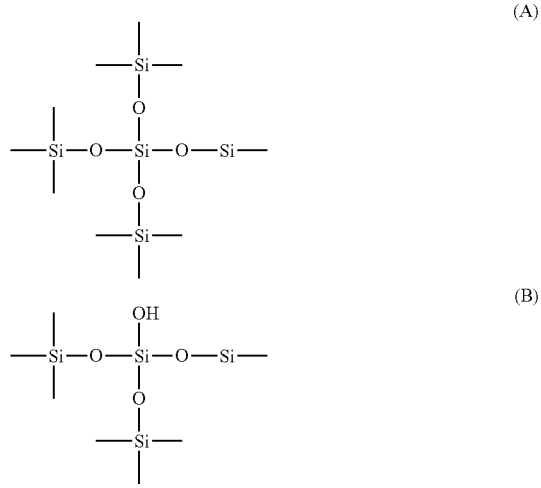

A silicon atom with these four bound oxygen atoms are generically called a Q site. In the present invention, each peak of $Q^0$ to $Q^4$ originating from a Q site will be called a $Q^n$ peak group. A $Q^n$ peak group of a silica membrane containing no organic substituent is usually observed as a continuous polymodal peak in an area of a chemical shift of −80 to −130 ppm.

In contrast, a silicon atom having three bound oxygen atoms and one other bound atom (normally a carbon atom) is generically called a T site. Like a peak originating from a Q site, a peak originating from a T site is observed as each peak of $T^0$ to $T^3$. In the present invention, each peak originating from a T site will be called a $T^n$ peak group. A $T^n$ peak group is generally observed as a continuous polymodal peak in an area on a higher magnetic field side (usually the chemical shift of −80 to −40 ppm) than a $Q^n$ peak group.

Further, a silicon atom with two bound oxygen atoms and two other bound atoms (normally carbon atoms) is generically called a D site. Like a peak group originating from a Q site or T site, a peak originating from a D site is observed as each peak ($D^n$ peak group) of $D^0$ to $D^n$ in a still higher magnetic field area (usually an area of the chemical shift of 0 to −40 ppm) than a $Q^n$ and $T^n$ peak groups to be observed as a polymodal peak. Each peak group of $D^n$, $T^n$, and $Q^n$ has an area proportional to a molar ratio of silicon atoms placed in an environment corresponding to each peak group and therefore, if the area of all peaks is set to a molar quantity of all silicon atoms, a total area of the $D^n$ peak group and $T^n$ peak group will usually correspond to a molar quantity of all silicon atoms directly bound to corresponding carbon atoms.

If the solid Si-NMR spectrum of the first semiconductor light-emitting device member in the present invention is measured, the $D^n$ peak group and $T^n$ peak group originating from silicon atoms directly bound to carbon atoms of an organic group and the $Q^n$ peak group originating from silicon atoms not bound to carbon atoms of the organic group each appear in different areas. Among these peaks, peaks of less than −80 ppm correspond to the $Q^n$ peak, as described above, and peaks of −80 ppm or more correspond to the $D^n$ and $T^n$ peaks. Though the $Q^n$ peak is not essential for the first semiconductor light-emitting device member in the present invention, at least one and preferably a plurality of peaks are observed in the $D^n$ and $T^n$ peak areas.

The value of chemical shift for the semiconductor light-emitting device member can be calculated, for example, based on a measurement result of solid Si-NMR measurement made according to the following method. Also, measured data is analyzed (the full width at half maximum, silanol amount and so on) by a method in which each peak is divided and extracted by waveform separation analysis or the like utilizing, for example, the Gauss function or Lorentz function.

[Solid Si-NMR Spectrum Measurement and Calculation of the Silanol Content]

When measuring a solid Si-NMR spectrum of a semiconductor light-emitting device member, solid Si-NMR spectrum measurement and waveform separation analysis are performed under the following conditions. The full width at half maximum of each peak is determined for the semiconductor light-emitting device member from resultant waveform data. A ratio (%) of silicon atoms in silanol to all silicon atoms is determined from the ratio of peak areas originating from silanol to all peak areas and then the silanol content is determined by comparing with a silicon content analyzed separately.

<Device Conditions>

Device: Infinity CMX-400 nuclear magnetic resonance spectroscope manufactured by Chemagnetics Co.

$^{29}Si$ resonance frequency: 79.436 MHz

Probe: 7.5 mm φ CP/MAS probe

Temperature: Room temperature

Rotational frequency of sample: 4 kHz

Measuring method: Single pulse method $^1H$ decoupling frequency: 50 kHz $^{29}$Si flip angle: 90°
$^{29}$Si 90° pulse width: 5.0 μs
Repetition time: 600 s
Total count: 128 times
Observation width: 30 kHz
Broadening factor: 20 Hz
<Data Processing Method>
For the semiconductor light-emitting device member, 512 points are taken in as measured data and zero-filled to 8192 points before Fourier transformation is performed.
<Waveform Separation Analysis Method>
For each peak after Fourier transformation, an optimization calculation is performed by the nonlinear least square method using the center position, height, and full width at half maximum of a peak shape created by a Lorentz waveform, Gauss waveform, or a mixture of both as variable parameters.

For identification of a peak, refer to AIChE Journal, 44 (5), p. 1141, 1998 or the like.

[I-1-2. Silicon Content]

The first semiconductor light-emitting device member in the present invention must have the silicon content of at least 20 weight % (feature (2)). The basic skeleton of a conventional semiconductor light-emitting device member is an organic resin such as an epoxy resin with carbon-carbon and carbon-oxygen bonds as a basic skeleton. In contrast, the basic skeleton of the first semiconductor light-emitting device member in the present invention is an inorganic siloxane bond like glass (silicate glass). As is evident from a chemical bond comparison table in Table 1 shown below, the siloxane bond has the following superior features as a semiconductor light-emitting device member.

(I) Light resistance is superior with large bond energy and properties resistant to pyrolysis and photolysis.

(II) Electrically polarized slightly.

(III) The chain structure has a high degree of freedom so that highly flexible structures can be formed and are freely rotatable about a siloxane chain.

(IV) Highly oxidized so that further oxidization is impossible.

(V) High electrical insulating properties.

TABLE 1

Chemical bond comparison table

| Bond | Bond distance (Å) | Bond energy (kcal/mol) | Bond angle (°) |
|---|---|---|---|
| Si—O—Si | 1.64 | 108 | 130 to 160 |
| C—O—C | 1.43 | 86 | 110 |
| C—C—C | 1.54 | 85 | 109 |

From these features, it is understood that a silicone semiconductor light-emitting device member formed by a skeleton in which the siloxane bond is formed three-dimensionally with a high degree of crosslinking can become a protective film, in contrast to a conventional resin semiconductor light-emitting device member such as an epoxy resin, that is similar to minerals such as glass and rock and high in heat resistance and light resistance. Particularly, a silicone semiconductor light-emitting device member with a methyl group as a substituent is superior in light resistance because the silicone semiconductor light-emitting device member does not have an absorption region in an ultraviolet region and photolysis is unlikely to occur.

The silicon content of the first semiconductor light-emitting device member in the present invention is 20 weight % or more, as described above, but among others 25 weight % or more is preferable and 30 weight % or more is still preferable. On the other hand, an upper limit is usually set to 47 weight % due to a fact that the silicon content of glass consisting entirely of $SiO_2$ is 47 weight %.

The silicon content of a semiconductor light-emitting device member can be calculated from an analysis result after performing inductively coupled plasma spectrometry (hereinafter abbreviated as "ICP" when appropriate) analysis using, for example, a method described below.

[Silicon Content Measurement]

A singly cured body of a semiconductor light-emitting device member is ground to pieces of about 100 μm and kept in a platinum crucible in the air at 450° C. for 1 hour and then at 750° C. for 1 hour and at 950° C. for 1.5 hours for burning. After removal of carbon components, a small amount of the resultant residual is added a 10-fold amount or more of sodium carbonate, heated by a burner to melt, then cooled to add desalted water and further diluted to several ppm in silicon while adjusting pH value to around neutrality using hydrochloric acid before performing ICP analysis.

[I-1-3. Silanol Content]

The first semiconductor light-emitting device member in the present invention has the silanol content in the range of usually 0.1 weight % or more and preferably 0.3 weight % or more, and usually 10 weight % or less, preferably 8 weight % or less, and still preferably 5 weight % or less (feature (3)).

A glass body produced by the sol gel method from alkoxysilane as a material usually does not completely polymerize to become an oxide under mild curing conditions of 150° C. and about three hours, and a certain amount of silanol remains. A glass body obtained exclusively from tetraalkoxysilane has high hardness and high light resistance, but a large amount of silanol remains because a molecular chain has a low degree of freedom due to a high degree of crosslinking and thus no complete condensation occurs. Also, when a hydrolyzed/condensed liquid is dried/cured, thickening is swift due to a large number of crosslinking points and drying and curing proceed simultaneously, resulting in a bulk body with large distortion. If such a member is used as a semiconductor light-emitting device member, new internal stress arises due to condensation of residual silanol when the member is used for a long period of time, making a malfunction such as cracks, peeling, and breaking of wire more likely to occur. Also, more silanol is found in a fracture surface of the member and moisture infiltration is likely to result because, though moisture permeability is low, surface hygroscopicity is high. The silanol content can be reduced by high-temperature burning at 400° C. or higher, but this is not practical because the heat-resistant temperature of most semiconductor light-emitting devices is 260° C. or lower.

The first semiconductor light-emitting device member in the present invention, on the other hand, varies little over time due to low silanol content, is superior in long-term capability stability, and has superior capabilities of low hygroscopicity and moisture permeability. However, if a member does not contain silanol at all, the member has poor adhesion to the semiconductor light-emitting device and therefore, the appropriate range of the silanol content described above exists for the first semiconductor light-emitting device member in the present invention.

The silanol content of a semiconductor light-emitting device member can be calculated by making solid Si-NMR spectrum measurement using, for example, the method described in [Solid Si-NMR spectrum measurement and calculation of the silanol content] of [I-1-1. Solid Si-NMR spectrum], determining a ratio (%) of silicon atoms in silanol to all silicon atoms from the ratio of peak areas originating from silanol to all peak areas, and comparing with a silicon content analyzed separately.

[I-1-4. Reasons why Advantages of the Present Invention are Obtained from the Above Features (1) to (3)]

Since the first semiconductor light-emitting device member in the present invention is provided with the above features (1) to (3), a cured body that is cured closely without causing cracks even in thick film portions, is superior in adhesion with a case and chip sealing characteristics, and also superior in light/heat resistance after curing can be obtained. A reason therefor has not been clarified, but is assumed to be as follows.

A semiconductor light-emitting device member can be obtained from inorganic glass either by a melt process in which low-melting glass is melted and then sealed or the sol gel method in which a liquid obtained by performing hydrolysis and polycondensation of alkoxysilane or the like at a relatively low temperature is coated and then dried/cured. Only the $Q''$ peak is mainly observed from members obtained by the melt process, but this method is not practical because a high temperature of at least 350° C. is required for melting, leading to thermal degradation of the semiconductor light-emitting device.

A hydrolysis and polycondensation product obtained from a tetrafunctional silane compound by the sol gel method, on the other hand, becomes totally inorganic glass and is vastly superior in heat resistance and weather resistance, but a cure reaction is accompanied by weight loss and volume reduction for a portion of dehydration because crosslinking proceeds due to a condensation (dehydration/dealcoholization) reaction of silanol. Thus, if only tetrafunctional silane having the $Q''$ peak is selected as a material, the degree of shrinkage on curing becomes too large and cracks are made more likely to appear in coating, making it impossible to form a thick film. Attempts to increase film thickness have been made in such a system by adding inorganic particles as an aggregate or recoating, but 10 μm or so is generally a limit thickness. If sol gel glass is used as a semiconductor light-emitting device member, there has been a problem that the film thickness of 500 to 1000 μm must be secured because molding on wiring portions of complicated shape is needed. Also as described above, heating at a high temperature of at least 400° C. is needed to sufficiently reduce residual silanol to obtain totally inorganic glass, which is not practical because the semiconductor device is thermally degraded.

In contrast, in the first semiconductor light-emitting device member in the present invention, a transparent glass film-like member or transparent elastomer-like member with the film thickness of up to 1000 μm can be obtained by introducing trifunctional silane having the $T''$ peak and/or bifunctional silane having the $D''$ peak to adjust a crosslink density to make the film have flexibility and at the same time, by performing hydrolysis and polycondensation to reduce the volume resulting from dehydration condensation and the crosslink density appropriately within a range that does not affect the function, and controlling hydrolysis/condensation and drying processes. Therefore, in the first semiconductor light-emitting device member in the present invention, the $T''$ peak and/or $D''$ peak observed in an area of −80 ppm or more is essential.

A technology of a hard coat film for eye glasses and the like is known as a method of making a film thicker using bifunctional or trifunctional material as a main component, but its film thickness is at most several min or less. Such a hard coat film is thin and thus can be cured uniformly by easily volatilizing a solvent, and differences in adhesion and linear expansion coefficient between the hard coat film and substrate have been considered as a main cause for cracks. In the first semiconductor light-emitting device member in the present invention, on the other hand, the film is thick like a paint and has itself a certain level of strength so that a small difference in linear expansion coefficient can be accommodated, but in contrast to a thin film, generation of internal stress caused by volume reduction due to solvent drying arises as a new problem. That is, when a deep container with a small opening area such as an LED cup is molded, if the deep container is heated for curing while a film deep part is not sufficiently dried up, solvent volatilization occurs after crosslinking and the volume decreases, leading to large cracks and foaming. Large internal stress is applied to such a film and measurement of solid Si-NMR of the film shows broader distribution of a siloxane bond angle of the detected $D''$, $T''$, and $Q''$ peak groups than when the internal stress is smaller, creating a broader peak for each. This fact implies that a bond angle represented by two —OSi with respect to Si has large distortion. That is, a film having a narrower full width at half maximum of peak will be a higher-quality film in which cracks are more unlikely to appear, even though the film is made of the same material.

A phenomenon in which the full width at half maximum increases in accordance with distortion is observed more sensitively as the degree of constraint of molecular motion of Si atoms increases, and its frequencies of appearance are given by $D''<T''<Q''$.

The first semiconductor light-emitting device member in the present invention is characterized in that the full width at half maximum of peak measured in an area of −80 ppm or more is smaller (narrower) than the range of a full width at half maximum of semiconductor light-emitting device members conventionally known by the sol gel method.

Summarizing in terms of chemical shifts, in the first semiconductor light-emitting device member in the present invention, the full width at half maximum of the $T''$ peak group whose peak top position is observed in an area of the chemical shift of −80 ppm or more and less than −40 ppm is in the range of usually 5.0 ppm or less, preferably 4.0 ppm or less, and usually 0.3 ppm or more, preferably 0.4 ppm or more.

Similarly, the full width at half maximum of the $D''$ peak group whose peak top position is observed in an area of the chemical shift of −40 ppm or more and 0 ppm or less is generally smaller than that of the $T''$ peak group due to smaller constraints of molecular motion and is in the range of usually 3.0 ppm or less, preferably 2.0 ppm or less, and usually 0.3 ppm or more.

If the full width at half maximum of peaks observed in the above chemical shift areas is larger than the above ranges, a state in which constraints of molecular motion is large and thus distortion is large is created, leading possibly to a member inferior in heat resistance, weather resistance, and durability in which cracks are more likely to appear. When, for example, a lot of tetrafunctional silane is used or large internal stress is generated by drying rapidly in a drying process, the range of the full width at half maximum will be larger than the above range.

If the full width at half maximum of peaks is smaller than the above ranges, Si atoms in its environment are not involved in siloxane crosslinking and, for example, trifunctional silane remains in a non-crosslinked state, leading possibly to a member inferior in heat resistance, weather resistance, and durability to materials formed mainly of siloxane bonds.

Further, as described above, at least one, preferably a plurality of peaks are observed in the $D''$ and $T''$ peak areas of a solid Si-nuclear magnetic resonance spectrum in the first semiconductor light-emitting device member in the present invention. Therefore, it is preferable that the solid Si-nuclear magnetic resonance spectrum of the first semiconductor light-emitting device member in the present invention has at least one, preferably two or more peaks selected from a group consisting of the D″ peak group and T″ peak group having the full width at half maximum in the above ranges.

Composition of the first semiconductor light-emitting device member in the present invention is limited to a case in which crosslinking in a system is mainly formed of inorganic components including silica. That is, even if a peak within the above full width at half maximum is found in an area of −80 ppm or more in a semiconductor light-emitting device member containing a small amount of Si component in a large amount of organic components, excellent heat resistance and heat resistance and coating capabilities defined in a description of the first semiconductor light-emitting device member in the present invention cannot be obtained. A semiconductor light-emitting device member having silicon content of 20 weight % or more as defined in the description of the first semiconductor light-emitting device member in the present invention contains $SiO_2$ of 43 weight % or more in terms of silica ($SiO_2$).

Since the first semiconductor light-emitting device member in the present invention contains an appropriate amount of silanol, silanol is bound to a polar portion existing on the device surface through hydrogen bond so that adhesion develops. The polar portion includes the hydroxyl group and oxygen in a metalloxane bond.

The first semiconductor light-emitting device member in the present invention forms due to dehydration/condensation a covalent bond with a hydroxyl group on the device surface when heated in the presence of an appropriate catalyst, developing of still firmer adhesion.

If there is too much silanol, on the other hand, adhesion increases in the system to make coating difficult and, with increased activity, when cured before light-boiling components volatilize by heating, foaming and internal stress increase, causing possibly cracks.

[I-1-5. Hardness Measured Value]

The first semiconductor light-emitting device member in the present invention is preferably a member presenting elastomer properties. More specifically, the hardness measured value (Shore A) by durometer type A is usually 5 or more, preferably 7 or more, and still preferably 10 or more, and usually 90 or less, preferably 80 or less, and still preferably 70 or less (feature 4). With the hardness measured value in the above range being provided, the first semiconductor light-emitting device member in the present invention can obtain advantages of being more resistant to cracks and superior in reflow resistance and resistance to temperature cycles.

The above hardness measured value (Shore A) can be measured according to a method described in JIS K6253. More specifically, the measurement can be made using an A-type rubber hardness scale manufactured by Kori Seiki MFG. Co., Ltd.

As described above, the first semiconductor light-emitting device member in the present invention preferably has a predetermined hardness measured value (Shore A). That is, the first semiconductor light-emitting device member in the present invention preferably presents elastomer properties whose crosslink density is adjusted. A semiconductor light-emitting device uses a plurality of members whose thermal expansion coefficients are different and the first semiconductor light-emitting device member in the present invention can relieve stress caused by expansion and contraction of each of the above members with elastomer properties described above. That is, the first semiconductor light-emitting device member in the present invention has less internal stress. Therefore, a semiconductor light-emitting device that is resistant to peeling, cracks, and breaking of wire while in use and superior in reflow resistance and resistance to temperature cycles can be provided.

Here, the reflow is a soldering technique by which solder paste is printed on a substrate and components are mounted thereupon before heating and joining. The reflow resistance refers to properties that can withstand a thermal shock of the maximum temperature 260° C. for 10 seconds.

Conventional inorganic sealants are very hard and brittle and thus cannot handle thermal expansion/thermal contraction of members having different thermal expansion coefficients used in a semiconductor light-emitting device, posing problems of frequent peeling, cracks, and breaking of wire while in use. Moreover, no inorganic sealing compound superior in reflow resistance and resistance to temperature cycles has not yet been obtained. However, according to the first semiconductor light-emitting device member in the present invention, a semiconductor light-emitting device superior in reflow resistance and resistance to temperature cycles can be provided.

[I-1-6. Peak Area Ratio]

The first semiconductor light-emitting device member in the present invention preferably satisfies the following condition (4'). That is, in the first semiconductor light-emitting device member in the present invention, (4') the ratio of (total area of peaks of the chemical shift of −40 ppm or more and 0 ppm or less)/(total area of peaks of the chemical shift of less than −40 ppm) in a solid Si-nuclear magnetic resonance spectrum (hereinafter called a "peak area ratio according to the present invention" in a description of the first semiconductor light-emitting device member in the present invention when appropriate) is usually 3 or more, preferably 5 or more, and still preferably 10 or more, and usually 200 or less, preferably 100 or less, and still preferably 50 or less.

That the peak area ratio according to the present invention is within the above range means that the first semiconductor light-emitting device member in the present invention has more bifunctional silane (D site) than multi-functional silane exceeding bifunctional silane such as trifunctional silane (T site) and tetrafunctional silane (Q site). With more bifunctional silane being provided, as described above, the first semiconductor light-emitting device member in the present invention can satisfy the condition (4) (presenting elastomer properties) and so stress can be relieved.

However, the first semiconductor light-emitting device member in the present invention may present elastomer properties even without satisfying the conditions (4'). This is a case when, for example, the first semiconductor light-emitting device member in the present invention is made by using a coupling agent such as alkoxide of metal excluding silicon as a crosslinking agent. The technique used for causing the first semiconductor light-emitting device member in the present invention to satisfy the condition (4) is arbitrary and is not limited to the condition (4').

[I-1-7. UV Transmittance]

The first semiconductor light-emitting device member in the present invention preferably has light transmittance of usually 80% or more, among others 85% or more, and further 90% or more on a luminous wavelength of a semiconductor light-emitting device with the film thickness of 0.5 mm. Efficiency of extracting light in the semiconductor light-emitting device has been enhanced by various technologies, but if transparency of a translucent member for sealing a chip or holding a phosphor is low, luminance of a semiconductor light-emitting device using the translucent member will be reduced, making it difficult to obtain a high-luminescent semiconductor light-emitting device product.

Here, a "luminous wavelength of a semiconductor light-emitting device" varies depending on the type of semiconductor light-emitting device and generally refers to wavelengths in a range of usually 300 nm or more, preferably 350 nm or more, and usually 900 nm or less, preferably 500 nm or less. If light transmittance is low for wavelengths in this range, the semiconductor light-emitting device member absorbs light and efficiency of extracting light decreases, making it impossible to obtain a high-luminescent device. Further, low light transmittance is undesirable because energy for reduced efficiency in extracting light is converted into heat, leading to thermal degradation.

Sealing members tend to degrade due to light in the near ultraviolet to blue regions (300 nm to 500 nm) and thus, the first semiconductor light-emitting device member in the present invention, which is superior in durability, is preferably used for a semiconductor light-emitting device having the luminous wavelengths in this region because its effect will be increased.

Light transmittance of a semiconductor light-emitting device member can be measured by an ultraviolet spectrophotometer using a sample of singly cured film with a smooth surface formed into a film thickness of 0.5 mm by, for example, a technique described below.

[Measurement of Transmittance]

Transmittance was measured using a singly cured film with a smooth surface of about 0.5 mm in thickness of a semiconductor light-emitting device member without scattering by defects or unevenness at wavelengths of 200 nm to 800 nm by an ultraviolet spectrophotometer (UV-3100 manufactured by Shimadzu Corporation).

The shape of semiconductor device is diverse and a large majority of semiconductor devices are used in a thick-film state exceeding 0.1 mm, but there are also uses of a thin film when, for example, a thin-film phosphor layer (for example, a layer of several μm in thickness including nanometer phosphor particles and fluorescent ions) is provided at a position apart from an LED chip (light-emitting device) and a high refractive index light extracting film is provided on a thin film right above an LED chip. In such a case, transmittance is preferably 80% or more with the thickness. In such forms of using a thin film, the first semiconductor light-emitting device member in the present invention also shows superior light resistance and heat resistance and is superior in sealing properties so that a thin film can steadily be formed without cracks or the like.

[I-1-8. Others]

The first semiconductor light-emitting device member in the present invention can be coated like a thick film and is superior not only in transparency, but also in sealing properties, heat resistance, and UV resistance, and thus can be applied as a semiconductor light-emitting device member in various forms. Particularly, the first semiconductor light-emitting device member can be used for semiconductor light-emitting devices whose luminous wavelength is in the blue to ultraviolet region as a useful member with less degradation.

[I-2. Manufacturing Method of Semiconductor Light-Emitting Device Members]

The method of manufacturing the first semiconductor light-emitting device member in the present invention is not particularly limited, and the first semiconductor light-emitting device member in the present invention can be obtained, for example, by performing hydrolysis and polycondensation of compounds represented by a general formula (1) and general formula (2) and/or their oligomers and drying polycondensate (hydrolyzate/polycondensate). However, if the first semiconductor light-emitting device member in the present invention should be a highly durable elastomer-like semiconductor light-emitting device member, it is preferable that the member consists principally of siloxane bonds and the crosslink density is reduced. Therefore, it is desirable that the material consists principally of a compound or oligomer represented by the general formula (1) and also the material consists principally of composition consisting principally of bifunctional units. If a material consisting principally of bifunctional units is selected as described above, the system will be stable, making gelation more unlikely to occur. Therefore, in this case, if the hydrolyzate/polycondensate contains a solvent, the solvent may be removed before drying.

The manufacturing method (called "manufacturing method of the first semiconductor light-emitting device member in the present invention" when appropriate) will be described below in detail.

[I-2-1. Material]

Compounds (hereinafter called "compounds (1)" in a description of the first semiconductor light-emitting device member in the present invention when appropriate) represented by the general formula (1) shown below and/or their oligomers will be used as a material.

[Chemical Formula 4]

$$M^{m+}X_n Y^1_{m-n} \quad (1)$$

In the general formula (1), M represents at least one element selected from a group consisting of silicon, aluminum, zirconium, and titanium. Among others, silicon is preferable.

In the general formula (1), m represents a valence of M and is an integer of 1 or greater and 4 or smaller. "m+" indicates that it is a positive valence.

n represents the number of X groups and is an integer of 1 or greater and 4 or smaller. However, m≥n holds.

In the general formula (1), X is a hydrolyzable group that generates a highly reactive hydroxyl group after being hydrolyzed by water in a solution or moisture in the air, and any conventionally known one can arbitrarily be used. For example, a low-grade alkoxy group of C1 to C5, acetoxy group, butanoxy group, and chlorine group can be cited. Here, an expression Ci (i is an integer) indicates that the number of carbon atoms is i. Furthermore, one hydrolyzable group may be used alone or two or more hydrolyzable groups may be used together in any combination at any ratio.

Among others, since components liberated after reaction are neutral, the low-grade alkoxy group of C1 to C5 is preferable. Particularly, a methoxy group or ethoxy group is preferable because these groups are highly reactive and a liberated solvent is lightly boiling.

Further, if X is an acetoxy group or chlorine group in the general formula (1), it is preferable to add a process of removing acid components when used as a semiconductor light-emitting device member for which insulating properties are needed because acetic acid or hydrochloric acid is liberated after hydrolysis reaction.

In the general formula (1), any known monovalent organic group of the so-called silane coupling agent can optionally be selected for $Y^1$ and used. Among others, organic groups particularly useful as $Y^1$ in the general formula (1) for the manufacturing method of the first semiconductor light-emitting device member in the present invention are those selected from a group (group of useful organic groups) represented by $Y^0$ below. Further, other organic groups may also be selected in order to improve affinity and adhesion with other materials constituting a semiconductor light-emitting device and to adjust the refractive index of a semiconductor light-emitting device member when appropriate.

<Group of Useful Organic Groups $Y^0$>

$Y^0$: Monovalent or higher organic groups derived from aliphatic compounds, alicyclic compounds, aromatic compounds, and aliphatic-aromatic compounds.

The number of carbon atoms of organic groups belonging to the group $Y^0$ is usually 1 or more, and usually 1000 or less, preferably 500 or less, still preferably 100 or less, and further still preferably 50 or less.

Further, at least part of hydrogen atoms in the organic groups belonging to the group $Y^0$ may be substituted by atoms and/or substituents such as organic functional groups exemplified below. At this time, a plurality of hydrogen atoms in an organic group belonging to the group $Y^0$ may be substituted by the following substituents and, in this case, one substituent or a combination of two or more substituents may be selected for substitution.

Examples of substituents that can be substituted for hydrogen atoms in the organic groups belonging to the group $Y^0$ include atoms such as F, Cl, Br, and I; and organic functional groups such as the vinyl group, methacryloxy group, acryloxy group, styryl group, mercapto group, epoxy group, epoxy cyclohexyl group, glycidoxy group, amino group, cyano group, nitro group, sulfonic acid group, carboxy group, hydroxy group, acyl group, alkoxy group, imino group, and phenyl group.

In all the cases described above, at least part of hydrogen atoms in the organic functional groups among substituents that can be substituted for hydrogen atoms in the organic groups belonging to the group $Y^0$ may be substituted by halogen atoms such as F, Cl, Br, and I.

However, among the substituents exemplified as substitutable for hydrogen in the organic groups belonging to the group $Y^0$, the organic functional groups are examples of substituents which can be introduced easily and organic functional groups having various physicochemical functionalities may be introduced in accordance with purposes of use.

Organic groups belonging to the group $Y^0$ may also have therein various atoms such as O, N, and S or atomic groups as connecting groups.

Various groups can be selected from the organic groups belonging to the above group of useful organic groups $Y^0$ as $Y^1$ in the general formula (1) in accordance with purposes, but in terms of superiority in UV resistance and heat resistance, it is preferable to select principally from the methyl group.

Concrete examples of the above compounds (1) when M is silicon include dimethyldimethoxysilane, dimethyldiethoxysilane, diphenyldimethoxysilane, diphenyldiethoxysilane, vinyl trimethoxysilane, vinyl triethoxysilane, vinyl triacetoxysilane, γ-aminopropyl trimethoxysilane, γ-glycidoxypropyl trimethoxysilane, γ-glycidoxypropyltriethoxysilane, β-(3,4-epoxy cyclohexyl)ethyltrimethoxysilane, γ-(3,4-epoxy cyclohexyl)ethyltriethoxysilane, γ-(meth)acryloxypropyl trimethoxysilane, phenyl trimethoxysilane, phenyl triacethoxysilane, γ-mercaptopropyl trimethoxysilane, γ-chloropropyl trimethoxysilane, β-cyanoethyl triethoxysilane, methyltrimethoxysilane, methyltriethoxysilane, methyltripropoxysilane, methyltributoxysilane, ethyltrimethoxysilane, ethyltriethoxysilane, tetramethoxysilane, tetraethoxysilane, tetrapropoxysilane, tetrabutoxysilane, dimethyldichlorosilane, diphenyldichlorosilane, methylphenyl dimethoxysilane, trimethylmethoxysilane, trimethylethoxysilane, trimethylchlorosilane, methyltrichlorosilane, γ-aminopropyl triethoxysilane, 4-aminobutyl triethoxysilane, p-aminophenyl trimethoxysilane, N-(2-aminoethyl)-3-aminopropyl trimethoxysilane, aminoethyl aminomethylphenethyl trimethoxysilane, 3-glycidoxypropyl trimethoxysilane, 2-(3,4-epoxy cyclohexyl)ethyltrimethoxysilane, 3-aminopropyl trimethoxysilane, 3-aminopropyl triethoxysilane, 4-aminobutyl triethoxysilane, N-(6-aminohexyl)aminopropyl trimethoxysilane, 3-chloropropyl trimethoxysilane, 3-chloropropyltrichlorosilane, (p-chloromethyl)phenyltrimethoxysilane, 4-chlorophenyl trimethoxysilane, 3-methacryloxypropyl trimethoxysilane, 3-methacryloxypropyl triethoxysilane, 3-acryloxypropyl trimethoxysilane, styrylethyl trimethoxysilane, 3-mercaptopropyl trimethoxysilane, vinyl trichlorosilane, vinyl tris (2-methoxyethoxy) silane, and trifluoropropyl trimethoxysilane.

Concrete examples of the compounds (1) when M is aluminum include aluminum triisopropoxide, aluminum tri-n-butoxide, aluminum tri-t-butoxide, and aluminum triethoxide.

Concrete examples of the compounds (1) when M is zirconium include zirconium tetramethoxide, zirconium tetraethoxide, zirconium tetra-n-propoxide, zirconium tetra-i-propoxide, zirconium tetra-n-butoxide, zirconium tetra-i-butoxide, zirconium tetra-t-butoxide, and zirconium dimethacrylate dibutoxide.

Concrete examples of the compounds (1) when M is titanium include titanium tetraisopropoxide, titanium tetra-n-butoxide, titanium tetra-i-butoxide, titanium methacrylate tri-isopropoxide, titanium tetramethoxypropoxide, titanium tetra-n-propoxide, and titanium tetraethoxide.

However, these compounds exemplified above are only part of coupling agents easily available on the market and more details can be shown, for example, by a list of coupling agents and related products in Chapter 9 of "Technology of Maximum Usage of Coupling Agents" issued by Institute for Science and Technology. Naturally, however, coupling agents that can be used for the manufacturing method of the first semiconductor light-emitting device member in the present invention are not limited by these exemplified coupling agents.

Compounds (hereinafter called "compounds (2)" in a description of the first semiconductor light-emitting device member in the present invention when appropriate) represented by the general formula (2) and/or their oligomers can also be used in the same manner as the above compounds (1) and/or their oligomers.

[Chemical Formula 5]

$$(M^{s+}X_tY^1_{s-t-1})_uY^2 \qquad (2)$$

In the general formula (2), M, X, and $Y^1$ each independently represent the same things as those in the general formula (1). Particularly for $Y^1$, just as in the case of the general formula (1), various groups can be selected from the organic groups belonging to the above group of useful organic groups $Y^0$ in accordance with purposes, but in terms of superiority in UV resistance and heat resistance, it is preferable to select principally from the methyl group.

In the general formula (2), s represents a valence of M and is an integer of 2 or greater and 4 or smaller. "s+" indicates that it is a positive integer.

Further, in the general formula (2), $Y^2$ represents a u-valent organic group. u represents an integer of 2 or greater. Therefore, any bivalent or higher organic group can arbitrarily be selected from organic groups known as organic groups of the so-called silane coupling agent for $Y^2$ in the general formula (2) and used Also, in the general formula (2), t represents an integer of 1 or greater and s−1 or smaller, where t≤s.

Examples of the above compounds (2) include various organic polymers and oligomers to which a plurality of hydrolytic silyl groups are bound as side chains and molecules to which hydrolytic silyl groups are bound to a plurality of ends of the molecules.

Concrete examples of the above compounds (2) and their product names are listed below:

Bis(triethoxysilylpropyl) tetrasulfide (Manufactured by Shin-Etsu Chemical Co., Ltd., KBE-846)

2-diethoxymethyl ethylsilyldimethyl-2-furanylsilane (Manufactured by Shin-Etsu Chemical Co., Ltd., LS-7740)

N,N'-bis[3-(trimethoxysilyl) propyl]ethylenediamine (Manufactured by Chisso Corporation, Sila-Ace XS1003)

N-glycidyl-N,N-bis[3-(methyldimethoxysilyl) propyl] amine (Manufactured by Toshiba Silicones Co., Ltd., TSL8227)

N-glycidyl-N,N-bis[3-(trimethoxysilyl) propyl]amine (Manufactured by Toshiba Silicones Co., Ltd., TSL8228)

N,N-bis[(methyldimethoxysilyl) propyl]amine (Manufactured by Toshiba Silicones Co., Ltd., TSL8206)

N,N-bis[3-(methyldimethoxysilyl)propyl]ethylenediamine (Manufactured by Toshiba Silicones Co., Ltd., TSL8212)

N,N-bis[(methyldimethoxysilyl) propyl]methacrylamide (Manufactured by Toshiba Silicones Co., Ltd., TSL8213)

N,N-bis[3-(trimethoxysilyl) propyl]amine (Manufactured by Toshiba Silicones Co., Ltd., TSL8208)

N,N-bis[3-(trimethoxysilyl) propyl]ethylenediamine (Manufactured by Toshiba Silicones Co., Ltd., TSL8214)

N,N-bis[3-(trimethoxysilyl) propyl]methacrylamide (Manufactured by Toshiba Silicones Co., Ltd., TSL8215)

N,N',N"-tris[3-(trimethoxysilyl) propyl]isocyanurate (Manufactured by Hydrus Chemical Inc., 12267-1)

1,4-bishydroxydimethylsilylbenzene (Manufactured by Shin-Etsu Chemical Co., Ltd., Ls-7325)

Compounds (1), compounds (2), and/or their oligomer can be used as a material. That is, in the manufacturing method of the first semiconductor light-emitting device member in the present invention, compounds (1), oligomers of the compounds (1), compounds (2), oligomers of the compounds (2), or oligomers of the compounds (1) and compounds (2) may be used as a material. If an oligomer of the compounds (1) or an oligomer of the compounds (2) is used as a material, the molecular weight of the oligomer is arbitrary as long as the first semiconductor light-emitting device member in the present invention can be obtained, but usually 400 or more.

Here, if the compounds (2) and/or oligomers thereof are used as a main material, a main chain structure in its system will consist principally of organic bonds, leading possibly to low durability. Thus, it is desirable to use a minimum amount of the compounds (2) to mainly provide functionality such as adhesion addition, refractive index adjustment, reactivity control, and inorganic particle dispersibility addition. If the compounds (1) and/or oligomers (compounds (1) derived components) thereof, and the compounds (2) and/or oligomers (compounds (2) derived components) thereof are used simultaneously, it is desirable that the ratio of usage of the compounds (2) derived components to the total weight of material is usually 30 weight % or less, preferably 20 weight % or less, and still preferably 10 weight % or less.

If, in the manufacturing method of the first semiconductor light-emitting device member in the present invention, an oligomer of the compounds (1) or compounds (2) is used as a material, the oligomer may be prepared in advance, but may also be prepared in a manufacturing process. That is, using a monomer such as the compounds (1) or compounds (2) as a material, the monomer may be once turned into an oligomer in the manufacturing process before being allowed to proceed with subsequent reactions of the oligomer.

Further, one of the compounds (1), compounds (2), and their oligomers may be used as a material, but it is also allowed to mix two or more compounds or oligomers in an arbitrary combination or composition. Further, the compounds (1), compounds (2), or their oligomer hydrolyzed in advance (that is, —X in the general formulas (1) and (2) is the OH group) may also be used.

However, in the manufacturing method of the first semiconductor light-emitting device member in the present invention, at least one of the compounds (1), compounds (2), and their oligomer (including those hydrolyzed) containing silicon as M and having at least one of the organic group $Y^1$ and organic group $Y^2$ must be used. Since it is preferable that crosslinks in the system are formed mainly by inorganic components including the siloxane bond, when both compounds (1) and compounds (2) are used, it is preferable that the compounds (1) is mainly used.

To obtain a semiconductor light-emitting device member consisting principally of the siloxane bond, compounds (1) and/or their oligomer is preferably used as a main component of the material. Further, it is still preferable that an oligomer of the compounds (1) and/or that of the compounds (2) are mainly composed of bifunctional components. Particularly, the bifunctional unit of an oligomer of the compounds (1) and/or that of the compounds (2) is preferably used as a bifunctional oligomer.

Further, if bifunctional components (hereinafter called "bifunctional component oligomer" in a description of the first semiconductor light-emitting device member in the present invention when appropriate) of an oligomer of the compounds (1) and/or that of the compounds (2) are mainly used, the ratio of usage of the bifunctional component oligomers to the total weight (that is, the sum of weight of the compounds (1), compounds (2), and their oligomers) is usually 50 weight % or more, preferably 60 weight % or more, and still preferably 70 weight % or more. The upper limit of the above ratio is usually 97 weight % or less. This is because using a bifunctional component oligomer as a main component of material is one of the factors that make it easy to manufacture the first semiconductor light-emitting device member in the present invention by the manufacturing method of the first semiconductor light-emitting device member in the present invention.

Advantages of using a bifunctional component oligomer as a main component of material will be described below in detail.

In a semiconductor light-emitting device member manufactured by the conventional sol gel method, hydrolyzate/polycondensate (including hydrolyzate/polycondensate contained in coating liquid (hydrolyzing liquid)) obtained by hydrolysis and polycondensation of its material showed high reaction activity. Thus, unless the hydrolyzate/polycondensate was diluted by a solvent such as alcohol, polymerization in the system would proceed rapidly before being cured, making molding and handling difficult. For example, if not diluted by a solvent, hydrolyzate/polycondensate was sometimes cured even at 40° C. to 50° C. Therefore, it was necessary to cause a solvent to exist with hydrolyzate/polycondensate to ensure handleability of hydrolyzate/polycondensate obtained after hydrolysis.

If hydrolyzate/polycondensate is dried and cured while the solvent is caused to exist with the hydrolyzate/polycondensate, shrinkage by desolvation (desolvation shrinkage) is added to shrinkage caused by dehydration condensation while curing. Accordingly, in a conventional semiconductor light-emitting device, cured bodies tended to have large internal stress, making cracks, peeling, and breaking of wire caused by the internal stress more likely to occur.

Further, if more bifunctional component monomers are used as material for the purpose of softening a semiconductor light-emitting device member in order to relieve the above internal stress, there was a possibility of increasing low-boiling cyclic material in a polycondensation body. Since the low-boiling cyclic material is volatilized during curing, an increase of low-boiling cyclic material will lead to lower weight yield. The low-boiling cyclic material is also volatilized from the cured body, leading possibly to generation of stress. Further, heat resistance of semiconductor light-emitting device members containing a large amount of low-boiling cyclic material may decrease. For the above reasons, it has been difficult to produce a semiconductor light-emitting device member as a highly capable elastomer-like cured body.

In contrast, in the manufacturing method of the first semiconductor light-emitting device member in the present invention, bifunctional components are oligomerized in advance in another system (that is, in a system not involved in the hydrolysis and polycondensation process) and low-boiling impurities without reactive ends are removed before being used as a material. Therefore, even if a large amount of bifunctional components (that is, the above bifunctional component oligomer) is used, low-boiling impurities thereof will not be volatilized, enabling realization of improvement in cured body weight yield and producing highly capable elastomer-like cured body.

Further, reaction activity of hydrolyzate/polycondensate can be controlled by using a bifunctional component oligomer as a main material. This can be considered to be caused by steric hindrance and electronic effects of hydrolyzate/polycondensate and reduction of an end amount of silanol due to use of the bifunctional component oligomer. Because reaction activity is controlled, hydrolyzate/polycondensate is not cured even without causing a solvent to exist and thus, the hydrolyzate/polycondensate can be made both one-component type and non-solvent system.

Also, because reaction activity of hydrolyzate/polycondensate is reduced, a curing start temperature can be set higher than before. Thus, a solvent whose temperature is lower than the curing start temperature of hydrolyzate/polycondensate is caused to exist, the solvent will be volatilized before curing of the hydrolyzate/polycondensate starts when the hydrolyzate/polycondensate is dried. This makes it possible to control generation of internal stress caused by desolvation shrinkage even if a solvent is used.

[I-2-2. Hydrolysis and Polycondensation Process]

In the manufacturing method of the first semiconductor light-emitting device member in the present invention, first the above compounds (1), compounds (2) and/or oligomers thereof are caused to undergo a hydrolysis and polycondensation reaction (hydrolysis and polycondensation process). This hydrolysis and polycondensation reaction can be caused by a known method. In a description of the first semiconductor light-emitting device member in the present invention below, the compounds (1), compounds (2) and oligomers thereof are referred to as "material compounds" when they are not distinguished.

A theoretical amount of water used for causing the hydrolysis and polycondensation reaction of the material compounds is based on a reaction formula shown in the following formula (3) and is half the molar ratio of total amount of hydrolyzable groups in the system.

[Formula 1]

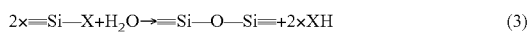

$$2 \times \equiv Si-X + H_2O \rightarrow \equiv Si-O-Si \equiv + 2 \times XH \qquad (3)$$

The above formula (3) represents a case in which M is silicon in the general formulas (1) and (2) as an example. "$\equiv Si$" and "$Si \equiv$" represent three of four dangling bonds held by a silicon atom in an abbreviated manner.

In the description of the first semiconductor light-emitting device member in the present invention, the theoretical amount of water required for the hydrolysis, that is, the amount of water corresponding to half the molar ratio of total amount of hydrolizable groups is selected as a reference (hydrolysis percentage 100%) and the amount of water used for hydrolysis is represented as a percentage to this reference value, that is, "hydrolysis percentage."

In the manufacturing method of the first semiconductor light-emitting device member in the present invention, the amount of water used for causing hydrolysis and polycondensation reaction is, when expressed as the above hydrolysis percentage, preferably in the range of usually 80% or more, among others, 100% or more. If the hydrolysis percentage is lower than this range, hydrolysis/polymerization is insufficient and thus material may volatilize during curing or hardness of cured body may be insufficient. If the hydrolysis percentage exceeds 200%, on the other hand, liberated water always remains in the system during curing, causing chips or phosphor to degrade due to moisture or causing foaming, cracks, or peeling during curing after a cup portion absorbs water. What is important in hydrolysis reaction is to perform hydrolysis and polycondensation using water of the hydrolysis percentage close to 100% or more (for example, 80% or more) and, by adding a process in which liberated water is removed before coating, the hydrolysis percentage exceeding 200% can be applied. However, in this case, using too much water may complicate a concentration process because the amount of water to be removed and that of solvent to be used as a compatibilizer increase or may reduce coating capabilities of members because polycondensation proceeds too much. Thus, it is preferable that the upper limit of the hydrolysis percentage is usually set to 500% or less, among others, 300% or less, and preferably 200% or less.

A known catalyst may coexist during hydrolysis and polycondensation of material compounds to promote hydrolysis and polycondensation. In this case, organic acids such as acetic acid, propionic acid, and butyric acid, inorganic acids such as nitric acid, hydrochloric acid, and phosphoric acid, and sulfuric acid, and an organometallic compound catalyst can be used as a catalyst to be used. For a member to be used for portions directly in contact with a semiconductor light-emitting device, an organometallic compound catalyst that does not have much effect on insulating property is preferable.

Hydrolyzate/polycondensate (polycondensate) of the above material compounds is preferably liquid. However, if solid hydrolyzate/polycondensate can be made liquid using a solvent, such hydrolyzate/polycondensate can also be used.

If liquid separation occurs in the system during hydrolysis and polycondensation reaction to produce a non-uniform state, a solvent may be used. For example, low-grade alcohols of C1 to C3, dimethylformamide, dimethylsulfoxide, acetone, tetrahydrofuran, methylcellosolve, ethylcellosolve, methylethylketone, and any other solvents that can be mixed homogeneously with water can be used as a solvent. Among others, however, solvents that are neither strongly acidic nor strongly basic are preferable for reasons of not affecting hydrolysis and polycondensation adversely. One solvent may be used alone or a plurality of solvents may be used together. The amount of solvent to be used may be freely selected, but it is preferable to use a minimum amount when coated on a semiconductor light-emitting device because the solvent is removed in most cases. It is also preferable to select a solvent whose boiling point is 100° C. or lower, preferably 80° C. or lower to facilitate solvent removal. In some cases, the initial non-uniform state becomes uniform during reaction because a solvent such as alcohol is generated by hydrolysis reaction without a need for adding a solvent from outside.

Hydrolysis and polycondensation reaction of the above material compounds occurs, when carried out under normal pressure, in the range of usually 15° C. or higher, preferably 20° C. or higher, and still preferably 40° C. or higher, and usually 140° C. or lower, preferably 135° C. or lower, and still preferably 130° C. or lower. A higher temperature may also be allowed by maintaining the liquid phase under applied pressure, but it is preferable that the temperature does not exceed 150° C.

The reaction time of hydrolysis and polycondensation reaction depends on the reaction temperature, but the reaction is caused in the range of usually 0.1 hour or more, preferably 1 hour or more, and still preferably 3 hours or more, and usually 100 hours or less, preferably 20 hours or less, and still preferably 15 hours or less.

If, under the above hydrolysis and polycondensation conditions, the time is too short or the temperature is too low, hydrolysis/polymerization is insufficient, leading possibly to volatilization of material during curing or insufficient hardness of cured bodies. In, on the other hand, the time is too long or the temperature is too high, the molecular weight of polymers becomes high and the amount of silanol in the system decreases, causing poor adhesion during coating and the structure of cured bodies becomes non-uniform due to premature curing, making cracks more likely to appear. Taking the above tendencies into consideration, it is preferable to select appropriate conditions in accordance with desired physical property values.

After the above hydrolysis and polycondensation reaction terminates, resultant hydrolyzate/polycondensate is stored at or below room temperature before its use. However, polycondensation slowly proceeds also in the meantime and thus it is preferable that the hydrolyzate/polycondensate is usually used within 60 days of storage at room temperature after the hydrolysis/polucondensation reaction under warming terminates, preferably within 30 days, and still preferably within 15 days especially when used as a thick-film member. The above period can be prolonged if necessary by storing hydrolyzate/polycondensate in a low temperature range in which the hydrolyzate/polycondensate does not freeze.

[I-2-3. Solvent Distillation]

If a solvent is used in the above hydrolysis and polycondensation process, it is preferable, usually before drying, to distill off the solvent from the hydrolyzate/polycondensate (solvent distillation process). Liquid hydrolyzate/polycondensate containing no solvent can thereby be produced. As described above, it has been difficult to handle hydrolyzate/polycondensate after distilling off the solvent because the hydrolyzate/polycondensate is cured. However, in the manufacturing method of the first semiconductor light-emitting device member in the present invention, reactivity of hydrolyzate/polycondensate is controlled if a bifunctional component oligomer is used and thus the hydrolyzate/polycondensate is not cured even if the solvent is distilled off before drying, enabling distillation of the solvent. By distilling off the solvent before drying, cracks, peeling, and breaking of wire due to desolvation shrinkage can be prevented.

Usually, water used for hydrolysis is also distilled off when the solvent is distilled off. Solvents to be distilled off also include solvents represented like XH generated by hydrolysis and polycondensation reaction of the material compounds represented by the general formulas (1) and (2).

Any method of distilling off the solvent may be used as long as effects of the present invention are not seriously damaged. However, distillation of the solvent at a temperature equal to or higher than the curing start temperature of the hydrolyzate/polycondensate should be avoided.

A concrete range of temperature conditions for distilling off a solvent is usually 60° C. or higher, preferably 80° C. or higher, and still preferably 100° C. or higher, and usually 150° C. or lower, preferably 130° C. or lower, and still preferably 120° C. or lower. If the temperature falls below the lower limit of this range, the solvent may be distilled off insufficiently. If the temperature exceeds the upper limit of this range, hydrolyzate/polycondensate may be gelatinized.

A pressure condition for distilling off a solvent is usually a normal pressure. Further, the pressure is reduced when necessary so that the reaction liquid boiling point during solvent distillation should not reach the curing start temperature (usually 120° C. or higher). The lower limit of the pressure is a level at which main components of the hydrolyzate/polycondensate are not distilled off.

However, distilling off a solvent is not an essential operation. Particularly if a solvent whose boiling point is equal to or lower than the cure temperature of the hydrolyzate/polycondensate is used at the time of drying the hydrolyzate/polycondensate, the solvent will be volatilized before curing of the hydrolyzate/polycondensate starts and thus appearance of cracks and the like due to desolvation shrinkage can be prevented without specially performing a solvent distillation process. However, since the volume of the hydrolyzate/polycondensate may change due to volatilization of the solvent, it is preferable to perform solvent distillation from the viewpoint of accurately controlling dimensions and shapes of semiconductor light-emitting device members.

[I-2-4. Drying]

By drying (drying process or curing process) the resultant hydrolyzate/polycondensate from the above hydrolysis and polycondensation reaction, the first semiconductor light-emitting device member in the present invention can be obtained. The hydrolyzate/polycondensate is usually liquid, as described above and, by drying the liquid hydrolyzate/polycondensate in a mold of desired shape, the first semiconductor light-emitting device member in the present invention in the desired shape can be formed. Also, by drying the hydrolyzate/polycondensate after coating the hydrolyzate/polycondensate on a desired region, the first semiconductor light-emitting device member in the present invention can be formed directly on the desired region. The liquid hydrolyzate/polycondensate will be called "hydrolyzed/polycondensed liquid" or "liquid for forming a semiconductor light-emitting device member" in the description of the manufacturing method of the first semiconductor light-emitting device member in the present invention when appropriate. Though the solvent does not necessarily evaporate in the drying process, the drying process here is assumed to include a phenomenon in which hydrolyzate/polycondensate having fluidity is cured by losing the fluidity. Therefore, the above "drying" may be interpreted as "curing" when evaporation of the solvent is not involved.

In the drying process, the metalloxane bond is formed by further polymerizing hydrolyzate/polycondensate and polymers are dried/cured to obtain the first semiconductor light-emitting device member in the present invention.

During drying, hydrolyzate/polycondensate is heated to a predetermined cure temperature for curing. The concrete temperature range is arbitrary as long as the hydrolyzate/polycondensate can be dried, but preferably 120° C. or higher and still preferably 150° C. or higher because the metalloxane bond is usually formed efficiently at 100° C. or higher. However, if the hydrolyzate/polycondensate is heated together with semiconductor light-emitting devices, it is preferable to perform the drying process usually at a temperature equal to or below the heat-resistant temperature of device components, preferably at 200° C. or lower.

The time (cure time) maintained at the cure temperature to dry hydrolyzate/polycondensate is not unconditionally determined due to catalyst concentration, member thickness and the like, but is usually 0.1 hour or more, preferably 0.5 hour or more, and still preferably 1 hour or more, and usually 10 hours or less, preferably 5 hours or less, and still preferably 3 hours or less.

Temperature rise conditions in the drying process are not particularly limited. That is, the temperature may be maintained at a constant level during drying process or the temperature may be changed continuously or intermittently. Also, the drying process may be performed two or more times. Further, the temperature may be changed stepwise in the drying process. By changing the temperature stepwise, an advantage of being able to prevent foaming caused by a residual solvent or dissolved water vapor can be obtained.

However, if, when the above hydrolysis and polycondensation reaction occurs in the presence of a solvent, no solvent distillation process is performed or a solvent remains in the hydrolyzate/polycondensate after performing the solvent distillation process, it is preferable that the drying process is performed by dividing the drying process into a first drying process in which a solvent is substantially removed at a temperature equal to or below the boiling point of the solvent and a second drying process in which hydrolyzate/polycondensate is dried at a temperature equal to or above the boiling point of the solvent. The "solvent" here includes a solvent represented like XH generated by the above hydrolysis and polycondensation reaction of material compounds. "Drying" in the description of the manufacturing method of the first semiconductor light-emitting device member in the present invention refers to a process in which the hydrolyzate/polycondensate of the material compounds lose the solvent and further the metalloxane bond is formed after polymerization/curing.

The first drying process substantially removes a contained solvent at a temperature equal to or below the boiling point of the solvent without actively promoting further polymerization of the hydrolyzate/polycondensate of the material compounds. That is, a product obtained from this process is a viscous liquid or soft film due to hydrogen bonds or hydrolyzate/polycondensate after removing the solvent existing as a liquid after the hydrolyzate/polycondensate before drying is concentrated.

However, usually the first drying process is preferably performed at a temperature below the boiling point of the solvent. If the first drying process is performed at a temperature equal to or above the boiling point of the solvent, the resultant film is foamed by vapor of the solvent, making it difficult to produce uniform films without defects. This first drying process may be performed as a single step if evaporation of the solvent is efficient when, for example, a thin-film member is formed, but may also be performed as a plurality of steps if evaporation efficiency is low when, for example, molded on a cup. For a shape for which evaporation efficiency is extremely low, after drying/concentration is performed on a separate efficient container in advance, hydrolyzate/polycondensate may be coated while still in a fluid state before further being dried. If the evaporation efficiency is low, it is preferable to contrive to dry a whole member uniformly without taking steps to promote only surface concentration of the member such as forced air drying of a large air flow.

In the second drying process, after the solvent of the above hydrolyzate/polycondensate has substantially disappeared in the first drying process, the hydrolyzate/polycondensate is heated at a temperature equal to or above the boiling point of the solvent to form the metalloxane bonds, producing stable cured bodies. If a large amount of solvent remains in this process, the volume reduces due to solvent evaporation while crosslinking reaction proceeds and thus large internal stress is generated, leading to peeling and cracks caused by shrinkage. Since the metalloxane bond is usually formed efficiently at 100° C. or higher, the second drying process is performed preferably at 100° C. or higher, and still preferably at 120° C. or higher. However, if the hydrolyzate/polycondensate is heated together with semiconductor light-emitting devices, it is preferable to perform the drying process usually at a temperature equal to or below the heat-resistant temperature of the device components, preferably at 200° C. or lower. The cure time in the second drying process is not unconditionally determined due to catalyst concentration, member thickness and the like, but is usually 0.1 hour or more, preferably 0.5 hour or more, and still preferably 1 hour or more, and usually 10 hours or less, preferably 5 hours or less, and still preferably 3 hours or less.

By separating the process for solvent removal (first drying process) and the curing process (second drying process) clearly, as described above, even if the solvent distillation process is not performed, semiconductor light-emitting device members having physical properties of the first semiconductor light-emitting device member in the present invention and superior in light resistance and heat resistance can be obtained without causing cracks and peeling.

However, it is still possible that curing may proceed in the first drying process and solvent removal may proceed in the second drying process, but curing in the first drying process and solvent removal in the second drying process are usually too small to affect effects of the present invention.

As long as the above first drying process and second drying process are substantially realized as described above, temperature rise conditions in each process are not particularly limited. That is, the temperature may be maintained at a constant level during each drying process or the temperature may be changed continuously or intermittently. Also, each drying process may be performed two or more times. Further, even if there is a period in which the temperature temporarily rises to the boiling point or above of the solvent during the first drying process or falls below the boiling point of the solvent during the second drying process, such processes are assumed to be included in the scope of the present invention as long as the above process for solvent removal (first drying process) and the curing process (second drying process) are substantially accomplished independently.

Further, if a solvent whose boiling point is equal to or below the cure temperature, preferably below the cure temperature of hydrolyzate/polycondensate is used, the solvent, which exists with the hydrolyzate/polycondensate, will be distilled off during the drying process before the temperature reaches the boiling point even when the hydrolyzate/polycondensate is heated up to the cure temperature without specific temperature adjustments. That is, in this case, the process (first drying process) of substantially removing the solvent at a temperature equal to or below the boiling point of the solvent is performed before hydrolyzate/polycondensate is cured in a process in which the temperature of the hydrolyzate/polycondensate rises up to its cure temperature during drying process. Accordingly, the hydrolyzate/polycondensate will be liquid hydrolyzate/polycondensate containing no solvent. Then, the process (second drying process) in which the hydrolyzate/polycondensate is cured by drying at a temperature (that is, the cure temperature) equal to or above the boiling point of the solvent will be performed. Therefore, if a solvent whose boiling point is equal to or below the cure temperature of hydrolyzate/polycondensate is used, the above first drying process and second drying process will be performed without even intending to perform both processes. Consequently, it is preferable to use a solvent whose boiling point is equal to or below the cure temperature, preferably below the cure temperature of hydrolyzate/polycondensate because quality of semiconductor light-emitting device members will not be significantly affected even if hydrolyzate/polycondensate contains a solvent when performing the drying process.

[I-2-5. Manufacturing a Hard Semiconductor Light-Emitting Device Member]

Meanwhile, if the first semiconductor light-emitting device member in the present invention should not have elastomer properties, that is, if so-called hard semiconductor light-emitting device members should be manufactured, a method is similar to the method above described in that hydrolysis and polycondensation of the compounds represented by the general formulas (1) and (2) and/or oligomers thereof are performed and then polycondensate (hydrolyzate/polycondensate) is dried, but is also different in material and operations when appropriate. The method for manufacturing such so-called hard semiconductor light-emitting device members will be described below.

[I-2-5-1. Material]

The same material as that used for manufacturing elastomer-like semiconductor light-emitting device members can be used for manufacturing hard semiconductor light-emitting device members. However, if the compounds (1) is used as material and semiconductor light-emitting device members to be manufactured should be made harder, it is preferable to increase the ratio of trifunctional and higher compounds (1) (that is, trifunctional and tetrafunctional compounds (1)) to bifunctional compounds (1) as material. This is because trifunctional and higher compounds can become crosslinking components and, by increasing the ratio of trifunctional and higher compounds, crosslinking of semiconductor light-emitting device members can be promoted.

Here, when a tetrafunctional or higher compound is used as a crosslinking agent, it is preferable to adjust the degree of crosslinking in a whole system by increasing the ratio of usage of bifunctional compounds when compared with a case in which a trifunctional compound is used. When an oligomer of the compounds (1) is used, an oligomer of bifunctional compounds only, that of trifunctional compounds only, that of tetrafunctional compounds only, and that having a plurality of units exist. If the ratio of trifunctional and higher monomer units to bifunctional monomer units increases in overall final semiconductor light-emitting device members, hard semiconductor light-emitting device members can be obtained in the same manner as above.

When the compounds (2) are used, a basic way of thinking is the same as when the above compounds (1) are used. However, if the molecular weight of an organic portion of the compounds (2) is large, flexibility tends to increase when compared with a case of smaller molecular weight because a distance between crosslinking points substantially increases.

As described above, semiconductor light-emitting device members whose full width at half maximum of peak of solid Si-NMR is within the range of the present invention can obtain useful and suitable flexibility by controlling the ratio of bifunctional monomer units and trifunctional and higher monomer units to adjust the degree of crosslinking and to reduce stress distortion.

[I-2-5-2. Operation]

The hydrolysis and polycondensation process is performed for manufacturing hard semiconductor light-emitting device members in the same manner as when elastomer-like semiconductor light-emitting device members are manufactured. However, when manufacturing hard semiconductor light-emitting device members, hydrolysis and polycondensation reaction occurs preferably in the presence of a solvent.

The drying process is also performed when hard semiconductor light-emitting device members are manufactured. However, when manufacturing hard semiconductor light-emitting device members, it is preferable to separate the drying process into the first drying process for substantially removing the solvent at a temperature equal to or below the boiling point of the solvent and the second drying process for drying at a temperature equal to or above the boiling point of the solvent. Details of the first drying process are the same as those when elastomer-like semiconductor light-emitting device members are manufactured except that products obtained from the first drying process are usually a viscous liquid or soft film due to hydrogen bonds and hydrolyzate/polycondensate after removing the solvent exists as a liquid. Details of the second drying process are the same as those when elastomer-like semiconductor light-emitting device members are manufactured.

Meanwhile, when hard semiconductor light-emitting device members are manufactured, the solvent distillation process for manufacturing elastomer-like semiconductor light-emitting device members is not usually performed.

By separating the process for solvent removal (first drying process) and the curing process (second drying process) clearly, as described above, even if hard semiconductor light-emitting device members are manufactured, semiconductor light-emitting device members having physical properties of the first semiconductor light-emitting device member in the present invention and superior in light resistance and heat resistance can be produced without causing cracks and peeling.

[I-2-6. Others]

After the above drying process, various types of additional treatment may be performed on the resultant semiconductor light-emitting device members if necessary. Types of additional treatment include surface treatment to improve adhesion to mold portions, preparation of antireflection coating, and preparation of a fine uneven surface to improve efficiency of extracting light.

[II. Second Semiconductor Light-Emitting Device Member]

[II-1. Configuration of a Second Semiconductor Light-Emitting Device Member]

A second semiconductor light-emitting device member in the present invention has features (5), (2), and (6) shown below:

(5) In a solid Si-nuclear magnetic resonance spectrum,
 (iii) the semiconductor light-emitting device member comprises a plurality of peaks whose peak top position is in an area of the chemical shift of −80 ppm or more, and
 (iv) the molar ratio of silicon corresponding to $D^2$ cyclic compound in trimers and tetramers to a total of silicon is 5% or more and 30% or less.
(2) Silicon content is 20 weight % or more.
(6) The weight loss rate when 150° C. and a degree of vacuum 6.0 Pa are reached is 3% or less.

First, these features (5), (2), and (6) will be described below.

[II-1-1. Solid Si-NMK Spectrum]

Number of peaks in an area of the chemical shift of −80 ppm or more

The second semiconductor light-emitting device member in the present invention comprises a plurality of peaks whose peak top position is in an area of the chemical shift of −80 ppm or more (feature (iii)).

As already described in a description of the first semiconductor light-emitting device member, a compound having silicon as its main component is represented by the rational formula of $SiO_2 \cdot nH_2O$ and has a structure in which an oxygen atom O is bound to each vertex of a tetrahedron of a silicon atom Si and further a silicon atom Si is bound to each of these oxygen atoms O to spread like a network. Schematic views shown below represent a network structure of Si—O without showing the above tetrahedron structure and part of oxygen atoms O is substituted by other components (for example, —H and —$CH_3$) in a repetitive unit of Si—O—Si—O—. If focused on one silicon atom Si, there is a silicon atom Si ($Q^4$) having four —OSi as shown in the schematic view (A), a silicon atom Si ($Q^3$) having three —OSi as shown in the schematic view (B) and the like. Then, in solid Si-NMR measurement, peaks based on each of the above silicon atoms Si are in order called a $Q^4$ peak, $Q^3$ peak, . . .

[Chemical Formula 6]

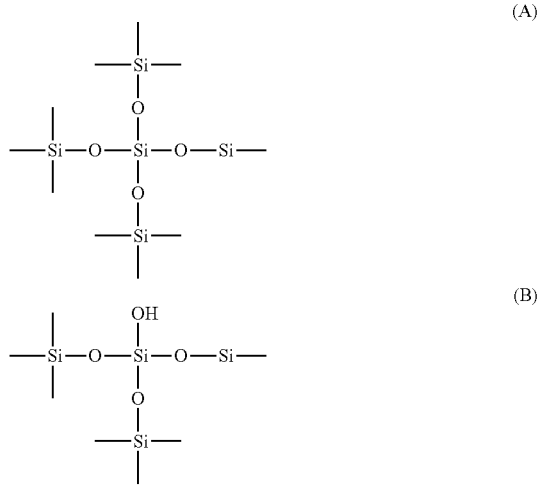

A silicon atom with these four bound oxygen atoms is generically called a Q site. In the present invention, as already mentioned in a description of the first semiconductor light-emitting device member in the present invention, each peak of $Q^0$ to $Q^4$ originating from a Q site will be called a $Q''$ peak group. A $Q''$ peak group of a silica membrane containing no organic substituent is usually observed as a continuous polymodal peak in an area of the chemical shift of −80 to −130 ppm.

In contrast, a silicon atom having three bound oxygen atoms and one other bound atom (normally a carbon atom) is generically called a T site. Like a peak originating from a Q site, a peak originating from a T site is observed as each peak of $T^0$ to $T^3$. In the present invention, as already mentioned in a description of the first semiconductor light-emitting device member in the present invention, each peak originating from a T site will be called a $T''$ peak group. A $T''$ peak group is generally observed as a continuous polymodal peak in an area on a higher magnetic field side (usually the chemical shift of −80 to −40 ppm) than a $Q''$ peak group.

Further, a silicon atom with two bound oxygen atoms and two other bound atoms (normally carbon atoms) is generically called a D site. Like a peak group originating from a Q site or T site, a peak originating from a D site is observed as each peak ($D''$ peak group) of $D^0$ to $D''$ in a still higher magnetic field area (usually an area of the chemical shift of 0 to −40 ppm) than a $Q''$ and $T''$ peak groups to be observed as a polymodal peak curve. Similarly, a silicon atom with one bound oxygen atom and three other bound atoms (normally carbon atoms) is generically called an M site and is observed as a polymodal peak curve in a highest magnetic field area (usually the chemical shift of 0 to 30 ppm). Each peak group of $M''$, $D''$, $T''$, and $Q''$ has an area proportional to a molar ratio of silicon atoms placed in an environment corresponding to each peak group and therefore, if the area of all peaks is set to a molar quantity of all silicon atoms, a total area of the $M''$ peak group, $D''$ peak group, and $T''$ peak group will usually correspond to a molar quantity of all silicon atoms directly bound to corresponding carbon atoms.

If the solid Si-NMR spectrum of the second semiconductor light-emitting device member in the present invention is measured, the $M''$ peak group, $D''$ peak group, and $T''$ peak group originating from silicon atoms directly bound to carbon atoms of an organic group and the $Q''$ peak group originating from silicon atoms not bound to carbon atoms of the organic group each appear in different areas. Among these peaks, peaks of less than −80 ppm correspond to the $Q''$ peak, as described above, and peaks of −80 ppm or more correspond to the $M''$, $D''$, and $T''$ peaks. Though the $Q''$ peak is not essential for the second semiconductor light-emitting device member in the present invention, a plurality of peaks are observed in the $M''$, $D''$, and $T''$ peak areas.

The value of chemical shift for the semiconductor light-emitting device member can be calculated, for example, based on a measurement result of solid Si-NMR measurement made according to a method described below in a description of examples. Also, measured data is analyzed (peak resolution) by a method in which each peak is divided and extracted by waveform separation analysis or the like utilizing, for example, the Gauss function or Lorentz function.

Features relating to the molar ratio of silicon corresponding to $D^2$ cyclic compound in trimers and tetramers to a total of silicon:

The second semiconductor light-emitting device member in the present invention is also characterized in that the molar ratio of silicon corresponding to $D^2$ cyclic compound in trimers and tetramers to a total of silicon is 5% or more and 30% or less (feature (iv)).

Here, "$D^2$" represents silicon atoms polymerized linearly by siloxane crosslinking (that is, two —OSi are bound) among silicon atoms of bifunctional silane showing a $D''$ peak group in the Si-nuclear magnetic resonance spectrum. A $D^2$ cyclic compound is a cyclic polymer of bifunctional silane, has no reactive ends, in contrast to straight-chain polymers, and has properties like low-polarity silicon oil. Each $D^2$ peak of three-membered rings and four-membered rings is usually clearly separated from straight-chain $D^2$ peaks in the Si-nuclear magnetic resonance spectrum, but $D^2$ peaks of five-membered rings or higher are difficult to separate from straight-chain $D^2$ peaks. For the second semiconductor light-emitting device member in the present invention, particularly three-membered rings and four-membered rings whose miscibility with hydrolyzing liquid and cured solid bodies are high are important.

The $D^2$ cyclic compound has no reactive ends and are chemically stable and superior in heat resistance and light resistance because of a structure of siloxane bonds. The $D^2$ cyclic compound acts as oil like a plasticizer in a glass body made by the sol gel method to give flexibility to resultant glass. If low-molecular-weight cyclic compound has the same organic group as that introduced into a glass body to adjust the degree of crosslinking and a high degree of miscibility with the glass body and are within a range of solubility, an extremely transparent and uniform glass body is provided. If a glass body is obtained by performing hydrolysis/polymerization of alkoxilane, volume reduction occurs and cracks are more likely to appear due to dehydration/dealcoholization condensation and solvent evaporation, but the $D^2$ cyclic compound also act as inert/nonvolatile oil to reduce the shrinkage factor and relieve internal stress. Such action as a plasticizer can also be developed by using ordinary organic high-boiling oil components, but there have also been problems as follows: since materials used as a plasticizer of ordinary paints and plastics have high molecular weight and viscosity, diffusion of low-boiling alcohol generated from alkoxysilane in thick-film coating is inhibited, causing foaming when heated, insufficient heat resistance and UV resistance, absorption of luminous wavelengths of a semiconductor light-emitting device, and difficulty of forming a uniform and transparent hybrid body composed mainly of inorganic glass.

The $D^2$ cyclic compound may be formed by hydrolysis/polymerization reaction when manufacturing semiconductor light-emitting device members or added from outside. The amount of $D^2$ cyclic compound contained in the second semiconductor light-emitting device member in the present invention exceeds a range of $D^2$ cyclic compound amount contained in semiconductor light-emitting device members known by the sol gel method. For example, the technology described in the above Patent Document 1 and Patent Document 2 uses tetrafunctional silane only and does not contain any $D^2$ cyclic compound. Also, the technology described in the above Patent Document 3 does not contain any description of $D^2$ cyclic compound and it is not known if it is possible to cause an appropriate amount of $D^2$ cyclic compound to be contained, control flexibility of a resultant semiconductor light-emitting device member, and control transparency and resistance to cracks of the resultant member.

Content of $D^2$ cyclic compound in trimers and tetramers contained in the second semiconductor light-emitting device member in the present invention is, when expressed as a ratio of silicon atoms originating from $D^2$ cyclic compound in trimers and tetramers to a total of silicon atoms in a system, is in the range of usually 5% or more, preferably 7% or more, and particularly preferably 10% or more, and usually 30% or less, preferably 25% or less, and particularly preferably 20% or less. If the content of $D^2$ cyclic compound in trimers and tetramers exceeds this range, phase separation occurs inside the semiconductor light-emitting device member, making the member opaque and $D^2$ cyclic compound more likely to volatilize. If the content of $D^2$ cyclic compound in trimers and tetramers falls below this range, on the other hand, flexibility and resistance to cracks are hard to develop.

The degree of polymerization of $D^2$ cyclic compound contained in the second semiconductor light-emitting device member in the present invention is in the range of usually trimers or higher, and decamers or lower, preferably pentamers or lower, and particularly preferably tertamers or lower. If the degree of polymerization exceeds this range, like silicone oil whose solubility to general solvents is low, miscibility with hydrolyzate/polymers and diluted solvents lowers so that coating liquid may be separated into layers or transparency may be lower. If the degree of polymerization falls below this range, no cyclic compound can be formed. If only tetramers or lower components are contained in $D^2$ cyclic compound, the amount of cyclic compound can be determined by measuring the solid-nuclear magnetic resonance spectrum. If pentamers or higher components are contained, the amount of cyclic compound can be determined by, for example, gas chromatography or GPC (Gel Permeation Chromatography).

Further, functional groups held by $D^2$ cyclic compound may be the same as or different from those held by coupling agents of constituent material of semiconductor light-emitting device members, but it is preferable to select the same or similar functional groups because miscibility between $D^2$ cyclic compound and a glass body including the $D^2$ cyclic compound improves accordingly.

Features relating to the weight loss rate (ratio of a volatilization amount of $D^2$ cyclic compound) during vacuum degassing:

In this connection, the second semiconductor light-emitting device member in the present invention is characterized in that the weight loss rate when vacuum degassing is performed after a sample is made to have constant weight (moisture drying) at 150° C. under normal pressure is usually 3% or less, preferably 2% or less, and particularly preferably 1% or less when 6.0 Pa is reached compared with a case in which 150° C. and the normal pressure are maintained (feature (6)). This weight loss rate can be considered to be a value corresponding to the above ratio of the volatilization amount of $D^2$ cyclic compound.

Silicone resin, for example, is known as a semiconductor light-emitting device member containing $D^2$ cyclic compound. However, since the silicone resin generally has few crosslinking points and an extremely coarse network structure, if a small amount of low-molecular-weight $D^2$ cyclic compound having volatility is contained, the $D^2$ cyclic compound gradually volatilizes at a higher temperature or over time and vaporizes out of the semiconductor light-emitting device. If a micro relay, micro switch, or micro motor is sealed up or half sealed and silicone resin containing $D^2$ cyclic compound exists within the same space, a phenomenon is known to occur in which components vaporizing from the silicone resin is changed to an insulator by electric energy at contact points thereof, causing poor conduction. Therefore, when using silicone resin in such an environment, the content of $D^2$ cyclic compound is limited to a reduced level and, in this case, permissible concentration in resin is at most 1%.

In contrast, the second semiconductor light-emitting device member in the present invention has a high degree of crosslinking and solid structure and therefore, $D^2$ cyclic compound is hard to vaporize and the second semiconductor light-emitting device member can usefully be utilized as a plasticizer without causing poor conduction when installed even if $D^2$ cyclic compound is contained.

[II-1-2. Silicon Content]

Like the first semiconductor light-emitting device member in the present invention, the second semiconductor light-emitting device member in the present invention also satisfies the feature (2).

That is, the second semiconductor light-emitting device member in the present invention must have the silicon content of 20 weight % or more (feature (2)). The basic skeleton of conventional semiconductor light-emitting device members is an organic resin such as an epoxy resin with carbon-carbon and carbon-oxygen bonds as a basic skeleton. In contrast, the basic skeleton of the second semiconductor light-emitting device member in the present invention is an inorganic siloxane bond like glass (silicate glass). As is evident from a chemical bond comparison table in Table 2 shown below, the siloxane bond has the following superior features as a semiconductor light-emitting device member.

(I) Light resistance is superior with large bond energy and properties resistant to pyrolysis and photolysis.

(II) Electrically polarized slightly.

(III) The chain structure has a high degree of freedom so that highly flexible structures can be formed and are freely rotatable around a siloxane chain.

(IV) Highlyoxidized so that further oxidization is impossible.

(V) Rich in electrical insulating properties.

TABLE 2

Chemical bond comparison table

| Bond | Bond distance (Å) | Bond energy (kcal/mol) | Bond angle (°) |
|---|---|---|---|
| Si—O—Si | 1.64 | 108 | 130 to 160 |
| C—O—C | 1.43 | 86 | 110 |
| C—C—C | 1.54 | 85 | 109 |

From these features, it is understood that a silicone semiconductor light-emitting device member formed by a skeleton in which the siloxane bond is formed three-dimensionally with a high degree of crosslinking can become a protective film, in contrast to a conventional resin silicone semiconductor light-emitting device member such as an epoxy resin, that is similar to minerals such as glass and rock and rich in heat resistance and light resistance. Particularly, a silicone semiconductor light-emitting device member with a methyl group as a substituent is superior in heat resistance because the silicone semiconductor light-emitting device member does not have an absorption region in an ultraviolet region and resists photolysis.

The silicon content of the second semiconductor light-emitting device member in the present invention is 20 weight % or more, as described above, but among others 25 weight % or more is preferable and 30 weight % or more is still preferable. On the other hand, an upper limit is usually set to 47 weight % due to a fact that the silicon content of glass consisting entirely of $SiO_2$ is 47 weight %.

The silicon content of a semiconductor light-emitting device member can be calculated from an analysis result after performing inductively coupled plasma spectrometry (hereinafter abbreviated as "ICP") analysis using, for example, a method described later in a description of examples.

[II-1-3. Reasons why Advantages of the Present Invention Are Obtained from the Above Features (5), (2), and (6)]

Since the second semiconductor light-emitting device member in the present invention is provided with the above features (5), (2), and (6), a cured body that is cured closely without causing cracks even in thick film portions, is superior in adhesion with a case and chip sealing characteristics, and also superior in light/heat resistance after curing can be obtained. A reason therefor has not been clarified, but is assumed to be as follows.

A semiconductor light-emitting device member can be obtained from inorganic glass either by a melt process in which low-melting glass is melted and then sealed or the sol gel method in which a liquid obtained by performing hydrolysis and polycondensation of alkoxysilane or the like at a relatively low temperature is applied and then dried/cured. Only the $Q''$ peak is mainly observed from members obtained by the melt process, but this method is not practical because a high temperature of 350° C. or more is required for melting, leading to thermal degradation of the semiconductor light-emitting device.

A hydrolysis and polycondensation product obtained from a tetrafunctional silane compound by the sol gel method, on the other hand, becomes totally inorganic glass and is significantly superior in heat resistance and weather resistance, but a cure reaction is accompanied by weight loss and volume reduction for a portion of dehydration because crosslinking proceeds due to a condensation (dehydration/dealcoholization) reaction of silanol. Thus, if only tetrafunctional silane having the $Q''$ peak is selected as a material, the degree of shrinkage on curing becomes too large and cracks are made more likely to appear in coating, making it impossible to form a thick film. Attempts to increase film thickness have been made in such a system by adding inorganic particles as an aggregate or recoating, but 10 μm or so is generally a limit thickness. If sol gel glass is used as a semiconductor light-emitting device member, there has been a problem that the film thickness of 500 to 1000 μm must be secured because molding on wiring portions of complicated shape is needed. Also as described above, heating at a high temperature of 400° C. or more is needed to sufficiently reduce residual silanol to obtain totally inorganic glass, which is not practical because the semiconductor device is thermally degraded.

In contrast, in the second semiconductor light-emitting device member in the present invention, a transparent glass filmy member with the film thickness of up to 1000 μm can be obtained by introducing trifunctional silane having the $T''$ peak and/or bifunctional silane having the $D''$ peak and/or monofunctional silane having the $M''$ peak to adjust the crosslink density to make the film have flexibility and at the same time, by performing hydrolysis and polycondensation to reduce the volume resulting from dehydration condensation and the crosslink density appropriately within a range that does not affect the function, and controlling hydrolysis/condensation and drying processes. Therefore, in the second semiconductor light-emitting device member in the present invention, the $T''$ peak and/or $D''$ peak and/or $M''$ peak observed in an area of −80 ppm or more is essential.

A technology of a hard coat film for glasses and the like is known as a method of making a film thicker using bifunctional or trifunctional material as a main component, but its film thickness is at most several μm or less. Such a hard coat film is thin and thus can be cured uniformly by easily volatilizing a solvent, and differences in adhesion and linear expansion coefficient between the hard coat film and substrate have been considered as a main cause for cracks. In the second semiconductor light-emitting device member in the present invention, on the other hand, the film is thick like a paint and has itself a certain level of strength so that a small difference in linear expansion coefficient can be accommodated, but in contrast to a thin film, generation of internal stress caused by volume reduction due to solvent drying arises as a new problem. That is, when a deep container with a small opening area such as an LED cup is molded, if the deep container is heated for curing while a film deep part is not sufficiently dried up, solvent volatilization occurs after crosslinking and the volume decreases, leading to large cracks and foaming. Large internal stress is applied to such a film and measurement of solid Si-NMR of the film shows broader distribution of the siloxane bond angle of the detected $M''$, $D''$, $T''$, and $Q''$ peak groups than when the internal stress is smaller, creating a broader peak for each. This fact implies that a bond angle represented by two —OSi with respect to Si has large distortion. That is, a film having a narrower full width at half maximum of peak will be a higher-quality film in which cracks are more unlikely to appear, even though the film is made of the same material.

A phenomenon in which the full width at half maximum increases in accordance with distortion is observed more sensitively as the degree of constraint of molecular motion of Si atoms increases, and its frequencies of appearance are given by $M''<D''<T''<Q''$.

In the second semiconductor light-emitting device member in the present invention, it is preferable that the full width at half maximum of peak measured in an area of $-80$ ppm or more is smaller (narrower) than the range of a full width at half maximum of semiconductor light-emitting device members conventionally known by the sol gel method.

Summarizing in terms of chemical shifts, in the second semiconductor light-emitting device member in the present invention, the full width at half maximum of the $T''$ peak group whose peak top position is observed in an area of the chemical shift of $-80$ ppm or more and less than $-40$ ppm is preferably in the range of usually 5.0 ppm or less, among others 4.0 ppm or less, and usually 1.0 ppm or more, among others 1.5 ppm or more.

Similarly, the full width at half maximum of the $D''$ peak group whose peak top position is observed in an area of the chemical shift of $-40$ ppm or more and 0 ppm or less is generally smaller than that of the $T''$ peak group due to smaller constraints of molecular motion and is preferably in the range of usually 3.0 ppm or less, among others 2.0 ppm or less, and usually 0.5 ppm or more.

Since the $M''$ peak group whose peak top position is observed in an area of the chemical shift of 0 ppm or more and 30 ppm or less is usually at an end of a siloxane chain, constraints of molecular motion is very small and the range of variations of the full width at half maximum due to distortion is very narrow.

If the full width at half maximum of peaks observed in the above chemical shift areas is larger than the above ranges, a state in which constraints of molecular motion is large and thus distortion is large is created, leading possibly to an inferior member in heat resistance, weather resistance, and durability in which cracks are more likely to appear. When, for example, a lot of tetrafunctional silane is used or large internal stress is generated by drying rapidly in a drying process, the range of the full width at half maximum will be larger than the above ranges.

If the full width at half maximum of peaks is smaller than the above ranges, Si atoms in its environment are not involved in siloxane crosslinking and, for example, trifunctional silane remains in a non-crosslinked state, leading possibly to an member inferior in heat resistance, weather resistance, and durability to materials formed mainly of siloxane bonds.

Further, as described above, a plurality of peaks are observed in the $M''$, $D''$, and $T''$ peak areas of a solid Si-nuclear magnetic resonance spectrum in the second semiconductor light-emitting device member in the present invention. Therefore, it is desirable that the solid Si-nuclear magnetic resonance spectrum of the second semiconductor light-emitting device member in the present invention has two or more peaks selected from a group consisting of the $M''$ peak group, $D''$ peak group, and $T''$ peak group having the full width at half maximum in the above range.

Composition of the second semiconductor light-emitting device member in the present invention is limited to a case in which crosslinking in the system is mainly formed of inorganic components such as silica. That is, even if (5) in a solid Si-nuclear magnetic resonance spectrum, (iii) a semiconductor light-emitting device member comprises a plurality of peaks whose peak top position is in an area of the chemical shift of $-80$ ppm or more, and (iv) the molar ratio of silicon corresponding to $D^2$ cyclic compound to a total of silicon is 5% or more and 30% or less, and (6) the weight loss rate when 150° C. and a degree of vacuum 6.0 Pa are reached is 3% or less in the semiconductor light-emitting device member containing a small amount of Si component in a large amount of organic components, excellent heat resistance and light resistance and coating capabilities defined in a description of the second semiconductor light-emitting device member in the present invention cannot be obtained. Therefore, like the above feature (2), the silicon content is required to be at least the predetermined value (20 weight %). A semiconductor light-emitting device member having silicon content of 20 weight % or more as defined in the description of the second semiconductor light-emitting device member in the present invention contains $SiO_2$ of 43 weight % or more in terms of silica ($SiO_2$).

[II-1-4. Light Transmittance]

The second semiconductor light-emitting device member in the present invention preferably has light transmittance of usually 80% or more, among others 85% or more, and further 90% or more on a luminous wavelength of a semiconductor light-emitting device with the film thickness of 0.5 mm. Efficiency of extracting light of the semiconductor light-emitting device has been enhanced by various technologies, but if transparency of a translucent member for sealing a chip or holding a phosphor is low, luminance of a semiconductor light-emitting device using the translucent member will be reduced, making it difficult to produce a high-intensity semiconductor light-emitting device product.

Here, a "luminous wavelength of a semiconductor light-emitting device" varies depending on the type of semiconductor light-emitting device and generally refers to wavelengths in the range of usually 300 nm or more, preferably 350 nm or more, and usually 900 nm or less, preferably 500 nm or less. If light transmittance is low for wavelengths in this range, the semiconductor light-emitting device member absorbs light and efficiency of extracting light decreases, making it impossible to produce a high-intensity device. Further, low light transmittance is not preferred because energy for reduced efficiency in extracting light is converted into heat, leading to thermal degradation.

Sealing members tend to degrade due to light in the near ultraviolet to blue regions (350 nm to 500 nm) and thus, the second semiconductor light-emitting device member in the present invention, which is superior in durability, is preferably used for a semiconductor light-emitting device having the luminous wavelengths in this region because its effect will be increased.

Light transmittance of a semiconductor light-emitting device member can be measured by an ultraviolet spectrophotometer using a sample of singly cured film with a smooth surface formed into a film thickness of 0.5 mm by, for example, a technique described in a description of examples.

The shape of semiconductor device is diverse and a large majority of semiconductor devices are used in a thick-film state exceeding 0.1 mm, but there are also uses of a thin film when, for example, a thin-film phosphor layer (for example, a layer of several μm in thickness including nanometer phosphor particles and fluorescent ions) is provided at a position apart from an LED chip (luminous element) and a high refractive index light extracting film is provided on a thin film right above an LED chip. In such a case, transmittance is preferably 80% or more with the film thickness. In such forms of using a thin film, the second semiconductor light-emitting device member in the present invention also shows superior light resistance and heat resistance and is superior in sealing properties so that a thin film can steadily be formed without cracks.

[II-1-5. Others]

In addition to the above characteristics, the second semiconductor light-emitting device member in the present invention preferably has characteristics described below.

For example, like the first semiconductor light-emitting device member in the present invention, it is preferable that the second semiconductor light-emitting device member in the present invention satisfies the feature (3). That is, the second semiconductor light-emitting device member in the present invention has the silanol content in the range of usually 0.1 weight % or more and, among others, 0.5 weight % or more, and usually 10 weight % or less and, among others, 8 weight % or less, and further 5 weight % or less (feature (3)).

A glass body produced by the sol gel method from alkoxysilane as a material usually does not completely polymerize to become an oxide under mild curing conditions of 150° C. and about three hours, and a certain amount of silanol remains. A glass body obtained exclusively from tetraalkoxysilane has high hardness and high light resistance, but a large amount of silanol remains because a molecular chain has a low degree of freedom due to a high degree of crosslinking and thus no complete condensation occurs. Also, when a hydrolyzed/condensed liquid is dried/cured, thickening is swift due to a large number of crosslinking points and drying and curing proceed simultaneously, resulting in a bulk body with large distortion. If such a member is used as a semiconductor light-emitting device member, new internal stress arises due to condensation of residual silanol when the member is used for a long period of time, making a malfunction such as cracks, peeling, and breaking of wire more likely to occur. Also, more silanol is found in a fracture surface of the member and moisture infiltration is likely to result because, though moisture permeability is low, surface hygroscopicity is high. The silanol content can be reduced by high-temperature burning at 400° C. or higher, but this is not practical because the heat-resistant temperature of most semiconductor light-emitting devices is 260° C. or lower.

The second semiconductor light-emitting device member in the present invention, on the other hand, varies little over time due to low silanol content, is superior in long-term stability in capability, and has superior properties low in both hygroscopicity and moisture permeability. However, if a member does not contain silanol at all, the member has poor adhesion to the semiconductor light-emitting device and therefore, the appropriate range of the silanol content described above exists for the second semiconductor light-emitting device member in the present invention.

If the second semiconductor light-emitting device member in the present invention contains an appropriate amount of silanol, silanol is bound to a polar portion existing on the device surface through hydrogen bond so that adhesion develops. The polar portion includes the hydroxyl group and oxygen in a metalloxane bond.

Further, the second semiconductor light-emitting device member in the present invention forms due to dehydration/condensation a covalent bond with a hydroxyl group on the device surface when heated in the presence of an appropriate catalyst, allowing development of still firmer adhesion.

If there is too much silanol, on the other hand, adhesion increases in the system to make coating difficult and, with increased activity, when cured before light-boiling components volatilize by heating, foaming and internal stress increase, possibly causing cracks.

The silanol content of a semiconductor light-emitting device member can be calculated by making solid Si-NMR spectrum measurement using, for example, a method described later in a description of examples, determining the ratio (%) of silicon atoms in silanol to all silicon atoms from the ratio of peak areas originating from silanol to all peak areas, and comparing with a silicon content analyzed separately.

Also, the second semiconductor light-emitting device member in the present invention can be coated like a thick film and is superior not only in transparency, but also in sealing properties, heat resistance, and UV resistance, and thus can be applied as a semiconductor light-emitting device member in various forms. Particularly, the second semiconductor light-emitting device member can be used for semiconductor light-emitting devices whose luminous wavelength is in the blue to ultraviolet region as a useful member with less degradation.

[II-2. Manufacturing Method of Semiconductor Light-Emitting Device Members]

The method of manufacturing the second semiconductor light-emitting device member in the present invention is not particularly limited and the second semiconductor light-emitting device member can be produced, for example, by performing hydrolysis and polycondensation of compounds represented by the general formula (1) and general formula (2) and/or their oligomers and drying polycondensate. The manufacturing method (called "manufacturing method of the second semiconductor light-emitting device member in the present invention" when appropriate) will be described below in detail.

[II-2-1. Material]

Compounds (hereinafter called "compounds (1)" in a description of the second semiconductor light-emitting device member in the present invention when appropriate) represented by the general formula (1) shown below and/or their oligomers will be used as a material.

[Chemical Formula 7]

$$M^{m+}X_n Y^1_{m-n} \quad (1)$$

In the general formula (1), M represents at least one element selected from a group consisting of silicon, aluminum, zirconium, and titanium. Among others, silicon is preferable.

In the general formula (1), m represents a valence of M and is an integer of 1 or greater and 4 or smaller. "m+" indicates that it is a positive valence.

n represents the number of X groups and is an integer of 1 or greater and 4 or smaller. However, m≥n holds.

In the general formula (1), X is a hydrolyzable group that generates a highly reactive hydroxyl group after being hydrolyzed by water in a solution or moisture in the air, and any known one can arbitrarily be used. For example, a low-grade alkoxy group of C1 to C5, acetoxy group, butanoxy group, and Cl— group can be cited. Here, an expression Ci (i is an integer) indicates that the number of carbon atoms is i. Furthermore, one hydrolyzable group may be used alone or two or more hydrolyzable groups may be used together in any combination at any ratio.

Among others, since components liberated after reaction are neutral, the low-grade alkoxy group of C1 to C5 is preferable. Particularly, a methoxy group or ethoxy group is preferable because these groups are highly reactive and a liberated solvent is lightly boiling.

Further, if X is an acetoxy group or Cl— group in the general formula (1), it is preferable to add a process to remove acid components when used as a semiconductor light-emitting device member for which insulating properties are needed because acetic acid or hydrochloric acid is liberated after hydrolysis reaction.

In the general formula (1), any known monovalent organic group of the so-called silane coupling agent can optionally be selected for $Y^1$ and used. Among others, organic groups particularly useful as $Y^1$ in the general formula (1) for the manufacturing method of the second semiconductor light-emitting device member in the present invention are those selected from a group (group of useful organic groups) represented by $Y^0$ below. Further, other organic groups may also be selected in order to improve affinity and adhesion with other materials constituting a semiconductor light-emitting device and adjust the refractive index of a semiconductor light-emitting device member when appropriate.

<Group of Useful Organic Groups $Y^0$>

$Y^0$: Monovalent or higher organic groups derived from aliphatic compounds, alicyclic compounds, aromatic compounds, and aliphatic-aromatic compounds.

The number of carbon atoms of organic groups belonging to the group $Y^0$ is usually 1 or more, and usually 1000 or less, preferably 500 or less, still preferably 100 or less, and further still preferably 50 or less.

Further, at least part of hydrogen atoms in the organic groups belonging to the group $Y^0$ may be substituted by atoms and/or substituents such as organic functional groups exemplified below. At this time, a plurality of hydrogen atoms in an organic group belonging to the group $Y^0$ may be substituted by the following substituents and, in this case, one substituent or a combination of two or more substituents may be selected for substitution.

Examples of substituents that can be substituted for hydrogen atoms in the organic groups belonging to the group $Y^0$ include atoms such as F, Cl, Br, and I, and organic functional groups such as the vinyl group, methacryloxy group, acryloxy group, styryl group, mercapto group, epoxy group, epoxy dicyclohexyl group, glycidoxy group, amino group, cyano group, nitro group, sulfonic acid group, carboxy group, hydroxy group, acyl group, alkoxy group, imino group, and phenyl group.

In all the cases described above, at least part of hydrogen atoms in the organic functional groups among substituents that can be substituted for hydrogen atoms in the organic groups belonging to the group $Y^0$ may be substituted by halogen atoms such as F, Cl, Br, and I.

However, among the substituents exemplified as substitutable for hydrogen in the organic groups belonging to the group $Y^0$, the organic functional groups are examples of substituents which can be introduced easily and organic functional groups having various physicochemical functionalities may be introduced in accordance with purposes of use.

Organic groups belonging to the group $Y^0$ may also have therein various atoms such as O, N, and S or atomic groups as connecting groups.

Various groups can be selected from the organic groups belonging to the above group of useful organic groups $Y^0$ as $Y^1$ in the general formula (1) in accordance with purposes, but in terms of superiority in UV resistance and heat resistance, it is preferable to select principally from the methyl group.

Concrete examples of the above compounds (1) when M is silicon include dimethyldimethoxysilane, dimethyldiethoxysilane, diphenyldimethoxysilane, diphenyldiethoxysilane, vinyl trimethoxysilane, vinyl triethoxysilane, vinyl triacethoxysilane, γ-aminopropyl trimethoxysilane, γ-glycidoxypropyl trimethoxysilane, γ-glycidoxypropyltriethoxysilane, β-(3,4-epoxy cyclohexyl)ethyltrimethoxysilane, γ-(3,4-epoxy cyclohexyl)ethyltriethoxysilane, γ-(meth) acryloxypropyl trimethoxysilane, phenyl trimethoxysilane, phenyl triacethoxysilane, γ-mercaptopropyl trimethoxysilane, γ-chloropropyl trimethoxysilane, β-cyanoethyl, triethoxysilane, methyltrimethoxysilane, methyltriethoxysilane, methyltripropoxysilane, methyltributoxysilane, ethyltrimethoxysilane, ethyltriethoxysilane, tetramethoxysilane, tetraethoxysilane, tetrapropoxysilane, tetrabutoxysilane, dimethyldichlorosilane, diphenyldichlorosilane, methylphenyl dimethoxysilane, trimethylmethoxysilane, trimethylethoxysilane, trimethylchlorosilane, methyltrichlorosilane, γ-aminopropyl triethoxysilane, 4-aminobutyl triethoxysilane, p-aminophenyl trimethoxysilane, N-(2-aminoethyl)-3-aminopropyl trimethoxysilane, aminoethyl aminomethylphenethyl trimethoxysilane, 3-glycidoxypropyl trimethoxysilane, 2-(3,4-epoxy cyclohexyl)ethyltrimethoxysilane, 3-aminopropyl trimethoxysilane, 3-aminopropyl triethoxysilane, 4-aminobutyl triethoxysilane, N-(6-aminohexyl)aminopropyl trimethoxysilane, 3-chloropropyl trimethoxysilane, 3-chloropropyltrichlorosilane, (p-chloromethyl)phenyltrimethoxysilane, 4-chlorophenyl trimethoxysilane, 3-methacryloxypropyl trimethoxysilane, 3-methacryloxypropyl triethoxysilane, 3-acryloxypropyl trimethoxysilane, styrylethyl trimethoxysilane, 3-mercaptopropyl trimethoxysilane, vinyl trichlorosilane, vinyl tris (2-methoxyethoxy) silane, and trifluoropropyl trimethoxysilane.

Concrete examples of the compounds (1) when M is aluminum include aluminum triisopropoxide, aluminum tri-n-butoxide, aluminum tri-t-butoxide, and aluminum triethoxide.

Concrete examples of the compounds (1) when M is zirconium include zirconium tetramethoxide, zirconium tetraethoxide, zirconium tetra-n-propoxide, zirconium tetra-i-propoxide, zirconium tetra-n-butoxide, zirconium tetra-i-butoxide, zirconium tetra-t-butoxide, and zirconium dimethacrylate dibutoxide.

Concrete examples of the compounds (1) when M is titanium include titanium tetraisopropoxide, titanium tetra-n-butoxide, titanium tetra-i-butoxide, titanium methacrylate triisopropoxide, titanium tetramethoxypropoxide, titanium tetra-n-propoxide, and titanium tetraethoxide.

However, these compounds exemplified above are only part of coupling agents easily available on the market and more details can be shown, for example, by a list of coupling agents and related products in Chapter 9 of "Technology of Optimum Usage of Coupling Agents" issued by Institute for Science and Technology. Naturally, however, coupling agents that can be used for the manufacturing method of the second semiconductor light-emitting device member in the present invention are not limited by these exemplified coupling agents.

Compounds (hereinafter called "compounds (2)" in a description of the second semiconductor light-emitting device member in the present invention when appropriate) represented by the general formula (2) and/or their oligomers can also be used in the same manner as the above compounds (1).

[Chemical Formula 8]

$$(M^{s+}X_tY^1_{s-t-1})_uY^2 \qquad (2)$$

In the general formula (2), M, X, and $Y^1$ each independently represent the same things as those in the general formula (1). Particularly for $Y^1$, just as in the case of the general formula (1), various groups can be selected from the organic groups belonging to the above group of useful organic groups $Y^0$ in accordance with purposes, but in terms of superiority in UV resistance and heat resistance, it is preferable to select principally from the methyl group.

In the general formula (2), s represents the valence of M and is an integer of 2 or greater and 4 or smaller. "s+" indicates that it is a positive integer.

Further, in the general formula (2), $Y^2$ represents a u-valent organic group. u represents an integer of 2 or greater. Therefore, any bivalent or higher organic group can arbitrarily be selected from organic groups known as organic groups of the so-called silane coupling agent for $Y^2$ in the general formula (2) and used.

Also, in the general formula (2), t represents an integer of 1 or greater and s−1 or smaller, where t≤s.

Examples of the above compounds (2) include various organic polymers and oligomers to which a plurality of hydrolytic silyl groups are bound as side chains and molecules to which hydrolytic silyl groups are bound to a plurality of ends of the molecules.

Concrete examples of the above compounds (2) and their product names are listed below:

Bis(triethoxysilylpropyl) tetrasulfide (Manufactured by Shin-Etsu Chemical Co., Ltd., KBE-846)
2-diethoxymethyl ethylsilyldimethyl-2-furanylsilane (Manufactured by Shin-Etsu Chemical Co., Ltd., LS-7740)
N,N'-bis[3-(trimethoxysilyl) propyl]ethylenediamine (Manufactured by Chisso Corporation, Sila-Ace XS1003)
N-glycidyl-N,N-bis[3-(methyldimethoxysilyl) propyl] amine (Manufactured by Toshiba Silicones Co., Ltd., TSL8227)
N-glycidyl-N,N-bis[3-(trimethoxysilyl) propyl]amine (Manufactured by Toshiba Silicones Co., Ltd., TSL8228)
N,N-bis[(methyldimethoxysilyl) propyl]amine (Manufactured by Toshiba Silicones Co., Ltd., TSL8206)
N,N-bis[3-(methyldimethoxysilyl) propyl]ethylenediamine (Manufactured by Toshiba Silicones Co., Ltd., TSL8212)
N,N-bis[(methyldimethoxysilyl) propyl]methacrylamide (Manufactured by Toshiba Silicones Co., Ltd., TSL8213)
N,N-bis[3-(trimethoxysilyl) propyl]amine (Manufactured by Toshiba Silicones Co., Ltd., TSL8208)
N,N-bis[3-(trimethoxysilyl) propyl]ethylenediamine (Manufactured by Toshiba Silicones Co., Ltd., TSL8214)
N,N-bis[3-(trimethoxysilyl) propyl]methacrylamide (Manufactured by Toshiba Silicones Co., Ltd., TSL8215)
N,N',N"-tris[3-(trimethoxysilyl) propyl] isocyanurate (Manufactured by Hydrus Chemical Inc., 12267-1)
1,4-bishydroxydimethylsilylbenzene (Manufactured by Shin-Etsu Chemical Co., Ltd., LS-7325)

Only one of the compounds (1) and compounds (2) may be used as a material, but it is also allowed to mix two or more compounds in any combination or composition. Also, as described above, oligomers of the compounds (1) and compounds (2) may be used as a material. Here, if the compounds (2) and/or an oligomer thereof is used as a main material, a main chain structure in its system will consist principally of organic bonds, leading possibly to low durability. Thus, it is desirable to use a minimum amount of the compounds (2) to mainly provide functionality such as adhesion addition, refractive index adjustment, reactivity control, and inorganic particle dispersibility addition. If the compounds (1) and/or oligomers (compounds (1) derived components) thereof, and the compounds (2) and/or oligomers (compounds (2) derived components) thereof are used simultaneously, it is desirable that the ratio of usage of the compounds (2) derived components to the total weight of material is usually 30 weight % or less, preferably 20 weight % or less, and still preferably 10 weight % or less. However, in the manufacturing method of the second semiconductor light-emitting device member in the present invention, at least one of the compounds (1) and compounds (2) that contain silicon as M and have at least one of the organic group $Y^1$ and organic group $Y^2$ must be used as a material.

[II-2-2. Hydrolysis and Polycondensation Process]

In the manufacturing method of the second semiconductor light-emitting device member in the present invention, first the above compounds (1), compounds (2) and/or oligomers thereof are caused to undergo a hydrolysis and polycondensation reaction (hydrolysis and polycondensation process). This hydrolysis and polycondensation reaction can be caused by a known method. In a description of the second semiconductor light-emitting device member in the present invention below, the compounds (1) and compounds (2) are referred to as "material compounds" when they are not distinguished.

A theoretical amount of water used for causing the hydrolysis and polycondensation reaction of the material compounds is based on a reaction formula shown in the following formula (3) and is half the molar ratio of total amount of hydrolyzable groups in the system.

[Formula 2]

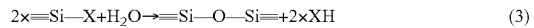

$$2x{\equiv}Si{-}X + H_2O \rightarrow {\equiv}Si{-}O{-}Si{\equiv} + 2xXH \qquad (3)$$

The above formula (3) represents a case in which M is silicon in the general formulas (1) and (2) as an example. "≡Si" and "Si≡" represent three of four dangling bonds held by a silicon atom in an abbreviated manner.

In the description of the second semiconductor light-emitting device member in the present invention, the theoretical amount of water required for the hydrolysis, that is, the amount of water corresponding to half the molar ratio of total amount of hydrolizable groups is selected as a reference (hydrolysis percentage 100%) and the amount of water used for hydrolysis is represented as a percentage to this reference value, that is, "hydrolysis percentage."

In the manufacturing method of the second semiconductor light-emitting device member in the present invention, the amount of water used for causing hydrolysis and polycondensation reaction is, when expressed as the above hydrolysis percentage, preferably in the range of usually 80% or more, among others, 100% or more. If the hydrolysis percentage is lower than this range, hydrolysis/polymerization is insufficient and thus material may volatilize during curing or hardness of cured body may be insufficient. If the hydrolysis percentage exceeds 200%, on the other hand, liberated water always remains in the system during curing, causing chips or phosphor to degrade due to moisture or causing foaming, cracks, or peeling during curing after a cup portion absorbs water. What is important in hydrolysis reaction is to perform hydrolysis and polycondensation using water of the hydrolysis percentage close to 100% or more (for example, 80% or more) and, by adding a process in which liberated water is removed before coating, the hydrolysis percentage exceeding 200% can be applied. However, in this case, using too much water may complicate a concentration process because the amount of water to be removed and that of solvent to be used as a compatibilizer increase or may reduce coating capabilities of members because polycondensation proceeds too far. Thus, it is preferable that the upper limit of the hydrolysis percentage is usually set to 500% or less, among others, 300% or less, and preferably 200% or less.

A known catalyst may be caused to exist during hydrolysis and polycondensation of material compounds to promote hydrolysis and polycondensation. In this case, organic acid such as acetic acid, propionic acid, and butyric acid, inorganic acid such as nitric acid, hydrochloric acid, phosphoric acid, and sulfuric acid, and an organometallic compound catalyst can be used as a catalyst to be used. For a member to be used for portions directly in contact with a semiconductor light-emitting device, an organometallic compound catalyst that has little effect on insulating property is preferable.

Hydrolyzate/polycondensate of the above material compounds is preferably liquid. However, if solid hydrolyzate/polycondensate can be made liquid using a solvent, such hydrolyzate/polycondensate can also be used.

If liquid separation occurs in the system during hydrolysis and polycondensation reaction to produce a non-uniform state, a solvent may be used. For example, low-grade alcohols of C1 to C3, dimethylformamide, dimethylsulfoxide, acetone, tetrahydrofuran, methylcellosolve, ethylcellosolve, methylethylketone, and any other solvents that can be mixed homogeneously with water can be used as a solvent. Among others, however, solvents that are neither highly acidic nor highly basic are preferable for reasons of not affecting hydrolysis and polycondensation adversely. One solvent may be used alone or a plurality of solvents may be used together. The amount of solvent to be used may be freely selected, but it is preferable to use a minimum amount when coated on a semiconductor light-emitting device because the solvent is removed in most cases. It is also preferable to select a solvent whose boiling point is 100° C. or lower, preferably 80° C. or lower to facilitate solvent removal. In some cases, the initial non-uniform state becomes uniform during reaction because a solvent such as alcohol is generated by hydrolysis reaction without a need for adding a solvent from outside.

Hydrolysis and polycondensation reaction of the above material compounds occurs, when carried out under normal pressure, in the range of usually 15° C. or higher, preferably 20° C. or higher, and still preferably 40° C. or higher, and usually 140° C. or lower, preferably 135° C. or lower, and still preferably 130° C. or lower. A higher temperature may also be allowed by maintaining the liquid phase under applied pressure, but it is preferable that the temperature does not exceed 150° C.

The reaction time of hydrolysis and polycondensation reaction depends on the reaction temperature, but the reaction is caused in the range of usually 0.1 hour or more, preferably 1 hour or more, and still preferably 3 hours or more, and usually 100 hours or less, preferably 20 hours or less, and still preferably 15 hours or less.

If, under the above hydrolysis and polycondensation conditions, the time is too short or the temperature is too low, hydrolysis/polymerization is insufficient, leading possibly to volatilization of material during curing or insufficient hardness of cured bodies. If, on the other hand, the time is too long or the temperature is too high, the molecular weight of polymers becomes high and the amount of silanol in the system decreases, causing poor adhesion during coating and the structure of cured bodies becomes non-uniform due to premature curing, making cracks more likely to appear. On the basis of the above tendencies, it is desirable to select appropriate conditions in accordance with desired physical property values.

After the above hydrolysis and polycondensation reaction terminates, resultant hydrolyzate/polycondensate is stored at or below room temperature before its use. However, polycondensation slowly proceeds also in the meantime and thus it is preferable that the hydrolyzate/polycondensate is usually used within 60 days of storage at room temperature after the hydrolysis and polycondensation reaction under warming terminates, preferably within 30 days, and still preferably within 15 days especially when used as a thick-film member. The above period can be prolonged if necessary by storing hydrolyzate/polycondensate in a low temperature range in which the hydrolyzate/polycondensate does not freeze.

[II-2-3. Drying]

By drying (drying process) the resultant hydrolyzate/polycondensate from the above hydrolysis and polycondensation reaction, the second semiconductor light-emitting device member in the present invention can be obtained. The hydrolyzate/polycondensate is usually liquid, as described above and, by drying the liquid hydrolyzate/polycondensate in a mold of desired shape, the second semiconductor light-emitting device member in the present invention in the desired shape can be formed. Also, by drying the hydrolyzate/polycondensate after coated on a desired region, the second semiconductor light-emitting device member in the present invention can be formed directly on the desired region. The liquid hydrolyzate/polycondensate will be called "hydrolyzed/polycondensed liquid" or "liquid for forming a semiconductor light-emitting device member" in the description of the manufacturing method of the second semiconductor light-emitting device member in the present invention when appropriate.

In the manufacturing method of the second semiconductor light-emitting device member in the present invention, it is preferable that the above hydrolysis and polycondensation reaction is caused to occur in the presence of a solvent and the drying process is divided into a first drying process in which the solvent is substantially removed at a temperature below the boiling point of the solvent and a second drying process in which hydrolyzate/polycondensate is dried at a temperature equal to or above the boiling point of the solvent. The "solvent" here includes a solvent represented like XH generated by the above hydrolysis and polycondensation reaction of material compounds represented by $M^{m+}X_nY^1_{m-n}$ and $(M^{s+}X_tY^1_{s-t-1})_uY^2$. "Drying" in manufacturing method of the second semiconductor light-emitting device member in the present invention refers to a process in which the hydrolyzate/polycondensate of the above hydrolysis and polycondensation reaction of material compounds loses the solvent and further the metalloxane bond is formed after polymerization/curing.

The first drying process substantially removes a contained solvent at a temperature below the boiling point of the solvent without actively promoting further polymerization of the hydrolyzate/polycondensate of the material compounds. That is, a product obtained from this process is a viscous liquid or soft film due to hydrogen bonds after the hydrolyzate/polycondensate before drying is concentrated. If the first drying process is performed at a temperature equal to or above the boiling point of the solvent, the resultant film is foamed by vapor of the solvent, making it difficult to produce uniform films without defects. This first drying process may be performed as a single step if evaporation of the solvent is efficient when, for example, a thin-film member is formed, but may also be performed as a plurality of steps if evaporation efficiency is low when, for example, molded on a cup. For a shape for which evaporation efficiency is extremely low, after drying/concentration is performed on a separate efficient container in advance, hydrolyzate/polycondensate may be coated while still in a fluid state before further being dried. If the evaporation efficiency is low, it is preferable to contrive to dry a whole member uniformly without taking steps to promote only surface concentration of the member such as forced air drying of a large air flow.

In the second drying process, after the solvent of the above hydrolyzate/polycondensate has substantially disappeared in the first drying process, the hydrolyzate/polycondensate is heated at a temperature equal to or above the boiling point of the solvent to form the metalloxane bonds, producing stable cured bodies. If a large amount of solvent remains in this process, the volume reduces due to solvent evaporation while crosslinking reaction proceeds and thus large internal stress is generated, leading to peeling and cracks caused by shrinkage. Since the metalloxane bond is usually formed efficiently at 100° C. or higher, the second drying process is performed preferably at 100° C. or higher, and still preferably at 120° C. or higher. However, if the hydrolyzate/polycondensate is heated together with semiconductor light-emitting devices, it is preferable to perform the drying process usually at a temperature equal to or below the heat-resistant temperature of the device components, preferably at 200° C. or lower. The cure time in the second drying process is not unconditionally determined due to catalyst concentration, member thickness and the like, but usually 0.1 hour or more, preferably 0.5 hour or more, and still preferably 1 hour or more, and usually 10 hours or less, preferably 5 hours or less, and still preferably 3 hours or less.

By separating the process for solvent removal (first drying process) and the curing process (second drying process) clearly, as described above, semiconductor light-emitting device members having physical properties of the second semiconductor light-emitting device member in the present invention and superior in light resistance and heat resistance can be produced without causing cracks and peeling.

As long as the above first drying process and second drying process are substantially realized as described above, temperature rise conditions in each process are not particularly limited. That is, the temperature may be maintained at a constant level during each drying process or the temperature may be changed continuously or intermittently. Also, each drying process may be performed two or more times. Further, even if there is a period in which the temperature temporarily rises to the boiling point or above of the solvent during the first drying process or falls below the boiling point of the solvent during the second drying process, such processes are assumed to be included in the scope of the present invention as long as the above process for solvent removal (first drying process) and the curing process (second drying process) are substantially accomplished independently.

[II-2-4. Others]

After the above drying process, various types of additional treatment may be performed on the resultant semiconductor light-emitting device members if necessary. Types of additional treatment include surface treatment to improve adhesion to mold portions, preparation of antireflection coating, and preparation of a fine uneven surface to improve efficiency of extracting light.

[III. Third Semiconductor Light-Emitting Device Member]

[III-1. Configuration of a Third Semiconductor Light-Emitting Device Member]

A third semiconductor light-emitting device member in the present invention is manufactured through predetermined manufacturing processes and further has features (7), (8), and (2) shown below:

(7) In a solid Si-nuclear magnetic resonance spectrum, the molar ratio of silicon corresponding to $D^n$ compounds to a total of silicon is 30% or more.

(8) In a solid Si-nuclear magnetic resonance spectrum, a total molar ratio of silicon corresponding to $D^2$ cyclic compound in trimers and tetramers to a total of silicon is 0.1% or more and 15% or less.

(2) Silicon content is 20 weight % or more.

First, these features (7), (8), and (2) will be described below.

[III-1-1. Feature (7)]

A third semiconductor light-emitting device member in the present invention has the molar ratio of silicon originating from $D^n$ compounds to a total of silicon of 30% or more in a solid Si-NMR spectrum (feature (7)).

As already described in descriptions of the first and second semiconductor light-emitting device members, a compound having silicon as its main component is represented by the rational formula of $SiO_2 \cdot nH_2O$ and has a structure in which an oxygen atom O is bound to each vertex of a tetrahedron of a silicon atom Si and further a silicon atom is bound to each of these oxygen atoms O to spread like a network. Schematic views shown below represent a network structure of Si—O without showing the above tetrahedron structure and part of oxygen atoms O is substituted by other components (for example, —H and —$CH_3$) in a repetitive unit of If focused on one silicon atom Si, there is a silicon atom Si ($Q^4$) having four —OSi as shown in the schematic view (A), a silicon atom Si ($Q^3$) having three —OSi as shown in the schematic view (B) and the like. Then, in solid Si-NMR measurement, peaks based on each of the above silicon atoms Si are in order called a $Q^4$ peak, $Q^3$ peak, ...

[Chemical Formula 9]

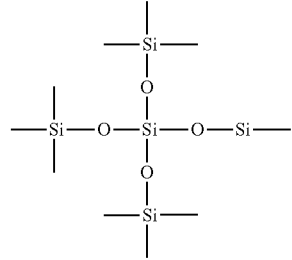

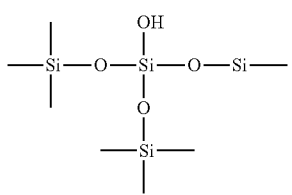

(B)

A silicon atom with these four bound oxygen atoms is generically called a Q site. As already mentioned in descriptions of the first and second semiconductor light-emitting device members in the present invention, each peak of $Q^0$ to $Q^4$ originating from a Q site will be herein called a $Q''$ peak group. A $Q''$ peak group of a silica membrane containing no organic substituent is usually observed as a continuous polymodal peak in an area of the chemical shift of −80 to −130 ppm.

In contrast, a silicon atom having three bound oxygen atoms and one other bound atom (normally a carbon atom) is generically called a T site. Like a peak originating from a Q site, a peak originating from a T site is observed as each peak of $T^0$ to $T^3$. As already mentioned in description of the first and second semiconductor light-emitting device members in the present invention, each peak originating from a T site will be herein called a $T''$ peak group. A $T''$ peak group is generally observed as a continuous polymodal peak in an area on a higher magnetic field side (usually the chemical shift of −80 to −40 ppm) than a $Q''$ peak group.

Further, a silicon atom with two bound oxygen atoms and two other bound atoms (normally carbon atoms) (that is, silicon corresponding to a $D''$ compound) is generically called a D site, as already mentioned in description of the first and second semiconductor light-emitting device members in the present invention. Like a peak group originating from a Q site or T site, a peak originating from a D site is observed as each peak ($D''$ peak group) of $D^0$ to $D''$ in a still higher magnetic field area (usually an area of the chemical shift of −3 to −40 ppm) than a $Q''$ and $T''$ peak groups to be observed as a polymodal peak curve.

Similarly, a silicon atom with one bound oxygen atom and three other bound atoms (normally carbon atoms) is generically called an M site and is observed as a polymodal peak curve in a highest magnetic field area (usually the chemical shift of 0 to −3 ppm).

Each peak group of $M''$, $D''$, $T''$, and $Q''$ has an area proportional to a molar ratio of silicon atoms placed in an environment corresponding to each peak group and therefore, if the area of all peaks is set to a molar quantity of all silicon atoms, a total area of the $Q''$ peak group, $M''$ peak group, $D''$ peak group, and $T''$ peak group will usually correspond to the molar quantity of all silicon atoms directly bound to corresponding carbon atoms.

The third semiconductor light-emitting device member in the present invention has in a solid Si-NMR spectrum a "molar ratio of silicon corresponding to $D''$ compounds to a total of silicon" of usually 30% or more, preferably 40% or more, and still preferably 50% or more, and usually 97% or less, preferably 95% or less, and still preferably 93% or less. Here, the "molar ratio of silicon originating from $D''$ compounds to a total of silicon" is represented by a "ratio of an area of the $D''$ peak group to the total peak area of silicon" measured in the solid Si-NMR spectrum. If this molar ratio falls below the above range, the third semiconductor light-emitting device member in the present invention may not be able to show flexibility. If the molar ratio exceeds the above range, the crosslink density decreases to display insufficient mechanical strength of the third semiconductor light-emitting device member in the present invention, leading to volatilization of included cyclic compound and lower sealing properties of oxygen/vapor.

The value of chemical shift for the semiconductor light-emitting device member can be calculated based on a measurement result of solid Si-NMR measurement made using, for example, a method described below in a description of examples. Also, measured data is analyzed (peak resolution) by a method in which each peak is divided and extracted by waveform separation analysis or the like utilizing, for example, the Gauss function or Lorentz function.

[III-1-2. Feature (8)]

The third semiconductor light-emitting device member in the present invention has a total molar ratio of silicon corresponding to $D^2$ cyclic compound in trimers and tetramers to a total of silicon of 0.1% or more and 15% or less in a solid Si-NMR spectrum (feature (8)).

Here, "$D^2$" represents silicon atoms polymerized linearly by siloxane crosslinking (that is, two —OSi are bound) among silicon atoms of bifunctional silane showing a $D''$ peak group in the Si-NMR spectrum. A $D^2$ cyclic compound is a cyclic polymer of bifunctional silane and has no reactive ends, in contrast to straight-chain polymers, and properties like low-polarity silicone oil. Each $D^2$ peak of three-membered rings and four-membered rings is usually clearly separated from straight-chain $D^2$ peaks in the Si-NMR spectrum, but $D^2$ peaks of five-membered rings or higher are difficult to separate from straight-chain $D^2$ peaks. For the third semiconductor light-emitting device member in the present invention, it is preferable that as small an amount of cyclic material whose degree of polymerization is usually ten-membered ring having volatility or lower as possible is contained. It is particularly preferable that content of three-membered rings and four-membered rings particularly whose boiling point is low and volatility is high is low.

More specifically, the third semiconductor light-emitting device member in the present invention has in a solid Si-NMR spectrum a "total molar ratio of silicon corresponding to $D^2$ cyclic compound in trimers and tetramers to a total of silicon" of usually 0.1% or more and preferably 1% or more, and usually 15% or less and preferably 10% or less. Here, the "total molar ratio of silicon corresponding to $D^2$ cyclic compound in trimers and tetramers to a total of silicon" is represented by a "ratio of the sum of peak areas of trimer $D^2$ cyclic compound and those of tetramer $D^2$ cyclic compound (that is, the total areas originating from trimer or tetramer $D^2$ cyclic compound) to the total peak areas of silicon" measured in the solid Si-NMR spectrum. If this molar ratio, which represents the ratio of silicon originating from $D^2$ cyclic compound falls below the above range, it becomes substantially impossible to use $D^2$ compounds as material, making it difficult to obtain a highly flexible glass body. If the molar ratio exceeds the above range, particularly for uses in which high heat resistance is required, cracks and chipping due to thermal shock appear more frequently and part of cyclic compound vaporizes. Content of $D^2$ cyclic compound of decamers and lower in silicone resin having a similar structure is reduced to several % due to possible volatilization, but the allowable content of the third semiconductor light-emitting device member in the present invention is higher compared with the silicone resin because the crosslink density is higher and $D^2$ cyclic compound is harder to volatilize.

[III-1-3. Feature (2)]

Like the first and second semiconductor light-emitting device members in the present invention, the third semiconductor light-emitting device member in the present invention also satisfies the feature (2).

That is, the third semiconductor light-emitting device member in the present invention must have the silicon content of at least 20 weight % (feature (2)). The basic skeleton of conventional semiconductor light-emitting device members is an organic resin such as an epoxy resin with carbon-carbon and carbon-oxygen bonds as a basic skeleton. In contrast, the basic skeleton of the third semiconductor light-emitting device member in the present invention is an inorganic siloxane bond like glass (silicate glass). As is evident from a chemical bond comparison table in Table 3 shown below, the siloxane bond has the following superior features as a semiconductor light-emitting device member.

(I) Light resistance is superior with large bond energy and properties resistant to pyrolysis and photolysis.

(II) Electrically polarized slightly.

(III) The chain structure has a high degree of freedom so that highly flexible structures can be formed and are freely rotatable around a siloxane chain.

(IV) Highly oxidized so that further oxidization is impossible.

(V) High electrical insulating properties.

TABLE 3

Chemical bond comparison table

| Bond | Bond distance (Å) | Bond energy (kcal/mol) | Bond angle (°) |
|---|---|---|---|
| Si—O—Si | 1.64 | 108 | 130 to 160 |
| C—O—C | 1.43 | 86 | 110 |
| C—C—C | 1.54 | 85 | 109 |

From these features, it is understood that a silicone semiconductor light-emitting device member formed by a skeleton in which the siloxane bond is formed three-dimensionally with a high degree of crosslinking can become a protective film, in contrast to a conventional resin silicone semiconductor light-emitting device member such as an epoxy resin, that is similar to minerals such as glass and rock and high in heat resistance and light resistance. Particularly, a silicone semiconductor light-emitting device member with a methyl group as a substituent is superior in heat resistance because the silicon semiconductor light-emitting device member does not have an absorption region in an ultraviolet region and resists photolysis.

The silicon content of the third semiconductor light-emitting device member in the present invention is 20 weight % or more, as described above, but among others 25 weight % or more is preferable and 30 weight % or more is still preferable. On the other hand, an upper limit is usually set to 47 weight % due to a fact that the silicon content of glass consisting entirely of $SiO_2$ is 47 weight %.

The silicon content of a semiconductor light-emitting device member can be calculated from an analysis result after performing inductively coupled plasma spectrometry (hereinafter abbreviated as "ICP") analysis using, for example, a method described later in a description of examples.

[III-1-4. Reasons why Effects of the Present Invention are Obtained from the Above Features (7), (8), and (2)]

Since the third semiconductor light-emitting device member in the present invention is provided with the above features (7), (8), and (2), a cured body that is cured closely without causing cracks even in thick film portions, is superior in adhesion with a case and chip sealing characteristics, and also superior in light/heat resistance after curing can be obtained. A reason therefor has not been clarified, but is assumed to be as follows.

A semiconductor light-emitting device member can conventionally be obtained from inorganic glass either by a melt process in which low-melting glass is melted and then sealed or the sol gel method in which a liquid obtained by performing hydrolysis and polycondensation of alkoxysilane or the like at a relatively low temperature is applied and then dried/cured. Only the $Q^n$ peak is mainly observed from members obtained by the melt process, but this method is not practical because a high temperature of at least 350° C. is required for melting, leading to thermal degradation of the semiconductor light-emitting device.

A hydrolysis and polycondensation product obtained from a tetrafunctional silane compound by the sol gel method, on the other hand, becomes totally inorganic glass and is significantly superior in heat resistance and weather resistance, but a cure reaction is accompanied by weight loss and volume reduction for a portion of dehydration because crosslinking proceeds due to a condensation (dehydration/dealcoholization) reaction of silanol. Thus, if only tetrafunctional silane having the $Q^n$ peak is selected as a material, the degree of shrinkage on curing becomes too large and cracks are made more likely to appear in coating, making it impossible to form a thick film. Attempts to increase film thickness have been made in such a system by adding inorganic particles as an aggregate or recoating, but 10 μm or so is generally a limit thickness. If sol gel glass is used as a semiconductor light-emitting device member, there has been a problem that the film thickness of 500 to 1000 μm must be secured because molding on wiring portions of complicated shape is needed. Also as described above, heating at a high temperature of at least 400° C. is needed to sufficiently reduce residual silanol to obtain totally inorganic glass, which is not practical because the semiconductor device is thermally degraded.

In contrast, in the third semiconductor light-emitting device member in the present invention, as described in feature (7), bifunctional silane having the $D^n$ peak is introduced to adjust the crosslink density to make the film have flexibility. Also, trifunctional silane having the $T^n$ peak and/or monofunctional silane having the $M^n$ peak are introduced when appropriate. Then, by performing hydrolysis and polycondensation of the silane to reduce the volume resulting from dehydration condensation and the crosslink density appropriately within a range that does not affect the function, and controlling hydrolysis/condensation and drying processes, a transparent glass filmy member with the film thickness of up to 1000 μm can be obtained. Therefore, in the third semiconductor light-emitting device member in the present invention, the $D^n$ peak observed in an area of −80 ppm or more is essential and the ratio of silicon originating from the corresponding $D^n$ compound must also fall with the range described in feature (7). Also, it is preferable that the $T^n$ peak and/or $M^n$ peak exists when appropriate. Further, the $Q^n$ peak may be included. However, the amount of the $Q^n$ peak included, if any, is usually small and the $Q^n$ peak is not essential.

Next, feature (8) will be described.

When bifunctional and trifunctional coupling agents are simultaneously hydrolyzed for introduction of organic groups and adjustments of the degree of crosslinking to form a glass body that is highly flexible and unlikely to crack, a uniform and heat-resistant glass body can be obtained in a microenvironment if all materials are homogeneously polymerized to form a network. However, in many cases, polymerization reaction proceeds unequally in accordance with reactivity of materials and a highly reactive coupling agent first polymerizes so that a coupling agent whose reactivity is low polymerizes later. Therefore, if a bifunctional silane coupling agent capable of providing a D" peak is contained in the material, a $D^2$ cyclic compound due to self-condensation that is not contained in the network of the glass body may be generated depending on reaction conditions, resulting in a semiconductor light-emitting device member having a solid-liquid two-layer structure including a liquid that could significantly affect heat resistance and coating properties.

If such $D^2$ cyclic compound is included in a state in which affinity for a system is high and vaporization is not allowed while the degree of crosslinking of the glass body is high, the $D^2$ cyclic compound is useful for flexibility development, crack prevention, and internal stress relief. However, if the degree of crosslinking is relaxed to increase flexibility without relying on plasticizer components, the $D^2$ cyclic compound becomes more likely to volatilize, leading to lower yield of silicon material before and after curing and silica deposition on electrical contact parts such as a micro relay and micro switch existing in a sealed environment during actual use.

Further, particularly when used for purposes requiring heat resistance, for example, for laser processing on a semiconductor light-emitting device member or a high-power semiconductor light-emitting device of ultrahigh luminance, low-molecular-weight $D^2$ cyclic compound may volatilize quickly by local heating depending on a method used, leading to expansion damage of the semiconductor light-emitting device member and occurrence of cracks and chipping.

For reasons described above, the third semiconductor light-emitting device member in the present invention with reduced concentration of $D^2$ cyclic compound is useful. Therefore, as described in feature (8), the total ratio of silicon corresponding to $D^2$ cyclic compound in trimers and tetramers must fall within a predetermined range.

Meanwhile, composition of the third semiconductor light-emitting device member in the present invention is limited to a case in which crosslinking in the system is mainly formed of inorganic components including silica. That is, in a semiconductor light-emitting device member in which a small amount of Si component is contained in a large amount of organic components, even if (7) in a solid NMR spectrum, the molar ratio of silicon corresponding to D" compounds to a total of silicon is 30% or more, and (8) in a solid NMR spectrum, a total molar ratio of silicon corresponding to $D^2$ cyclic compound in trimers and tetramers to a total of silicon is 0.1% or more and 15% or less, excellent heat resistance, light resistance, and coating capabilities defined in a description of the third semiconductor light-emitting device member in the present invention cannot be obtained. Therefore, like the above feature (2), the silicon content is required to be at least a predetermined value (20 weight %). A semiconductor light-emitting device member having silicon content of 20 weight % or more as defined in the description of the third semiconductor light-emitting device member in the present invention contains $SiO_2$ of 43 weight % or more in terms of silica ($SiO_2$).

[II-1-5. Light Transmittance]

The third semiconductor light-emitting device member in the present invention preferably has light transmittance of usually 80% or more, among others 85% or more, and further 90% or more on a luminous wavelength of a semiconductor light-emitting device with the film thickness of 0.5 mm. Efficiency of extracting light of the semiconductor light-emitting device has been enhanced by various technologies, but if transparency of a translucent member for sealing a chip or holding a phosphor is low, luminance of a semiconductor light-emitting device using the translucent member will be reduced, making it difficult to produce a high-intensity semiconductor light-luminescent device product.

Here, a "luminous wavelength of a semiconductor light-emitting device" varies depending on the type of semiconductor light-emitting device and generally refers to wavelengths in the range of usually 300 nm or more, preferably 350 nm or more, and usually 900 nm or less, preferably 500 nm or less. If light transmittance is low for wavelengths in this range, the semiconductor light-emitting device member absorbs light and efficiency of extracting light decreases, making it impossible to produce a high-luminescent device. Further, low light transmittance is not preferred because energy for reduced efficiency in extracting light is converted into heat, leading to thermal degradation.

Sealing members tend to degrade due to light in the near ultraviolet to blue regions (300 nm to 500 nm) and thus, the third semiconductor light-emitting device member in the present invention, which is superior in durability, is preferably used for a semiconductor light-emitting device having the luminous wavelengths in this region because its effect will be increased.

Light transmittance of a semiconductor light-emitting device member can be measured by an ultraviolet spectrophotometer using a sample of singly cured film with a smooth surface formed into a film thickness of 0.5 mm using, for example, a technique described below in a description of examples.

The shape of semiconductor device is diverse and a large majority of semiconductor devices are used in a thick-film state exceeding 0.1 mm, but there are also uses of a thin film when, for example, a thin-film phosphor layer (for example, a layer of several μm in thickness including nanometer phosphor particles and fluorescent ions) is provided at a position apart from an LED chip (luminous element) and a high refractive index light extracting film is provided on a thin film right above an LED chip. In such a case, transmittance is preferably 80% or more with the film thickness. In such forms of using a thin film, the third semiconductor light-emitting device member in the present invention also shows superior light resistance and heat resistance and is superior in sealing properties so that a thin film can steadily be formed without cracks.

[III-1-6. Others]

In addition to the above characteristics, the third semiconductor light-emitting device member in the present invention preferably has characteristics described below when appropriate.

[i] Characteristics Relating to the Full Width at Half Maximum of Peak

A technology of a hard coat film for glasses and the like is conventionally known as a method of making a film thicker using bifunctional or trifunctional material as a main component, but its film thickness is at most several μm or less. Such a hard coat film is thin and thus can be cured uniformly by easily volatilizing a solvent, and differences in adhesion and linear expansion coefficient between the hard coat film and substrate have been considered as a main cause for cracks. In the third semiconductor light-emitting device member in the present invention, on the other hand, the film is thick like a paint and has itself a certain level of strength so that a small difference in linear expansion coefficient can be accommodated, but in contrast to a thin film, generation of internal stress caused by volume reduction due to solvent drying arises as a new problem.

That is, when a deep container with a small opening area such as an LED cup is molded, if the deep container is heated for curing while a film deep part is not sufficiently dried up, solvent volatilization occurs after crosslinking and the volume decreases, leading to large cracks and foaming. Large internal stress is usually applied to such a film and measurement of solid Si-NMR of the film shows more distribution of the siloxane bond angle of the detected D″ peak group and the M″, T″, and Q″ peak groups detected according to circumstances than when the internal stress is smaller, creating a broader peak for each. This fact implies that a bond angle represented by two —OSi with respect to Si has large distortion. That is, a film having a narrower full width at half maximum of peak will be a higher-quality film in which cracks are more unlikely to appear, even though the film is made of the same material.

A phenomenon in which the full width at half maximum increases in accordance with distortion is observed more sensitively as the degree of constraint of molecular motion of Si atoms increases, and its frequencies of appearance are given by M″<D″<T″<Q″.

Therefore, in the third semiconductor light-emitting device member in the present invention, it is preferable that the full width at half maximum of peak measured in solid Si-NMR, particularly that of the D″ peak group is smaller (narrower) than the range of a full width at half maximum of semiconductor light-emitting device members conventionally known by the sol gel method.

Summarizing in terms of chemical shifts, in the third semiconductor light-emitting device member in the present invention, the full width at half maximum of the T″ peak group whose peak top position is observed in an area of the chemical shift of −80 ppm or more and less than −40 ppm is preferably in the range of usually 5.0 ppm or less, among others 4.0 ppm or less, and usually 0.3 ppm or more, among others 0.4 ppm or more.

Similarly, the full width at half maximum of the D″ peak group whose peak top position is observed in an area of the chemical shift of −40 ppm or more and less than −3 ppm is generally smaller than that of the T″ peak group due to smaller constraints of molecular motion and is preferably in the range of usually 3.0 ppm or less, among others 2.0 ppm or less, and usually 0.3 ppm or more.

Since the M″ peak group whose peak top position is observed in an area of the chemical shift of −3 ppm or more and 0 ppm or less is usually at an end of a siloxane chain, constraints of molecular motion is very small and the range of variations of the full width at half maximum due to distortion is very narrow.

If the full width at half maximum of peaks observed in the above chemical shift areas is larger than the above ranges, a state in which constraints of molecular motion is large and thus distortion is large is created, leading possibly to an inferior member in heat resistance, weather resistance, and durability in which cracks are more likely to appear. When, for example, a lot of tetrafunctional silane is used or large internal stress is generated by drying rapidly in a drying process, the range of the full width at half maximum will be larger than the above ranges.

If the full width at half maximum of peaks is smaller than the above ranges, Si atoms in its environment are not involved in siloxane crosslinking and, for example, trifunctional silane remains in a non-crosslinked state, leading possibly to a member inferior in heat resistance, weather resistance, and durability to materials formed mainly of siloxane bonds.

[ii] Characteristics Regarding the Silanol Content

The third semiconductor light-emitting device member in the present invention has the silanol content preferably in the range of usually 0.1 weight % or more, among others 0.3 weight % or more, and usually 10 weight % or less, among others 8 weight % or less, further 5 weight % or less.

A glass body produced by the sol gel method from alkoxysilane as a material usually does not completely polymerize to become an oxide under mild curing conditions of 150° C. and about three hours, and a certain amount of silanol remains. A glass body obtained exclusively from tetraalkoxysilane has high hardness and high light resistance, but a large amount of silanol remains because a molecular chain has a low degree of freedom due to a high degree of crosslinking and thus no complete condensation occurs. Also, when a hydrolyzed/condensed liquid is dried/cured, thickening is swift due to a large number of crosslinking points and drying and curing proceed simultaneously, resulting in a bulk body with large distortion. If such a member is used as a semiconductor light-emitting device member, new internal stress arises due to condensation of residual silanol when the member is used for a long period of time, making a malfunction such as cracks, peeling, and breaking of wire more likely to occur. Also, more silanol is found in a fracture surface of the member and moisture infiltration is likely to result because, though moisture permeability is low, surface hygroscopicity is high. The silanol content can be reduced by high-temperature burning at 400° C. or higher, but this is not practical because the heat-resistant temperature of most semiconductor light-emitting devices is 260° C. or lower.

The third semiconductor light-emitting device member in the present invention, on the other hand, varies little over time due to low silanol content, is superior in long-term stability in capability, and has superior capabilities of low hygroscopicity and moisture permeability. However, if a member does not contain silanol at all, the member has poor adhesion to the semiconductor light-emitting device and therefore, the appropriate range of the silanol content described above exists for the third semiconductor light-emitting device member in the present invention.

If the third semiconductor light-emitting device member in the present invention contains an appropriate amount of silanol, silanol is bound to a polar portion existing on the device surface through hydrogen bond so that adhesion develops. The polar portion includes the hydroxyl group and oxygen in a metalloxane bond.

Further, the third semiconductor light-emitting device member in the present invention forms due to dehydration/condensation a covalent bond with a hydroxyl group on the device surface when heated in the presence of an appropriate catalyst, allowing development of still firmer adhesion.

If there is too much silanol, on the other hand, adhesion increases in the system to make coating difficult and, with increased activity, when cured before light-boiling components volatilize by heating, foaming and internal stress increase, causing possibly cracks.

The silanol content of a semiconductor light-emitting device member can be calculated by making solid Si-NMR spectrum measurement using, for example, a method described later in a description of examples, determining a ratio (%) of silicon atoms in silanol to all silicon atoms from the ratio of peak areas originating from silanol to all peak areas, and comparing with a silicon content analyzed separately.

[iii] Others

The third semiconductor light-emitting device member in the present invention can be coated like a thick film and is superior not only in transparency, but also in sealing properties, heat resistance, and UV resistance, and thus can be applied as a semiconductor light-emitting device member in various forms. Particularly, the third semiconductor light-emitting device member can be used for semiconductor light-emitting devices whose luminous wavelength is in the blue to ultraviolet region as a useful member with less degradation.

[III-2. Manufacturing Method of the Third Semiconductor Light-Emitting Device Members]

The method of manufacturing the third semiconductor light-emitting device member in the present invention (called "manufacturing method of the third semiconductor light-emitting device member in the present invention" when appropriate) includes processes in which hydrolysis and polycondensation of compounds represented by the general formula (1) and general formula (2) described later and/or their oligomers are performed and polycondensate is dried. The manufacturing method will be described below in detail.

[III-2-1. Material]

Compounds (hereinafter called "compounds (1)" in a description of the third semiconductor light-emitting device member in the present invention when appropriate) represented by the general formula (1) shown below and/or their oligomers will be used as a material.

[Chemical Formula 10]

$$M^{m+}X_n Y^1{}_{m-n} \qquad (I)$$

In the general formula (1), M represents at least one element selected from a group consisting of silicon, aluminum, zirconium, and titanium. Among others, silicon is preferable.

In the general formula (1), M represents a valence of M and is an integer of 1 or greater and 4 or smaller. "m+" indicates that it is a positive valence.

n represents the number of X groups and is an integer of 1 or greater and 4 or smaller. However, m≥n holds.

In the general formula (1), X is a hydrolyzable group that generates a highly reactive hydroxyl group after being hydrolyzed by water in a solution or moisture in the air, and any known one can arbitrarily be used. For example, a low-grade alkoxy group of C1 to C5, acetoxy group, butanoxy group, and chlorine group can be cited. Here, an expression Ci (i is an integer) indicates that the number of carbon atoms is i. Furthermore, one hydrolyzable group may be used alone or two or more hydrolyzable groups may be used together in an arbitrary combination and ratio.

Among others, since components liberated after reaction are neutral, the low-grade alkoxy group of C1 to C5 is preferable. Particularly, a methoxy group or ethoxy group is preferable because these groups are highly reactive and a liberated solvent is lightly boiling.

Further, if X is an acetoxy group or chlorine group in the general formula (1), it is preferable to add a process to remove acid components when used as a semiconductor light-emitting device member for which insulating properties are needed in order that acetic acid or hydrochloric acid is liberated after hydrolysis reaction.

In the general formula (1), any known monovalent organic group of the so-called silane coupling agent can arbitrarily be selected for $Y^1$ and used. Among others, organic groups particularly useful as $Y^1$ in the general formula (1) for the manufacturing method of the third semiconductor light-emitting device member in the present invention are those selected from a group (group of useful organic groups) represented by $Y^0$ below.

<Group of Useful Organic Groups $Y^0$>

$Y^0$: Monovalent or higher organic groups derived from aliphatic compounds, alicyclic compounds, aromatic compounds, and aliphatic-aromatic compounds.

The number of carbon atoms of organic groups belonging to the group $Y^0$ is usually 1 or more, and usually 1000 or less, preferably 500 or less, still preferably 100 or less, and further still preferably 50 or less.

Further, at least part of hydrogen atoms in the organic groups belonging to the group $Y^0$ may be substituted by atoms and/or substituents such as organic functional groups exemplified below. At this time, a plurality of hydrogen atoms in an organic group belonging to the group $Y^0$ may be substituted by the following substituents and, in this case, one substituent or a combination of two or more substituents may be selected for substitution.

Examples of substituents that can be substituted for hydrogen atoms in the organic groups belonging to the group $Y^0$ include atoms such as F, Cl, Br, and I, and organic functional groups such as the vinyl group, methacryloxy group, acryloxy group, styryl group, mercapto group, epoxy group, epoxy cyclohexyl group, glycidoxy group, amino group, cyano group, nitro group, sulfonic group, carboxy group, hydroxy group, acyl group, alkoxy group, imino group, and phenyl group.

In all the cases described above, at least part of hydrogen atoms in the organic functional groups among substituents that can be substituted for hydrogen atoms in the organic groups belonging to the group $Y^0$ may be substituted by halogen atoms such as F, Cl, Br, and I.

However, among the substituents exemplified as substitutable for hydrogen in the organic groups belonging to the group $Y^0$, the organic functional groups are examples of substituents which can be introduced easily and organic functional groups having various physicochemical functionalities may be introduced in accordance with purposes of use.

Organic groups belonging to the group $Y^0$ may also have therein various atoms such as O, N, and S or atomic groups as connecting groups.

Various groups can be selected from the organic groups belonging to the above group of useful organic groups $Y^0$ as $Y^1$ in the general formula (1) in accordance with purposes, but in terms of superiority in UV resistance and heat resistance, it is preferable to select principally from the methyl group. Further, other organic groups may also be selected in order to improve affinity and adhesion with other materials constituting a semiconductor light-emitting device and change the refractive index of a semiconductor light-emitting device member when appropriate.

Concrete examples of the above compounds (1) when M is silicon include dimethyldimethoxysilane, dimethyldiethoxysilane, diphenyldimethoxysilane, diphenyldiethoxysilane, vinyl trimethoxysilane, vinyl triethoxysilane, vinyl triacetoxysilane, γ-aminopropyl trimethoxysilane, γ-glycidoxypropyl trimethoxysilane, γ-glycidoxypropyltriethoxysilane, β-(3,4-epoxy cyclohexyl)ethyltrimethoxysilane, γ-(3,4-epoxy cyclohexyl)ethyltriethoxysilane, γ-(meth)acryloxypropyl trimethoxysilane, phenyl trimethoxysilane, phenyl triacethoxysilane, γ-mercaptopropyl trimethoxysilane, γ-chloropropyl trimethoxysilane, β-cyanoethyl triethoxysilane, methyltrimethoxysilane, methyltriethoxysilane, methyltripropoxysilane, methyltributoxysilane, ethyltrimethoxysilane, ethyltriethoxysilane, tetramethoxysilane, tetraethoxysilane, tetrapropoxysilane, tetrabutoxysilane, dimethyldichlorosilane, diphenyldichlorosilane, methylphenyl dimethoxysilane, trimethylmethoxysilane, trimethylethoxysilane, trimethylchlorosilane, methyltrichlorosilane, γ-aminopropyl triethoxysilane, 4-aminobutyl triethoxysilane, p-aminophenyl triethoxysilane, N-(2-aminoethyl)-3-aminopropyl trimethoxysilane, aminoethyl aminomethylphenethyl trimethoxysilane, 3-glycidoxypropyl trimethoxysilane, 2-(3,4-epoxy cyclohexyl)ethyltrimethoxysilane, 3-aminopropyl trimethoxysilane, 3-aminopropyl triethoxysilane, 4-aminobutyl triethoxysilane, N-(6-aminohexyl)aminopropyl trimethoxysilane, 3-chloropropyl trimethoxysilane, 3-chloropropyltrichlorosilane, (p-chloromethyl)phenyltrimethoxysilane, 4-chlorophenyl trimethoxysilane, 3-methacryloxypropyl trimethoxysilane, 3-methacryloxypropyl triethoxysilane, 3-acryloxypropyl trimethoxysilane, styrylethyl trimethoxysilane, 3-mercaptopropyl trimethoxysilane, vinyl trichlorosilane, vinyl tris (2-methoxyethoxy) silane, and trifluoropropyl trimethoxysilane.

Concrete examples of the compounds (1) when M is aluminum include aluminum triisopropoxide, aluminum tri-n-butoxide, aluminum tri-t-butoxide, and aluminum triethoxide.

Concrete examples of the compounds (1) when M is zirconium include zirconium tetramethoxide, zirconium tetraethoxide, zirconium tetra-n-propoxide, zirconium tetra-i-propoxide, zirconium tetra-n-butoxide, zirconium tetra-i-butoxide, zirconium tetra-t-butoxide, and zirconium dimethacrylate dibutoxide.

Concrete examples of the compounds (1) when M is titanium include titanium tetraisopropoxide, titanium tetra-n-butoxide, titanium tetra-i-butoxide, titaniummethacrylatetriisopropoxide, titanium tetramethoxypropoxide, titanium tetra-n-propoxide, and titanium tetraethoxide.

However, these compounds exemplified above are only part of coupling agents easily available on the market and more details can be shown, for example, by a list of coupling agents and related products in chapter 9 of "Technology of Optimum Usage of Coupling Agents" issued by Institute for Science and Technology. Naturally, however, coupling agents that can be used for the manufacturing method of the third semiconductor light-emitting device member in the present invention are not limited by these exemplified coupling agents.

Compounds (hereinafter called "compounds (2)" in a description of the third semiconductor light-emitting device member in the present invention when appropriate) represented by the general formula (2) can also be used in the same manner as the above compounds (1).

[Chemical Formula 11]

$$(M^{s+}X_tY^1{}_{s-t-1})_uY^2 \quad (2)$$

In the general formula (2), M, X, and $Y^1$ each independently represent the same things as those in the general formula (1). Particularly for $Y^1$, just as in the case of the general formula (1), various groups can be selected from the organic groups belonging to the above group of useful organic groups $Y^0$ in accordance with purposes, but in terms of superiority in UV resistance and heat resistance, it is preferable to select principally from the methyl group.

In the general formula (2), s represents the valence of M and is an integer of 2 or greater and 4 or smaller. "s+" indicates that it is a positive integer.

Further, in the general formula (2), $Y^2$ represents a u-valent organic group. u represents an integer of 2 or greater. Therefore, any bivalent or higher organic group can arbitrarily be selected from organic groups known as organic groups of the so-called silane coupling agent for $Y^2$ in the general formula (2) and used.

Also, in the general formula (2), t represents an integer of 1 or greater and s−1 or smaller, where t≤s.

Examples of the above compounds (2) include various organic polymers and oligomers to which a plurality of hydrolytic silyl groups are bound as side chains and molecules to which hydrolytic silyl groups are bound to a plurality of ends of the molecules.

Concrete examples of the above compounds (2) and their product names are listed below:

Bis(triethoxysilylpropyl) tetrasulfide (Manufactured by Shin-Etsu Chemical Co., Ltd., KBE-846)

2-diethoxymethyl ethylsilyldimethyl-2-furanylsilane (Manufactured by Shin-Etsu Chemical Co., Ltd., LS-7740)

N,N'-bis[3-(trimethoxysilyl) propyl]ethylenediamine (Manufactured by Chisso Corporation, Sila-Ace XS1003)

N-glycidyl-N,N-bis[3-(methyldimethoxysilyl) propyl] amine (Manufactured by Toshiba Silicones Co., Ltd., TSL8227)

N-glycidyl-N,N-bis[3-(trimethoxysilyl) propyl]amine (Manufactured by Toshiba Silicones Co., Ltd., TSL8228)

N,N-bis[(methyldimethoxysilyl) propyl]amine (Manufactured by Toshiba Silicones Co., Ltd., TSL8206)

N,N-bis[3-(methyldimethoxysilyl)propyl]ethylenediamine (Manufactured by Toshiba Silicones Co., Ltd., TSL8212)

N,N-bis[(methyldimethoxysilyl) propyl]methacrylamide (Manufactured by Toshiba Silicones Co., Ltd., TSL8213)

N,N-bis[3-(trimethoxysilyl) propyl]amine (Manufactured by Toshiba Silicones Co., Ltd., TSL8208)

N,N-bis[3-(trimethoxysilyl) propyl]ethylenediamine (Manufactured by Toshiba Silicones Co., Ltd., TSL8214)

N,N-bis[3-(trimethoxysilyl) propyl]methacrylamide (Manufactured by Toshiba Silicones Co., Ltd., TSL8215)

N,N',N''-tris[3-(trimethoxysilyl) propyl] isocyanurate (Manufactured by Hydrus Chemical Inc., 12267-1)

1,4-bishydroxydimethylsilylbenzene (Manufactured by Shin-Etsu Chemical Co., Ltd., Ls-7325)

Only one of the compounds (1) and compounds (2) may be used as a material, but it is also allowed to mix two or more compounds in any combination or composition. Also, as described above, oligomers of the compounds (1) and compounds (2) may be used as a material. Here, if the compounds (2) and/or oligomers thereof are used as a main material, a main chain structure in its system will consist principally of organic bonds, leading possibly to low durability. Thus, it is desirable to use a minimum amount of the compounds (2) to mainly provide functionality such as adhesion addition, refractive index adjustment, reactivity control, and inorganic particle dispersibility addition. If the compounds (1) and/or oligomers (compounds (1) derived components) thereof, and the compounds (2) and/or oligomers (compounds (2) derived components) thereof are used simultaneously, it is desirable that the ratio of usage of the compounds (2) derived components to the total weight of material is usually 30 weight % or less, preferably 20 weight % or less, and still preferably 10 weight % or less. However, in the manufacturing method of the third semiconductor light-emitting device member in the present invention, at least one of the compounds (1) and compounds (2) that contain silicon as M and have at least one of the organic group $Y^1$ and organic group $Y^2$ must be used as a material. Since it is preferable that crosslinking consists principally of the siloxane bond, if both the compounds (1) and compounds (2) are used, it is preferable to mainly use the compounds (1).

[III-2-2. Hydrolysis and Polycondensation Process]

In the manufacturing method of the third semiconductor light-emitting device member in the present invention, first at least one of the above compounds (1), compounds (2) and/or oligomers thereof is caused to undergo a hydrolysis and polycondensation reaction (hydrolysis and polycondensation process). This hydrolysis and polycondensation reaction can be caused by a known method. In a description of the third semiconductor light-emitting device member in the present invention below, the compounds (1), compounds (2) and oligomers thereof are referred to as "material compounds" when they are not distinguished.

A theoretical amount of water used for causing the hydrolysis and polycondensation reaction of the material compounds is based on a reaction formula shown in the following formula (3) and is half the molar ratio of total amount of hydrolyzable groups in the system.

[Formula 3]

(3)

The above formula (3) represents a case in which M is silicon in the general formulas (1) and (2) as an example. "≡Si" and "Si≡" represent three of four dangling bonds held by a silicon atom in an abbreviated manner.

In the description of the third semiconductor light-emitting device member in the present invention, the theoretical amount of water required for the hydrolysis, that is, the amount of water corresponding to half the molar ratio of total amount of hydrolizable groups is selected as a reference (hydrolysis percentage 100%) and the amount of water used for hydrolysis is represented as a percentage to this reference value, that is, "hydrolysis percentage."

In the manufacturing method of the third semiconductor light-emitting device member in the present invention, the amount of water used for causing hydrolysis and polycondensation reaction is, when expressed as the above hydrolysis percentage, preferably in the range of usually 80% or more, among others, 100% or more. If the hydrolysis percentage is lower than this range, hydrolysis/polymerization is insufficient and thus material may volatilize during curing or hardness of cured body may be insufficient. If the hydrolysis percentage exceeds 200%, on the other hand, liberated water always remains in the system during curing, causing chips or phosphor to degrade due to moisture or causing foaming, cracks, or peeling during curing after a cup portion absorbs water. What is important in hydrolysis reaction is to perform hydrolysis and polycondensation using water of the hydrolysis percentage close to 100% or more (for example, 80% or more) and, by adding a process in which liberated water is removed before coating, the hydrolysis percentage exceeding 200% can be applied. However, in this case, using too much water may complicate a concentration process because the amount of water to be removed and that of solvent to be used as a compatibilizer increase or may reduce coating capabilities of members because polycondensation proceeds too far. Thus, it is preferable that the upper limit of the hydrolysis percentage is usually set to 500% or less, among others, 300% or less, and preferably 200% or less.

A known catalyst may be caused to exist during hydrolysis and polycondensation of material compounds to promote hydrolysis and polycondensation. In this case, organic acid such as acetic acid, propionic acid, and butyric acid, inorganic acid such as nitric acid, hydrochloric acid, and phosphoric acid, and sulfuric acid, and an organometallic compound catalyst can be used as a catalyst to be used. For a member to be used for portions directly in contact with a semiconductor light-emitting device, an organometallic compound catalyst that has less effect on insulating property is preferable.

Hydrolyzate/polycondensate of the above material compounds is preferably liquid. However, if solid hydrolyzate/polycondensate can be made liquid using a solvent, such hydrolyzate/polycondensate can also be used.

If liquid separation occurs in the system during hydrolysis and polycondensation reaction to produce a non-uniform state, a solvent may be used. For example, low-grade alcohols of C1 to C3, dimethylformamide, dimethylsulfoxide, acetone, tetrahydrofuran, methylcellosolve, ethylcellosolve, methylethylketone, and any other solvents that can be mixed homogeneously with water can be used as a solvent. Among others, however, solvents that are neither highly acidic nor highly basic are preferable for reasons of not affecting hydrolysis and polycondensation adversely. One solvent may be used alone or a plurality of solvents may be used together. Further, the solvent may be used together with hydrophobic solvent. The amount of solvent to be used may be freely selected, but it is preferable to use a minimum amount when coated on a semiconductor light-emitting device because the solvent is removed in most cases. It is also preferable to select a solvent whose boiling point is 100° C. or lower, preferably 80° C. or lower to facilitate solvent removal. In some cases, the initial non-uniform state becomes uniform during reaction because a solvent such as alcohol is generated by hydrolysis reaction without a need for adding a solvent from outside.

Hydrolysis and polycondensation reaction of the above material compounds occurs, when carried out under normal pressure, in the range of usually 15° C. or higher, preferably 20° C. or higher, and still preferably 40° C. or higher, and usually 140° C. or lower, preferably 135° C. or lower, and still preferably 130° C. or lower. A higher temperature may also be allowed by maintaining the liquid phase under applied pressure, but it is preferable that the temperature does not exceed 150° C.

The reaction time of hydrolysis and polycondensation reaction depends on the reaction temperature, but the reaction is caused in the range of usually 0.1 hour or more, preferably 1 hour or more, and still preferably 3 hours or more, and usually 100 hours or less, preferably 20 hours or less, and still preferably 15 hours or less.

If, under the above hydrolysis and polycondensation conditions, the time is too short or the temperature is too low, hydrolysis/polymerization is insufficient, leading possibly to volatilization of material during curing or insufficient hardness of cured bodies. In, on the other hand, the time is too long or the temperature is too high, the molecular weight of polymers becomes high and the amount of silanol in the system decreases, causing poor adhesion during coating and the structure of cured bodies becomes non-uniform due to premature curing, making cracks more likely to appear. On the basis of the above tendencies, it is desirable to select appropriate conditions in accordance with desired physical property values.

After the above hydrolysis and polycondensation reaction terminates, resultant hydrolyzate/polycondensate is stored at or below room temperature before its use. However, polycondensation slowly proceeds also in the meantime and thus it is preferable that the hydrolyzate/polycondensate is usually used within 60 days of storage at room temperature after the hydrolysis/polycondensation reaction under warming terminates, preferably within 30 days, and still preferably within 15 days particularly when used as a thick-film member. The above period can be prolonged if necessary by storing hydrolyzate/polycondensate in a low temperature range in which the hydrolyzate/polycondensate does not freeze.

[III-2-3. Drying Process]

By drying (drying process) the resultant hydrolyzate/polycondensate from the above hydrolysis and polycondensation reaction, the third semiconductor light-emitting device member in the present invention can be obtained. The hydrolyzate/polycondensate is usually liquid, as described above and, by drying the liquid hydrolyzate/polycondensate in a mold of desired shape, the third semiconductor light-emitting device member in the present invention in the desired shape can be formed. Also, by drying the hydrolyzate/polycondensate after coated on a desired region, the third semiconductor light-emitting device member in the present invention can be formed directly on the desired region. The liquid hydrolyzate/polycondensate will be called "hydrolyzed/polycondensed liquid" or "liquid for forming a semiconductor light-emitting device member" in the description of the third semiconductor light-emitting device member in the present invention when appropriate.

In the manufacturing method of the third semiconductor light-emitting device member in the present invention, it is preferable that the above hydrolysis and polycondensation reaction is caused to occur in the presence of a solvent and the drying process is divided into a first drying process in which the solvent is substantially removed at a temperature equal to or below the boiling point of the solvent, preferably below the boiling point and a second drying process in which hydrolyzate/polycondensate is dried at a temperature equal to or above the boiling point of the solvent.

The "solvent" here includes a solvent represented like XH generated by the above hydrolysis and polycondensation reaction of material compounds represented by $M^{m+}X_nY^1_{m-m}$ and $(M^{s+}X_rY^1_{s-t-1})_uY^2$. "Drying" in the description of the manufacturing method of the third semiconductor light-emitting device member in the present invention refers to a process in which the hydrolyzate/polycondensate of the above hydrolysis and polycondensation reaction of material compounds loses the solvent and further the metalloxane bond is formed after polymerization/curing.

The first drying process substantially removes a contained solvent at a temperature equal to or below the boiling point of the solvent, preferably below the boiling point without actively promoting further polymerization of the hydrolyzate/polycondensate of the material compounds. That is, a product obtained from this process is a viscous liquid or soft film due to hydrogen bonds after the hydrolyzate/polycondensate before drying is concentrated. If the first drying process is performed at a temperature equal to or above the boiling point of the solvent, the resultant film is foamed by vapor of the solvent, making it difficult to produce uniform films without defects. This first drying process may be performed as a single step if evaporation of the solvent is efficient when, for example, a thin-film member is formed, but may also be performed as a plurality of steps if evaporation efficiency is low when, for example, molded on a cup. For a shape for which evaporation efficiency is extremely low, after drying/concentration is performed on a separate efficient container in advance, hydrolyzate/polycondensate may be coated while still in a fluid state before further being dried. If the evaporation efficiency is low, it is preferable to contrive to dry a whole member uniformly without taking steps to promote only surface concentration of the member such as forced air drying of a large air flow.

In the second drying process, after the solvent of the above hydrolyzate/polycondensate has substantially disappeared in the first drying process, the hydrolyzate/polycondensate is heated at a temperature equal to or above the boiling point of the solvent to form the metalloxane bonds, producing stable cured bodies. If a large amount of solvent remains in this process, the volume reduces due to solvent evaporation while crosslinking reaction proceeds and thus large internal stress is generated, leading to peeling and cracks caused by shrinkage. Since the metalloxane bond is usually formed efficiently at 100° C. or higher, the second drying process is performed preferably at 100° C. or higher, and still preferably at 120° C. or higher. However, if the hydrolyzate/polycondensate is heated together with semiconductor light-emitting devices, it is preferable to perform the drying process usually at a temperature equal to or below the heat-resistant temperature of the device components, preferably at 200° C. or lower. The cure time in the second drying process is not unconditionally determined due to catalyst concentration, member thickness and the like, but usually 0.1 hour or more, preferably 0.5 hour or more, and still preferably 1 hour or more, and usually 10 hours or less, preferably 5 hours or less, and still preferably 3 hours or less.

By separating the process for solvent removal (first drying process) and the curing process (second drying process) clearly, as described above, semiconductor light-emitting device members having physical properties of the third semiconductor light-emitting device member in the present invention and superior in light resistance and heat resistance can be produced without causing cracks and peeling.

As long as the above first drying process and second drying process are substantially realized as described above, temperature rise conditions in each process are not particularly limited. That is, the temperature may be maintained at a constant level during each drying process or the temperature may be changed continuously or intermittently. Also, each drying process may be performed two or more times. Further, even if there is a period in which the temperature temporarily rises to the boiling point or above of the solvent during the first drying process or falls below the boiling point of the solvent during the second drying process, such processes are assumed to be included in the scope of the present invention as long as the above process for solvent removal (first drying process) and the curing process (second drying process) are substantially accomplished independently.

[III-2-4. Reduction of $D^2$ Cyclic Compound]

In the manufacturing method of the third semiconductor light-emitting device member in the present invention, $D^2$ cyclic compound is usually reduced, in addition to the above hydrolysis and polycondensation process and drying process. $D^2$ cyclic compound may be reduced by suitably providing a process before or after the above hydrolysis and polycondensation process or drying process, or performing some operation during the hydrolysis and polycondensation process or drying process.

Any method can be used to reduce $D^2$ cyclic compound if $D^2$ cyclic compound can be reduced while satisfying the above physical properties of the third semiconductor light-emitting device member in the present invention. Also, two or more methods may be combined.

Desirable methods include:
1) method of dilution with siloxane polymers not containing $D^2$ cyclic compound;
2) method of controlling hydrolysis reaction; and
3) method of removing $D^2$ cyclic compound after hydrolysis reaction. Among others, the above methods 1) and 2) are easy to apply and more effective. Though systems to which the method 3) can be applied are limited, the concentration of $D^2$ cyclic compound can be made very low.

Each method will be described below:

1) Method of Dilution with Siloxane Polymers not Containing $D^2$ Cyclic Compound:

Siloxane polymers not containing $D^2$ cyclic compound is not limited and any siloxane polymer can be used as long as effects of the present invention are not seriously impaired. Useful siloxane polymers include cage polymers and polyhedral clusters such as nano-scale silica particles and silsesquioxane compounds; and oligomers of Si atom pentamers or higher derived from monofunctional and/or trifunctional and/or tetrafunctional silane coupling agents. One siloxane polymer not containing $D^2$ cyclic compound may be used alone or two or more siloxane polymers may be used in an arbitrary combination and ratio.

The siloxane polymers are diluted by homogeneously dispersing or dissolving the siloxane polymers in a hydrolyzing liquid of a semiconductor light-emitting device member to be introduced into. Further, it is desirable that, if a particle diameter or molecular size of the siloxane polymers is small, the diameter is equal to or smaller than luminous wavelengths of the semiconductor light-emitting device member and, if the particle diameter is large, the refractive index thereof is close to that of the semiconductor light-emitting device member so that transparency of the resultant semiconductor light-emitting device member is not impaired.

2) Method of Controlling Hydrolysis Reaction:

If $D^2$ cyclic compound should be reduced by controlling hydrolysis reaction, it is preferable that the catalyst type is an organometallic compound catalyst rather than acid. If a plurality of silane coupling agents including bifunctional silane coupling agents are simultaneously hydrolyzed, acidic catalysts tend to promote uneven reaction in the system and may generate a large amount of monopolymers such as cyclic compound and straight-chain polymers not compatible with the system and separate, in an extreme case, a hydrolyzing liquid.

Therefore, when using such acidic catalysts, it is desirable to work out an introduction order and usage of catalysts when used alone and also to consider using such acidic catalysts together with an organometallic compound catalyst. Further, it is also useful to manipulate the order of hydrolysis and mixing timing of each silane coupling agent in accordance with reactivity of a plurality of silane coupling agents to be used and to mix part of material separately. Also, it is effective to make organic groups of silane coupling agents, which are $D''$ compounds, bulky to make it difficult to produce low-molecular-weight cyclic compound.

3) Method of Removing $D^2$ Cyclic Compound after Hydrolysis Reaction:

In the method of removing $D^2$ cyclic compound after hydrolysis reaction, for example, a small amount of high-boiling solvent is mixed with a hydrolyzing liquid to remove low-molecular-weight cyclic material together with the high-boiling solvent by vacuum distillation or the like before, if necessary, dilution again by the high-boiling solvent or the like. The high-boiling solvent here refers to a solvent whose boiling point is higher than that of the cyclic compound. If a system remains stable after removing a solvent, low-boiling cyclic compound can be removed directly together with a low-boiling solvent without mixing a high-boiling solvent.

[III-2-5. Others]

After the above drying process, various types of additional treatment may be performed on the resultant semiconductor light-emitting device members if necessary. Types of additional treatment include surface treatment to improve adhesion to mold portions, preparation of antireflection coating, and preparation of a fine uneven surface to improve efficiency of extracting light.

[IV. Advantageous Characteristics of the First to Third Semiconductor Light-Emitting Device Members]

The first to third semiconductor light-emitting device members in the present invention (hereinafter referred to simply as "semiconductor light-emitting device member in the present invention" when the first to third semiconductor light-emitting device members in the present invention are not distinguished) are each superior in adhesion to a container, heat resistance, and UV resistance. Since the semiconductor light-emitting device member in the present invention has such advantageous characteristics, the semiconductor light-emitting device member in the present invention can suitably be used as a sealing compound of semiconductor light-emitting devices.

[IV-1. Adhesion]

The semiconductor light-emitting device member in the present invention has functional groups that can be bound to a predetermined functional group (for example, a hydroxyl group and oxygen in metalloxane bond) present on the surface of a resin such as polyphthalamide, ceramics, or metal through hydrogen bond. A container (such as a cup described later) for a semiconductor light-emitting device is usually formed of ceramics or metal. Also, hydroxyl groups usually exist on the surface of ceramics or metal. On the other hand, the semiconductor light-emitting device member in the present invention usually has functional groups that can be bound to the hydroxyl groups through hydrogen bond. Therefore, the first to third semiconductor light-emitting device members in the present invention are superior in adhesion to the container for semiconductor light-emitting devices through the hydrogen bond.

Functional groups of the semiconductor light-emitting device member in the present invention that can be bound to the hydroxyl groups through hydrogen bond include silanol and an alkoxy group. Only one functional group or two or more types of functional groups may be used.

Whether the semiconductor light-emitting device member in the present invention has any functional group that can be bound to the hydroxyl group through hydrogen bond can be checked by a technique of spectroscopy such as the solid Si-NMR, solid $^1$H-NMR, infrared absorption spectrum (IR), and Raman spectrum.

[IV-2. Heat Resistance]

The semiconductor light-emitting device member in the present invention is superior in heat resistance. That is, the semiconductor light-emitting device member in the present invention has a property that transmittance thereof with respect to light having a predetermined wavelength hardly varies even when left alone under high temperature conditions. More specifically, before and after leaving alone for about 500 hours under the temperature condition of 200° C., the semiconductor light-emitting device member in the present invention has the degree of maintenance of the transmittance with respect to light whose wavelength is 405 nm of usually 80% or more, preferably 90% or more, and still preferably 95% or more, and usually 110% or less, preferably 105% or less, and still preferably 100% less.

The above ratio of variation can be measured in the same manner as the above [Measurement of transmittance] by measuring transmittance using an ultraviolet/visible spectrophotometer.

[IV-3. UV Resistance]

The semiconductor light-emitting device member in the present invention is superior in light resistance. That is, the semiconductor light-emitting device member in the present invention has a property that transmittance thereof with respect to light having a predetermined wavelength hardly varies even when irradiated with UV (ultraviolet rays). More specifically, before and after being irradiated with light whose center wavelength is 380 nm and radiant intensity is 0.4 kW/m$^2$ for 72 hours, the semiconductor light-emitting device member in the present invention has the degree of maintenance of the transmittance with respect to light whose wavelength is 405 nm of usually 80% or more, preferably 90% or more, and still preferably 95% or more, and usually 110% or less, preferably 105% or less, and still preferably 100% less.

The above ratio of variation can be measured in the same manner as the above [Measurement of transmittance] by measuring transmittance using an ultraviolet/visible spectrophotometer.

[V. Uses of the Semiconductor Light-Emitting Device Member]

The semiconductor light-emitting device member in the present invention is not particularly limited in its use and can be used for various purposes including as a member (sealing compound) for sealing a semiconductor light-emitting device and the like. Among others, by combining with phosphor particles and/or inorganic oxide particles, the semiconductor light-emitting device member in the present invention can suitably be used for specific purposes. The combined use with phosphor particles and inorganic oxide particles will be described below.

[V-1. Combined Use with Phosphor Particles]

The semiconductor light-emitting device member in the present invention can be used, for example, as a wavelength conversion member by dispersing a phosphor in the semiconductor light-emitting device member for molding inside a semiconductor light-emitting device cup or coating as a thin film on an appropriate transparent support. One phosphor may be used alone or two or more types of phosphors may be used in an arbitrary combination and ratio.

[Phosphor]

Composition of the phosphor is not particularly limited, but it is preferable to combine a crystalline matrix, for example, metallic oxide such as $Y_2O_3$ and $Zn_2SiO_4$, phosphate such as $Ca_5(PO_4)_3Cl$, or sulfide such as ZnS, SrS, and CaS with ions of rare earth metal such as Ce, Pr, Nd, Pm, Sm, Eu, Tb, Dy, Ho, Er, Tm, and Yb or ions of metal such as Ag, Cu, Au, Al, Mn, and Sb as an activator or coactivator.

Preferable examples of the crystalline matrix include sulfide such as (Zn, Cd) S, $SrGa_2S_4$, SrS, and ZnS, oxysulfide such as $Y_2O_2S$, aluminate such as $(Y, Gd)_3Al_5O_{12}$, $YAlO_3$, $BaMgAl_{10}O_{17}$, (Ba, Sr) (Mg, Mn)$Al_{10}O_{17}$, (Ba, Sr, Ca) (Mg, Zn, Mn) $Al_{10}O_{17}$, $BaAl_{12}O_{19}$, CeMg $Al_{11}O_{19}$, (Ba, Sr, Mg) $O.Al_2O_3$, $BaAl_2Si_2O_8$, $SrAl_2O_4$, $Sr_4Al_{14}O_{25}$, and $Y_3Al_5O_{12}$, silicate such as $Y_2SiO_5$ and $Zn_2SiO_4$, oxide such as $SnO_2$ and $Y_2O_3$, borate such as $GdMgB_5O_{10}$, (Y, Gd) $BO_3$, halophosphate such as $Ca_{10}(PO_4)_6(F, Cl)_2$ and (Sr, Ca, Ba, Mg)$_{10}$ $(PO_4)_6Cl_2$ and phosphate such as $Sr_2P_2O_7$ and (La, Ce) $PO_4$.

However, the above crystalline matrix and the activator or coactivator are not particularly limited in elemental composition and can partially be substituted by analogous elements, and a resultant phosphor can be used if it absorbs light in the near-ultraviolet to visible region and emits visible light.

More specifically, substances shown below can be used as a phosphor, but these are only exemplary substances and phosphors that can be used in the present invention are not limited to these. In the exemplification shown below, phosphors whose structure is different only partially are shown in an abbreviated manner when appropriate. For example, "$Y_2SiO_5:Ce^{3+}$", "$Y_2SiO_5:Tb^{3+}$", and "$Y_2SiO_5:Ce^{3+}, Tb^{3+}$" are shown in a unifying manner as "$Y_2SiO_5:Ce^{3+}, Tb^{3+}$", and "$La_2O_2S:Eu$", "$Y_2O_2S:Eu$" and "$(La,Y)_2O_2S:Eu$" are shown in a unifying manner as "$(La, Y)_2O_2S:Eu$". An abbreviated location is delimited by a comma (,).

Red Phosphor

The range of concrete wavelengths of fluorescence emitted by a phosphor that emits red fluorescence (hereinafter referred to as a "red phosphor" when appropriate) is exemplified as usually 570 nm or more, preferably 580 nm or more, and usually 700 nm or less, preferably 680 nm or less.

Such red phosphors include a europium activation alkaline earth silicon nitride phosphor represented by (Mg, Ca, Sr, Ba)$_2Si_5N_8$:Eu and configured by fracture particles having a red fracture surface to emit light in the red region and europium activation rare earth oxychalcogenide phosphor represented by (Y, La, Gd, Lu)$_2O_2S$:Eu and configured by grown particles having approximately a spherical shape as a regular crystal growth shape to emit light in the red region.

Further, a phosphor containing oxynitride and/or oxysulfide containing at least one element selected from a group consisting of Ti, Zr, Hf, Nb, Ta, W, and Mo disclosed by Japanese Patent Application Laid-Open No. 2004-300247 and containing an α-sialon structure in which part or all of Al elements are substituted by the Ga elements can also be used in the present embodiment. Such a phosphor is a phosphor containing oxynitride and/or oxysulfide.

As other red phosphors, an Eu activation oxysulfide phosphor such as (La, Y)$_2O_2S$:Eu, Eu activation oxide phosphor such as Y(V, P)O$_4$:Eu and Y$_2O_3$:Eu; Eu, Mn activation silicate phosphor such as (Ba, Sr, Ca, Mg)$_2$SiO$_4$:Eu, Mn and (Ba, Mg)$_2$SiO$_4$:Eu, Mn; Eu activation sulfide phosphor such as (Ca, Sr) S:Eu, Eu activation aluminate phosphor such as YAlO$_3$:Eu, Eu activation silicate phosphor such as LiY$_8$(SiO$_4$)$_8$O$_2$:Eu, Ca$_2Y_8$(SiO$_4$)$_6$O$_2$:Eu, (Sr, Ba, Ca)$_3$SiO$_5$:Eu, and Sr$_2$BaSiO$_5$:Eu, Ce activation aluminate phosphor such as (Y, Gd)$_3Al_5O_{12}$:Ce and (Tb, Gd)$_3Al_5O_{12}$:Ce, Eu activation nitride phosphor such as (Ca, Sr, Ba)$_2Si_5N_8$:Eu, (Mg, Ca, Sr, Ba)SiN$_2$:Eu, and (Mg, Ca, Sr, Ba)AlSiN$_3$:Eu, Ce activation nitride phosphor such as (Mg, Ca, Sr, Ba)AlSiN$_3$:Ce; Eu, Mn activation halophosphate phosphor such as (Sr, Ca, Ba, Mg)$_{10}$(PO$_4$)$_8$Cl$_2$:Eu, Mn; Eu, Mn activation silicate phosphor such as (Ba$_3$Mg)Si$_2O_8$:Eu, Mn and (Ba, Sr, Ca, Mg)$_3$(Zn, Mg)Si$_2O_8$:Eu, Mn; Mn activation germanide phosphor such as 3.5MgO.0.5MgF$_2$.GeO$_2$:Mn, Eu activation oxynitride phosphor such as Eu activation α-sialon; Eu, Bi activation oxide phosphor such as (Gd, Y, Lu, La)$_2O_3$:Eu, Bi; Eu, Bi activation oxysulfide phosphor such as (Gd, Y, Lu, La)$_2O_2$S: Eu, Bi; Eu, Bi activation vanadate phosphor such as (Gd, Y, Lu, La) VO$_4$: Eu, Bi; Eu, Ce activation sulfide phosphor such as SrY$_2S_4$:Eu, Ce; Ce activation sulfide phosphor such as CaLa$_2S_4$:Ce; Eu, Mn activation phosphate phosphor such as (Ba, Sr, Ca)MgP$_2O_7$:Eu, Mn and (Sr, Ca, Ba, Mg, Zn)$_2P_2O_7$: Eu, Mn; Eu, Mo activation tungstate phosphor such as (Y, Lu)$_2WO_8$:Eu, Mo; Eu, Ce activation nitride phosphor such as (Ba, Sr, Ca)$_xSi_yN_z$:Eu, Ce (x, y, and z are integers equal to 1 or greater); Eu, Mn activation halophosphate phosphor such as (Ca, Sr, Ba, Mg)$_{10}$(PO$_4$)$_6$(F, Cl, Br, OH):Eu, Mn and Ce activation silicate phosphor such as $((Y, Lu, Gd, Tb)_{1-x-y}Sc_x Ce_y)_2(Ca, Mg)_{1-r} (Mg, Zn)_{2+r}Si_{z-q}Ge_qO_{12+\delta}$ can also be used.

Also as a red phosphor, a red organic phosphor comprised of rare earth element ion complexes having anions such as β-diketonate, β-diketone, aromatic carboxylic acid, and Broensted acid as ligands, perylene pigment (for example, dibenzo{[f,f']-4,4',7,7'-tetraphenyl}diindeno[1,2,3-cd:1',2', 3'-lm]perylene), anthraquinone pigment, lake pigment, azo pigment, quinacridone pigment, anthracene pigment, isoindoline pigment, isoindolinone pigment, phthalocyanine pigment, triphenylmethane basic dye, indanthrone pigment, indophenol pigment, cyanine pigment, and dioxazine pigment can also be used.

Also, among red phosphors, those whose peak wavelength is 580 nm or more, preferably 590 nm or more, and 620 nm or less, preferably 610 nm or less can be suitably used as an orange phosphor. Examples such orange phosphors include (Sr, Ba)$_3$SiO$_5$:Eu, (Sr, Mg)$_3$(PO$_4$)$_2$:Sn$^{2+}$, and SrCaAlSiN$_3$:Eu.

Green Phosphor

The range of concrete wavelengths of fluorescence emitted by a phosphor that emits green fluorescence (hereinafter referred to as a "green phosphor" when appropriate) is exemplified as usually 490 nm or more, preferably 500 nm or more, and usually 570 nm or less, preferably 550 nm or less.

Such green phosphors include a europium activation alkaline earth silicon oxynitride phosphor represented by (Mg, Ca, Sr, Ba)Si$_2$O$_2$N$_2$:Eu and configured by fracture particles having a fracture surface to emit light in the green region and europium activation alkaline earth silicate phosphor represented by (Ba, Ca, Sr, Mg)$_2$SiO$_4$:Eu and configured by fracture particles having a fracture surface to emit light in the green region.

As other green phosphors, an Eu activation aluminate phosphor such as Sr$_4$Al$_{14}$O$_{25}$:Eu and (Ba, Sr, Ca) Al$_2$O$_4$:Eu, Eu activation silicate phosphor such as (Sr, Ba)Al$_2$Si$_2$O$_8$:Eu, (Ba, Mg)$_2$SiO$_4$:Eu, (Ba, Sr, Ca, Mg)$_2$SiO$_4$:Eu, and (Ba, Sr, Ca)$_2$(Mg, Zn)Si$_2$O$_7$:Eu; Ce, Tb activation silicate phosphor such as Y$_2$SiO$_5$:Ce, Tb, Eu activation boric acid phosphate phosphor such as Sr$_2$P$_2$O$_7$—Sr$_2$B$_2$O$_5$:Eu, Eu activation halosilicate phosphor such as Sr$_2$Si$_3$O$_8$-2SrCl$_2$:Eu, Mn activation silicate phosphor such as Zn$_2$SiO$_4$:Mn, Tb activation aluminate phosphor such as CeMgAl$_{11}$O$_{19}$:Tb and Y$_3$Al$_5$O$_{12}$:Tb, Tb activation silicate phosphor such as Ca$_2$Y$_8$(SiO$_4$)$_6$O$_2$:Tb and La$_3$Ga$_5$SiO$_{14}$:Tb; Eu, Tb, Sm activation thiogallate phosphor such as (Sr, Ba, Ca)Ga$_2$S$_4$:Eu, Tb, Sm; Ce activation aluminate phosphor such as Y$_3$ (Al, Ga)$_6$O$_{12}$:Ce and (Y, Ga, Tb, La, Sm, Pr, Lu)$_3$ (Al, Ga)$_5$O$_{12}$:Ce. Ce activation silicate phosphor such as Ca$_3$Sc$_2$Si$_3$O$_{12}$:Ce and Ca$_3$(Sc, Mg, Na, Li)$_2$Si$_3$O$_{12}$:Ce, Ce activation oxide phosphor such as CaSc$_2$O$_4$:Ce, Eu activation oxynitride phosphor such as SrSi$_2$O$_2$N$_2$:Eu, (Sr, Ba, Ca) Si$_2$O$_2$N$_2$:Eu, and Eu activation β-sialon and Eu activation α-sialon; Eu, Mn activation aluminate phosphor such as BaMgAl$_{10}$O$_{17}$:Eu, Mn; Eu activation aluminate phosphor such as SrAl$_2$O$_4$:Eu, Tb activation oxysulfide phosphor such as (La, Gd, Y)$_2$O$_2$S:Tb; Ce, Tb activation phosphate phosphor such as LaPO$_4$:Ce, Tb; sulfide phosphor such as ZnS:Cu, Al and ZnS:Cu, Au, Al; Ce, Tb activation borate phosphor such as (Y, Ga, Lu, Sc, La)BO$_3$:Ce, Tb; Na$_2$Gd$_2$B$_2$O$_7$:Ce, Tb; and (Ba, Sr)$_2$(Ca, Mg, Zn)B$_2$O$_6$:K, Ce, Tb; Eu, Mn activation halosilicate phosphor such as Ca$_8$Mg (SiO$_4$)$_4$Cl$_2$:Eu, Mn; Eu activation thioaluminate phosphor and thiogallate phosphor such as (Sr, Ca, Ba) (Al, Ga, In)$_2$S$_4$:Eu, and Eu, Mn activation halosilicate phosphor such as (Ca, Sr)$_8$(Mg, Zn) (SiO$_4$)$_4$Cl$_2$:Eu, Mn can also be used.

Also, organic phosphors such as a pyridine-phthalimide condensation derivative, fluorescent dyes such as benzooxazinone, quinazolinone, coumarin, quinophthalone, and naphthalate imide, and terbium complex having hexylsalicylate as a ligand can be used as a green phosphor.

Blue Phosphor

The range of concrete wavelengths of fluorescence emitted by a phosphor that emits blue fluorescence (hereinafter referred to as a "blue phosphor" when appropriate) is exemplified as usually 420 nm or more, preferably 440 nm or more, and usually 480 nm or less, preferably 470 nm or less.

Such blue phosphors include a europium activation barium-magnesium aluminate phosphor represented by BaMgAl$_{10}$O$_{17}$:Eu and configured by grown particles having approximately a hexagonal shape as a regular crystal growth shape to emit light in the blue region, europium activation calcium halophosphate phosphor represented by (Ca, Sr, Ba)$_5$(PO$_4$)$_3$Cl:Eu and configured by grown particles having approximately a spherical shape as a regular crystal growth shape to emit light in the blue region, europium activation alkaline earth chloroborate phosphor represented by (Ca, Sr, Ba)$_2$B$_5$O$_9$Cl:Eu and configured by grown particles having approximately a cubic shape as a regular crystal growth shape to emit light in the blue region, and europium activation alkaline earth aluminate phosphor represented by (Sr, Ca, Ba)Al$_2$O$_4$:Eu or (Sr, Ca, Ba)$_4$Al$_{14}$O$_{25}$:Eu and configured by fracture particles having a fracture shape to emit light in the blue region.

As other blue phosphors, an Sn activation phosphate phosphor such as Sr$_2$P$_2$O$_7$:Sn, Eu activation aluminate phosphor such as Sr$_4$Al$_{14}$O$_{25}$:Eu, BaMgAl$_{10}$O$_{17}$:Eu, and BaAl$_8$O$_{13}$:Eu, Ce activation thiogallate phosphor such as SrGa$_2$S$_4$:Ce and CaGa$_2$S$_4$:Ce, Eu activation aluminate phosphor such as (Ba, Sr, Ca) MgAl$_{10}$O$_{17}$:Eu and BaMgAl$_{10}$O$_{17}$:Eu, Tb, Sm; Eu, Mn activation aluminate phosphor such as (Ba, Sr, Ca)MgAl$_{10}$O$_{17}$:Eu, Mn; Eu activation halophosphate phosphor such as (Sr, Ca, Ba, Mg)$_{10}$(PO$_4$)$_6$Cl$_2$:Eu and (Ba, Sr, Ca)$_5$ (PO$_4$)$_3$ (Cl, F, Br, OH):Eu, Mn, Sb; Eu activation silicate phosphor such as BaAl$_2$Si$_2$O$_8$:Eu and (Sr, Ba)$_3$MgSi$_2$O$_8$:Eu, Eu activation phosphate phosphor such as Sr$_2$P$_2$O$_7$:Eu, sulfide phosphor such as ZnS:Ag and ZnS:Ag, Al; Ce activation silicate phosphor such as Y$_2$SiO$_5$:Ce, tungstate phosphor such as CaWO$_4$, Eu, Mn activation boric acid phosphate phosphor such as (Ba, Sr, Ca) BPO$_5$:Eu, Mn, (Sr, Ca)$_{10}$ (PO$_4$)$_6$.nB$_2$O$_3$:Eu, and 2SrO.0.84P$_2$O$_5$.0.16B$_2$O$_3$:Eu, and Eu activation halosilicate phosphor such as Sr$_2$Si$_3$O$_5$.2SrCl$_2$:Eu can also be used.

Also, organic phosphors such as a fluorescent dye of naphthalate imide, benzooxazole, styryl, coumarin, pilarizon, and triazole compounds and thulium complex can be used as a blue phosphor.

One phosphor may be used alone or two or more types of phosphors may be used in an arbitrary combination and ratio.

A media particle diameter of these phosphor particles is not particularly limited, but is usually 100 nm or more, preferably 2 μm or more, and still preferably 5 μm or more, and usually 100 μm or less, preferably 50 μm or less, and still preferably 20 μm or less. Also, the shape of phosphor particles is not particularly limited as long as formation of semiconductor light-emitting device members is not affected, for example, fluidity of a phosphor part formation liquid (liquid obtained by adding a phosphor to the above semiconductor light-emitting device member formation liquid) is not affected.

In the present invention, the method of adding phosphor particles is not particularly limited. If phosphor particles are in a good dispersion state, it is sufficient only to post-mix phosphor particles into the above semiconductor light-emitting device member formation liquid. If phosphor particles tend to aggregate, by mixing in advance phosphor particles into a reaction solution (hereinafter referred to as a "solution before hydrolysis" when appropriate) containing material compounds before hydrolysis to perform hydrolysis and polycondensation in the presence of phosphor particles, silane coupling processing is performed in part of the particle surface and the dispersion state of phosphor particles is improved Some types of phosphor are hydrolyzable. However, moisture content exists potentially as silanol bodies and almost no liberated moisture content exists in a liquid state (semiconductor light-emitting device member formation liquid) before coating of the semiconductor light-emitting device member in the present invention, and therefore such phosphors can also be used without being hydrolyzed. If the semiconductor light-emitting device member formation liquid after hydrolysis and polycondensation is used after performing dehydration/dealcoholization processing, an advantage of easily combining with such phosphors can also be obtained.

Further, the semiconductor light-emitting device member in the present invention can also be made fluorescent glass in which ionic phosphors and organic/inorganic fluorescent components are homogeneously/transparently dissolved/dispersed.

[V-2. Combined Use with Inorganic Oxide Particles]

In order to improve optical characteristics and workability, the semiconductor light-emitting device member in the present invention may further contain inorganic oxide particles for the purpose of obtaining any of effects <1> to <5> shown below.

<1> By mixing inorganic oxide particles as a light scattering substance into the semiconductor light-emitting device member to cause light of the semiconductor light-emitting device to scatter, the amount of light of semiconductor luminous elements incident on the phosphor is increased to improve efficiency of wavelength conversion and also the angle of spreading light from the semiconductor light-emitting device to the outside is increased.

<2> By blending the semiconductor light-emitting device member with inorganic oxide particles as a binder, cracks are prevented.

<3> By blending the semiconductor light-emitting device member formation liquid with inorganic oxide particles as a viscosity modifier, viscosity of the formation liquid is improved.

<4> By blending the semiconductor light-emitting device member with inorganic oxide particles, shrinkage thereof is reduced.

<5> By blending the semiconductor light-emitting device member with inorganic oxide particles, the refractive index thereof is adjusted to improve efficiency of extracting light.

In this case, it is only necessary to mix an appropriate amount of inorganic oxide particles into the semiconductor light-emitting device member formation liquid according to purposes together with phosphor particles. Effects obtained depend on the type and amount of inorganic oxide particles to be mixed.

If, for example, the inorganic oxide particle is ultrafine particle silica (manufactured by Nippon Aerosil Co., Ltd., commercial name: AEROSIL#200) with particle diameter of some 10 nm, the effect of the above <3> is noticeable because thixotropy of the semiconductor light-emitting device member formation liquid increases.

If the inorganic oxide particle is fractured silica or spherical silica whose diameter is several μm, the effects of the above <2> and <4> are noticeable because thixotropy hardly increases and instead the semiconductor light-emitting device member is focused in its working as an aggregate.

Also, if inorganic oxide particles of about 1 μm in diameter whose refractive index is different from that of the semiconductor light-emitting device member are used, the effect of the above <1> is noticeable because light scattering at an interface between the semiconductor light-emitting device member and inorganic oxide particles increases.

If inorganic oxide particles having the diameter of 3 to 5 nm, more specifically, equal to or less than the luminous wavelength whose refractive index is larger than that of the semiconductor light-emitting device member are used, the effect of the above <5> is noticeable because the refractive index can be improved while maintaining transparency of the semiconductor light-emitting device member.

Therefore, the type of inorganic oxide particles to be mixed may be selected according to purposes. Only one type of inorganic oxide particles may be selected or a plurality of types of inorganic oxide particles may be combined. Also, surface treatment may be provided using a surface treatment agent such as a silane coupling agent to improve dispersibility.

Exemplified types of inorganic oxide particles to be used include silica, barium titanate, titanium oxide, zirconium oxide, niobium oxide, aluminum oxide, cerium oxide, and yttrium oxide, but a selection can be made according to purposes and should not be limited to those mentioned above.

Inorganic oxide particles may be in any form according to purposes such as powder and slurry. However, if transparency must be maintained, it is preferable to equate the refractive index of inorganic oxide particles with that of the semiconductor light-emitting device member in the present invention or to add water/solvent transparent sol to the semiconductor light-emitting device member formation liquid.

[IV. Semiconductor Light-Emitting Device]

Semiconductor light-emitting devices using the semiconductor light-emitting device member in the present invention (semiconductor light-emitting devices in the present invention) will be described below with reference to embodiments. In each embodiment below, the semiconductor light-emitting device is abbreviated as a "luminescent device" when appropriate. In which part to use the semiconductor light-emitting device member in the present invention will be summarized after all embodiments have been described. However, these embodiments are used only for convenience of description and examples of luminescent devices (semiconductor light-emitting devices) to which the semiconductor light-emitting device member in the present invention is applied are not limited to these embodiments.

[Basic Concepts]

Semiconductor light-emitting devices using the semiconductor light-emitting device member in the present invention include application examples of A) and B) shown below. In each application example, compared with conventional semiconductor light-emitting device members, the semiconductor light-emitting device member in the present invention shows superiority in light durability and heat resistance, less frequent cracks and peeling, and less degradation in luminance. Therefore, members with high reliability for a long period of time can be provided by the semiconductor light-emitting device member in the present invention.

A) Semiconductor light-emitting devices using the luminescent color from a luminous element as it is B) Semiconductor light-emitting devices that emit light of desired wavelengths using fluorescence by arranging a phosphor part near a luminous element and causing a phosphor or phosphor components in the phosphor part to be excited by light from the luminous element In the application example of A), the semiconductor light-emitting device member in the present invention can be used singly as a highly durable sealing compound, light extracting film, and various functional component hold-back agents by utilizing high durability, transparency, and sealing compound properties of the semiconductor light-emitting device member in the present invention. Particularly when the semiconductor light-emitting device member in the present invention is used as a functional component hold-back agent for holding the above inorganic oxide particles and the semiconductor light-emitting device member in the present invention is caused to hold a transparent high-refraction component, reflection on a light exiting surface of the luminous element can be reduced to be able to enhance efficiency of extracting light by using the semiconductor light-emitting device member in the present invention in close contact with the light exiting surface of the luminous element and making the semiconductor light-emitting device member in the present invention to have the refractive index approximately equal to that of the luminous element.

Also, in the application example of B), the semiconductor light-emitting device member in the present invention can demonstrate superior capabilities similar to those of the above application example of A) and also form a phosphor part that is highly durable and extracts light with high efficiency by holding a phosphor or phosphor components. Further, by causing the semiconductor light-emitting device member in the present invention to hold a transparent high-refraction component together with the phosphor or phosphor components, interface reflection can be reduced to be able to enhance efficiency of extracting light by making the semiconductor light-emitting device member in the present invention to have the refractive index approximately equal to that of the luminous element or phosphor.

Figure 49A:
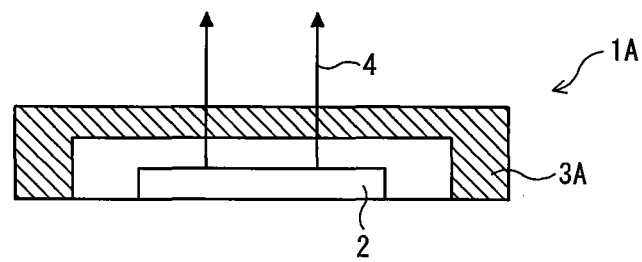
FIG. 49(a) and FIG. 49(b) are respectively explanatory views of basic concepts of each embodiment.
Figure 49B:
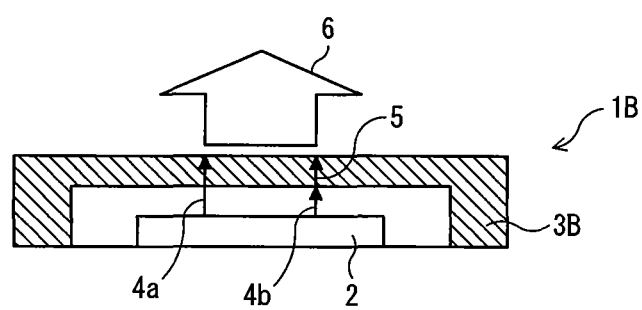

A basic concept of each embodiment to which the semiconductor light-emitting device member in the present invention is applied will be described below with reference to FIG. 49(a) and FIG. 49(b). FIG. 49(a) and FIG. 49(b) are explanatory views of the basic concept of each embodiment, and FIG. 49(a) corresponds to the above application example of A) and FIG. 49(b) corresponds to the above application example of B).

As shown FIG. 49(a) and FIG. 49(b), luminescent devices (semiconductor light-emitting devices) 1A and 1B of each embodiment comprises a luminous element 2 comprised of an LED chip and semiconductor light-emitting device members 3A and 3B in the present invention disposed near the luminous element 2.

However, in embodiments (embodiments A-1 and A-2) corresponding to the above application example of A), as shown in FIG. 49(a), the luminescent device 1A does not contain any phosphor or phosphor component in the semiconductor light-emitting device member 3A. In this case, the semiconductor light-emitting device member 3A performs various functions such as sealing the luminous element 2, extracting light, and holding functional components. In a description below, the semiconductor light-emitting device member 3A containing no phosphor or phosphor component will be called a "transparent member" when appropriate.

On the other hand, in embodiments (embodiments B-1 to B-40) corresponding to the above application example of B), as shown in FIG. 49(b), the luminescent device 1B contain a phosphor or phosphor component in the semiconductor light-emitting device member 3B. In this case, the semiconductor light-emitting device member 3B can perform, in additions to the functions that can be performed by the semiconductor light-emitting device member 3A in FIG. 49(a), the wavelength conversion function. In a description below, the semiconductor light-emitting device member 3B containing a phosphor or phosphor component will be called a "phosphor part" when appropriate. The phosphor part may be shown by numerals 33 and 34 according to its shape or functions when appropriate.

The luminous element 2 is comprised of an LED chip emitting blue light or ultraviolet light, but may be an LED chip of other luminescent color.

The transparent member 3A performs various functions such as the highly durable sealing compound of the luminous element 2, a light extracting film, and various function adding films. The transparent member 3A may be used alone, but excluding the phosphor and phosphor components, can be caused to contain any additive as long as effects of the present invention are not significantly impaired.

The phosphor part 3B, on the other hand, can perform not only functions such as the highly durable sealing compound of the luminous element 2, a light extracting film, and various function adding films, but also the wavelength conversion function that emits light of the desire wavelength after being excited by light from the luminous element 2. The phosphor part 3B needs only to contain at least a phosphor material that emits light of the desired wavelength after being excited by light from the luminous element 2. Examples of such a phosphor material include various phosphors exemplified above. Luminescent colors that can be emitted by the phosphor part 3B include white of a fluorescent lamp and yellow of a bulb, as well as three primary colors red (R), green (G), and blue (B). In summary, the phosphor part 3B has the wavelength conversion function for emitting light of the desired wavelength that is different from that of excitation light.

In the above luminescent device 1A shown in FIG. 49(a), light 4 emitted from the luminous element 2 passes through the transparent member 3A before being emitted out of the luminescent device 1A. Therefore, in the luminescent device 1A, the light 4 emitted from the luminous element 2 will be used unchanged in the luminescent color when emitted from the luminous element 2.

In the luminescent device 1B shown in FIG. 49(b), on the other hand, a portion of light 4a emitted from the luminous element 2 passes through the phosphor part 3B unchanged before being emitted out of the luminescent device 1B. Also in the luminescent device 1B, a remaining portion of the light 4b emitted from the luminous element 2 is absorbed by the phosphor part 3B so that the phosphor part 3B is excited and a light 5 of wavelength specific to fluorescent components such as phosphor particles, fluorescent ions, and fluorescent dyes contained in the phosphor part 3B is emitted out of the luminescent device 1B.

Therefore, a synthesized light 6 of the light 4a that has passed through the phosphor part 3B after being emitted from the luminous element 2 and the light 5 emitted from the phosphor part 3B will be emitted from the luminescent device 1B as wavelength converted light, and the luminescent color of the whole luminescent device 1B will be determined by the luminescent color of the luminous element 2 and that of the phosphor part 3B. The light 4a that passes through the phosphor part 3B after being emitted from the luminous element 2 is not necessarily needed.

A. Embodiments That do not Use Fluorescence

Embodiment A-1

In the luminescent device 1A in the present embodiment, as shown in FIG. 1, the luminous element 2 is surface-mounted on an insulating substrate 16 on which printed wiring 17 is carried out. In the luminous element 2, a p-type semiconductor layer (not shown) and an n-type semiconductor layer (not shown) in a luminous layer part 21 are connected electrically to the printed wiring 17 and 17 via conductive wires 15 and 15 respectively. The conductive wires 15 and 15 have a small cross section so that light emitted from the luminous element 2 should not be blocked.

Any luminous element 2 that emits light of wavelengths from ultraviolet to infrared regions may be used, but here a gallium nitride LED chip is assumed to be used. In the luminous element 2, the n-type semiconductor layer (not shown) is formed on a lower side in FIG. 1 and the p-type semiconductor layer (not shown) is formed on an upper side, and the upper side of FIG. 1 is assumed to a front for a description below because light output is extracted from the p-type semiconductor layer side.

A frame-shaped frame 18 encircling the luminous element 2 is fixed onto the insulating substrate 16 and a sealing part 19 for sealing/protecting the luminous element 2 is provided inside the frame 18. The sealing part 19 is formed of the transparent member 3A, which is the semiconductor light-emitting device member in the present invention, and can be formed by performing potting with the above semiconductor light-emitting device member formation liquid.

Thus, the luminescent device 1A in the present embodiment is provided with the luminous element 2 and transparent member 3A, and thus light durability and heat resistance of the luminescent device 1A can be improved. Moreover, since cracks and peeling are less likely to occur in the sealing part 3A, transparency in the sealing part 3A can be increased.

Further, light color unevenness and light color variations can be reduced and also efficiency of extracting light to the outside can be enhanced. That is, since the sealing part 3A can be made to be transparent without clouding and turbidity, the luminescent device 1A is superior in homogeneity of light color with almost no light color variation among luminescent devices 1A and can enhance efficiency of extracting light from the luminous element 2 to the outside when compared with a conventional one. Also, weather resistance of luminous material can be enhanced and thus the lifetime of the luminescent device 1A can be made longer.

Embodiment A-2

Figure 2:
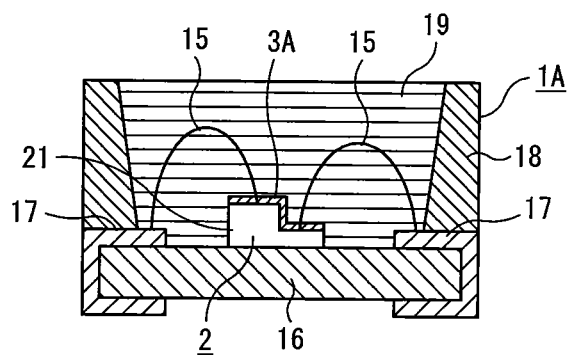
FIG. 2 is a schematic sectional view showing an embodiment A-2.

The luminescent device 1A in the present embodiment is structured, as shown in FIG. 2, in the same manner as the above embodiment A-1 except that the front of the luminous element 2 is covered with the transparent member 3A and the sealing part 19 is formed thereupon with a material different from that of the transparent member 3A. The transparent member 3A on the surface of the luminous element 2 is a transparent thin film functioning as a light extracting film and sealing film and can be formed, for example, by coating the above semiconductor light-emitting device member formation liquid using a spin coating when a chip of the luminous element 2 is formed. Meanwhile, the same numeral is attached to the same component as in the embodiment A-1 to omit a description thereof.

Thus, like the embodiment A-1, the luminescent device 1A in the present embodiment is provided with the luminous element 2 and transparent member 3A, and thus light durability and heat resistance of the luminescent device 1A can be improved. Moreover, since cracks and peeling are less likely to occur in the sealing part 3A, transparency in the sealing part 3A can be increased. Further, advantages like those of the embodiment A-1 can be obtained.

B. Embodiments Using Fluorescence

Embodiment B-1

Figure 3A:
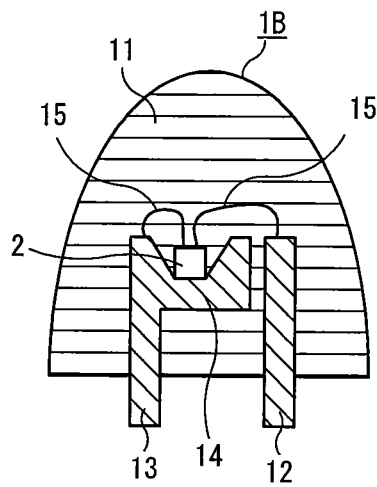
FIG. 3(a) is a schematic sectional view and FIG. 3(b) is a substantial section enlarged view.
Figure 3B:
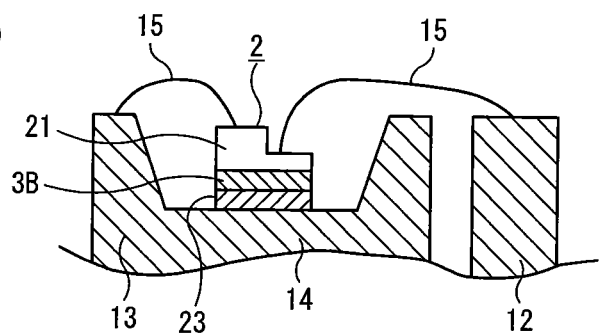

The luminescent device 1B in the present embodiment is provided, as shown in FIG. 3(*a*), with the luminous element 2 comprised of an LED chip and a mold part 11 obtained by forming a translucent transparent material into a cannonball shape. The mold part 11 covers the luminous element 2 and the luminous element 2 is electrically connected to lead terminals 12 and 13 formed of conductive material. The lead terminals 12 and 13 are formed of a lead frame.

In the luminous element 2, which is a gallium nitride LED chip, an n-type semiconductor layer (not shown) is formed on the lower side in FIG. 3(*a*) and a p-type semiconductor layer (not shown) is formed on the upper side, and the upper side of FIG. 3(*a*) and FIG. 3(*b*) is assumed to the front for a description below because light output is extracted from the p-type semiconductor layer side. A rear surface of the luminous element 2 is joined to a mirror (cup surface) 14 attached to a front end part of the lead terminal 13 by die bonding. The luminous element 2, in which the above p-type semiconductor layer and n-type semiconductor layer are connected to the conductive wires (for example, gold wires) 15 and 15 by bonding respectively, is electrically connected to the lead terminals 12 and 13 via the conductive wires 15 and 15. The conductive wires 15 and 15 have a small cross section so that light emitted from the luminous element 2 should not be blocked.

The mirror 14 has a function to reflect light emitted from both sides and the rear surface of the luminous element 2 in a front direction, and light emitted from the LED chip and that reflected by the mirror 14 in the front direction are emitted in the front direction via the front end part of the mold part 11 functioning as a lens. The mold part 11 covers the luminous element 2 along with the mirror 14, conductive wires 15 and 15, and part of the lead terminals 12 and 13 to prevent degradation of characteristics of the luminous element 2 due to reaction with moisture in the air. Rear end parts of the lead terminals 12 and 13 project from the rear surface of the mold part 11.

In the luminous element 2, as shown in FIG. 3(*b*), the luminous layer part 21 composed of a gallium nitride semiconductor is formed on the phosphor part 3B using a semiconductor process and a reflecting layer 23 is formed on the rear surface of the phosphor part 3B. Light from the luminous layer part 21 is emitted in all directions and part of the light absorbed by the phosphor part 3B excites the phosphor part 3B to emit light of the wavelength specific to the above fluorescent components. The light emitted from the phosphor part 3B is reflected by the reflecting layer 3 before being emitted in the front direction. Therefore, a synthesized light obtained by synthesizing light emitted from the luminous layer part 21 and that emitted from the phosphor part 3B will be obtained by the luminescent device 1B.

Thus, the luminescent device 1B in the present embodiment is provided with the luminous element 2 and the phosphor part 3B that emits light of the desired wavelength after being excited by light from the luminous element 2. Here, if the phosphor part 3B is superior in translucency, a portion of light emitted from the luminous element 2 is emitted unchanged to the outside and fluorescent components, which are mainly responsible for light emission, are excited by a remaining portion of the light emitted from the luminous element 2 to emit light specific to light emission of the fluorescent components to the outside. Thus, it becomes possible to obtain a synthesized light of light emitted from the luminous element 2 and that emitted from fluorescent components of the phosphor part 3B, and also to reduce light color unevenness and light color variations and to enhance efficiency of extracting light to the outside. That is, if the phosphor part 3B that is highly transparent and has neither clouding nor turbidity is used, the luminescent device 1B is superior in homogeneity of light color with almost no light color variation among luminescent devices 1B and can enhance efficiency of extracting light to the outside when compared with a conventional one. Also, weather resistance of luminous material can be enhanced and thus the lifetime of the luminescent device 1B can be made longer.

Also in the luminescent device 1B in the present embodiment, the phosphor part 3B serves also as a substrate forming the luminous element 2 and therefore fluorescent components in the phosphor part that are mainly responsible for light emission can efficiently be excited by part of light from the luminous element 2, enhancing luminance of light by light emission specific to the fluorescent components.

Embodiment B-2

Figure 4:
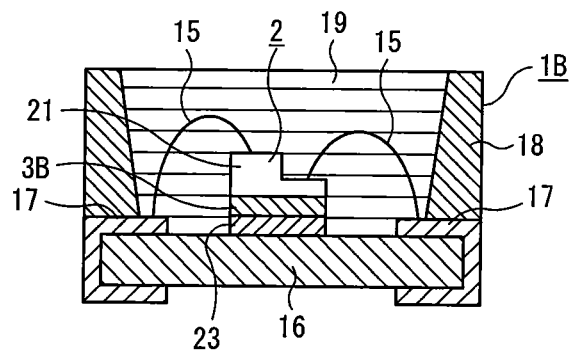
FIG. 4 is a schematic sectional view showing an embodiment B-2.

In the luminescent device 1B in the present embodiment, as shown in FIG. 4, the luminous element 2 is surface-mounted on the insulating substrate 16 on which the printed wiring 17 is carried out. Here, the luminous element 2 is structured in the same manner as in the embodiment B-1 in which the luminous layer part 21 composed of a gallium nitride semiconductor is formed on the phosphor part 3B and the reflecting layer 23 is formed on the rear surface of the phosphor part 3B. In the luminous element 2, a p-type semiconductor layer (not shown) and an n-type semiconductor layer (not shown) in the luminous layer part 21 are connected electrically to the printed wiring 17 and 17 via the conductive wires 15 and 15 respectively.

The frame-shaped frame 18 encircling the luminous element 2 is fixed onto the insulating substrate 16 and the sealing part 19 for sealing/protecting the luminous element 2 is provided inside the frame 18.

Thus, like the luminescent device 1B in the present embodiment is also provided with the luminous element 2 and the phosphor part 3B that emits light of the desired wavelength after being excited by light from the luminous element 2, and thus a synthesized light of light from the luminous element 2 and that from the phosphor can be obtained. Also, like the embodiment B-1, it becomes possible to reduce light color unevenness and light color variations and to enhance efficiency of extracting light to the outside, leading to a longer lifetime.

Embodiment B-3

Figure 5:
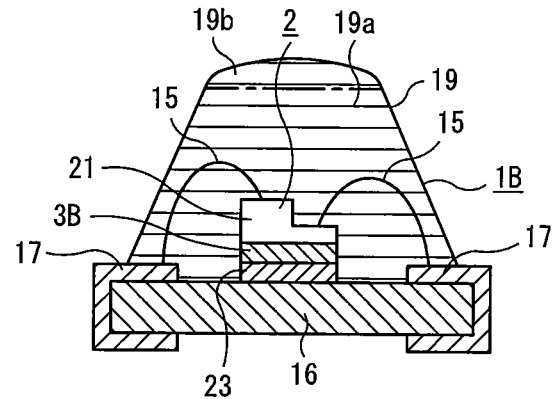
FIG. 5 is a schematic sectional view showing an embodiment B-3.

The luminescent device 1B in the present embodiment has a basic structure that is approximately the same as that in the embodiment B-2, but the frame 18 (See FIG. 4) described in the embodiment B-2 is not used and, as shown in FIG. 5, the shape of the sealing part 19 is different. Meanwhile, the same numeral is attached to the same component as in the embodiment B-2 to omit a description thereof.

The sealing part 19 in the present embodiment comprises a sealing function part 19a in a truncated cone shape for sealing the luminous element 2 and a lens function part 19b in a lens shape to function as a lens in the front end part of the sealing part 19.

Thus, like the embodiment B-1, the luminescent device 1B in the present embodiment reduce the number of components compared with the embodiment B-2, allowing miniaturization and weight reduction. Moreover, by providing the lens function part 19b functioning as a lens in part of the sealing part 19, distribution of light that is superior in directivity can be obtained.

Embodiment B-4

Figure 6:
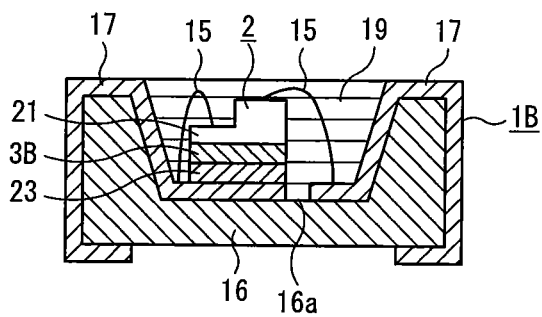
FIG. 6 is a schematic sectional view showing an embodiment B-4.

The luminescent device 1B in the present embodiment has a basic structure that is approximately the same as that in the embodiment B-2 and, as shown in FIG. 6, is characterized in that a hollow 16a for accommodating the luminous element 2 is provided on one surface (upper surface in FIG. 6) of the insulating substrate 16, the luminous element 2 is mounted at the bottom of the hollow 16a, and the sealing part 19 is provided inside the hollow 16a. Here, the printed wiring 17 and 17 formed in the insulating substrate 16 are extended to the bottom of the hollow 16a and electrically connected to the luminous layer part 21 composed of a gallium nitride semiconductor of the luminous element 2 via the conductive wires 15 and 15. Meanwhile, the same numeral is attached to the same component as in the embodiment B-2 to omit a description thereof.

Thus, the sealing part 19 of the luminescent device 1B in the present embodiment is formed by filling the hollow 16a formed on the upper surface of the insulating substrate 16 and therefore the sealing part 19 can be formed without using the frame 18 [see FIG. 5] described in the embodiment B-2 and the molding die described in the embodiment B-3, advantageously simplifying a sealing process of the luminous element 2 compared with the embodiments B-2 and B-3.

Embodiment B-5

Figure 7:
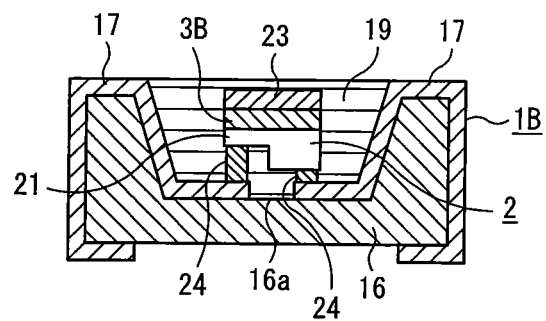
FIG. 7 is a schematic sectional view showing an embodiment B-5.

The luminescent device 1B in the present embodiment has a basic structure that is approximately the same as that in the embodiment B-4 and, as shown in FIG. 7, is characterized in that the luminous element 2 is so-called flip-chip-mounted on the insulating substrate 16. That is, the luminous element 2 is provided with bumps 24 and 24 made of conductive material on the surface side of a p-type semiconductor layer (not shown) and an n-type semiconductor layer (not shown) in the luminous layer part 21 respectively and the luminous layer part 21 is electrically connected face down to the printed wiring 17 and 17 of the insulating substrate 16 via the bumps 24 and 24. Therefore, in the luminous element 2 in the present embodiment, the luminous layer part 21 is disposed on the side nearest to the insulating substrate 16, the reflecting layer 23 is disposed on the side farthest from the insulating substrate 16, and the phosphor part 3B is sandwiched by the luminous layer part 21 and reflecting layer 23. Meanwhile, the same numeral is attached to the same component as in the embodiment B-4 to omit a description thereof.

In the luminescent device 1B in the present embodiment, light reflected by the reflecting layer 23 in a downward (back) direction in FIG. 7 is reflected by an inner circumferential surface of the hollow 16a before being reflected in an upward (front) direction. Here, it is desirable to separately provide a reflecting layer made of material whose refractive index is high in portions excluding the printed wiring 17 and 17 on the inner circumferential surface of the hollow 16a.

Thus, the luminescent device 1B in the present embodiment does not require the conductive wires 15 and 15 like the embodiment B-4 to connect the printed wiring 17 and 17 provided on the insulating substrate 16 and the luminous element 2, and therefore mechanical strength and reliability can be improved compared with the embodiment B-4.

Embodiment B-6

Figure 8:
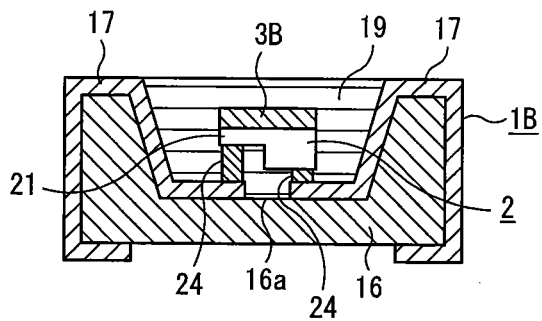
FIG. 8 is a schematic sectional view showing an embodiment B-6.

The luminescent device 1B in the present embodiment has a basic structure that is approximately the same as that in the embodiment B-5 and, as shown in FIG. 8, is different in that the reflecting layer 23 described in the embodiment B-5 is not provided. In other words, in the luminescent device 1B in the present embodiment, light emitted from the luminous layer part 21 and that emitted from the phosphor part 3B will be emitted in the front direction unchanged after passing through the sealing part 19. Meanwhile, the same numeral is attached to the same component as in the embodiment B-5 to omit a description thereof.

Thus, the luminescent device 1B in the present embodiment can reduce the number of components compared with the embodiment B-5, facilitating manufacture.

Embodiment B-7

Figure 9:
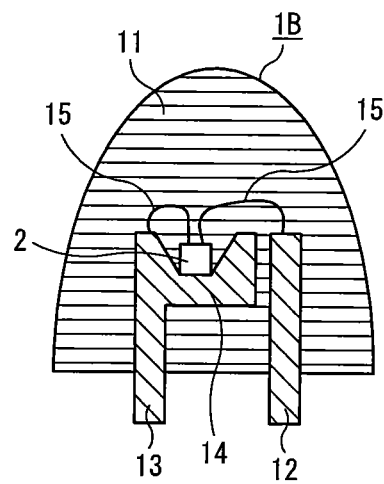
FIG. 9 is a schematic sectional view showing an embodiment B-7.

The luminescent device 1B in the present embodiment has a basic structure that is approximately the same as that in the embodiment B-1 and, as shown in FIG. 9, is characterized in that the mold part 11 covering the luminous element 2 is provided and the mold part 11 is formed integrally with a phosphor part. Meanwhile, the same numeral is attached to the same component as in the embodiment B-1 to omit a description thereof.

When manufacturing the luminescent device 1B in the present embodiment, the mold part 11 is formed by a method by which a product in progress without the mold part 11 is immersed in a molding die storing a phosphor part formation liquid and the phosphor part formation liquid (polycondensate) is cured.

Thus, the mold part 11 and the phosphor part are integrally formed in the present embodiment and therefore it becomes possible to enhance sealing properties, transparency, light resistance, and heat resistance of the mold part 11 and to control cracks and peeling accompanying long-term use by using the semiconductor light-emitting device member in the present invention as the phosphor part, as described later.

Embodiment B-8

Figure 10:
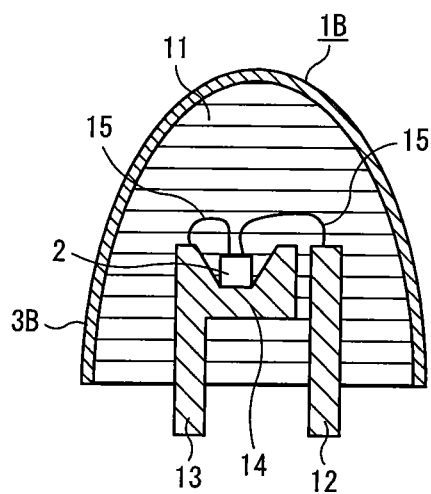
FIG. 10 is a schematic sectional view showing an embodiment B-8.

The luminescent device 1B in the present embodiment has a basic structure that is approximately the same as that in the embodiment B-1 and, as shown in FIG. 10, is characterized in that the cup-shaped phosphor part 3B whose rear surface is open is mounted on an outer surface of the mold part 11. That is, in the present embodiment, instead of providing the phosphor part 3B in the luminous element 2 like the embodiment B-1, the phosphor part 3B in a shape along an outer circumference of the mold part 11 is provided. Meanwhile, the same numeral is attached to the same component as in the embodiment B-1 to omit a description thereof.

The phosphor part 3B in the present embodiment may also be formed as a thin film by the method of causing a phosphor part formation liquid (polycondensate) to cure as described in the embodiment B-7 or a member obtained by molding a solid phosphor part like a cup in advance may be mounted on the mold part 11.

Thus, in the luminescent device 1B in the present embodiment, the amount of used material for the phosphor part can be reduced compared with a case in which the whole mold part 11 and phosphor part are integrally formed like the luminescent device 1B in the embodiment B-7, leading to lower costs.

Embodiment B-9

Figure 11:
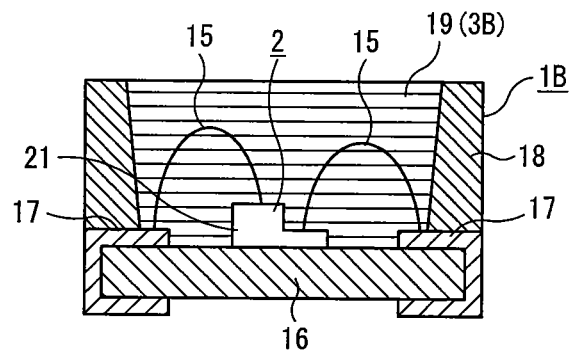
FIG. 11 is a schematic sectional view showing an embodiment B-9.

The luminescent device 1B in the present embodiment has a basic structure that is approximately the same as that in the embodiment B-2 and, as shown in FIG. 11, is characterized in that the frame-shaped frame 18 disposed to encircle the luminous element 2 on one surface (upper surface in FIG. 11) of the insulating substrate 16 is provided and the sealing part 19 inside the frame 18 is formed of a phosphor part similar to that of the phosphor part 3B described in the embodiment B-2. Meanwhile, the same numeral is attached to the same component as in the embodiment B-2 to omit a description thereof.

Thus, the sealing part 19 is formed of a phosphor part in the present embodiment and therefore it becomes possible to enhance sealing properties, transparency, light resistance, and heat resistance of the mold part 11 and to control cracks and peeling accompanying long-term use by using the semiconductor light-emitting device member in the present invention as the phosphor part, as described later.

Embodiment B-10

Figure 12:
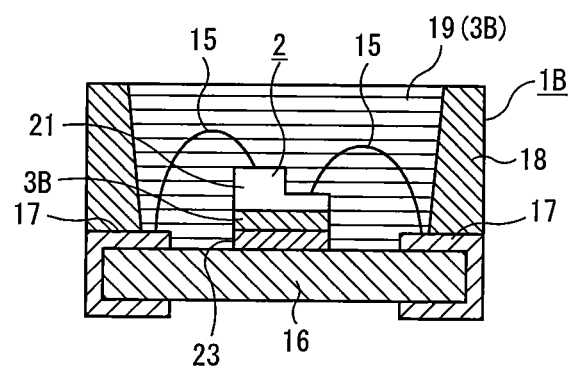
FIG. 12 is a schematic sectional view showing an embodiment B-10.

The luminescent device 1B in the present embodiment has a basic structure that is approximately the same as that in the embodiment B-2 and, as shown in FIG. 12, is characterized in that the frame-shaped frame 18 disposed to encircle the luminous element 2 on one surface (upper surface in FIG. 12) of the insulating substrate 16 is provided and the sealing part 19 inside the frame 18 is formed of a phosphor part similar to that of the phosphor part 3B described in the embodiment B-2. Meanwhile, the same numeral is attached to the same component as in the embodiment B-2 to omit a description thereof.

Thus, the sealing part 19 is formed of a phosphor part in the present embodiment and therefore, it becomes possible to enhance sealing properties, transparency, light resistance, and heat resistance of the mold part 11 and to control cracks and peeling accompanying long-term use by using the semiconductor light-emitting device member in the present invention as the phosphor part, as described later.

Also in the present embodiment, the phosphor part 3B is formed on the rear surface of the luminous layer part 21 in the luminous element 2 and the sealing part 19 covering the luminous element 2 is formed of a phosphor part and therefore, the phosphor part is present in all directions of the luminous layer part 21 in the luminous element 2, providing an advantage of being able to perform excitation and light emission of the phosphor part still more efficiently than the embodiment B-9.

Embodiment B-11

Figure 13:
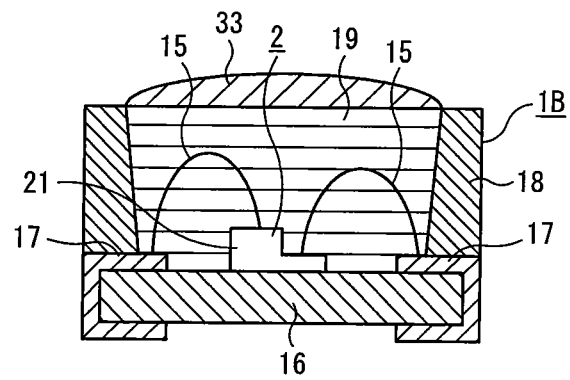
FIG. 13 is a schematic sectional view showing an embodiment B-11.

The luminescent device 1B in the present embodiment has a basic structure that is approximately the same as that in the embodiment B-2 and, as shown in FIG. 13, is characterized in that the phosphor part 33 formed in advance like a lens is disposed on the upper surface of the sealing part 19 made of translucent material. Here, the phosphor part 33 is made of material similar to that of the phosphor part 3B described in the embodiment B-2 and is used to emit light of the desired wavelength after being excited by light from the luminous element 2. Meanwhile, the same numeral is attached to the same component as in the embodiment B-2 to omit a description thereof.

Thus, in the luminescent device 1B in the present embodiment, the phosphor part 33 has not only the wavelength conversion function, but also a function as a lens so that directional control of light emission using a lens effect can be performed.

Embodiment B-12

Figure 14:
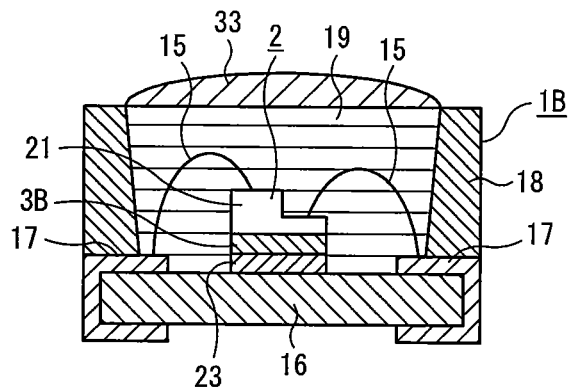
FIG. 14 is a schematic sectional view showing an embodiment B-12.

The luminescent device 1B in the present embodiment has a basic structure that is approximately the same as that in the embodiment B-2 and, as shown in FIG. 14, is characterized in that the phosphor part 33 formed in advance like a lens is disposed on the upper surface of the sealing part 19 made of translucent material. Here, the phosphor part 33 is made of material similar to that of the phosphor part 3B described in the embodiment B-2 and is used to emit light of the desired wavelength after being excited by light from the luminous element 2. Meanwhile, the same numeral is attached to the same component as in the embodiment B-2 to omit a description thereof.

Thus, in the luminescent device 1B in the present embodiment, the phosphor part 33 has not only the wavelength conversion function, but also a function as a lens so that directional control of light emission using a lens effect can be performed. Also in the present embodiment, the phosphor part 3B is formed on the rear surface of the luminous layer part 21 in the luminous element 2 and thus excitation and light emission of the phosphor part can advantageously be performed still more efficiently than the embodiment B-11.

Embodiment B-13

Figure 15:
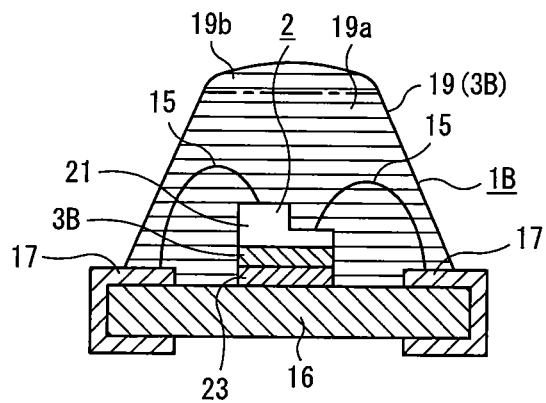
FIG. 15 is a schematic sectional view showing an embodiment B-13.

The luminescent device 1B in the present embodiment has a basic structure that is approximately the same as that in the embodiment B-3 and, as shown in FIG. 15, is characterized in that the sealing part 19 covering the luminous element 2 is provided on the upper surface side of the insulating substrate 16 and the sealing part 19 is formed of a phosphor part. Here, like the embodiment B-3, the sealing part 19 comprises the sealing function part 19a in a truncated cone shape for sealing the luminous element 2 and the lens function part 19b in a lens shape to function as a lens in the front end part of the sealing part 19. Meanwhile, the same numeral is attached to the same component as in the embodiment B-3 to omit a description thereof.

Thus, in the luminescent device 1B in the present embodiment, the sealing part 19 has not only the function to seal/protect the luminous element 2, but also the wavelength conversion function to convert wavelengths of light from the luminous element 2 and the lens function to control directivity of light emission. It is also possible to enhance weather resistance of the sealing part 19 to make its lifetime longer. Also in the present embodiment, the phosphor part 3B is formed on the rear surface of the luminous layer part 21 in the luminous element 2 and the sealing part 19 covering the luminous element 2 is formed of a phosphor part, and therefore the phosphor part is present in all directions of the luminous layer part 21 in the luminous element 2, providing an advantage of being able to perform excitation and light emission of the phosphor part still more efficiently than the embodiment B-12.

Embodiment B-14

Figure 16:
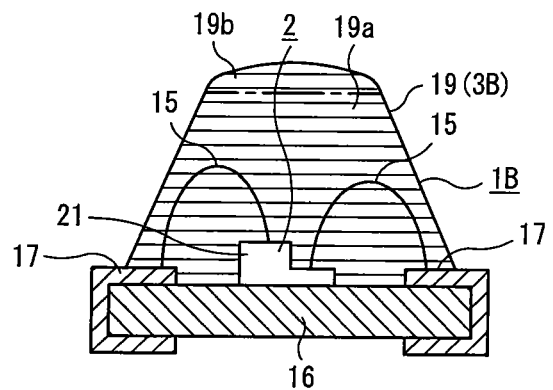
FIG. 16 is a schematic sectional view showing an embodiment B-14.

The luminescent device 1B in the present embodiment has a basic structure that is approximately the same as that in the embodiment B-3 and, as shown in FIG. 16, is characterized in that the sealing part 19 covering the luminous element 2 is provided on one side (upper side in FIG. 16) of the insulating substrate 16 and the sealing part 19 is formed of the phosphor part 3B. Here, like the embodiment B-3, the sealing part 19 comprises the sealing function part 19a in a truncated cone shape for sealing the luminous element 2 and the lens function part 19b in a lens shape to function as a lens in the front end part of the sealing part 19. Meanwhile, the same numeral is attached to the same component as in the embodiment B-3 to omit a description thereof.

Thus, in the luminescent device 1B in the present embodiment, the sealing part 19 has not only the function to seal/protect the luminous element 2, but also the wavelength conversion function to convert wavelengths of light from the luminous element 2 and the lens function to control directivity of light emission. It is also possible to enhance weather resistance of the sealing part 19 to make its lifetime longer.

Embodiment B-15

Figure 17:
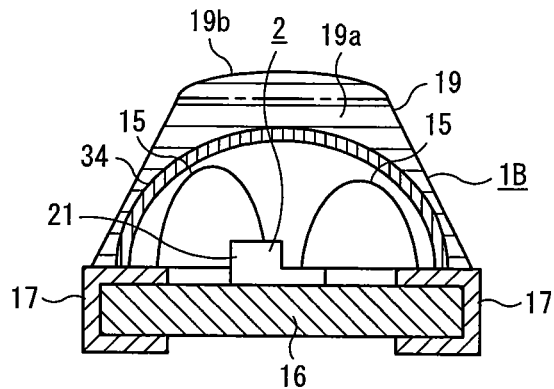
FIG. 17 is a schematic sectional view showing an embodiment B-15.

The luminescent device 1B in the present embodiment has a basic structure that is approximately the same as that in the embodiment B-3 and, as shown in FIG. 17, is characterized in that the dome-shaped phosphor part 34 covering the luminous element 2 is disposed on the upper surface side of the insulating substrate 16 and the sealing part 19 made of translucent resin is formed on the outer surface side of the phosphor part 34. Here, like the embodiment B-3, the sealing part 19 comprises the sealing function part 19a for sealing the luminous element 2 and the lens function part 19b in a lens shape to function as a lens in the front end part of the sealing part 19. Meanwhile, the same numeral is attached to the same component as in the embodiment B-3 to omit a description thereof.

Thus, the luminescent device 1B in the present embodiment can reduce the amount of used material for the phosphor part 34 compared with the embodiments B-13 and B-14. Also in the present embodiment, the dome-shaped phosphor part 34 covering the luminous element 2 is disposed and therefore degradation of the luminous element 2 due to moisture from outside or the like can more reliably be prevented by using the semiconductor light-emitting device member in the present invention as the phosphor part, as described later to make its lifetime longer.

Embodiment B-16

Figure 18:
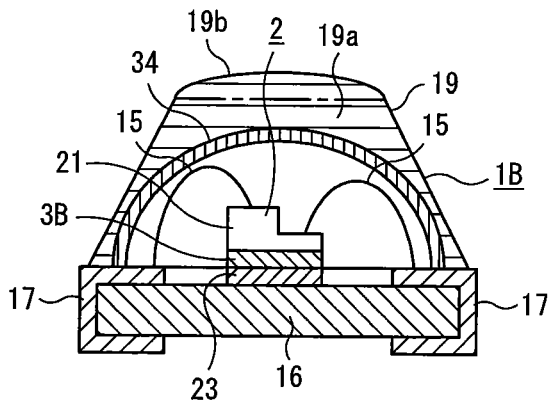
FIG. 18 is a schematic sectional view showing an embodiment B-16.

The luminescent device 1B in the present embodiment has a basic structure that is approximately the same as that in the embodiment B-3 and, as shown in FIG. 18, is characterized in that the dome-shaped phosphor part 34 covering the luminous element 2 is disposed on the upper surface side of the insulating substrate 16 and the sealing part 19 is formed on the outer surface side of the phosphor part 34. Here, like the embodiment B-3, the sealing part 19 comprises the sealing function part 19a for sealing the luminous element 2 and the lens function part 19b in a lens shape to function as a lens in the front end part of the sealing part 19. Meanwhile, the same numeral is attached to the same component as in the embodiment B-3 to omit a description thereof.

Thus, the luminescent device 1B in the present embodiment can reduce the amount of used material for the phosphor part 34 compared with the embodiments B-13 and B-14. Also in the present embodiment, the dome-shaped phosphor part 34 covering the luminous element 2 is disposed and therefore degradation of the luminous element 2 due to moisture from outside or the like can more reliably be prevented by using the semiconductor light-emitting device member in the present invention as the phosphor part, as described later to make its lifetime longer. Further, in the present embodiment, the phosphor part 3B is formed on the rear surface of the luminous layer part 21 in the luminous element 2 and the sealing part 19 covering the luminous element 2 is formed of a phosphor part, and therefore the phosphor part is present in all directions of the luminous layer part 21 in the luminous element 2, providing an advantage of being able to perform excitation and light emission of the phosphor part still more efficiently than the embodiment B-15.

Embodiment B-17

Figure 19:
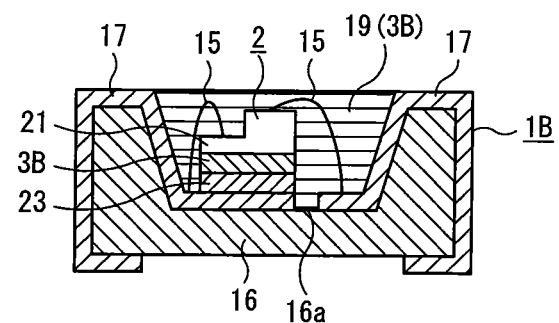
FIG. 19 is a schematic sectional view showing an embodiment B-17.

The luminescent device 1B in the present embodiment has a basic structure that is approximately the same as that in the embodiment B-4 and, as shown in FIG. 19, is characterized in that the sealing part 19 for sealing the luminous element 2 disposed at the bottom of the hollow 16a provided on one surface (upper surface in FIG. 19) of the insulating substrate 16 is provided and the sealing part 19 is formed of a phosphor part. Here, like the phosphor part 3B described in the embodiment B-1, the phosphor part emits light of the desired wavelength excited by light from the luminous element 2. Meanwhile, the same numeral is attached to the same component as in the embodiment B-4 to omit a description thereof.

Thus, in the luminescent device 1B in the present embodiment, the sealing part 19 is formed of a phosphor part and therefore, it becomes possible to enhance sealing properties, transparency, light resistance, and heat resistance of the sealing part 19 and to control cracks and peeling accompanying long-term use by using the semiconductor light-emitting device member in the present invention as the phosphor part, as described later. Also in the present embodiment, the phosphor part 3B is formed on the rear surface of the luminous layer part 21 in the luminous element 2 and the sealing part 19 covering the luminous element 2 is formed of the phosphor part 3B, and therefore the phosphor part is present in all directions of the luminous layer part 21 in the luminous element 2, providing an advantage of being able to perform excitation and light emission of the phosphor part still more efficiently than the embodiment B-15.

Embodiment B-18

Figure 20:
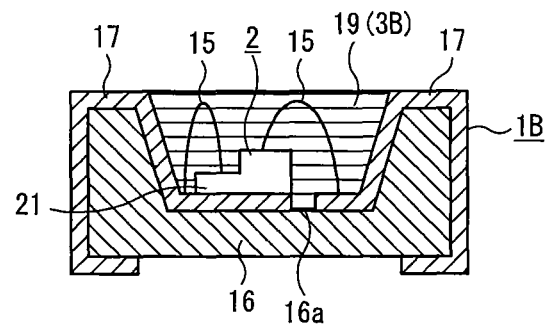
FIG. 20 is a schematic sectional view showing an embodiment B-18.

The luminescent device 1B in the present embodiment has a basic structure that is approximately the same as that in the embodiment B-4 and, as shown in FIG. 20, is characterized in that the sealing part 19 for sealing the luminous element 2 disposed at the bottom of the hollow 16a provided on one surface (upper surface in FIG. 20) of the insulating substrate 16 is provided and the sealing part 19 is formed of the phosphor part 3B. Here, like the phosphor part 3B described in the embodiment B-1, the phosphor part 3B emits light of the desired wavelength after being excited by light from the luminous element 2. Meanwhile, the same numeral is attached to the same component as in the embodiment B-4 to omit a description thereof.

Thus, in the luminescent device 1B in the present embodiment, the sealing part 19 is formed of a phosphor part and therefore, it becomes possible to enhance sealing properties, transparency, light resistance, and heat resistance of the sealing part 19 and to control cracks and peeling accompanying long-term use by using the semiconductor light-emitting device member in the present invention as the phosphor part 3B, as described later.

Embodiment B-19

Figure 21:
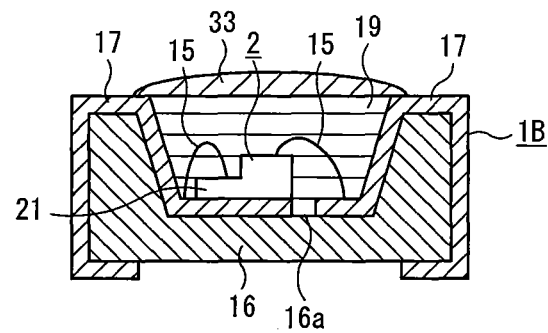
FIG. 21 is a schematic sectional view showing an embodiment B-19.

The luminescent device 1B in the present embodiment has a basic structure that is approximately the same as that in the embodiment B-4 and, as shown in FIG. 21, is characterized in that the phosphor part 33 formed in a lens shape in advance is disposed on the upper surface (light extraction surface) of the sealing part 19. Here, like the phosphor part 3B described in the embodiment B-1, the phosphor part 33 emits light of the desired wavelength after being excited by light from the luminous element 2. Meanwhile, the same numeral is attached to the same component as in the embodiment B-4 to omit a description thereof.

Thus, in the luminescent device 1B in the present embodiment, the phosphor part 33 has not only the wavelength conversion function, but also a function as a lens so that directional control of light emission using a lens effect can be performed.

Embodiment B-20

Figure 22:
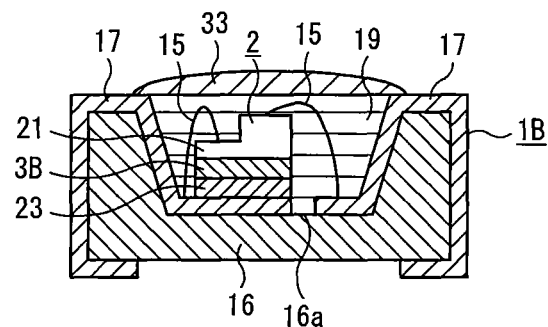
FIG. 22 is a schematic sectional view showing an embodiment B-20.

The luminescent device 1B in the present embodiment has a basic structure that is approximately the same as that in the embodiment B-4 and, as shown in FIG. 22, is characterized in that the phosphor part 33 formed in a lens shape in advance is disposed on the upper surface (light extraction surface) of the sealing part 19. Here, like the phosphor part 3B described in the embodiment B-1, the phosphor part 33 emits light of the desired wavelength after being excited by light from the luminous element 2. Meanwhile, the same numeral is attached to the same component as in the embodiment B-4 to omit a description thereof.

Thus, in the luminescent device 1B in the present embodiment, the phosphor part 33 has not only the wavelength conversion function, but also a function as a lens so that directional control of light emission using a lens effect can be performed. Also in the present embodiment, the phosphor part 3B is disposed also on the rear surface of the luminous layer part 21 in the luminous element 2 and therefore excitation and light emission of the phosphor part is performed still more efficiently than the embodiment B-19.

Embodiment B-21

Figure 23:
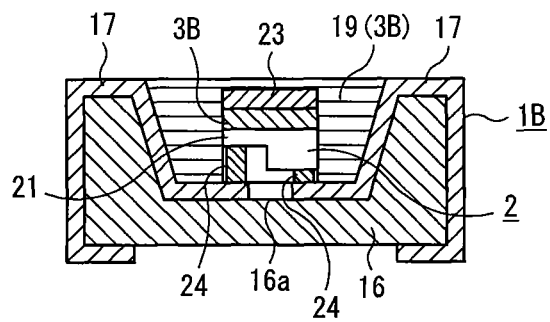
FIG. 23 is a schematic sectional view showing an embodiment B-21.
Figure 24:
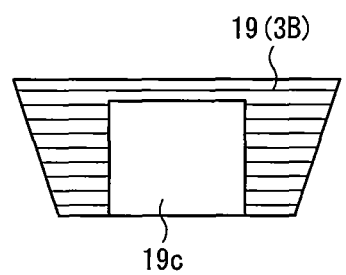
FIG. 24 is an relevant section enlarged view showing the embodiment B-21.

The luminescent device 1B in the present embodiment has a basic structure that is approximately the same as that in the embodiment B-5 and, as shown in FIG. 23, is characterized in that the sealing part 19 for sealing the luminous element 2 disposed at the bottom of the hollow 16a provided on one surface (upper surface in FIG. 23) of the insulating substrate 16 is provided and the sealing part 19 is formed of the phosphor part 3B. Here, as shown in FIG. 24, the sealing part 19, which is processed in advance to have a shape corresponding to the hollow 16a in its outer circumferential shape with a hollow 19c for accommodating the luminous element 2 at a position corresponding to the luminous element 2, is inserted into the hollow 16a of the insulating substrate 16 on which the luminous element 2 is mounted, and therefore the sealing process can be simplified. Like the phosphor part 3B described in the embodiment B-1, the phosphor part 3B forming the sealing part 19 emits light of the desired wavelength after being excited by light from the luminous element 2. Meanwhile, the same numeral is attached to the same component as in the embodiment B-5 to omit a description thereof.

Thus, in the luminescent device 1B in the present embodiment, the sealing part 19 is formed of a phosphor part and therefore, it becomes possible to enhance sealing properties, transparency, light resistance, and heat resistance of the sealing part 19 and to control cracks and peeling accompanying long-term use by using the semiconductor light-emitting device member in the present invention as the phosphor part 3B, as described later. Also in the present embodiment, light emitted in the front direction from the luminous layer part 21 in the luminous element 2 is once reflected by the reflecting layer 23 toward an inner bottom surface of the hollow 16a and therefore, by providing a reflecting layer on the inner bottom surface and inner circumferential surface of the hollow 16a, the reflected light will further be reflected by the inner bottom surface and inner circumferential surface before being emitted in the front direction, providing advantages of being able to take a longer light path and perform excitation and light emission more efficiently with the phosphor part 3B.

Embodiment B-22

Figure 25:
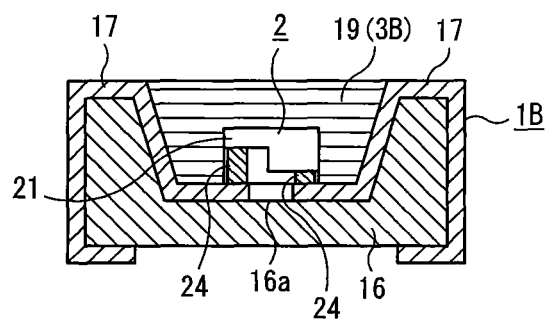
FIG. 25 is a schematic sectional view showing an embodiment B-22.
Figure 26:
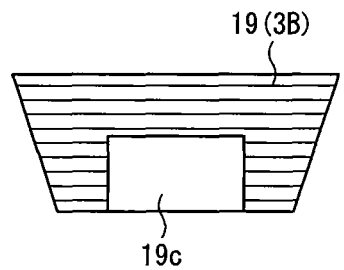
FIG. 26 is an relevant section enlarged view showing the embodiment B-22.

The luminescent device 1B in the present embodiment has a basic structure that is approximately the same as that in the embodiment B-5 and, as shown in FIG. 25, is characterized in that the sealing part 19 for sealing the luminous element 2 disposed at the bottom of the hollow 16a provided on one surface (upper surface in FIG. 25) of the insulating substrate 16 is provided and the sealing part 19 is formed of the phosphor part 3B. Here, as shown in FIG. 26, the sealing part 19, which is processed in advance to have a shape corresponding to the hollow 16a in its outer circumferential shape with the hollow 19c for accommodating the luminous element 2 at a position corresponding to the luminous element 2, is inserted into the hollow 16a of the insulating substrate 16 on which the luminous element 2 is mounted, and therefore the sealing process can be simplified. Like the phosphor part 3B described in the embodiment B-1, the phosphor part 3B forming the sealing part 19 emits light of the desired wavelength after being excited by light from the luminous element 2. Meanwhile, the same numeral is attached to the same component as in the embodiment B-5 to omit a description thereof.

Thus, in the luminescent device 1B in the present embodiment, the sealing part 19 is formed of the phosphor part 3B and therefore, it becomes possible to enhance sealing properties, transparency, light resistance, and heat resistance of the sealing part 19 and to control cracks and peeling accompanying long-term use by using the semiconductor light-emitting device member in the present invention as the phosphor part 3B, as described later.

Embodiment B-23

Figure 27:
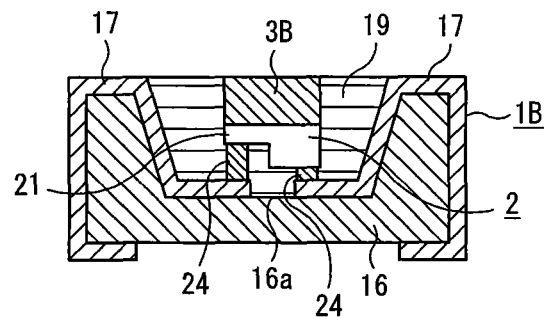
FIG. 27 is a schematic sectional view showing an embodiment B-23.

The luminescent device 1B in the present embodiment has a basic structure that is approximately the same as that in the embodiment B-6 and, as shown in FIG. 27, is characterized in that the phosphor part 3B processed like a rod in advance is disposed on the upper surface of the luminous element 2. Here, the sealing part 19 made of translucent material is formed around the luminous element 2 and phosphor part 3B, and one end surface (lower end surface in FIG. 27) of the phosphor part 3B is in close contact with the luminous layer part 21 in the luminous element 2 and another end surface (upper end surface in FIG. 27) is exposed. Meanwhile, the same numeral is attached to the same component as in the embodiment B-6 to omit a description thereof.

Figure 28:
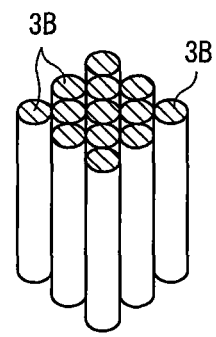
FIG. 28 is an relevant section enlarged view showing the embodiment B-23.

Thus, in the luminescent device 1B in the present embodiment, the phosphor part 3B whose one end surface is in close contact with the luminous layer part 21 in the luminous element 2 is formed like a rod and therefore, light emitted from the luminous layer part 21 can efficiently be absorbed into the phosphor part 3B through the one end surface of the phosphor part 3B before causing light of the phosphor part 3B excited by the absorbed light to efficiently emit to the outside through the other end surface of the phosphor part 3B. Meanwhile, only one phosphor part 3B is used in the present embodiment by forming the phosphor part 3B into a relatively major-diameter rod, but as shown in FIG. 28, the phosphor part 3B may be formed into a relatively minor-diameter fiber shape, a plurality of such phosphor parts 3B being arranged and disposed. Also, the sectional shape of the phosphor part 3B is not limited to a round shape and may be, for example, a rectangular shape or any other shape.

Embodiment B-24

Figure 29:
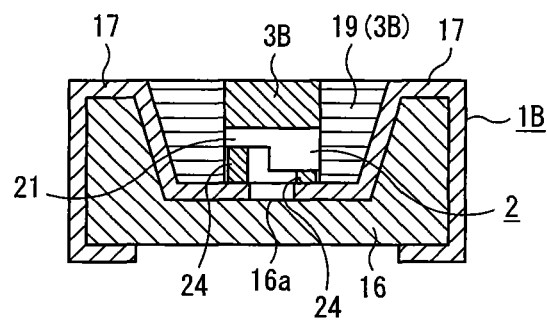
FIG. 29 is a schematic sectional view showing an embodiment B-24.
Figure 30:
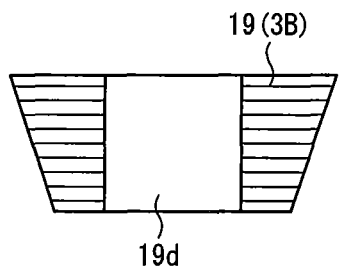
FIG. 30 is a relevant section enlarged view showing the embodiment B-24.

The luminescent device 1B in the present embodiment has a basic structure that is approximately the same as that in the embodiment B-23 and, as shown in FIG. 29, is characterized in that the sealing part 19 provided inside the hollow 16a of the insulating substrate 16 is provided and the sealing part 19 is formed of the phosphor part 3B. Here, as shown in FIG. 30, the sealing part 19, which is processed in advance to have a shape corresponding to the hollow 16a in its outer circumferential shape with the through-hole 19d for accommodating the luminous element 2 at a position corresponding to the luminous element 2, is inserted into the hollow 16a of the insulating substrate 16 on which the luminous element 2 is mounted, and therefore the sealing process can be simplified. Like the phosphor part 3B described in the embodiment B-1, the phosphor part 3B forming the sealing part 19 emits light of the desired wavelength after being excited by light from the luminous element 2. Meanwhile, the same numeral is attached to the same component as in the embodiment B-23 to omit a description thereof.

Figure 31:
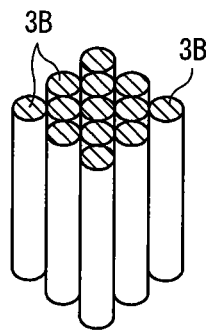
FIG. 31 is a relevant section perspective view showing the embodiment B-24.

Thus, in the luminescent device 1B in the present embodiment, the sealing part 19 is also formed of the phosphor part 3B and therefore it becomes possible to make the lifetime of the luminescent device 1B longer and light emission more efficient. Meanwhile, only one phosphor part 3B is used in the present embodiment by forming the phosphor part 3B into a relatively major-diameter rod, but as shown in FIG. 31, the phosphor part 3B may be formed into a relatively minor-diameter fiber shape, a plurality of such phosphor parts 38 being arranged and disposed. Also, the sectional shape of the phosphor part 3B is not limited to a round shape and may be, for example, a rectangular shape or any other shape.

Embodiment B-25

Figure 32:
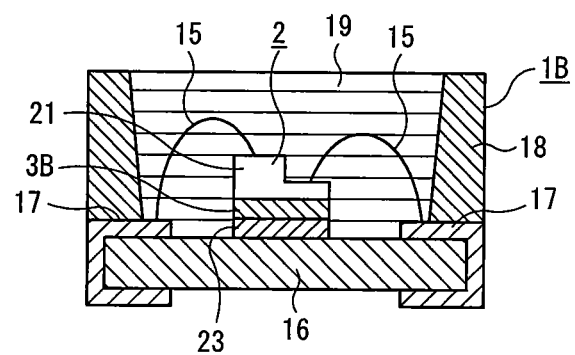
FIG. 32 is a schematic sectional view showing an embodiment B-25.

The luminescent device 1B in the present embodiment has a basic structure that is approximately the same as that in the embodiment B-2 and, as shown in FIG. 32, is characterized in that the frame 18 disposed on one surface (upper surface on FIG. 32) of the insulating substrate 16 is provided, the luminous layer part 21 in the luminous element 2 is made of AlGaN and emits near ultraviolet light, and phosphor powder (for example, powder of a YAG:$Ce^{3+}$ phosphor that emits yellow light after being excited by near ultraviolet light) is dispersed in translucent material used as the sealing part 19 inside the frame 18. In the present embodiment, fluorophosphate glass (for example, $P_2O_5 \cdot AlF_3 \cdot MgF \cdot CaF_2 \cdot SrF_2 \cdot BaCl_2$: $Eu^{2+}$ that emits blue light after being excited by near ultraviolet light) is used as the phosphor part 3B. Meanwhile, the same numeral is attached to the same component as in the embodiment B-2 to omit a description thereof.

Thus, in the luminescent device 1B in the present embodiment, phosphor powder that emits light after being excited by light from the luminous element 2 is dispersed in the sealing part 19 and therefore, light output of a synthesized light of light emitted from the luminous element 2, that emitted from the phosphor part 3B, and that emitted from the phosphor powder is obtained.

Consequently, by selecting material that emits near ultraviolet light as material of the luminous layer part 21 in the luminous element 2, both the phosphor part 3B and phosphor powder in the sealing part 19 will be excited by light emitted from the luminous element 2 to emit intrinsic light of each before a synthesized light of both is obtained. In the present embodiment, blue light is emitted from the phosphor part 3B and yellow light is emitted from the phosphor powder to obtain white light, which is different from both luminescent colors.

Only part of materials for existing phosphor powder those for existing phosphor particles in phosphor part can each emit light and a desired light color may not be obtainable by only one of the phosphor powder and phosphor part. In such a case, the present invention is very effective. That is, if desired light color characteristics cannot be obtained from the phosphor part 3B alone, the luminescent device 1B of the desired light color characteristics can be realized by also using phosphor powder having suitable light color characteristics the phosphor part 3B lacks as a complement. Though the luminescent color of the phosphor powder is made different from that of the phosphor part 3B in the present embodiment, by making the luminescent color of the phosphor powder identical to that of the phosphor part 33, it becomes possible to increase optical power and enhance efficiency of light emission because light emitted from the phosphor powder is superimposed on that emitted from the phosphor part 3B. Here, when the luminescent color of the phosphor part 3B and that of the phosphor powder are made approximately identical, red light emission, for example, can be made very efficient by using $P_2O_5.SrF_2.BaF_2:Eu^{3+}$ that emits red light as phosphor particles of the phosphor part 3B and $Y_2O_2S:Eu^{3+}$ that emits red light as the phosphor powder. This combination of the phosphor part 3B and phosphor powder is only an example and any other combination may naturally be adopted.

Embodiment B-26

Figure 33:
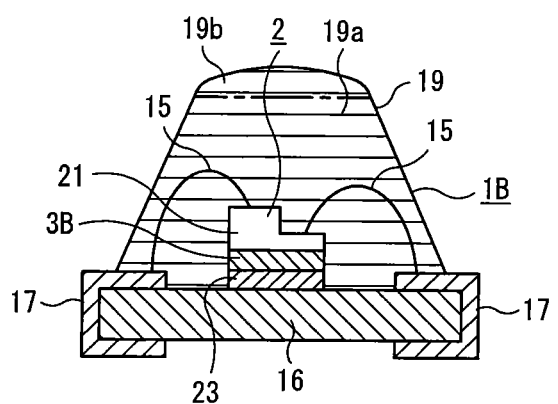
FIG. 33 is a schematic sectional view showing an embodiment B-26.

The luminescent device 1B in the present embodiment has a basic structure that is approximately the same as that in the embodiment B-3 and, as shown in FIG. 33, is characterized in that the sealing part 19 for sealing the luminous element 2 is provided on one surface (upper surface in FIG. 33) of the insulating substrate 16, the luminous layer part 21 in the luminous element 2 is made of AlGaN and emits near ultraviolet light, phosphor powder (for example, powder of a YAG:$Ce^{3+}$ phosphor that emits yellow light after being excited by near ultraviolet light) is dispersed in translucent material used as the sealing part 19, and the sealing part 19 functions as a phosphor part. In the present embodiment, fluorophosphate glass (for example, $P_2O_5.AlF_3.MgF.CaF_2.SrF_2.BaCl_2:Eu^{2+}$ that emits blue light after being excited by near ultraviolet light) is used as phosphor particles in the phosphor part 3B. Meanwhile, the same numeral is attached to the same component as in the embodiment B-3 to omit a description thereof.

Thus, in the luminescent device 1B in the present embodiment, like the embodiment B-25, phosphor powder that emits light after being excited by light from the luminous element 2 is dispersed in the sealing part 19 and therefore, light output of a synthesized light of light emitted from the luminous element 2, that emitted from the phosphor part 3B, and that emitted from the phosphor powder is obtained. That is, like the embodiment B-25, by selecting material that emits near ultraviolet light as material of the luminous layer part 21 in the luminous element 2, both the phosphor part 3B and phosphor powder in the sealing part 19 will be excited by light emitted from the luminous element 2 to emit intrinsic light of each before a synthesized light of both is obtained. Though the luminescent color of the phosphor powder is made different from that of the phosphor part 3B also in the present embodiment, by making the luminescent color of the phosphor powder identical to that of the phosphor part 3B, it becomes possible to increase optical power and enhance efficiency of light emission because light emitted from the phosphor powder is superimposed on that emitted from the phosphor part 3B.

Embodiment B-27

Figure 34:
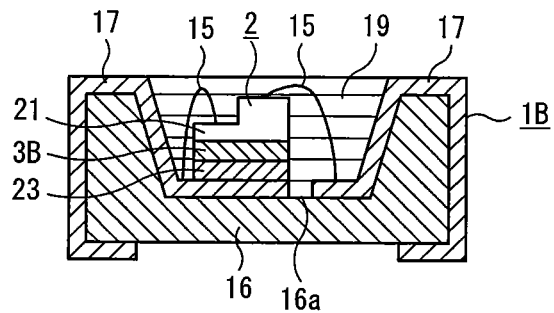
FIG. 34 is a schematic sectional view showing an embodiment B-27.

The luminescent device 1B in the present embodiment has a basic structure that is approximately the same as that in the embodiment B-4 and, as shown in FIG. 34, is characterized in that the sealing part 19 for sealing the luminous element 2 by filling up the hollow 16a formed on the upper surface of the insulating substrate 16 is provided, the luminous layer part 21 in the luminous element 2 is made of AlGaN and emits near ultraviolet light, phosphor powder (for example, powder of a YAG:$Ce^{3+}$ phosphor that emits yellow light after being excited by near ultraviolet light) is dispersed in translucent material used as the sealing part 19, and the sealing part 19 functions as a phosphor part. In the present embodiment, fluorophosphate glass (for example, $P_2O_5.AlF_3.MgF.CaF_2.SrF_2.BaCl_2:Eu^{2+}$ that emits blue light after being excited by near ultraviolet light) is used as phosphor particles in the phosphor part 3B. Meanwhile, the same numeral is attached to the same component as in the embodiment B-4 to omit a description thereof.

Thus, in the luminescent device 1B in the present embodiment, like the embodiment B-25, phosphor powder that emits light after being excited by light from the luminous element 2 is dispersed in the sealing part 19 and therefore, light output of a synthesized light of light emitted from the luminous element 2, that emitted from the phosphor part 3B, and that emitted from the phosphor powder is obtained. That is, like the embodiment B-25, by selecting material that emits near ultraviolet light as material of the luminous layer part 21 in the luminous element 2, both the phosphor part 3B and phosphor powder in the sealing part 19 will be excited by light emitted from the luminous element 2 to emit intrinsic light of each before a synthesized light of both is obtained. Though the luminescent color of the phosphor powder is made different from that of the phosphor part 3B also in the present embodiment, by making the luminescent color of the phosphor powder identical to that of the phosphor part 3B, it becomes possible to increase optical power and enhance efficiency of light emission because light emitted from the phosphor powder is superimposed on that emitted from the phosphor part 3B.

Embodiment B-28

Figure 35:
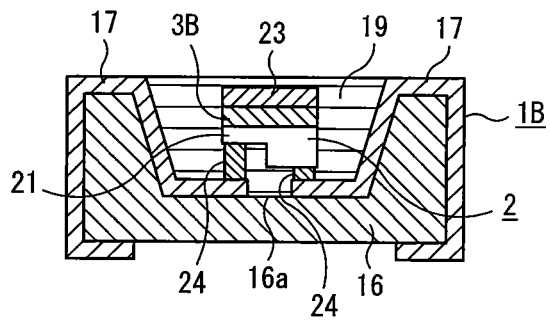
FIG. 35 is a schematic sectional view showing an embodiment B-28.

The luminescent device 1B in the present embodiment has a basic structure that is approximately the same as that in the embodiment B-5 and, as shown in FIG. 35, is characterized in that the sealing part 19 for sealing the luminous element 2 by filling up the hollow 16a formed on one surface (upper surface in FIG. 35) of the insulating substrate 16 is provided, the luminous layer part 21 in the luminous element 2 is made of AlGaN and emits near ultraviolet light, phosphor powder (for example, powder of a YAG:$Ce^{3+}$ phosphor that emits yellow light after being excited by near ultraviolet light) is dispersed in translucent material used as the sealing part 19, and the sealing part 19 functions as a phosphor part. In the present embodiment, fluorophosphate glass (for example, $P_2O_5.AlF_3.MgF.CaF_2.SrF_2.BaCl_2:Eu^{2+}$ that emits blue light after being excited by near ultraviolet light) is used as phosphor particles in the phosphor part 3B. Meanwhile, the same numeral is attached to the same component as in the embodiment B-5 to omit a description thereof.

Thus, in the luminescent device 1B in the present embodiment, like the embodiment B-25, phosphor powder that emits light after being excited by light from the luminous element 2 is dispersed in the sealing part 19 and therefore, light output of a synthesized light of light emitted from the luminous element 2, that emitted from the phosphor part 3B, and that emitted from the phosphor powder is obtained. That is, like the embodiment B-25, by selecting material that emits near ultraviolet light as material of the luminous layer part 21 in the luminous element 2, both the phosphor part 3B and phosphor powder in the sealing part 19 will be excited by light emitted from the luminous element 2 to emit intrinsic light of each before a synthesized light of both is obtained. Though the luminescent color of the phosphor powder is made different from that of the phosphor part 3B also in the present embodiment, by making the luminescent color of the phosphor powder identical to that of the phosphor part 3B, it becomes possible to increase optical power and enhance efficiency of light emission because light emitted from the phosphor powder is superimposed on that emitted from the phosphor part 3B.

Embodiment B-29

Figure 36:
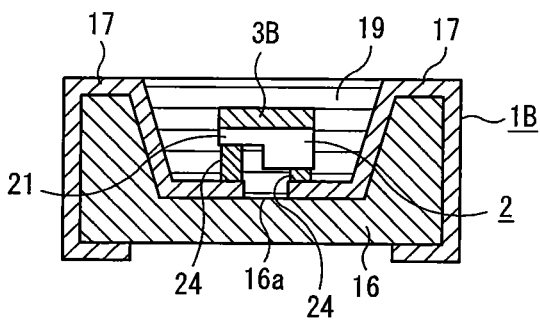
FIG. 36 is a schematic sectional view showing an embodiment B-29.

The luminescent device 1B in the present embodiment has a basic structure that is approximately the same as that in the embodiment B-6 and, as shown in FIG. 36, is characterized in that the sealing part 19 for sealing the luminous element 2 by filling up the hollow 16a formed on one surface (upper surface in FIG. 36) of the insulating substrate 16 is provided, the luminous layer part 21 in the luminous element 2 is made of AlGaN and emits near ultraviolet light, phosphor powder (for example, powder of a YAG:$Ce^{3+}$ phosphor that emits yellow light after being excited by near ultraviolet light) is dispersed in translucent material used as the sealing part 19, and the sealing part 19 functions as a phosphor part. In the present embodiment, fluorophosphate glass (for example, $P_2O_5.AlF_3.MgF.CaF_2.SrF_2.BaCl_2:Eu^{2+}$ that emits blue light after being excited by near ultraviolet light) is used as phosphor particles in the phosphor part 3B. Meanwhile, the same numeral is attached to the same component as in the embodiment B-6 to omit a description thereof.

Thus, in the luminescent device 1B in the present embodiment, like the embodiment B-25, phosphor powder that emits light after being excited by light from the luminous element 2 is dispersed in the sealing part 19 and therefore, light output of a synthesized light of light emitted from the luminous element 2, that emitted from the phosphor part 3B, and that emitted from the phosphor powder is obtained. That is, like the embodiment B-25, by selecting material that emits near ultraviolet light as material of the luminous layer part 21 in the luminous element 2, both the phosphor part 3B and phosphor powder in the sealing part 19 will be excited by light emitted from the luminous element 2 to emit intrinsic light of each before a synthesized light of both is obtained. Though the luminescent color of the phosphor powder is made different from that of the phosphor part 3B also in the present embodiment, by making the luminescent color of the phosphor powder identical to that of the phosphor part 3B, it becomes possible to increase optical power and enhance efficiency of light emission because light emitted from the phosphor powder is superimposed on that emitted from the phosphor part 3B.

Embodiment B-30

Figure 37A:
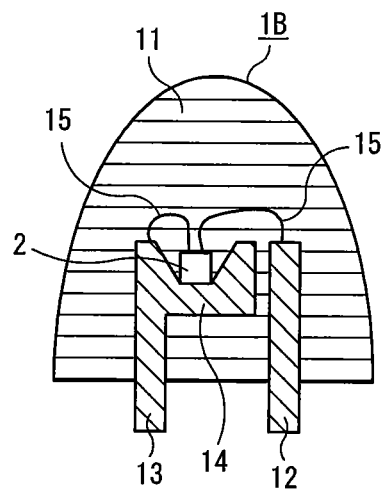
FIG. 37(a) is a schematic sectional view and FIG. 37(b) is a relevant section enlarged view.
Figure 37B:
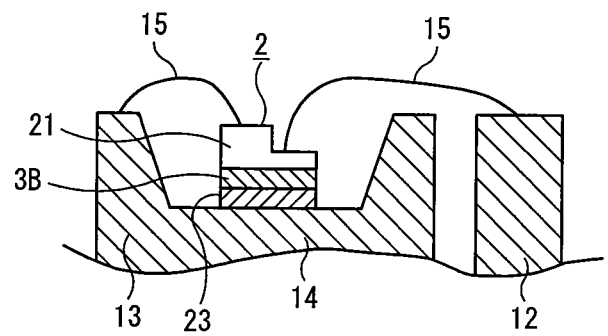

The luminescent device 1B in the present embodiment has a basic structure that is approximately the same as that in the embodiment B-1 and, as shown in FIG. 37(a) and FIG. 37(b), is characterized in that the cannonball-shaped mold part 11 is provided, the luminous layer part 21 in the luminous element 2 is made of AlGaN and emits near ultraviolet light, phosphor powder (for example, powder of a YAG:$Ce^{3+}$ phosphor that emits yellow light after being excited by near ultraviolet light) is dispersed in translucent material used as the mold part 11, and the mold part 11 functions as a phosphor part. In the present embodiment, fluorophosphate glass (for example, $P_2O_5.AlF_3.MgF.CaF_2.SrF_2.BaCl_2:Eu^{2+}$ that emits blue light after being excited by near ultraviolet light) is used as phosphor particles in the phosphor part 3B. Meanwhile, the same numeral is attached to the same component as in the embodiment B-1 to omit a description thereof.

Thus, in the luminescent device 1B in the present embodiment, like the embodiment B-25, phosphor powder that emits light after being excited by light from the luminous element 2 is dispersed in the mold part 11 and therefore, light output of a synthesized light of light emitted from the luminous element 2, that emitted from the phosphor part 3B, and that emitted from the phosphor powder is obtained. That is, like the embodiment B-25, by selecting material that emits near ultraviolet light as material of the luminous layer part 21 in the luminous element 2, both the phosphor part 3B and phosphor powder in the mold part 11 will be excited by light emitted from the luminous element 2 to emit intrinsic light of each before a synthesized light of both is obtained. Though the luminescent color of the phosphor powder is made different from that of the phosphor part 3B also in the present embodiment, by making the luminescent color of the phosphor powder identical to that of the phosphor part 3B, it becomes possible to increase optical power and enhance efficiency of light emission because light emitted from the phosphor powder is superimposed on that emitted from the phosphor part 3B.

Embodiment B-31

Figure 38:
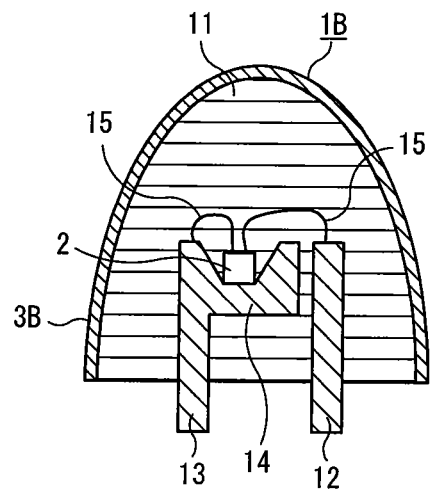
FIG. 38 is a schematic sectional view showing an embodiment B-31.

The luminescent device 1B in the present embodiment has a basic structure that is approximately the same as that in the embodiment B-8 and, as shown in FIG. 38, is characterized in that the cannonball-shaped mold part 11 is provided, the luminous layer part 21 (not illustrated in FIG. 38) in the luminous element 2 is made of AlGaN and emits near ultraviolet light, phosphor powder (for example, powder of a YAG:$Ce^{3+}$ phosphor that emits yellow light after being excited by near ultraviolet light) is dispersed in translucent material used as the mold part 11, and the mold part 11 functions as a phosphor part. In the present embodiment, fluorophosphate glass (for example, $P_2O_5.AlF_3.MgF.CaF_2.SrF_2.BaCl_2:Eu^{2+}$ that emits blue light after being excited by near ultraviolet light) is used as phosphor particles in the phosphor part 3B. Meanwhile, the same numeral is attached to the same component as in the embodiment B-8 to omit a description thereof.

Thus, in the luminescent device 1B in the present embodiment, like the embodiment B-25, phosphor powder that emits light after being excited by light from the luminous element 2 is dispersed in the mold part 11 and therefore, light output of a synthesized light of light emitted from the luminous element 2, that emitted from the phosphor part 3B, and that emitted from the phosphor powder is obtained. That is, like the embodiment B-25, by selecting material that emits near ultraviolet light as material of the luminous layer part 21 in the luminous element 2, both the phosphor part 3B and phosphor powder in the mold part 11 will be excited by light emitted from the luminous element 2 to emit intrinsic light of each before a synthesized light of both is obtained. Though the luminescent color of the phosphor powder is made different from that of the phosphor part 3B also in the present embodiment, by making the luminescent color of the phosphor powder identical to that of the phosphor part 3B, it becomes possible to increase optical power and enhance efficiency of light emission because light emitted from the phosphor powder is superimposed on that emitted from the phosphor part 3B.

Embodiment B-32

Figure 39:
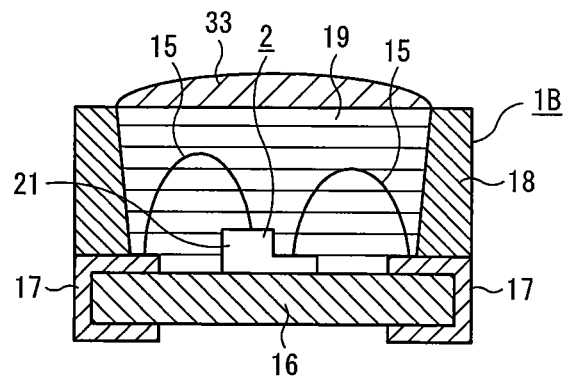
FIG. 39 is a schematic sectional view showing an embodiment B-32.

The luminescent device 1B in the present embodiment has a basic structure that is approximately the same as that in the embodiment B-11 and, as shown in FIG. 39, is characterized in that the sealing part 19 for sealing the luminous element 2 is provided on one surface (upper side in FIG. 39) of the insulating substrate 16, the luminous layer part 21 in the luminous element 2 is made of AlGaN and emits near ultraviolet light, phosphor powder (for example, powder of a YAG:Ce$^{3+}$ phosphor that emits yellow light after being excited by near ultraviolet light) is dispersed in translucent material used as the sealing part 19, and the sealing part 19 functions as a phosphor part. In the present embodiment, fluorophosphate glass (for example, $P_2O_5.AlF_3.MgF.CaF_2.SrF_2.BaCl_2$:Eu$^{2+}$ that emits blue light after being excited by near ultraviolet light) is used as phosphor particles in the phosphor part 3B. Meanwhile, the same numeral is attached to the same component as in the embodiment B-11 to omit a description thereof.

Thus, in the luminescent device 1B in the present embodiment, like the embodiment B-25, phosphor powder that emits light after being excited by light from the luminous element 2 is dispersed in the sealing part 19 and therefore, light output of a synthesized light of light emitted from the luminous element 2, that emitted from the phosphor part 3B, and that emitted from the phosphor powder is obtained. That is, like the embodiment B-25, by selecting material that emits near ultraviolet light as material of the luminous layer part 21 in the luminous element 2, both the phosphor part 3B and phosphor powder in the sealing part 19 will be excited by light emitted from the luminous element 2 to emit intrinsic light of each before a synthesized light of both is obtained. Though the luminescent color of the phosphor powder is made different from that of the phosphor part 3B also in the present embodiment, by making the luminescent color of the phosphor powder identical to that of the phosphor part 3B, it becomes possible to increase optical power and enhance efficiency of light emission because light emitted from the phosphor powder is superimposed on that emitted from the phosphor part 3B.

Embodiment B-33

Figure 40:
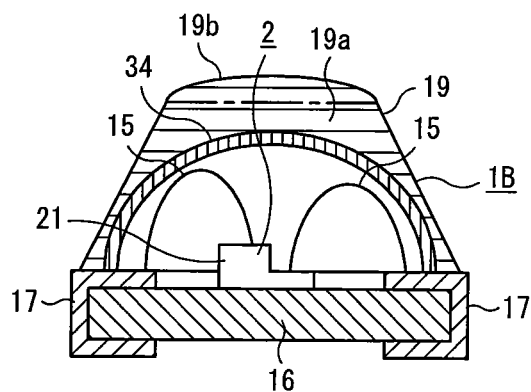
FIG. 40 is a schematic sectional view showing an embodiment B-33.

The luminescent device 1B in the present embodiment has a basic structure that is approximately the same as that in the embodiment B-15 and, as shown in FIG. 40, is characterized in that the sealing part 19 for sealing the luminous element 2 is provided on one surface (upper side in FIG. 40) of the insulating substrate 16, the luminous layer part 21 in the luminous element 2 is made of AlGaN and emits near ultraviolet light, phosphor powder (for example, powder of a YAG:Ce$^{3+}$ phosphor that emits yellow light after being excited by near ultraviolet light) is dispersed in translucent material used as the sealing part 19, and the sealing part 19 functions as a phosphor part. In the present embodiment, fluorophosphate glass (for example, $P_2O_5.AlF_3.MgF.CaF_2.SrF_2.BaCl_2$:Eu$^{2+}$ that emits blue light after being excited by near ultraviolet light) is used as phosphor particles in the phosphor part 3B. Meanwhile, the same numeral is attached to the same component as in the embodiment B-15 to omit a description thereof.

Thus, in the luminescent device 1B in the present embodiment, like the embodiment B-25, phosphor powder that emits light after being excited by light from the luminous element 2 is dispersed in the sealing part 19 and therefore, light output of a synthesized light of light emitted from the luminous element 2, that emitted from the phosphor part 3B, and that emitted from the phosphor powder is obtained. That is, like the embodiment B-25, by selecting material that emits near ultraviolet light as material of the luminous layer part 21 in the luminous element 2, both the phosphor part 3B and phosphor powder in the sealing part 19 will be excited by light emitted from the luminous element 2 to emit intrinsic light of each before a synthesized light of both is obtained. Though the luminescent color of the phosphor powder is made different from that of the phosphor part 3B also in the present embodiment, by making the luminescent color of the phosphor powder identical to that of the phosphor part 3B, it becomes possible to increase optical power and enhance efficiency of light emission because light emitted from the phosphor powder is superimposed on that emitted from the phosphor part 3B.

Embodiment B-34

Figure 41:
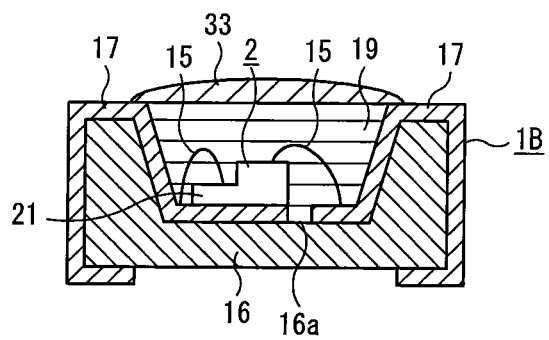
FIG. 41 is a schematic sectional view showing an embodiment B-34.

The luminescent device 1B in the present embodiment has a basic structure that is approximately the same as that in the embodiment B-19 and, as shown in FIG. 41, is characterized in that the sealing part 19 for sealing the luminous element 2 by filling up the hollow 16a formed on one surface (upper surface in FIG. 41) of the insulating substrate 16 is provided, the luminous layer part 21 in the luminous element 2 is made of AlGaN and emits near ultraviolet light, phosphor powder (for example, powder of a YAG:Ce$^{3+}$ phosphor that emits yellow light after being excited by near ultraviolet light) is dispersed in translucent material used as the sealing part 19, and the sealing part 19 functions as a phosphor part. In the present embodiment, fluorophosphate glass (for example, $P_2O_5.AlF_3.MgF.CaF_2.SrF_2.BaCl_2$:Eu$^{2+}$ that emits blue light after being excited by near ultraviolet light) is used as phosphor particles in the phosphor part 3B. Meanwhile, the same numeral is attached to the same component as in the embodiment B-19 to omit a description thereof.

Thus, in the luminescent device 1B in the present embodiment, like the embodiment B-25, phosphor powder that emits light after being excited by light from the luminous element 2 is dispersed in the sealing part 19 and therefore, light output of a synthesized light of light emitted from the luminous element 2, that emitted from the phosphor part 3B, and that emitted from the phosphor powder is obtained. That is, like the embodiment B-25, by selecting material that emits near ultraviolet light as material of the luminous layer part 21 in the luminous element 2, both the phosphor part 3B and phosphor powder in the sealing part 19 will be excited by light emitted from the luminous element 2 to emit intrinsic light of each before a synthesized light of both is obtained. Though the luminescent color of the phosphor powder is made different from that of the phosphor part 3B also in the present embodiment, by making the luminescent color of the phosphor powder identical to that of the phosphor part 3B, it becomes possible to increase optical power and enhance efficiency of light emission because light emitted from the phosphor powder is superimposed on that emitted from the phosphor part 3B.

Embodiment B-35

Figure 42:
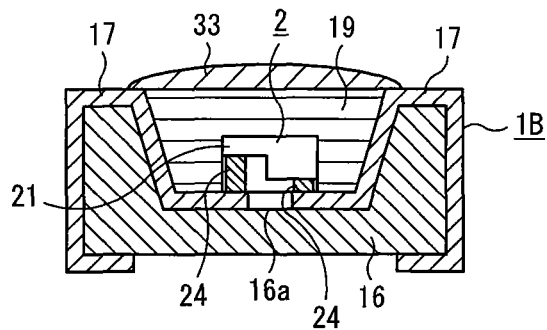
FIG. 42 is a schematic sectional view showing an embodiment B-35.

The luminescent device 1B in the present embodiment has a basic structure that is approximately the same as that in the embodiments B-12 and B-22 and, as shown in FIG. 42, is characterized in that the sealing part 19 for sealing the luminous element 2 by filling up the hollow 16a formed on one surface (upper surface in FIG. 42) of the insulating substrate 16 is provided, the luminous layer part 21 in the luminous element 2 is made of AlGaN and emits near ultraviolet light, phosphor powder (for example, powder of a YAG:$Ce^{3+}$ phosphor that emits yellow light after being excited by near ultraviolet light) is dispersed in translucent material used as the sealing part 19, and the sealing part 19 functions as a phosphor part. In the present embodiment, fluorophosphate glass (for example, $P_2O_5.AlF_3.MgF.CaF_2.SrF_2.BaCl_2:Eu^{2+}$ that emits blue light after being excited by near ultraviolet light) is used as phosphor particles in the phosphor part 3B. Meanwhile, the same numeral is attached to the same component as in the embodiments B-12 and B-22 to omit a description thereof.

Thus, in the luminescent device 1B in the present embodiment, like the embodiment B-25, phosphor powder that emits light after being excited by light from the luminous element 2 is dispersed in the sealing part 19 and therefore, light output of a synthesized light of light emitted from the luminous element 2, that emitted from the phosphor part 3B, and that emitted from the phosphor powder is obtained. That is, like the embodiment B-25, by selecting material that emits near ultraviolet light as material of the luminous layer part 21 in the luminous element 2, both the phosphor part 3B and phosphor powder in the sealing part 19 will be excited by light emitted from the luminous element 2 to emit intrinsic light of each before a synthesized light of both is obtained. Though the luminescent color of the phosphor powder is made different from that of the phosphor part 3B also in the present embodiment, by making the luminescent color of the phosphor powder identical to that of the phosphor part 3B, it becomes possible to increase optical power and enhance efficiency of light emission because light emitted from the phosphor powder is superimposed on that emitted from the phosphor part 3B.

Embodiment B-36

Figure 43:
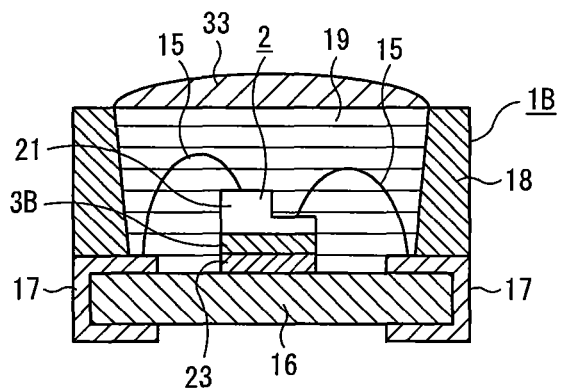
FIG. 43 is a schematic sectional view showing an embodiment B-36.

The luminescent device 1B in the present embodiment has a basic structure that is approximately the same as that in the embodiment B-12 and, as shown in FIG. 43, is characterized in that the sealing part 19 for sealing the luminous element 2 is provided on the upper surface of the insulating substrate 16, the luminous layer part 21 in the luminous element 2 is made of AlGaN and emits near ultraviolet light, phosphor powder (for example, powder of a YAG:$Ce^{3+}$ phosphor that emits yellow light after being excited by near ultraviolet light) is dispersed in translucent material used as the sealing part 19, and the sealing part 19 functions as a phosphor part. In the present embodiment, fluorophosphate glass (for example, $P_2O_5.AlF_3.MgF.CaF_2.SrF_2.BaCl_2:Eu^{2+}$ that emits blue light after being excited by near ultraviolet light) is used as phosphor particles in the phosphor part 3B. Meanwhile, the same numeral is attached to the same component as in the embodiment B-12 to omit a description thereof.

Thus, in the luminescent device 1B in the present embodiment, like the embodiment B-25, phosphor powder that emits light after being excited by light from the luminous element 2 is dispersed in the sealing part 19 and therefore, light output of a synthesized light of light emitted from the luminous element 2, that emitted from the phosphor part 3B, and that emitted from the phosphor powder is obtained. That is, like the embodiment B-25, by selecting material that emits near ultraviolet light as material of the luminous layer part 21 in the luminous element 2, both the phosphor part 3B and phosphor powder in the sealing part 19 will be excited by light emitted from the luminous element 2 to emit intrinsic light of each before a synthesized light of both is obtained. Though the luminescent color of the phosphor powder is made different from that of the phosphor part 3B also in the present embodiment, by making the luminescent color of the phosphor powder identical to that of the phosphor part 3B, it becomes possible to increase optical power and enhance efficiency of light emission because light emitted from the phosphor powder is superimposed on that emitted from the phosphor part 3B.

Embodiment B-37

Figure 44:
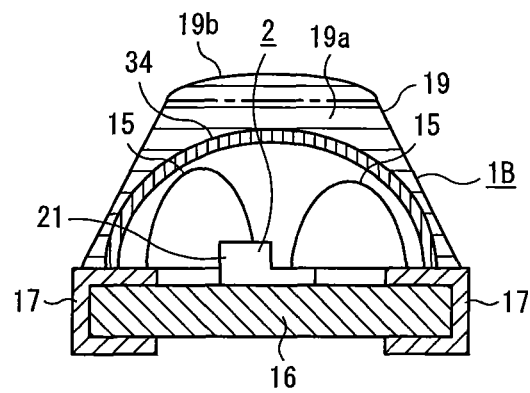
FIG. 44 is a schematic sectional view showing an embodiment B-37.

The luminescent device 1B in the present embodiment has a basic structure that is approximately the same as that in the embodiment B-16 and, as shown in FIG. 44, is characterized in that the sealing part 19 for sealing the luminous element 2 is provided on one surface (upper surface in FIG. 44) of the insulating substrate 16, the luminous layer part 21 in the luminous element 2 is made of AlGaN and emits near ultraviolet light, phosphor powder (for example, powder of a YAG:$Ce^{3+}$ phosphor that emits yellow light after being excited by near ultraviolet light) is dispersed in translucent material used as the sealing part 19, and the sealing part 19 functions as a phosphor part. In the present embodiment, fluorophosphate glass (for example, $P_2O_5.AlF_3.MgF.CaF_2.SrF_2.BaCl_2:Eu^{2+}$ that emits blue light after being excited by near ultraviolet light) is used as phosphor particles in the phosphor part 3B. Meanwhile, the same numeral is attached to the same component as in the embodiment B-16 to omit a description thereof.

Thus, in the luminescent device 1B in the present embodiment, like the embodiment B-25, phosphor powder that emits light after being excited by light from the luminous element 2 is dispersed in the sealing part 19 and therefore, light output of a synthesized light of light emitted from the luminous element 2, that emitted from the phosphor part 3B, and that emitted from the phosphor powder is obtained. That is, like the embodiment B-25, by selecting material that emits near ultraviolet light as material of the luminous layer part 21 in the luminous element 2, both the phosphor part 3B and phosphor powder in the sealing part 19 will be excited by light emitted from the luminous element 2 to emit intrinsic light of each before a synthesized light of both is obtained. Though the luminescent color of the phosphor powder is made different from that of the phosphor part 3B also in the present embodiment, by making the luminescent color of the phosphor powder identical to that of the phosphor part 3B, it becomes possible to increase optical power and enhance efficiency of light emission because light emitted from the phosphor powder is superimposed on that emitted from the phosphor part 3B.

Embodiment B-38

Figure 45:
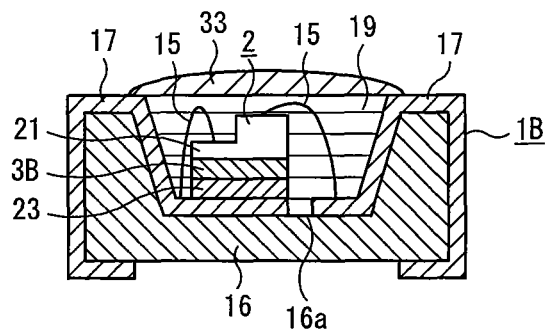
FIG. 45 is a schematic sectional view showing an embodiment B-38.

The luminescent device 1B in the present embodiment has a basic structure that is approximately the same as that in the embodiment B-20 and, as shown in FIG. 45, is characterized in that the sealing part 19 for sealing the luminous element 2 by filling up the hollow 16a formed on one surface (upper surface in FIG. 45) of the insulating substrate 16 is provided, the luminous layer part 21 in the luminous element 2 is made of AlGaN and emits near ultraviolet light, phosphor powder (for example, powder of a YAG:$Ce^{3+}$ phosphor that emits yellow light after being excited by near ultraviolet light) is dispersed in translucent material used as the sealing part 19, and the sealing part 19 functions as a phosphor part. In the present embodiment, fluorophosphate glass (for example, $P_2O_5.AlF_3.MgF.CaF_2.SrF_2.BaCl_2$:$Eu^{2+}$ that emits blue light after being excited by near ultraviolet light) is used as phosphor particles in the phosphor part 3B. Meanwhile, the same numeral is attached to the same component as in the embodiment B-20 to omit a description thereof.

Thus, in the luminescent device 1B in the present embodiment, like the embodiment B-25, phosphor powder that emits light after being excited by light from the luminous element 2 is dispersed in the sealing part 19 and therefore, light output of a synthesized light of light emitted from the luminous element 2, that emitted from the phosphor part 3B, and that emitted from the phosphor powder is obtained. That is, like the embodiment B-25, by selecting material that emits near ultraviolet light as material of the luminous layer part 21 in the luminous element 2, both the phosphor part 3B and phosphor powder in the sealing part 19 will be excited by light emitted from the luminous element 2 to emit intrinsic light of each before a synthesized light of both is obtained. Though the luminescent color of the phosphor powder is made different from that of the phosphor part 3B also in the present embodiment, by making the luminescent color of the phosphor powder identical to that of the phosphor part 3B, it becomes possible to increase optical power and enhance efficiency of light emission because light emitted from the phosphor powder is superimposed on that emitted from the phosphor part 3B.

Embodiment B-39

Figure 46:
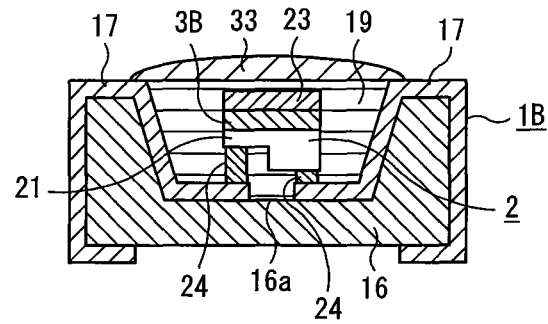
FIG. 46 is a schematic sectional view showing an embodiment B-39.

The luminescent device 1B in the present embodiment has a basic structure that is approximately the same as that in the embodiments B-5 and B-12 and, as shown in FIG. 46, is characterized in that the sealing part 19 for sealing the luminous element 2 by filling up the hollow 16a formed on one surface (upper surface in FIG. 46) of the insulating substrate 16 is provided, the luminous layer part 21 in the luminous element 2 is made of AlGaN and emits near ultraviolet light, phosphor powder (for example, powder of a YAG:$Ce^{3+}$ phosphor that emits yellow light after being excited by near ultraviolet light) is dispersed in translucent material used as the sealing part 19, and the sealing part 19 functions as a phosphor part. In the present embodiment, fluorophosphate glass (for example, $P_2O_5.AlF_3.MgF.CaF_2.SrF_2.BaCl_2$:$Eu^{2+}$ that emits blue light after being excited by near ultraviolet light) is used as phosphor particles in the phosphor part 3B. Meanwhile, the same numeral is attached to the same component as in the embodiments B-5 and B-12 to omit a description thereof.

Thus, in the luminescent device 1B in the present embodiment, like the embodiment B-25, phosphor powder that emits light after being excited by light from the luminous element 2 is dispersed in the sealing part 19 and therefore, light output of a synthesized light of light emitted from the luminous element 2, that emitted from the phosphor part 3B, and that emitted from the phosphor powder is obtained. That is, like the embodiment B-25, by selecting material that emits near ultraviolet light as material of the luminous layer part 21 in the luminous element 2, both the phosphor part 3B and phosphor powder in the sealing part 19 will be excited by light emitted from the luminous element 2 to emit intrinsic light of each before a synthesized light of both is obtained. Though the luminescent color of the phosphor powder is made different from that of the phosphor part 3B also in the present embodiment, by making the luminescent color of the phosphor powder identical to that of the phosphor part 3B, it becomes possible to increase optical power and enhance efficiency of light emission because light emitted from the phosphor powder is superimposed on that emitted from the phosphor part 3B.

Embodiment B-40

Figure 47:
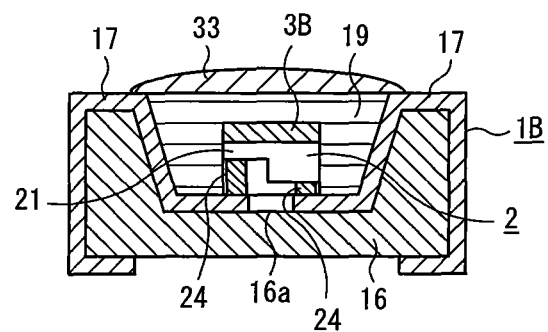
FIG. 47 is a schematic sectional view showing an embodiment B-40.

The luminescent device 1B in the present embodiment has a basic structure that is approximately the same as that in the embodiments B-20 and B-21 and, as shown in FIG. 47, is characterized in that the sealing part 19 for sealing the luminous element 2 by filling up the hollow 16a formed on one surface (upper surface in FIG. 47) of the insulating substrate 16 is provided, the luminous layer part 21 in the luminous element 2 is made of AlGaN and emits near ultraviolet light, phosphor powder (for example, powder of a YAG:$Ce^{3+}$ phosphor that emits yellow light after being excited by near ultraviolet light) is dispersed in translucent material used as the sealing part 19, and the sealing part 19 functions as a phosphor part. In the present embodiment, fluorophosphate glass (for example, $P_2O_5.AlF_3.MgF.CaF_2.SrF_2.BaCl_2$:$Eu^{2+}$ that emits blue light after being excited by near ultraviolet light) is used as phosphor particles in the phosphor part 3B. Meanwhile, the same numeral is attached to the same component as in the embodiments B-20 and B-21 to omit a description thereof.

Thus, in the luminescent device 1B in the present embodiment, like the embodiment B-25, phosphor powder that emits light after being excited by light from the luminous element 2 is dispersed in the sealing part 19 and therefore, light output of a synthesized light of light emitted from the luminous element 2, that emitted from the phosphor part 3B, and that emitted from the phosphor powder is obtained. That is, like the embodiment B-25, by selecting material that emits near ultraviolet light as material of the luminous layer part 21 in the luminous element 2, both the phosphor part 3B and phosphor powder in the sealing part 19 will be excited by light emitted from the luminous element 2 to emit intrinsic light of each before a synthesized light of both is obtained. Though the luminescent color of the phosphor powder is made different from that of the phosphor part 3B also in the present embodiment, by making the luminescent color of the phosphor powder identical to that of the phosphor part 3B, it becomes possible to increase optical power and enhance efficiency of light emission because light emitted from the phosphor powder is superimposed on that emitted from the phosphor part 3B.

Figure 48:
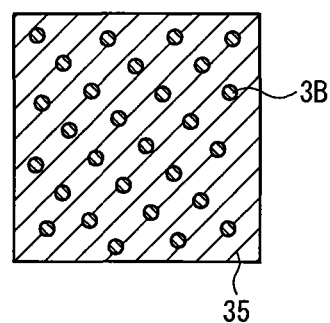
FIG. 48 is an explanatory view of another configuration example of a relevant section of each embodiment.

Meanwhile, in the above embodiments, the phosphor part 3B is processed into desired forms or formed by the sol gel method, but as shown in FIG. 48, by using a solid medium 35 made of translucent material in which a large number of the phosphor parts 3B formed as a sphere whose diameter is a little larger than the visible wavelengths are dispersed, instead of the phosphor parts in the above embodiments, the amount of used material for the phosphor part can be reduced while maintaining transparency of the phosphor part in the visible wavelength range, leading to lower costs.

Though the luminescent device 1B in each of the above embodiments has only one luminous element 2, one unit of module may naturally be constituted by a plurality of luminous elements 2 to arrange a phosphor part as luminous material close to at least part of modules. For a luminescent device provided with the cannonball-shaped mold part 11 described in the embodiment B-1, for example, a plurality of luminescent devices may be implemented on the same printed board to constitute one unit of module. Also, for a surface-mounted luminescent device described in the embodiment B-2, for example, a plurality of the luminous elements 2 may be arranged on the same insulating substrate 16 to constitute one unit of module.

[Application of the Semiconductor Light-Emitting Device Member]

In the luminescent devices (semiconductor light-emitting devices) 1A and 1B of each embodiment A-1, A-2, and B-1 to B-40 described above, the position to which the semiconductor light-emitting device member in the present invention is applied is not particularly limited. Examples in which the semiconductor light-emitting device member in the present invention is applied as members forming the transparent member 3A and the phosphor parts 3B, 33, and 34 have been shown in the above embodiments, and in addition, the semiconductor light-emitting device member in the present invention can also be suitably used as members forming, for example, the above mold part 11, frame 18, and sealing part 19. By using the semiconductor light-emitting device member in the present invention as these members, various effects such as the above superior sealing properties, transparency, light resistance, heat resistance, control of cracks and peeling accompanying long-term use and the like can be obtained.

When applying the semiconductor light-emitting device member in the present invention, it is preferable to alter the shape when appropriate in accordance with the position to which the present invention is applied. When the present invention is applied to the phosphor parts 3B, 33, and 34, for example, the above fluorescent components such as phosphor particles, phosphor ions, and fluorescent dyes may be used by mixing the fluorescent components into the semiconductor light-emitting device member in the present invention. This brings about an effect of enhancing maintainability of the phosphor, in addition to the above-mentioned various effects.

Since the semiconductor light-emitting device member in the present invention is highly durable, the member can seal luminous elements (such as LED chips) as a sealing material (inorganic adhesive use) superior in light durability (UV durability) and heat resistance even when the member is used alone without phosphor.

If the above inorganic oxide particles are used by mixing the particles into the semiconductor light-emitting device member in the present invention, the effects mentioned above in a description of combined use of inorganic oxide particles can be obtained, in addition to the above-mentioned various effects. Particularly if adjusted to a refractive index close to that of the luminous element by combined use of inorganic oxide particles, the member acts as a suitable light extracting film.

[Uses of Semiconductor Light-Emitting Devices]

Semiconductor light-emitting devices can be used, for example, for luminescent devices. To use a semiconductor light-emitting device for a luminescent device, it is necessary only to place a phosphor-containing layer containing a mixture of a red phosphor, blue phosphor, and green phosphor over a light source. In this case, the red phosphor, blue phosphor, and green phosphor need not be necessarily mixed in the same layer and, for example, a layer containing the red phosphor may be stacked on top of a layer containing the blue phosphor and green phosphor.

In a luminescent device, a phosphor-containing layer can be provided on a light source. The phosphor-containing layer can be provided as a contact layer between the light source and sealing resin part, a coating layer outside the sealing resin part, or a coating layer inside an outside cap. A form in which a phosphor is contained inside sealing resin may also be adopted.

The semiconductor light-emitting device member in the present invention can be used as the sealing resin to be used. Other types of resin also may be used. Such types of resin usually include thermoplastic resin, thermosetting resin, and photo-setting resin. More specifically, examples include methyl methacrylate such as polymethacrylate methyl; styrene resin such as polystyrene, styrene-acrylonitrile copolymers; polycarbonate resin; polyester resin; phenoxy resin; butyral resin; polyvinyl alcohol; cellulose resin such as ethyl cellulose, cellulose acetate, and cellulose acetate butyrate; epoxy resin; phenol resin; and silicone resin. Also, inorganic material, for example, metal alkoxide and ceramic precursor polymer, a solution obtained after hydrolysis/polymerization of a solution containing metal alkoxide by the sol gel method, or inorganic material obtained by curing a combination of such inorganic material such as inorganic material containing siloxane bond may be used.

The amount of used phosphor for binder resin is not particularly limited, but is usually 0.01 to 100 part by weight with respect to the binder resin 100 weight section, preferably 0.1 to 80 weight section, still preferably 1 to 60 weight section.

Also, the sealing resin can be made to contain color tone correcting dyes, antioxidants, processing/oxidization and heat stabilizers such as phosphorous processing stabilizers, light resistance stabilizers such as ultraviolet absorbers, and silane coupling agents.

Any light source that emits light whose peak wavelength is in the range of 350 nm to 500 nm may be used, and a light-emitting diode (LED) and laser diode (LD) can be cited as concrete examples. Among others, GaN LEDs and LDs using GaN compound semiconductors are preferable. This is because GaN LEDs and LDs, whose radiant power output and external quantum effects are far greater than those of SiC LEDs, can give bright luminescence with very low power in combination with the phosphors. For current load of 20 mA, for example, GaN LEDs and LDs usually have luminescence intensity 100 times or higher than that of SiC LEDs. Among GaN LEDs and LDs, those having an $Al_xGaYN$ luminous layer, GaN luminous layer, or $In_xGaYN$ luminous layer is preferable. Among GaN LEDs, those having the $In_xGaYN$ luminous layer are particularly preferable because luminescence intensity thereof is very high, and among GaN LDs, those having a multiple quantum well structure of the $In_x$-GaYN luminous layer and GaN luminous layer are particularly preferable because luminescence intensity thereof is very high.

X+Y shown above usually takes a value in the range of 0.8 to 1.2. In GaN LEDs, these luminous layers doped with Zn or Si or without doping are preferable for adjusting luminescent characteristics.

GaN LEDs have basic components of the luminous layer, p layer, n layer, electrodes, and substrate, and those with a hetero structure in which the luminous layer is sandwiched by the n-type and p-type $Al_xGaYN$ layers, GaN layers, or $In_x$-GaYN layers have high luminous efficiency and are preferable and those whose hetero structure is replaced by a quantum well structure have higher luminous efficiency and are still preferable.

The luminescent device emits white light, and whose luminous efficiency is 20 lm/W or more, preferably 22 lm/W or more, still preferably 25 lm/W or more, and particularly preferably 28 lm/W or more, and whose average color rendering performance index Ra is 80 or more, preferably 85 or more, and still preferably 88 or more.

The luminescent device can be used alone or by a combination of a plurality of luminescent devices, for example, as a lighting lamp, back light for LCD and the like, various kinds of illuminators such as ultra-thin-type illumination, and an image display device.

EXAMPLES

The present invention will be described more specifically below by using some examples, but these examples are for describing the present invention and do not intend to limit the present invention to these aspects.

1. Examples Relating to the First Semiconductor Light-Emitting Device Member (Like Elastomer)

Analysis Method

Analyses were performed according to the following procedure for semiconductor light-emitting device members of each example and each comparative example described later.

[Luminance Improvement Rate]

Luminance of each semiconductor light-emitting device obtained in the example and comparative examples was compared on a wavelength of 405 nm before and after forming the semiconductor light-emitting device member.

[Solid Si-NMR Spectrum Measurement and Silanol Content Calculation]

Solid Si-NMR spectrum measurement and waveform separation analysis of semiconductor light-emitting device members of each example and each comparative example were performed under the following conditions. The full width at half maximum of each peak was determined for the semiconductor light-emitting device member of each example and each comparative example from the obtained waveform data. The ratio (%) of silicon atoms in silanol to all silicon atoms was determined from the ratio of peak areas originating from silanol to all peak areas and was compared with a silicon content analyzed separately to determine the silanol content.

<Device Conditions>

Device: Infinity CMX-400 nuclear magnetic resonance spectroscope manufactured by Chemagnetics
$^{29}Si$ resonance frequency: 79.436 MHz
Probe: 7.5 mm φ CP/MAS probe
Temperature: Room temperature
Rotational frequency of sample: 4 kHz
Measuring method: Single pulse method
$^1H$ decoupling frequency: 50 kHz
$^{29}Si$ flip angle: 90°
$^{29}Si$ 90° pulse width: 5.0 μs
Repetition time: 600 s
Total count: 128 times
Observation width: 30 kHz
Broadening factor: 20 Hz <Data Processing Method>

For the semiconductor light-emitting device members of Example 1-1 and Comparative Examples 1-1, 1-3, and 1-4, 512 points were taken in as measured data and zero-filled to 8192 points before Fourier transformation was performed. For the semiconductor light-emitting device member of Comparative Example 1-2 composed of silicone resin, 2048 points were taken in as measured data and zero-filled to 8192 points before Fourier transformation is performed because peaks were very sharp.

<Waveform Separation Analysis Method>

For each peak after Fourier transformation, an optimization calculation was performed by the nonlinear least square method using the center position, height, and full width at half maximum of a peak shape created by a Lorentz waveform, Gauss waveform, or a mixture of both as variable parameters.

For identification of a peak, AIChE Journal, 44(5), p. 1141, 1998 was referred to.

[Hardness Measurement]

Hardness (Shore A) of each semiconductor light-emitting device member of the example and comparative examples was measured based on JIS K6253 using an A-type (durometer type A) rubber hardness scale manufactured by Kori Seiki MFG. Co., Ltd.

[Transmittance Measurement]

Transmittance was measured using a singly cured film with a smooth surface of about 0.5 mm in thickness of the semiconductor light-emitting device member of each example and each comparative example without scattering by defects or unevenness at wavelengths of 200 nm to 800 nm by an ultraviolet spectrophotometer (UV-3100 manufactured by Shimadzu Corporation). Table 4 shows transmittance on the wavelength of 405 nm.

[UV Test]

A sample of 5 cm in diameter and about 0.5 mm in thickness of the semiconductor light-emitting device member of each example and each comparative example prepared by using a Teflon (registered trademark) petri dish was irradiated with ultraviolet rays and film conditions before and after irradiation were compared.

Irradiation equipment: Accelerated light resistance test apparatus manufactured by Suga Test Instruments Co., LTd.—Metering weather meter MV30

Irradiation wavelength: 255 nm or longer. Main wavelengths are in the range of 300 nm to 450 nm (with emission lines in 480 nm to 580 nm)

Irradiation time: 72 hours

[Heat Test]

A sample of 5 cm in diameter and about 0.5 mm in thickness of each semiconductor light-emitting device member of the example and comparative examples prepared by using a Teflon (registered trademark) petri dish was kept in a forced-air drier at temperature 250° C. for five days. Transmittance of the sample on a wavelength of 405 nm before and that after the test were compared to check for change.

[Reflow Resistance Test]

(1) 7 μL of a hydrolyzed/polycondensed liquid before curing of each semiconductor light-emitting device member of the example and comparative examples was dropped into a ceramic cup with an opening diameter of 4 mm and a depth of 1 mm at a recess and then the cup was kept in an explosion-proof furnace in a gentle breeze at 50° C. for 30 min, next at 120° C. for 1 hour, and further at 150° C. for 3 hours to prepare a sample for measurement.

(2) The obtained sample for measurement was caused to absorb moisture in an atmosphere of temperature 85° C. and humidity 95% for 6 hours.

(3) The sample for measurement that had absorbed moisture was put on an iron plate whose surface temperature was 280° C. for 90 sec. Under this condition, the sample for measurement reached the maximum temperature of 260° C. and the retention time of the sample for measurement at this temperature was 30 seconds.

(4) Next, the sample for measurement was put on a cooling plate (made of stainless with thickness of 1 cm at room temperature) to cool the sample for 30 seconds.

(5) After cooling, the sample for measurement was picked up by tweezers and then a middle portion of the tweezers was hit against a corner (rim) of the cooling plate 60 times to indirectly give a shock to the sample.

(6) The above steps (1) to (5) were repeated six times to check for peeling of the semiconductor light-emitting device member.

[Continuous Lighting Test]

A driving current of 20 mA was passed through each semiconductor light-emitting device member obtained from the example and comparative examples to continuously light at temperature of 85° C. and in relative humidity of 85%. Luminance after elapse of 150 hours was compared with that before the lighting test.

[Silicon Content Measurement]

A singly cured body of the semiconductor light-emitting device member of each example and each comparative example was ground to pieces of about 100 µm and kept in a platinum crucible in the air at 450° C. for 1 hour and then at 750° C. for 1 hour and at 950° C. for 1.5 hours for burning. After removal of carbon components, to a resultant residual small amount was added a 10-fold amount or more of sodium carbonate, heated by a burner to melt, then cooled to add desalted water and further diluted to several ppm in silicon while adjusting pH value to around neutrality using hydrochloric acid before performing ICP analysis.

Example 1-1

698.3 g of double-ended silanol dimethyl silicone oil XC96-723 (oligomer) manufactured by Toshiba Silicones Co., Ltd., 69.8 g of phenyl trimethoxysilane, 153.4 g of aluminum acetylacetone salt methanol solution of 5 weight % as a catalyst, and 18.3 g of water were measured in a three-necked flask equipped with a stir wing and capacitor, the mixture was stirred at room temperature under atmospheric pressure for 15 min, and initial hydrolysis was performed before the mixture was caused to reflux while being stirred at about 75° C. for 4 hours.

Subsequently, methanol and low-boiling silicon components were distilled off until the internal temperature reached 100° C. and further the mixture was caused to reflux while being stirred at 100° C. for 4 hours. The reaction mixture was cooled down to the room temperature to prepare a hydrolyzed/polycondensated liquid. The ratio of hydrolysis of this liquid is 192% for phenyl trimethoxysilane. The material XC96-723 corresponds to 200% hydrolysate.

The hydrolyzed/polycondensated liquid was divided into two portions using a micro pipet to drop a total of 4.5 µL onto a GaN semiconductor light-emitting device having a luminous wavelength of 405 nm.

Next, the device was kept at 50° C. for 30 minutes to perform first drying and then kept at 120° C. for 1 hour and subsequently at 150° C. for 3 hours to perform second drying to form a crack-free, transparent, and elastomer-like sealing member. Luminance was measured by passing a current of 20 mA through the obtained semiconductor light-emitting device. Measurements of [Luminance improvement rate] and [Continuous lighting test] were thereby made.

3 g of the above hydrolyzed/polycondensated liquid was placed in the Teflon (registered trademark) petri dish with the diameter of 5 cm and then the petri dish was kept in an explosion-proof furnace in a gentle breeze at 50° C. for 30 min to perform the first drying, next at 120° C. for 1 hour and subsequently at 150° C. for 3 hours to perform the second drying to obtain an independent, circular, transparent, and elastomer-like film with the thickness of about 0.5 mm. Using the obtained film, [Solid Si-NMR spectrum measurement and silanol content calculation], [Hardness measurement], [Transmittance measurement], [UV test], [Heat test], and [Silicon content measurement] were performed.

Figure 50:
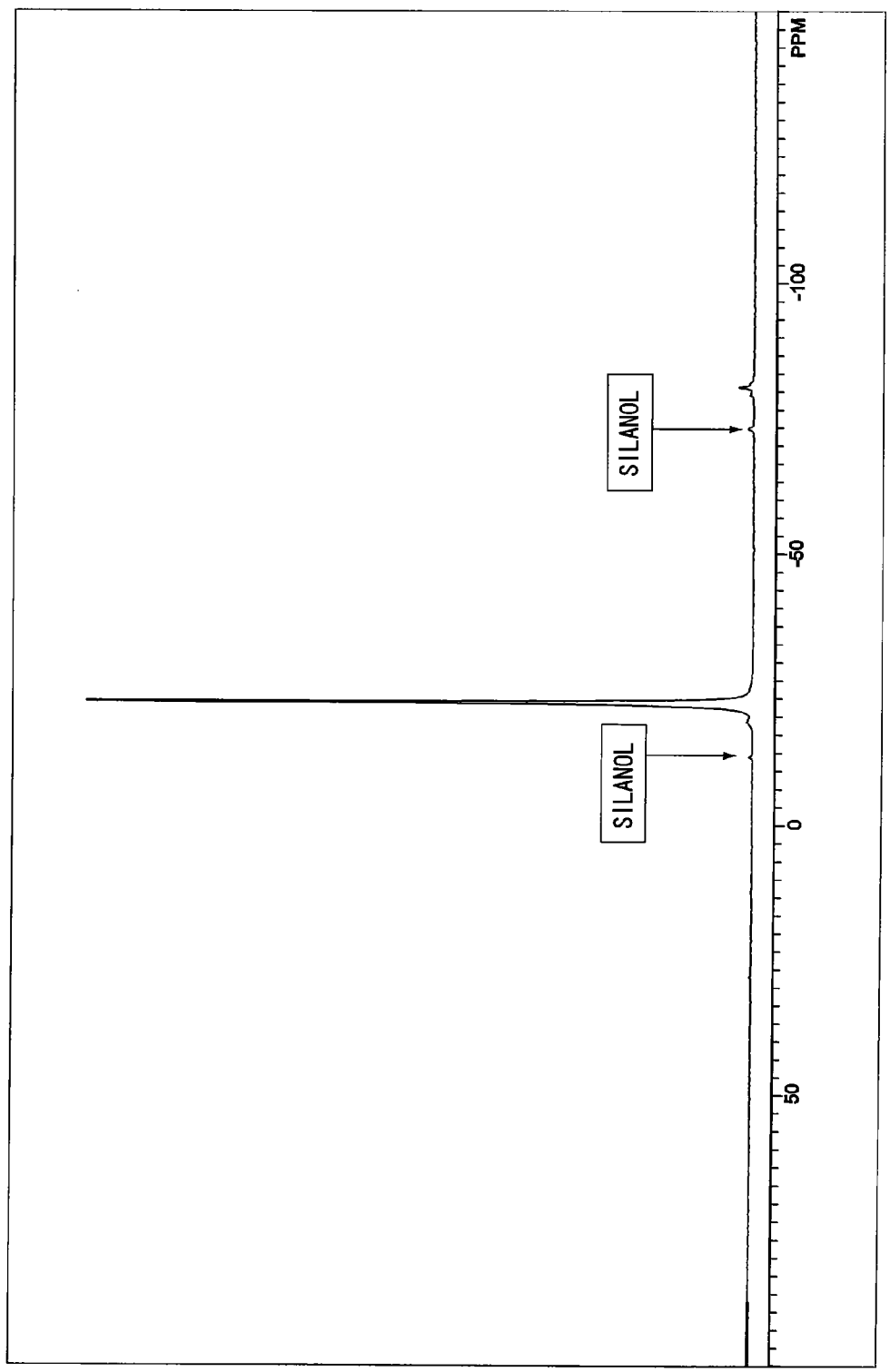
FIG. 50 is a solid Si-NMR spectrum measured in an example 1-1 of the present invention.

Further, using the above hydrolyzed/polycondensated liquid, [Reflow resistance test] was performed. FIG. 50 shows the solid Si-NMR spectrum of the present example.

Comparative Example 1-1

27.4 g of dimethyldimethoxysilane, 1.6 g of methyltrimethoxysilane, 5.8 g of 5% acetylacetone aluminum salt methanol solution as a catalyst, and 5.3 g of water were placed in a container that can be closed and then mixed. After heating at 50° C. for 8 hours in a hot water bath while stirring with a stirrer in a hermetically sealed state, the mixture was brought back to the room temperature to prepare a hydrolyzed/polycondensated liquid. The ratio of hydrolysis of this liquid is 120%.

The hydrolyzed/polycondensated liquid was divided into five portions using a micro pipet to drop a total of 20 µL onto a GaN semiconductor light-emitting device having a luminous wavelength of 405 nm. The device was left alone at room temperature for a while each time the hydrolyzed/polycondensated liquid was dropped to allow the solvent to volatilize so that the next portion (about 2 µL) can be placed before the next portion is dropped.

Next, the device was kept at 35° C. for 30 min and subsequently at 50° C. for 1 hour to perform the first drying and then kept at 150° C. for 3 hours to perform second drying to volatilize most of the hydrolyzed/polycondensated liquid so that the chip could be sealed, but a wire was exposed. Using the obtained film, [Luminance improvement rate] was measured. However, [Continuous lighting test] could not be measured.

8 g of the above hydrolyzed/polycondensated liquid was placed in the Teflon (registered trademark) petri dish with the diameter of 5 cm and the petri dish was kept in an explosion-proof furnace in a gentle breeze at 40° C. for 4 hours and subsequently the temperature was raised from 40° C. to 65° C. in 3 hours to perform the first drying, and then at 150° C. for 3 hours to perform the second drying to obtain an independent, circular, transparent, and elastomer-like film with the thickness of about 0.2 mm. Because the film was very soft and sticky and broken when taken out, the film could not be used for [Transmittance measurement], [UV test], [Heat test], and [Reflow resistance test]. However, the film could be used to perform [Solid Si-NMR spectrum measurement and silanol content calculation], [Hardness measurement], and [Silicon content measurement].

Comparative Example 1-2

Commercially available silicone resin (JCR6101UP manufactured by Dow Corning Corporation) used as a mold agent for semiconductor light-emitting devices was dropped onto a GaN semiconductor light-emitting device having a luminous wavelength of 405 nm using a micro pipet and then the device was heated at 150° C. for 2 hours for drying to obtain an elastomer-like sealing member (semiconductor light-emitting device member: Sample A). A current of 20 mA was passed through the obtained semiconductor light-emitting device to measure luminance. [Luminance improvement rate] and [Continuous lighting test] were thereby measured.

The Teflon (registered trademark) plate was coated with the above silicone resin using an applicator and then the Teflon plate was vacuum-degassed at 25° C. for 1 hour and heated at 150° C. for 2 hours for drying to obtain an elastomer-like film with the thickness of about 0.5 mm by peeling off the film from the Teflon plate. Using the film, [Solid Si-NMR spectrum measurement and silanol content calculation], [Hardness measurement], [Transmittance measurement], [UV test], [Heat test], and [Silicon content measurement] were performed.

Further, [Reflow resistance test] was performed using the above silicone resin.

Comparative Example 1-3

Commercially available two-component curing aromatic epoxy resin used as a mold agent for semiconductor light-emitting devices was dropped onto a GaN semiconductor light-emitting device having a luminous wavelength of 405 nm using a micro pipet and then the device was heated at 120° C. for 4 hours for drying to obtain a hard transparent sealing member (semiconductor light-emitting device member). A current of 20 mA was passed through the obtained semiconductor light-emitting device to measure luminance. [Luminance improvement rate] and [continuous lighting test] were thereby measured.

The above epoxy resin was placed in the Teflon (registered trademark) petri dish with the diameter of 5 cm and then the Teflon petri dish was vacuum-degassed at 25° C. for 1 hour and heated at 120° C. for 4 hours for drying to obtain bluish, circular, and transparent resin films with the thickness of about 1 mm and 0.5 mm as independent films. Using the film, [Solid Si-NMR spectrum measurement and silanol content calculation], [Hardness measurement], [Transmittance measurement], [UV test], [Heat test], and [Silicon content measurement] were performed.

Further, [Reflow resistance test] was performed using the above epoxy resin.

Comparative Example 1-4

30.80 g of methyl silicate (MKC silicate MS51 manufactured by Mitsubishi Chemical Corporation), 56.53 g of methanol, 6.51 g of water, and 6.16 g of 5% acetylacetone aluminum salt methanol solution as a catalyst were placed in a container that can be closed and then mixed. After heating at 50° C. for 8 hours in a hot water bath while stirring with a stirrer in a hermetically sealed state, the mixture was brought back to the room temperature to prepare a hydrolyzed/polycondensated liquid. The ratio of hydrolysis of this liquid is 113%.

When, after dropping the hydrolyzed/polycondensated liquid onto a GaN semiconductor light-emitting device having a luminous wavelength of 405 nm using a micro pipet, the device was kept at 35° C. for 30 min and subsequently at 50° C. for 1 hour to perform the first drying and then kept at 150° C. for 3 hours to perform second drying, a large amount of cracks appeared and therefore the film could not be used as a sealing member (semiconductor light-emitting device member).

When 10 ml of the above hydrolyzed/polycondensated liquid was placed in the Teflon (registered trademark) petri dish with the diameter of 5 cm and dried under the same conditions as those of Example 1-1, a glass film of about 0.3 mm in thickness resulted, but a large amount of cracks appeared in a process of drying and the glass film broke into pieces, making it impossible to take out the film as an independent, circular, and transparent glass film. However, [Silicon content measurement] was performed using the film.

[Analysis Results]

Table 4 shows analysis results of samples prepared in the above example and comparative examples.

TABLE 4

| | | Example 1-1 | Comparative Example 1-1 | Comparative Example 1-2 | Comparative Example 1-3 | Comparative Example 1-4 |
|---|---|---|---|---|---|---|
| 405 nm luminance improvement rate (%) | | 140 | 95 (*) | 130 | 132 | (***) |
| Number of observed peaks in solid Si-nuclear magnetic resonance spectrum (only peaks of −80 ppm or more) | Peaks whose peak top position is in an area of chemical shift −40 ppm or more and 0 ppm or less and whose full width at half maximum is 0.3 ppm or more and 3.0 ppm or less | 2 or more | 2 or more | 1 | 0 | 0 |
| | Peaks whose peak top position is in an area of chemical shift −80 ppm or more and less than −40 ppm and whose full width at half maximum is 0.3 ppm or more and 5.0 ppm or less | 2 or more | 2 or more | 0 | 0 | 0 |

TABLE 4-continued

|  | Example 1-1 | Comparative Example 1-1 | Comparative Example 1-2 | Comparative Example 1-3 | Comparative Example 1-4 |
|---|---|---|---|---|---|
| Silanol content (weight %) | 0.30 | 0.35 | 0 | 0 | 15.1 |
| Hardness (Shore A) | 27 | 2 | 36 | 100 | (***) |
| 405 nm transmittance (%) | 80% or more | () | 70% | 80% or more | (*) |
| UV test (72 hours) | No change | () | No change | Yellowing | (*) |
| Heat test (250° C.) | No change | () | No change | Transmittance 0% after 24 hours | (*) |
| Reflow resistance test | No peeling/ detachment | () | Cup edge peeled | No change | (*) |
| Continuous lighting test | No change | () | Not lit | Lower luminance | (*) |
| Silicon content (weight %) | 38 | 36 | 35 | 0 | 43 |

(*) A large amount of volatilization with wire exposed
(**) Not measurable
(***) Not measurable due to appearance of cracks 2. Examples Relating to the First Semiconductor Light-Emitting Device Member (Hard One)

2-I. Analysis Method

Analyses were performed according to the following procedure for semiconductor light-emitting device members of each example and each comparative example described later.

[2-I-1. Solid Si-NMR Spectrum Measurement and Silanol Content Calculation]

Solid Si-NMR spectrum measurement and waveform separation analysis of semiconductor light-emitting device members of each example and each comparative example were performed under the following conditions. The full width at half maximum of each peak was determined for the semiconductor light-emitting device member of each example and each comparative example from the obtained data. The ratio (%) of silicon atoms in silanol to all silicon atoms was determined from the ratio of peak areas originating from silanol to all peak areas and was compared with a silicon content analyzed separately to determine the silanol content.

<Device Conditions>
Device: Infinity CMX-400 nuclear magnetic resonance spectroscope manufactured by Chemagnetics
$^{29}$Si resonance frequency: 79.436 MHz
Probe: 7.5 mm φ CP/MAS probe
Temperature: Room temperature
Rotational frequency of sample: 4 kHz
Measuring method: Single pulse method
$^{1}$H decoupling frequency: 50 kHz
$^{29}$Si flip angle: 90°
$^{29}$Si 90° pulse width: 5.0 μs
Repetition time: 600 s
Total count: 128 times
Observation width: 30 kHz
Broadening factor: 20 Hz <Data Processing Method>
For the semiconductor light-emitting device members of Examples 2-1 to 2-3 and Comparative Examples 2-1, and 2-3, 512 points were taken in as measured data and zero-filled to 8192 points before Fourier transformation was performed. For the semiconductor light-emitting device member of Comparative Example 2-2 composed of silicone resin, 2048 points were taken in as measured data and zero-filled to 8192 points before Fourier transformation is performed because peaks were very sharp.

<Waveform Separation Analysis Method>
For each peak after Fourier transformation, an optimization calculation was performed by the nonlinear least square method using the center position, height, and full width at half maximum of a peak shape created by a Lorentz waveform, Gauss waveform, or a mixture of both as variable parameters.

For identification of a peak, AIChE Journal, 44(5), p. 1141, 1998 was referred to.

[2-I-2. Silicon Content Measurement]
A singly cured body of the semiconductor light-emitting device member of each example and each comparative example was ground to pieces of about 100 μm and kept in a platinum crucible in the air at 450° C. for 1 hour and then at 750° C. for 1 hour and at 950° C. for 1.5 hours for burning. After removal of carbon components, a resultant residual small amount was added a 10-fold amount or more of sodium carbonate, heated by a burner to melt, then cooled to add desalted water and further diluted to several ppm in silicon while adjusting pH value to around neutrality using hydrochloric acid before performing ICP analysis.

[2-I-3. Transmittance Measurement]
Transmittance was measured using a singly cured film with a smooth surface of about 0.5 mm in thickness of the semiconductor light-emitting device member of each example and each comparative example without scattering by defects or unevenness at wavelengths of 200 nm to 800 nm by an ultraviolet spectrophotometer (UV-3100 manufactured by Shimadzu Corporation).

[2-I-4. TG-DTA Measurement]
Heating weight loss was measured by heating crushed pieces of about 10 mg of the semiconductor light-emitting device member of each example and each comparative example from 35° C. to 500° C. at the rate of temperature rise of 20° C./min in an air flow of 20 ml/min by a thermogravimetry-differential thermal analysis (hereinafter abbreviated as "TG-DTA" when appropriate) measuring apparatus (TG/DTA6200 manufactured by Seiko Instruments Inc.).

[2-I-5. Moisture Absorptivity Measurement]
A singly cured body of the semiconductor light-emitting device member of each example and each comparative example was ground to pieces of 1 mm square and kept at 150° C. for 3 hours for drying. Then, 1 g of such pieces was put into a weighing bottle to perform a moisture absorptivity test at 25° C. and 70 RH % and a moisture absorptivity was calculated according to the following formula after confirming absorption up to the constant weight.

Moisture absorptivity (%)=[(moisture absorbed sample weight)−(absolute dry sample weight)]/ (absolute dry sample weight)×100    [Formula 4]

[2-I-6. UV Test]
A sample of 5 cm in diameter and about 1 mm in thickness of the semiconductor light-emitting device member of each example and each comparative example prepared by using the Teflon (registered trademark) petri dish was irradiated with ultraviolet rays under the following conditions and then film states before and after irradiation were compared.
Irradiation equipment: Accelerated light resistance test apparatus manufactured by Suga Test Instruments Co., LTd.—Metering weather meter MV3000
Irradiation wavelength: 255 nm or longer. Main wavelengths are in the range of 300 nm to 450 nm (with emission lines in 480 nm to 580 nm)
Irradiation time: 72 hours

2-II. Manufacture of the Semiconductor Light-Emitting Device Member

Example 2-1

12.7 g of methyltrimethoxysilane, 11.2 g of dimethyldimethoxysilane, 3.3 g of methanol, 8.1 g of water, and 4.8 g of 5% acetylacetone aluminum salt methanol solution as a catalyst were placed in a container that can be closed and then mixed. After heating at 50° C. for 8 hours in a hot water bath while stirring with a stirrer in a hermetically sealed state, the mixture was brought back to the room temperature to prepare a hydrolyzed/polycondensated liquid. The ratio of hydrolysis of this liquid is 192%.

The hydrolyzed/polycondensated liquid was divided into four/five portions using a micro pipet to drop a total of 11 µl onto a GaN semiconductor light-emitting device having a luminous wavelength of 405 nm. The device was left alone at room temperature for a while each time the hydrolyzed/polycondensated liquid was dropped to allow the solvent to volatilize so that the next portion (about 2 µL) can be placed before the next portion is dropped. Next, the device was kept at 35° C. for 30 min and subsequently at 50° C. for 1 hour to perform the first drying and then kept at 150° C. for 3 hours to perform second drying to form a crack-free transparent sealing member (semiconductor light-emitting device member: Sample A). A current of 20 mA was passed through the obtained semiconductor light-emitting device to measure luminance.

8.1 ml of the above hydrolyzed/polycondensated liquid was placed in the Teflon (registered trademark) petri dish with the diameter of 5 cm and the petri dish was kept in an explosion-proof furnace in a gentle breeze at 40° C. for 4 hours and subsequently the temperature was raised from 40° C. to 65° C. in 3 hours to perform the first drying, and then at 150° C. for 3 hours to perform the second drying to obtain an independent, circular, and transparent glass film (semiconductor light-emitting device member: Sample B) with the thickness of about 1 mm. This Sample B was provided to the above [2-I-6. UV test].

Figure 51:
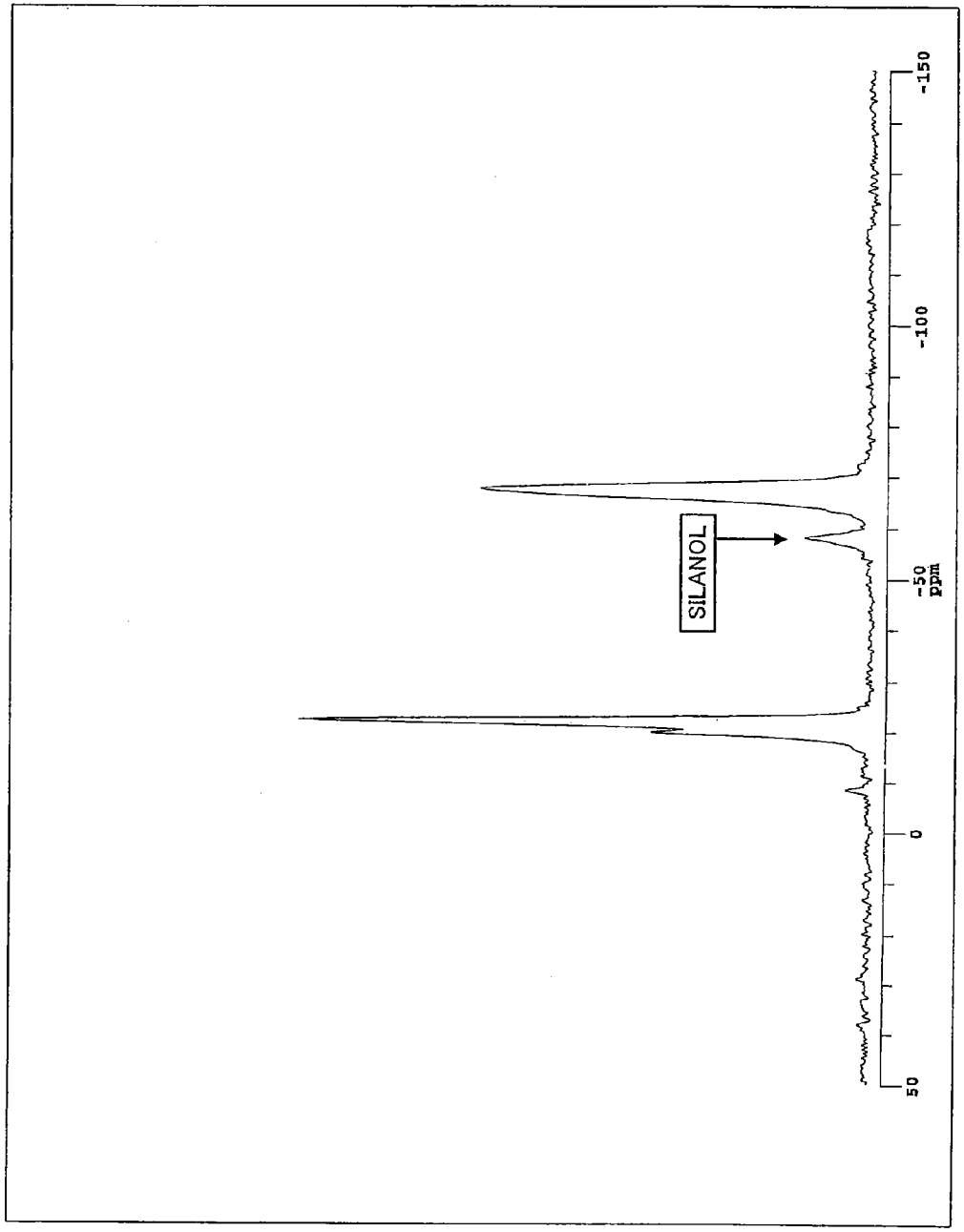
FIG. 51 is a solid Si-NMR spectrum measured in an example 2-1 of the present invention.

By performing the same operations after reducing the liquid quantity of the hydrolyzed/polycondensated liquid to 4.1 ml, an independent, circular, and transparent glass film (semiconductor light-emitting device member: Sample C) with the thickness of about 0.5 mm was obtained. This Sample C was provided to the above [2-I-3. Transmittance measurement]. Also, using pieces obtained by grinding Sample C using a mortar, the above [2-I-1. Solid Si-NMR spectrum measurement and silanol content calculation], [2-I-2. Silicon content measurement], [2-I-4. TG-DTA measurement], and [2-I-5. Moisture absorptivity measurement] were performed. FIG. 51 shows the solid Si-NMR spectrum of the present example.

Example 2-2

9.03 g of methyltrimethoxysilane, 7.97 g of dimethyldimethoxysilane, 5.73 g of water, titania sol with silica coating (13.9 g of methanol dispersions whose solid content is 20 weight %) whose particle size is 5 nm as a refractive index adjustor, and 3.40 g of 5% acetylacetone aluminum salt methanol solution as a catalyst were placed in a container that can be closed and then mixed. After heating at 50° C. for 8 hours in a hot water bath while stirring with a stirrer in a hermetically sealed state, the mixture was brought back to the room temperature to prepare a hydrolyzed/polycondensated liquid. The ratio of hydrolysis of this liquid is 192%.

13 µl of the hydrolyzed/polycondensated liquid was dropped onto a GaN semiconductor light-emitting device having a luminous wavelength of 405 nm using a micro pipet according to the same procedure as that of Example 2-1. Next, the device was kept at 35° C. for 30 minutes and subsequently at 50° C. for 1 hour to perform the first drying and then kept at 150° C. for 3 hours to perform second drying to form a crack-free transparent sealing member (semiconductor light-emitting device member: Sample A). A current of 20 mA was passed through the obtained semiconductor light-emitting device to measure luminance.

7.9 ml of the above hydrolyzed/polycondensated liquid was placed in the Teflon (registered trademark) petri dish with the diameter of 5 cm and dried under the same conditions as those of Example 2-1 to obtain an independent, circular, and transparent glass film (semiconductor light-emitting device member: Sample B) with the thickness of about 1 mm. This Sample B was provided to the above [2-I-6. UV test].

Figure 52:
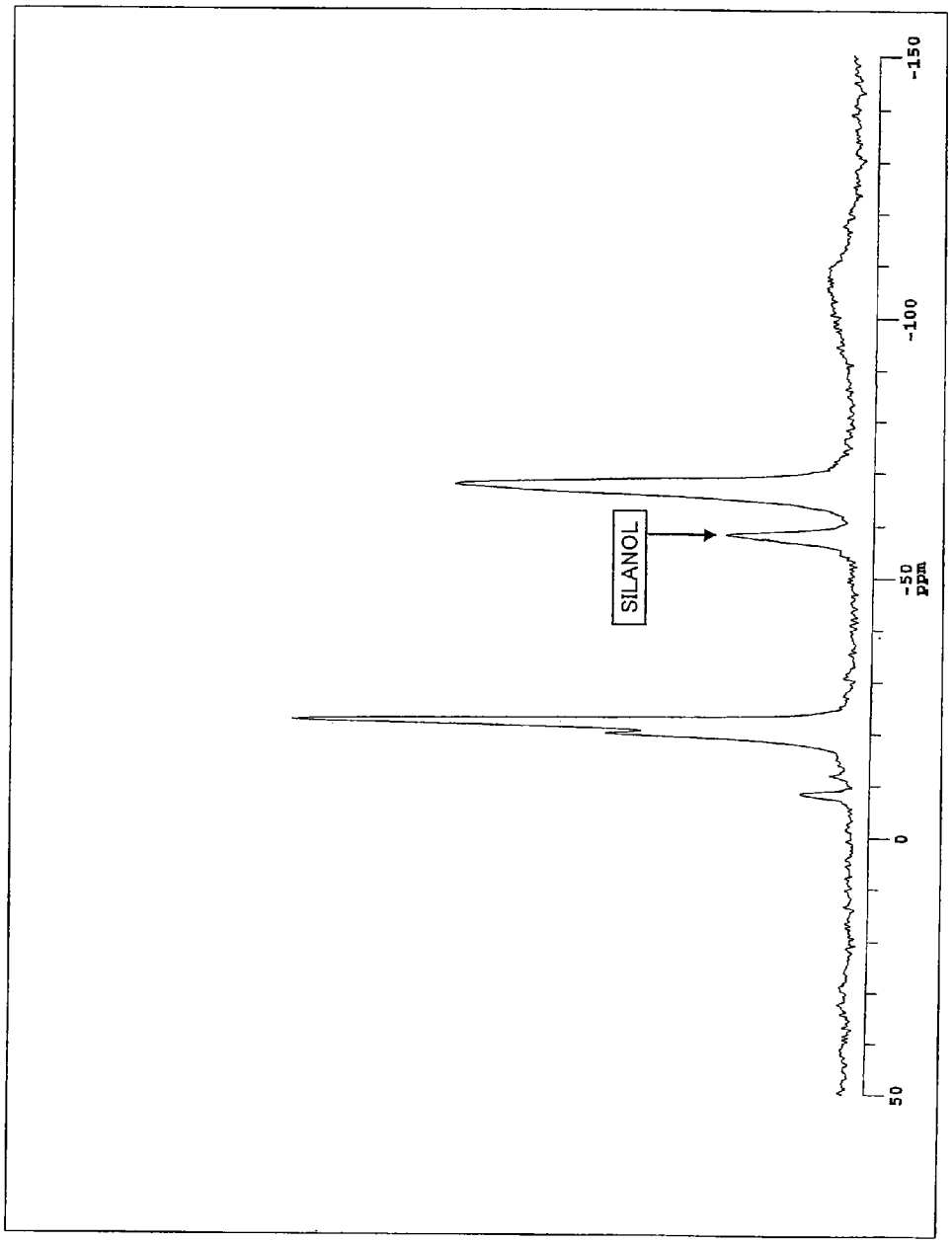
FIG. 52 is a solid Si-NMR spectrum measured in an example 2-2 of the present invention.

By performing the same operations after reducing the liquid quantity of the hydrolyzed/polycondensated liquid to 4.0 ml, an independent, circular, and transparent glass film (semiconductor light-emitting device member: Sample C) with the thickness of about 0.5 mm was obtained. This Sample C was provided to the above [2-I-3. Transmittance measurement]. Using pieces obtained by grinding Sample C using a mortar, the above [2-I-1. Solid Si-NMR spectrum measurement and silanol content calculation], [2-I-2. Silicon content measurement], [2-I-4. TG-DTA measurement], and [2-I-5. Moisture absorptivity measurement] were performed. FIG. 52 shows the solid Si-NMR spectrum of the present example. The refractive index of Sample C measured by the immersion method using dust-size particles obtained by grinding Sample C in a mortar was 1.48.

Example 2-3

11.4 g of methyltrimethoxysilane, 10.0 g of dimethyldimethoxysilane, 4.5 g of water, 9.8 g of methanol silica sol (30 weight %) manufactured by Nissan Chemical Industries, Ltd., and 4.3 g of 5% acetylacetone aluminum salt methanol solution as a catalyst were placed in a container that can be closed and then mixed. After heating at 50° C. for 8 hours in a hot water bath while stirring with a stirrer in a hermetically sealed state, the mixture was brought back to the room temperature to prepare a hydrolyzed/polycondensated liquid. The ratio of hydrolysis of this liquid is 120%.

10 µl of the hydrolyzed/polycondensated liquid was dropped onto a GaN semiconductor light-emitting device having a luminous wavelength of 405 nm using a micro pipet. Next, the device was kept at 35° C. for 30 min and subsequently at 50° C. for 1 hour to perform the first drying and then kept at 150° C. for 3 hours to perform second drying to form a crack-free transparent sealing member (semiconductor light-emitting device member: Sample A). A current of 20 mA was passed through the obtained semiconductor light-emitting device to measure luminance.

7.2 ml of the above hydrolyzed/polycondensated liquid was placed in the Teflon (registered trademark) petri dish with the diameter of 5 cm and dried under the same conditions as those of Example 2-1 to obtain an independent, circular, and transparent glass film (semiconductor light-emitting device member: Sample B) with the thickness of about 1 mm. This Sample B was provided to the above [2-I-6. UV test].

Figure 53:
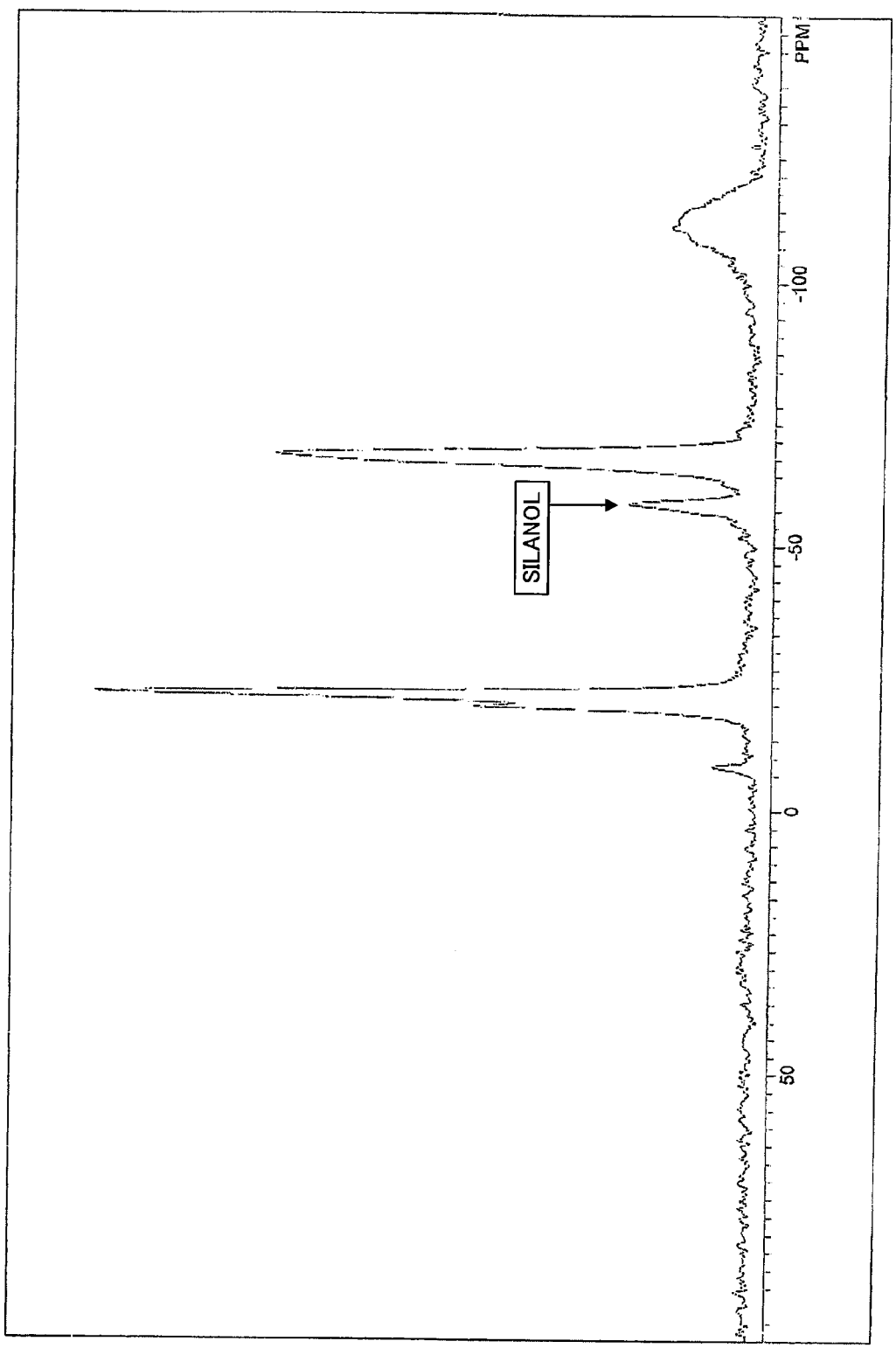
FIG. 53 is a solid Si-NMR spectrum measured in an example 2-3 of the present invention.

By performing the same operations after reducing the liquid quantity of the hydrolyzed/polycondensated liquid to 3.6 ml, an independent, circular, and transparent glass film (semiconductor light-emitting device member: Sample C) with the thickness of about 0.5 mm was obtained. This Sample C was provided to the above [2-I-3. Transmittance measurement]. Using pieces obtained by grinding Sample C using a mortar, the above [2-I-1. Solid Si-NMR spectrum measurement and silanol content calculation], [2-I-2. Silicon content measurement], [2-I-4. TG-DTA measurement], and [2-I-5. Moisture absorptivity measurement] were performed. FIG. 53 shows the solid Si-NMR spectrum of the present example.

Comparative Example 2-1

30.80 g of methyl silicate (MKC silicate MS51 manufactured by Mitsubishi Chemical Corporation), 56.53 g of methanol, 6.51 g of water, 6.16 g of 5% acetylacetone aluminum salt methanol solution as a catalyst were placed in a container that can be closed and then mixed. After heating at 50° C. for 8 hours in a hot water bath while stirring with a stirrer in a hermetically sealed state, the mixture was brought back to the room temperature to prepare a hydrolyzed/polycondensated liquid. The ratio of hydrolysis of this liquid is 113%.

When, after dropping the hydrolyzed/polycondensated liquid onto a GaN semiconductor light-emitting device having a luminous wavelength of 405 nm using a micro pipet, the device was kept at 35° C. for 30 min and subsequently at 50° C. for 1 hour to perform the first drying and then kept at 150° C. for 3 hours to perform second drying, a large amount of cracks appeared and therefore the film could not be used as a sealing member (semiconductor light-emitting device member).

When 10 ml of the above hydrolyzed/polycondensated liquid was placed in the Teflon (registered trademark) petri dish with the diameter of 5 cm and dried under the same conditions as those of Example 2-1, a glass film of about 0.3 mm in thickness resulted, but a large amount of cracks appeared in a process of drying and the glass film broke into pieces, making it impossible to take out the film as an independent, circular, and transparent glass film.

Figure 54:
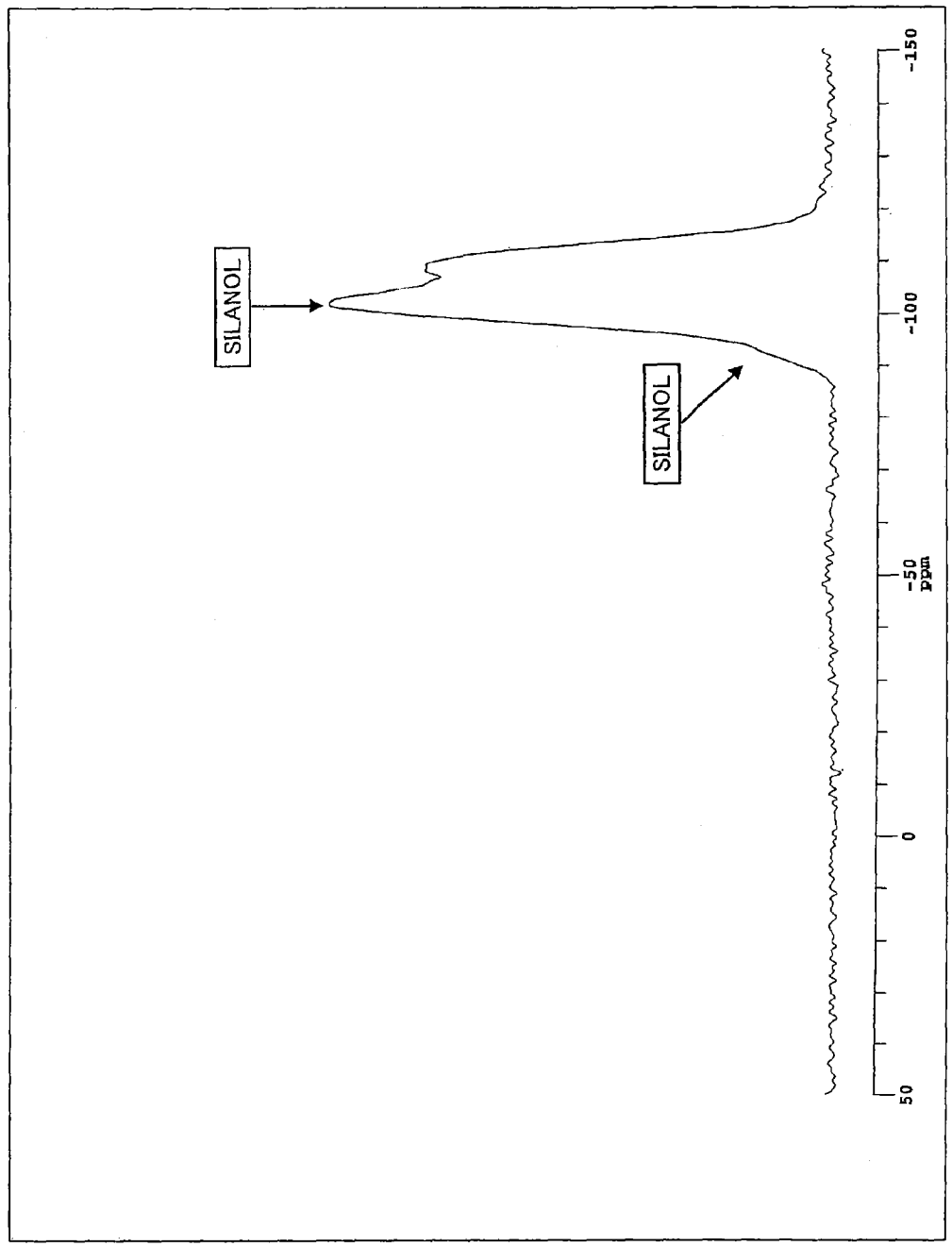
FIG. 54 is a solid Si-NMR spectrum measured in Comparative Example 2-1.

Also, the above [2-I-1. Solid Si-NMR spectrum measurement and silanol content calculation], [2-I-2. Silicon content measurement], [2-I-4. TG-DTA measurement], and [2-I-5. Moisture absorptivity measurement] were performed using the above glass powder. FIG. 54 shows the solid Si-NMR spectrum of the present comparative example.

Comparative Example 2-2

Commercially available silicon resin (JCR6101UP manufactured by Dow Corning Corporation) used as a mold agent for semiconductor light-emitting devices was dropped onto a GaN semiconductor light-emitting device having a luminous wavelength of 405 nm using a micro pipet and then the device was heated at 150° C. for 2 hours for curing to obtain an elastomer-like sealing member (semiconductor light-emitting device member: Sample A). A current of 20 mA was passed through the obtained semiconductor light-emitting device to measure luminance.

Figure 55:
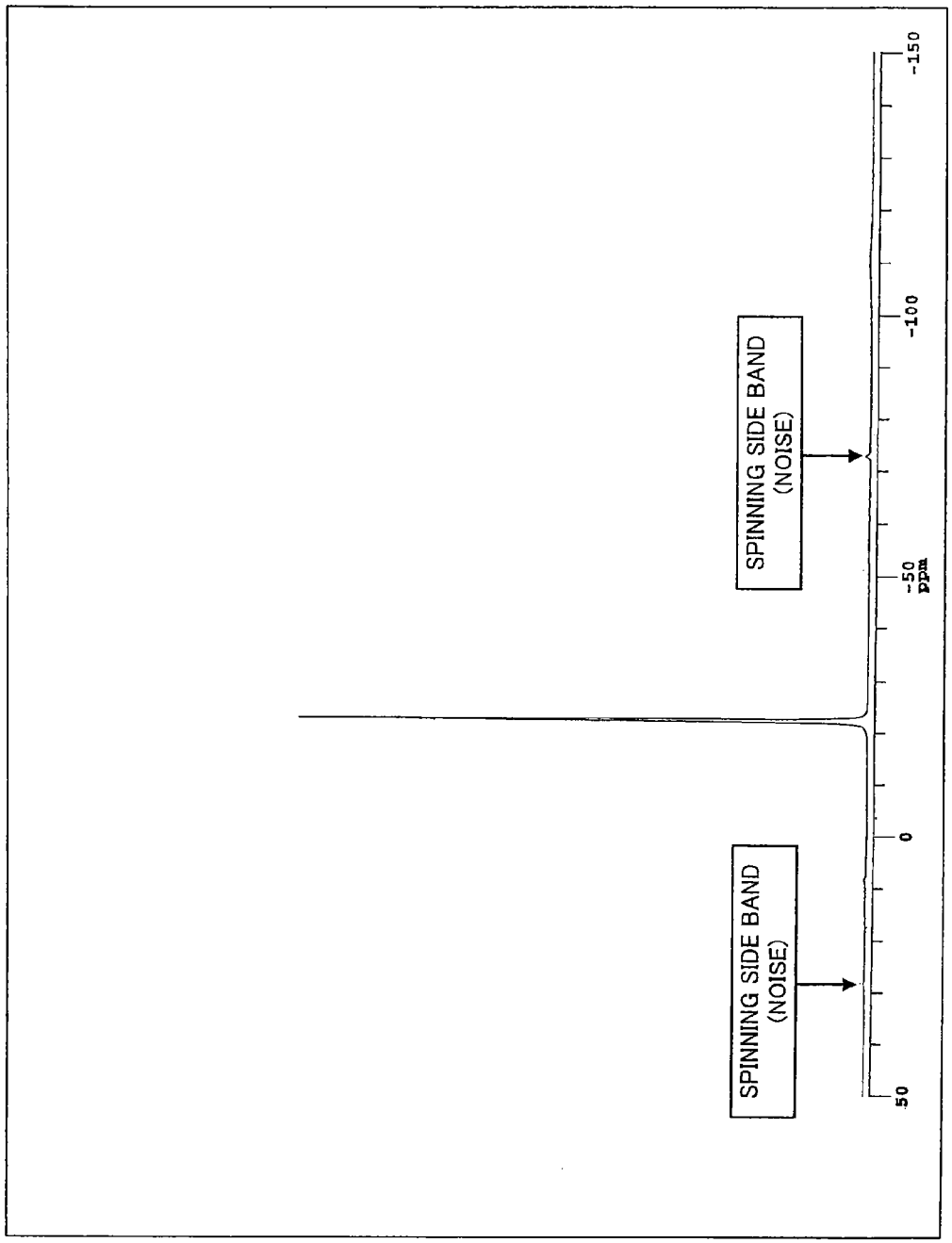
FIG. 55 is a solid Si-NMR spectrum measured in Comparative Example 2-2.

The Teflon (registered trademark) plate was coated with the above silicone resin using an applicator and then the Teflon plate was vacuum-degassed at 25° C. for 1 hour and heated at 150° C. for 2 hours for curing to obtain elastomer-like films (semiconductor light-emitting device members: Sample B and Sample C) with the thickness of about 1 mm and 0.5 mm by peeling off the films from the Teflon plate. Sample B was provided to the above [2-I-6. UV test]. Sample C was provided to the above [2-I-3. Transmittance measurement]. Using pieces obtained by grinding Sample C using a freezer mill, [2-I-1. Solid Si-NMR spectrum measurement and silanol content calculation], [2-I-2. Silicon content measurement], [2-I-4. TG-DTA measurement], and [2-I-5. Moisture absorptivity measurement] were performed. FIG. 55 shows solid Si-NMR spectrum of the present comparative example.

Comparative Example 2-3

Commercially available two-component curing aromatic epoxy resin used as a mold agent for semiconductor light-emitting devices was dropped onto a GaN semiconductor light-emitting device having a luminous wavelength of 405 nm using a micro pipet and then the device was heated at 120° C. for 4 hours for curing to obtain a hard transparent sealing member (semiconductor light-emitting device member). A current of 20 mA was passed through the obtained semiconductor light-emitting device to measure luminance.

The above epoxy resin was placed in the Teflon (registered trademark) petri dish with the diameter of 5 cm and then the Teflon petri dish was vacuum-degassed at 25° C. for 1 hour and heated at 120° C. for 4 hours for curing to obtain bluish, circular, and transparent resin films (semiconductor light-emitting device members: Sample B and Sample C) with the thickness of about 1 mm and 0.5 mm as independent films. Sample B was provided to the above [2-I-6. UV test]. Sample C was provided to the above [2-I-3. Transmittance measurement]. Using pieces obtained by grinding Sample C using a freezer mill, [2-I-1. Solid Si-NMR spectrum measurement and silanol content calculation], [2-I-2. Silicon content measurement], [2-I-4. TG-DTA measurement], and [2-I-5. Moisture absorptivity measurement] were performed.

Comparative Example 2-4

13.6 g of methyltrimethoxysilane, 5.2 g of water, and 2.7 g of 5% acetylacetone aluminum salt methanol solution as a catalyst were placed in a container that can be closed and then mixed. After heating at 50° C. for 8 hours in a hot water bath while stirring with a stirrer in a hermetically sealed state, the mixture was brought back to the room temperature to prepare a hydrolyzed/polycondensated liquid. The ratio of hydrolysis of this liquid is 192%. The hydrolyzed/polycondensated liquid was divided into four/five portions using a micro pipet to drop a total of 11 μl onto a GaN semiconductor light-emitting device having a luminous wavelength of 405 nm. The device was left alone at room temperature for a while each time the hydrolyzed/polycondensated liquid was dropped to allow the solvent to volatilize so that the next portion (about 2) can be placed before the next portion is dropped. Next, the device was kept at 35° C. for 1 hour and subsequently at 50° C. for 1 hour to perform the first drying and then kept at 150° C. for 3 hours to perform second drying to form a transparent sealing member, but large cracks and peeling appeared, making the sealing member (semiconductor light-emitting device member) unusable.

8.0 ml of the above hydrolyzed/polycondensated liquid was placed in the Teflon (registered trademark) petri dish with the diameter of 5 cm and the petri dish was kept in an explosion-proof furnace in a gentle breeze at 40° C. for 4 hours and subsequently the temperature was raised from 40° C. to 65° C. in 3 hours to perform the first drying, and then at 150° C. for 3 hours to perform the second drying to obtain an amorphous glass film (semiconductor light-emitting device member: Sample B) with the thickness of about 1 mm and conspicuous curvature and foaming. This Sample B was provided to the above [2-I-5. UV test].

Figure 56:
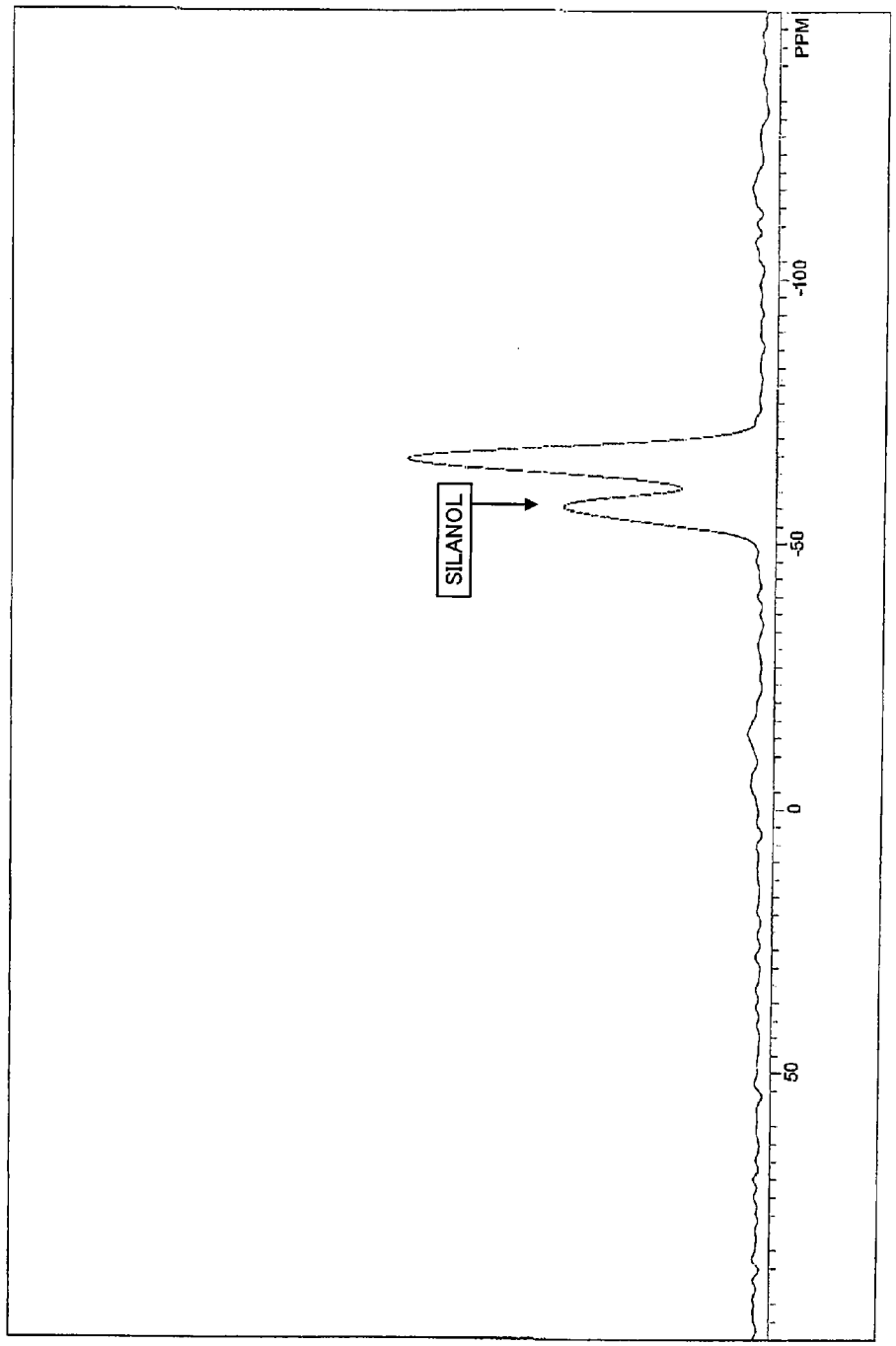
FIG. 56 is a solid Si-NMR spectrum measured in Comparative Example 2-4.

By performing the same operations after reducing the liquid quantity of the hydrolyzed/polycondensated liquid to 4.0 ml, an amorphous glass film (semiconductor light-emitting device member: Sample C) with the thickness of about 0.5 mm and conspicuous curvature and foaming was obtained. This Sample C was provided to the above [2-I-3. Transmittance measurement]. Using pieces obtained by grinding Sample C using a mortar, the above [2-I-1. Solid Si-NMR spectrum measurement], [2-I-2. Silicon content measurement], [2-I-4. TG-DTA measurement], and [2-I-6. Measurement of weight loss rate during vacuum degassing] were performed. FIG. 56 shows the solid Si-NMR spectrum of the present example.

2-III. Evaluation of the Semiconductor Light-Emitting Device Member

Analyses of the semiconductor light-emitting devices and semiconductor light-emitting device members of each example and each comparative example obtained according to the procedure in the above [2-II. Manufacture of the semiconductor light-emitting device member] were performed according to the procedure in the above [2-I. Analysis method]. Table 5 shown below lists the results of these analyses.

As shown in the following Table 5, excluding Example 2-1 in which no sealing member was formed due to appearance of cracks, luminance of the semiconductor light-emitting devices obtained in each example and each comparative example has improved compared with that prior to formation of the sealing members (semiconductor light-emitting device members).

Also, as shown in the following Table 5, the semiconductor light-emitting device members of Examples 2-1 to 2-3 satisfying requirements of the present invention not only excel in heat resistance and UV resistance, but also have less affinity for moisture than the semiconductor light-emitting device member composed exclusively of tetraalkoxysilane in the comparative example 2-1, making degradation due to hygroscopicity less likely. Also, an appropriately remaining small amount of silanol causes adhesiveness to develop, leading to excellent adhesion to inorganic material such as chips. Further, since a member skeleton and crosslinking points are formed by a siloxane structure, semiconductor light-emitting device members that are stable for a long period of time without change in physical properties can be provided.

TABLE 5

| | | Example 2-1 | Example 2-2 | Example 2-3 | Comparative example 2-1 | Comparative example 2-2 | Comparative example 2-3 | Comparative example 2-4 |
|---|---|---|---|---|---|---|---|---|
| 405 nm luminance improvement rate (%) | | 147 | 150 | 140 | —(*) | 130 | 132 | —(*) |
| Range of Si-NMR peak full width at half maximum (ppm) and the number of observed peaks (only peaks of −80 ppm or more) | Chemical shift range 0 to −40 (ppm) | 0.90 to 1.56 (two or more) | 0.83 to 1.60 (two or more) | 0.94 to 1.73 (two or more) | 0 | 0 | 0 | 0 |
| | Chemical shift range −40 to −80 (ppm) | 1.81 to 2.79 (two or more) | 2.16 to 3.34 (two or more) | 2.22 to 3.25 (two or more) | 0 | 0 | 0 | 0 |
| Silicon content (weight %) | | 40 | 33 | 41 | 43 | 35 | 0 | 40 |
| Silanol content (weight %) | | 1.2 | 4.0 | 1.9 | 15.1 | 0 | 0 | 8.8 |
| 405 nm transmittance (%) | | 80≤ | 80≤ | 80≤ | —(*) | 70 | 80≤ | —(**) |
| TG-DTA weight loss (%) | | −3.0 | −7.0 | −3.6 | −4.0 | −19.5 | −15 | −3.5 |
| Moisture absorptivity (%) at 25° C. and 70 RH % | | 0.11 | 0.62 | — | 6.97 | 0.13 | 2.0 | 5.0 |
| UV test | | No change | No change | No change | —(*) | No change | Yellowing | No change |

(*)Not measurable due to appearance of cracks
(**)Not measurable due to sample curvature or foaming

3. Examples Relating to the Second Semiconductor Light-Emitting Device Member

3-I. Analysis Method

Analyses were performed according to the following procedure for semiconductor light-emitting device members of each example and each comparative example described later.

[3-I-1. Solid Si-NMR Spectrum Measurement]

Solid Si-NMR spectrum measurement and waveform separation analysis of semiconductor light-emitting device members of each example and each comparative example were performed under the following conditions. The ratio (%) of silicon atoms in $D^2$ cyclic compound to all silicon atoms was determined from the ratio of peak areas originating from $D^2$ cyclic compound in trimers and tetramers to all peak areas from the obtained waveform data.

<Device Conditions>

Device: Infinity CMX-400 nuclear magnetic resonance spectroscope manufactured by Chemagnetics
$^{29}Si$ resonance frequency: 79.436 MHz
Probe: 7.5 mm φ CP/MAS probe
Temperature: Room temperature
Rotational frequency of sample: 4 kHz
Measuring method: Single pulse method
$^1H$ decoupling frequency: 50 kHz
$^{29}Si$ flip angle: 90°
$^{29}Si$ 90° pulse width: 5.0 μs
Repetition time: 600 s
Total count: 128 times
Observation width: 30 kHz
Broadening factor: 20 Hz <Data Processing Method>

For the semiconductor light-emitting device members of Examples 3-1 to 3-3 and Comparative Examples 3-1, and 3-3, 512 points were taken in as measured data and zero-filled to 8192 points before Fourier transformation was performed. For the semiconductor light-emitting device member of Comparative Example 3-2 composed of silicone resin, 2048 points were taken in as measured data and zero-filled to 8192 points before Fourier transformation is performed because peaks were very sharp.

<Waveform Separation Analysis Method>

For each peak after Fourier transformation, an optimization calculation was performed by the nonlinear least square method using the center position, height, and full width at half maximum of a peak shape created by a Lorentz waveform, Gauss waveform, or a mixture of both as variable parameters.

For identification of a peak, AIChE Journal, 44(5), p. 1141, 1998 was referred to.

[3-I-2. Silicon Content Measurement]

A singly cured body of the semiconductor light-emitting device member of each example and each comparative example was ground to pieces of about 100 μm and kept in a platinum crucible in the air at 450° C. for 1 hour and then at 750° C. for 1 hour and at 950° C. for 1.5 hours for burning. After removal of carbon components, to a resultant residual small amount was added a 10-fold amount or more of sodium carbonate, heated by a burner to melt, then cooled to add desalted water and further diluted to several ppm in silicon while adjusting pH value to around neutrality using hydrochloric acid before performing ICP analysis.

[3-I-3. Transmittance Measurement]

Transmittance was measured using a singly cured film with a smooth surface of about 0.5 mm in thickness of the semiconductor light-emitting device member of each example and each comparative example without scattering by defects or unevenness at wavelengths of 200 nm to 800 nm by an ultraviolet spectrophotometer (UV-3100 manufactured by Shimadzu Corporation).

[3-I-4. TG-DTA Measurement]

Heating weight loss was measured by heating crushed pieces of about 10 mg of the semiconductor light-emitting device member of each example and each comparative example from 35° C. to 500° C. at the rate of temperature rise of 20° C./min in an air flow of 200 ml/min by a thermogravimetry-differential thermal analysis (hereinafter abbreviated as "TG-DTA" when appropriate) measuring apparatus (TG/DTA6200 manufactured by Seiko Instruments Inc.).

[3-I-5. UV Test]

A sample of 5 cm in diameter and about 1 mm in thickness of the semiconductor light-emitting device member of each example and each comparative example prepared by using the Teflon (registered trademark) petri dish was irradiated with ultraviolet rays under the following conditions and then film states before and after irradiation were compared.

Irradiation equipment: Accelerated light resistance test apparatus manufactured by Suga Test Instruments Co., LTd.—Metering weather meter MV3000
Irradiation wavelength: 255 nm or longer. Main wavelengths are in the range of 300 nm to 450 nm (with emission lines in 480 nm to 580 nm)
Irradiation time: 72 hours

[3-I-6. Measurement Of Weight Loss Rate During Vacuum Degassing]

A vacuum degasser AUTOSORB DEGASSER manufactured by Quantachrome Instruments was used for measuring the amount of volatilization. The weight loss rate (%) was determined by measuring 2 to 3 g of a powder sample (Sample C), from which moisture has already been removed up to the constant weight in a forced-air drier at 150° C. and under normal pressure, in a glass cell, vacuum-degassing the powder sample at 150° C., and comparing a weight loss when a degree of vacuum of 6.0 Pa (45 mTorr) was reached with a dry weight before degassing. As described above, the weight loss rate can be considered to be a value corresponding to a ratio of the amount of volatilization of $D^2$ cyclic compound. For the epoxy resin in Comparative Example 3-3, both the temperature for moisture removal and that for vacuum degassing were set to 120° C. because the heat resistance was low and the cure temperature was 120° C.

3-II. Manufacture of the Semiconductor Light-Emitting Device Member

Example 3-1

11.2 g of dimethyldimethoxysilane, 3.3 g of methanol, 3.2 g of water, and 4.8 g of 5% acetylacetone aluminum salt methanol solution as a catalyst were placed in a container that can be closed and then mixed. After heating at 50° C. for 8 hours in a hot water bath while stirring with a stirrer in a hermetically sealed state, 12.7 g of methyltrimethoxysilane and 4.8 g of water were added and the mixture was further heated at 50° C. for 8 hours in the hot water bath while stirring with the stirrer in a hermetically sealed state before being brought back to the room temperature to prepare a hydrolyzed/polycondensated liquid. The ratio of hydrolysis of this liquid is 192%.

The hydrolyzed/polycondensated liquid was divided into four/five portions using a micro pipet to drop a total of 11 μl onto a GaN semiconductor light-emitting device having a luminous wavelength of 405 nm. The device was left alone at room temperature for a while each time the hydrolyzed/polycondensated liquid was dropped to allow the solvent to volatilize so that the next portion (about 2 μL) can be placed before the next portion is dropped. Next, the device was kept at 35° C. for 30 min and subsequently at 50° C. for 1 hour to perform the first drying and then kept at 150° C. for 3 hours to perform second drying to form a crack-free transparent sealing member (semiconductor light-emitting device member: Sample A). A current of 20 mA was passed through the obtained semiconductor light-emitting device to measure luminance.

8.1 ml of the above hydrolyzed/polycondensated liquid was placed in the Teflon (registered trademark) petri dish with the diameter of 5 cm and the petri dish was kept in an explosion-proof furnace in a gentle breeze at 40° C. for 4 hours and subsequently the temperature was raised from 40° C. to 65° C. in 3 hours to perform the first drying, and then at 150° C. for 3 hours to perform the second drying to obtain an independent, circular, and transparent glass film (semiconductor light-emitting device member: Sample B) with the thickness of about 1 mm. This Sample B was provided to the above [3-I-5. UV test].

By performing the same operations after reducing the liquid quantity of the hydrolyzed/polycondensated liquid to 4.1 ml, an independent, circular, and transparent glass film (semiconductor light-emitting device member: Sample C) with the thickness of about 0.5 mm was obtained. This Sample C was provided to the above [3-I-3. Transmittance measurement]. Also, using pieces obtained by grinding Sample C using a mortar, the above [3-I-1. Solid Si-NMR spectrum measurement], [3-I-2. Silicon content measurement], [3-I-4. TG-DTA measurement], and [3-I-6. Measurement of weight loss rate during vacuum degassing] were performed.

Example 3-2

0.2 g of octamethyl cyclotetrasiloxane, which is $D^2$ cyclic compound, was added to 9.8 g of the hydrolyzed/polycondensated liquid in Example 3-1 and the mixture was stirred at room temperature for 3 min until the mixture became homogeneous to prepare and evaluate Sample A, Sample B, and Sample C like Example 3-1.

Comparative Example 3-1

30.80 g of methyl silicate (MKC silicate MS51 manufactured by Mitsubishi Chemical Corporation), 56.53 g of methanol, 6.51 g of water, 6.16 g of 5% acetylacetone aluminum salt methanol solution as a catalyst were placed in a container that can be closed and then mixed. After heating at 50° C. for 8 hours in a hot water bath while stirring with a stirrer in a hermetically sealed state, the mixture was brought back to the room temperature to prepare a hydrolyzed/polycondensated liquid. The ratio of hydrolysis of this liquid is 113%.

When, after dropping the hydrolyzed/polycondensated liquid onto a GaN semiconductor light-emitting device having a luminous wavelength of 405 nm using a micro pipet, the device was kept at 35° C. for 30 min and subsequently at 50° C. for 1 hour to perform the first drying and then kept at 150° C. for 3 hours to perform second drying, a large amount of cracks appeared and therefore the film could not be used as a sealing member (semiconductor light-emitting device member).

When 10 ml of the above hydrolyzed/polycondensated liquid was placed in the Teflon (registered trademark) petri dish with the diameter of 5 cm and dried under the same conditions as those of Example 3-1, a glass film of about 0.3 mm in thickness resulted, but a large amount of cracks appeared in a process of drying and the glass film broke into pieces, making it impossible to take out the film as an independent, circular, and transparent glass film.

Comparative Example 3-2

Commercially available silicone resin (JCR6101UP manufactured by Dow Corning Corporation) used as a mold agent for semiconductor light-emitting devices was dropped onto a GaN semiconductor light-emitting device having a luminous wavelength of 405 nm using a micro pipet and then the device was heated at 150° C. for 2 hours for curing to obtain an elastomer-like sealing member (semiconductor light-emitting device member: Sample A). A current of 20 mA was passed through the obtained semiconductor light-emitting device to measure luminance.

The Teflon (registered trademark) plate was coated with the above silicone resin using an applicator and then the Teflon plate was vacuum-degassed at 25° C. for 1 hour and heated at 150° C. for 2 hours for curing to obtain elastomer-like films (semiconductor light-emitting device members: Sample B and Sample C) with the thickness of about 1 mm and 0.5 mm by peeling off the films from the Teflon plate. Sample B was provided to the above [3-I-5. UV test]. Sample C was provided to the above [3-I-3. Transmittance measurement]. Using pieces obtained by grinding Sample C using a freezer mill, [3-I-1. Solid Si-NMR spectrum measurement], [3-I-2. Silicon content measurement], [3-I-4. TG-DTA measurement], and [3-I-6. Measurement of weight loss rate during vacuum degassing] were performed.

Comparative Example 3-3

Commercially available two-component curing aromatic epoxy resin used as a mold agent for semiconductor light-emitting devices was dropped onto a GaN semiconductor light-emitting device having a luminous wavelength of 405 nm using a micro pipet and then the device was heated at 120° C. for 4 hours for curing to obtain a hard transparent sealing member (semiconductor light-emitting device member). A current of 20 mA was passed through the obtained semiconductor light-emitting device to measure luminance.

The above epoxy resin was placed in the Teflon (registered trademark) petri dish with the diameter of 5 cm and then the Teflon petri dish was vacuum-degassed at 25° C. for 1 hour and heated at 120° C. for 4 hours for curing to obtain bluish, circular, and transparent resin films (semiconductor light-emitting device members: Sample B and Sample C) with the thickness of about 1 mm and 0.5 mm as independent films. Sample B was provided to the above [3-I-5. UV test]. Sample C was provided to the above [3-I-3. Transmittance measurement]. Using pieces obtained by grinding Sample C using a freezer mill, [3-I-1. Solid Si-NMR spectrum measurement], [3-I-2. Silicon content measurement], [3-I-4. TG-DTA measurement], and [3-I-6. Measurement of weight loss rate during vacuum degassing] were performed.

Comparative Example 3-4

13.6 g of methyltrimethoxysilane, 5.2 g of water, and 2.7 g of 5% acetylacetone aluminum salt methanol solution as a catalyst were placed in a container that can be closed and then mixed. After heating at 50° C. for 8 hours in a hot water bath while stirring with a stirrer in a hermetically sealed state, the mixture was brought back to the room temperature to prepare a hydrolyzed/polycondensated liquid. The ratio of hydrolysis of this liquid is 192%. The hydrolyzed/polycondensated liquid was divided into four/five portions using a micro pipet to drop a total of 11 µl onto a GaN semiconductor light-emitting device having a luminous wavelength of 405 nm. The device was left alone at room temperature for a while each time the hydrolyzed/polycondensated liquid was dropped to allow the solvent to volatilize so that the next portion (about 2 µl) can be placed before the next portion is dropped. Next, the device was kept at 35° C. for 1 hour and subsequently at 50° C. for 1 hour to perform the first drying and then kept at 150° C. for 3 hours to perform second drying to form a transparent sealing member, but large cracks and peeling appeared, making the sealing member (semiconductor light-emitting device member) unusable.

8.0 ml of the above hydrolyzed/polycondensated liquid was placed in the Teflon (registered trademark) petri dish with the diameter of 5 cm and the petri dish was kept in an explosion-proof furnace in a gentle breeze at 40° C. for 4 hours and subsequently the temperature was raised from 40° C. to 65° C. in 3 hours to perform the first drying, and then at 150° C. for 3 hours to perform the second drying to obtain an amorphous glass film (semiconductor light-emitting device member: Sample B) with the thickness of about 1 mm and conspicuous curvature and foaming. This Sample B was provided to the above [3-I-5. UV test].

By performing the same operations after reducing the liquid quantity of the hydrolyzed/polycondensated liquid to 4.0 ml, an amorphous glass film (semiconductor light-emitting device member: Sample C) with the thickness of about 0.5 mm and conspicuous curvature and foaming was obtained. This Sample C was provided to the above [3-I-3. Transmittance measurement]. Using pieces obtained by grinding Sample C using a mortar, [3-I-1. Solid Si-NMR spectrum measurement], [3-I-2. Silicon content measurement], [3-I-4. TG-DTA measurement], and [3-I-6. Measurement of weight loss rate during vacuum degassing] were performed.

3-III. Evaluation of the Semiconductor Light-Emitting Device Member

Analyses of the semiconductor light-emitting devices and semiconductor light-emitting device members of each example and each comparative example obtained according to the procedure in the above [3-II. Manufacture of the semiconductor light-emitting device member] were performed according to the procedure in the above [3-I. Analysis method]. Table 6 shown below lists the results of these analyses.

As shown in the following Table 6, excluding Example 3-1 in which no sealing member was formed due to appearance of cracks, luminance of the semiconductor light-emitting devices obtained in each example and each comparative example has improved compared with that prior to formation of the sealing members (semiconductor light-emitting device members).

Also, as shown in the following Table 6, the semiconductor light-emitting device members of Examples 3-1 and 3-2 satisfying requirements of the present invention not only excel in heat resistance and UV resistance, but also make cracks less likely to appear than the semiconductor light-emitting device members of Comparative Example 3-1 (MSH4) and Comparative Example 3-4 (trifunctional components only) that do not contain $D^2$ cyclic compound at all, have a weight loss rate value considered to correspond to the amount of volatilization of contained cyclic compound (low-molecular-weight cyclic siloxane) smaller than that of silicone resin, and make poor connection less likely to occur when mounted together with elements having electric contact, and therefore can evidently be used as semiconductor light-emitting device members excellent in reliability.

4. Examples Relating to the Third Semiconductor Light-Emitting Device Member

4-I. Analysis Method

Analyses were performed according to the following procedure for semiconductor light-emitting device members of each example and each comparative example described later.

[4-I-1. Solid Si-NMR Spectrum Measurement]

Solid Si-NMR spectrum measurement and waveform separation analysis of semiconductor light-emitting device members of each example and each comparative example were performed under the following conditions. For the semiconductor light-emitting device members of each example and each comparative example, the molar ratio (%) of silicon atoms corresponding to $D^n$ compounds to all silicon atoms was determined from the ratio of a peak area of the $D^n$ peak group to all peak areas from the obtained waveform data. Similarly, the total ratio of molar ratios of silicon atoms corresponding to $D^2$ cyclic compound in trimers and tetramers was determined from the ratio of peak areas originating from $D^2$ cyclic compound in trimers and tetramers to all peak areas from the obtained waveform data.

<Device Conditions>

Device: Infinity CMX-400 nuclear magnetic resonance spectroscope manufactured by Chemagnetics $^{29}$Si resonance frequency: 79.436 MHz Probe: 7.5 mm φ CP/MAS probe Temperature: Room temperature Rotational frequency of sample: 4 kHz Measuring method: Single pulse method $^1$H decoupling frequency: 50 kHz $^{29}$Si flip angle: 90°

$^{29}$Si 90° pulse width: 5.0 μs

Repetition time: 600 s

Total count: 128 times

Observation width: 30 kHz

Broadening factor: 20 Hz

<Data Processing Method>

For the semiconductor light-emitting device members of Examples 4-1 to 4-3 and Comparative Examples 4-1 to 4-3 and 4-5, 512 points were taken in as measured data and zero-filled to 8192 points before Fourier transformation was performed. For the semiconductor light-emitting device

TABLE 6

|  | Example 3-1 | Example 3-2 | Comparative example 3-1 | Comparative example 3-2 | Comparative example 3-3 | Comparative example 3-4 |
| --- | --- | --- | --- | --- | --- | --- |
| 405 nm luminance improvement rate (%) | 145 | 144 | —(*) | 130 | 132 | —(*) |
| Number of observed Si-NMR peaks (only peaks of −80 ppm or more) | Two or more | Two or more | 0 | 1 | 0 | Two or more |
| Content of silicon originating from $D^2$ cyclic compound (total of trimers and tetramers) (weight %) | 14 | 18 | 0 | 0 | 0 | 0 |
| Silicon content (weight %) | 39 | 39 | 43 | 35 | 0 | 40 |
| 405 nm transmittance (%) | 80≤ | 80≤ | —(*) | 70≤ | 80≤ | —(***) |
| TG-DTA weight loss (%) | −3.2 | −3.3 | −4.0 | −19.5 | −15 | −3.5 |
| UV test | No change | No change | No change | No change | Yellowing | No change |
| Weight loss rate during vacuum degassing (%) | 0.5 | 0.5 | 0.3 | 1.1 | 3.1(**) | 0.3 |

(*)Not measurable due to appearance of cracks
(**)Both the moisture removal temperature and vacuum degassing temperature set to 120° C.
(***)Not measurable due to sample curvature or foaming member of Comparative Example 4-4 composed of silicone resin, 2048 points were taken in as measured data and zero-filled to 8192 points before Fourier transformation is performed because peaks were very sharp.

<Waveform Separation Analysis Method>

For each peak after Fourier transformation, an optimization calculation was performed by the nonlinear least square method using the center position, height, and full width at half maximum of a peak shape created by a Lorentz waveform, Gauss waveform, or a mixture of both as variable parameters.

For identification of a peak, AIChE Journal, 44(5), p. 1141, 1998 was referred to.

[4-I-2. Silicon Content Measurement]

A singly cured body of the semiconductor light-emitting device member of each example and each comparative example was ground to pieces of about 100 μl and kept in a platinum crucible in the air at 450° C. for 1 hour and then at 750° C. for 1 hour and at 950° C. for 1.5 hours for burning. After removal of carbon components, a resultant residual small amount was added a 10-fold amount or more of sodium carbonate, heated by a burner to melt, then cooled to add desalted water and further diluted to several ppm in silicon while adjusting pH value to around neutrality using hydrochloric acid before performing ICP analysis.

[4-I-3. Transmittance Measurement]

Transmittance was measured using a singly cured film with a smooth surface of about 0.5 mm in thickness of the semiconductor light-emitting device member of each example and each comparative example without scattering by defects or unevenness at wavelengths of 200 nm to 800 nm by an ultraviolet spectrophotometer (UV-3100 manufactured by Shimadzu Corporation).

[4-I-4. UV Test]

A sample of 5 cm in diameter and about 1 mm in thickness of the semiconductor light-emitting device member of each example and each comparative example prepared by using the Teflon (registered trademark) petri dish was irradiated with ultraviolet rays under the following conditions and then film states before and after irradiation were compared.
Irradiation equipment: Accelerated light resistance test apparatus manufactured by Suga Test Instruments Co., LTd.—Metering weather meter MV3000
Irradiation wavelength: 255 nm or longer. Main wavelengths are in the range of 300 nm to 450 nm (with emission lines in 480 nm to 580 nm)
Irradiation time: 72 hours

[4-I-5. Heat Test]

Crushed pieces of 1 cm square of each Sample B (described later) of the semiconductor light-emitting device member of each example and each comparative example were placed in a platinum crucible and the crucible was put in an electric furnace heated to 400° C. After heating for 1 hour, the crucible was taken out and cooled down to examine change in weight and appearance change by visual inspection before and after heating.

4-II. Manufacture of the Semiconductor Light-Emitting Device Member

Example 4-1

9.7 g of methyltrimethoxysilane, 8.5 g of dimethyldimethoxysilane, 3.8 g of water, 14.3 g of methanol silica sol manufactured by Nissan Chemical Industries, Ltd. as siloxane polymer containing no $D^2$ cyclic compound, and 3.6 g of 5% acetylacetone aluminum salt methanol solution as a catalyst were placed in a container that can be closed and then mixed. After heating at 50° C. for 8 hours in a hot water bath while stirring with a stirrer in a hermetically sealed state, the mixture was brought back to the room temperature to prepare a hydrolyzed/polycondensated liquid. The ratio of hydrolysis of this liquid is 120%.

The hydrolyzed/polycondensated liquid was divided into four/five portions using a micro pipet to drop a total of 11 μl onto a GaN semiconductor light-emitting device having a luminous wavelength of 405 nm. The device was left alone at room temperature for a while each time the hydrolyzed/polycondensated liquid was dropped to allow the solvent to volatilize so that the next portion (about 2 μL) can be placed before the next portion is dropped. Next, the device was kept at 35° C. for 30 min and subsequently at 50° C. for 1 hour to perform the first drying and then kept at 150° C. for 3 hours to perform second drying to form a crack-free transparent sealing member (semiconductor light-emitting device member: Sample A). A current of 20 mA was passed through the obtained semiconductor light-emitting device to measure luminance.

7.4 ml of the above hydrolyzed/polycondensated liquid was placed in the Teflon (registered trademark) petri dish with the diameter of 5 cm and the petri dish was kept in an explosion-proof furnace in a gentle breeze at 40° C. for 4 hours and subsequently the temperature was raised from 40° C. to 65° C. in 3 hours to perform the first drying, and then at 150° C. for 3 hours to perform the second drying to obtain an independent, circular, and transparent glass film (semiconductor light-emitting device member: Sample B) with the thickness of about 1 mm. This Sample B was provided to the above [4-I-4. UV test].

By performing the same operations after reducing the liquid quantity of the hydrolyzed/polycondensated liquid to 3.7 ml, an independent, circular, and transparent glass film (semiconductor light-emitting device member: Sample C) with the thickness of about 0.5 mm was obtained. This Sample C was provided to the above [4-I-3. Transmittance measurement]. Also, using pieces obtained by grinding Sample C using a mortar, the above [4-I-1. Solid Si-NMR spectrum measurement] and [4-I-2. Silicon content measurement] were performed.

Example 4-2

15.1 g of methyltrimethoxysilane, 13.3 g of dimethyldimethoxysilane, 6.0 g of water, and 5.7 g of 5% acetylacetone aluminum salt methanol solution as a catalyst were placed in a container that can be closed and then mixed. After heating at 50° C. for 8 hours in a hot water bath while stirring with a stirrer in a hermetically sealed state, the mixture was brought back to the room temperature to prepare a hydrolyzed/polycondensated liquid. The ratio of hydrolysis of this liquid is 120%.

1.0 g of octamethyl cyclotetrasiloxane, which is $D^2$ cyclic compound, was added to 9.0 g of the hydrolyzed/polycondensated liquid and the mixture was stirred at room temperature for 3 min until the mixture became homogeneous.

Using the hydrolyzed/polycondensated liquid after stirring, Sample A, Sample B, and Sample C were prepared and evaluated as shown below.

That is, Sample A was prepared in the same manner as in Example 4-1 except that the total quantity of the hydrolyzed/polycondensated liquid to be dropped onto a GaN semiconductor light-emitting device was changed to 9 μl to measure luminance.

Also, Sample B was prepared in the same manner as in Example 4-1 except that the amount of the hydrolyzed/polycondensated liquid to be used was changed to 7.9 ml to provide Sample B to [4-I-4. UV test].

Further, Sample C was prepared in the same manner as in Example 4-1 except that the amount of the hydrolyzed/polycondensated liquid to be used was changed to 3.8 ml to provide Sample C to [4-I-3. Transmittance measurement]. Using pieces obtained by grinding Sample C using a freezer mill, [4-I-1. Solid Si-NMR spectrum measurement] and [4-I-2. Silicon content measurement] were performed.

Example 4-3

50 g of double-ended silanol dimethyl silicone oil (XC96-723) manufactured by Toshiba Silicones Co., Ltd., 5 g of methyltrimethoxysilane, 11 g of aluminum acetylacetone salt methanol solution of 5% as a catalyst, and 1.90 g of water were measured in a three-necked flask equipped with a stir wing and capacitor, the mixture was stirred at room temperature under atmospheric pressure for 15 min, and initial hydrolysis was performed before the mixture was caused to reflux while being stirred at about 80° C. for 4 hours.

Subsequently, methanol and low-boiling silicon components were distilled off until the internal temperature reached 120° C. and further the mixture was caused to reflux while being stirred at 120° C. for 4 hours. The reaction mixture was cooled down to the room temperature to prepare a hydrolyzed/polycondensated liquid. The ratio of hydrolysis of this liquid is 192% for methyltrimethoxysilane. The material XC96-723 corresponds to 200% hydrolysate.

The hydrolyzed/polycondensated liquid was divided into two portions using a micro pipet to drop a total of 4.5 µL onto a GaN semiconductor light-emitting device having a luminous wavelength of 405 nm. Next, the device was kept at 50° C. for 30 min to perform first drying and then kept at 130° C. for 1 hour and subsequently at 150° C. for 3 hours to perform second drying to form a crack-free, transparent, and elastomer-like sealing member. Luminance was measured by passing a current of 20 mA through the obtained semiconductor light-emitting device.

3 g of the above hydrolyzed/polycondensated liquid was placed in the Teflon (registered trademark) petri dish with the diameter of 5 cm and then the petri dish was kept in an explosion-proof furnace in a gentle breeze at 50° C. for 30 min to perform the first drying, next at 130° C. for 1 hour and subsequently at 150° C. for 3 hours to perform the second drying to obtain an independent, circular, transparent, and elastomer-like film with the thickness of about 0.5 mm.

The circular, transparent, and elastomer-like film was provided to the above [4-I-3. Transmittance measurement] and [4-I-4. UV test]. Small pieces obtained by cutting the circular, transparent, and elastomer-like film with scissors were provided to the above [4-I-1. Solid Si-NMR spectrum measurement] and [4-I-2. Silicon content measurement].

Comparative Example 4-1

30.80 g of methyl silicate (MKC silicate MS51 manufactured by Mitsubishi Chemical Corporation), 56.53 g of methanol, 6.51 g of water, and 6.16 g of 5% acetylacetone aluminum salt methanol solution as a catalyst were placed in a container that can be closed and then mixed. After heating at 50° C. for 8 hours in a hot water bath while stirring with a stirrer in a hermetically sealed state, the mixture was brought back to the room temperature to prepare a hydrolyzed/polycondensated liquid. The ratio of hydrolysis of this liquid is 113%.

When, after dropping the hydrolyzed/polycondensated liquid onto a GaN semiconductor light-emitting device having a luminous wavelength of 405 nm using a micro pipet, the device was kept at 35° C. for 30 min and subsequently at 50° C. for 1 hour to perform the first drying and then kept at 150° C. for 3 hours to perform second drying, a large amount of cracks appeared and therefore the film could not be used as a sealing member (semiconductor light-emitting device member).

When 10 ml of the above hydrolyzed/polycondensated liquid was placed in the Teflon (registered trademark) petri dish with the diameter of 5 cm and dried under the same conditions as those of Example 4-1, a glass film of about 0.3 mm in thickness resulted, but a large amount of cracks appeared in a process of drying and the glass film broke into pieces, making it impossible to take out the film as an independent, circular, and transparent glass film.

Comparative Example 4-2

31.79 g of methyltrimethoxysilane, 28.05 g of dimethyldimethoxysilane, 15.50 g of water, and 4.67 g of hydrochloric acid water of 0.01 mol/l as a catalyst were placed in a container that can be closed and then mixed. After heating at 50° C. for 8 hours in a hot water bath while stirring with a stirrer in a hermetically sealed state, the mixture was brought back to the room temperature to prepare a hydrolyzed/polycondensated liquid. The ratio of hydrolysis of this liquid is 120%.

When 4 ml of the hydrolyzed/polycondensated liquid was placed in the Teflon (registered trademark) petri dish with the diameter of 5 cm and dried under the same conditions as those of Example 4-1, a liquid like starch syrup resulted and no cured body could be obtained. After further storage of the hydrolyzed/polycondensated liquid, which had been homogeneously transparent after the above heating at 50° C., for 20 hours, the liquid separated into two layers, making the liquid unusable for coating.

Comparative Example 4-3

1.0 g of octamethyl cyclotetrasiloxane, which is $D^2$ cyclic compound, was added to 9.0 g of the hydrolyzed/polycondensated liquid in Example 4-2 and the mixture was stirred at room temperature for 3 min until the mixture became homogeneous to prepare and evaluate Sample A, Sample B, and Sample C like Example 4-2.

Comparative Example 4-4

Commercially available silicone resin (JCR6101UP manufactured by Dow Corning Corporation) used as a mold agent for semiconductor light-emitting devices was dropped onto a GaN semiconductor light-emitting device having a luminous wavelength of 405 nm using a micro pipet and then the device was heated at 150° C. for 2 hours for curing to obtain an elastomer-like sealing member (semiconductor light-emitting device member: Sample A). A current of 20 mA was passed through the obtained semiconductor light-emitting device to measure luminance.

The Teflon (registered trademark) plate was coated with the above silicone resin using an applicator and then the Teflon plate was vacuum-degassed at 25° C. for 1 hour and heated at 150° C. for 2 hours for curing to obtain elastomer-like films (semiconductor light-emitting device members: Sample B and Sample C) with the thickness of about 1 mm and 0.5 mm by peeling off the films from the Teflon plate.

Sample B was provided to the above [4-I-4. UV test]. Sample C was provided to the above [4-I-3. Transmittance measurement]. Using pieces obtained by grinding Sample C using a freezer mill, [4-I-1. Solid Si-NMR spectrum measurement] and [4-I-2. Silicon content measurement] were performed.

Comparative Example 4-5

Commercially available two-component curing aromatic epoxy resin used as a mold agent for semiconductor light-emitting devices was dropped onto a GaN semiconductor light-emitting device having a luminous wavelength of 405 nm using a micro pipet and then the device was heated at 120° C. for 4 hours for curing to obtain a hard transparent sealing member (semiconductor light-emitting device member). A current of 20 mA was passed through the obtained semiconductor light-emitting device to measure luminance.

The above epoxy resin was placed in the Teflon (registered trademark) petri dish with the diameter of 5 cm and then the Teflon petri dish was vacuum-degassed at 25° C. for 1 hour and heated at 120° C. for 4 hours for curing to obtain bluish, circular, and transparent resin films (semiconductor light-emitting device members: Sample B and Sample C) with the thickness of about 1 mm and 0.5 mm as independent films. Sample B was provided to the above [4-I-4. UV test]. Sample C was provided to the above [4-I-3. Transmittance measurement]. Using pieces obtained by grinding Sample C using a freezer mill, [4-I-1. Solid Si-NMR spectrum measurement] and [4-I-2. Silicon content measurement] were performed.

4-III. Evaluation of the Semiconductor Light-Emitting Device Member

Analyses of the semiconductor light-emitting devices and semiconductor light-emitting device members of each example and each comparative example obtained according to the procedure in the above [4-II. Manufacture of the semiconductor light-emitting device member] were performed according to the procedure in the above [4-I. Analysis method]. Table 7 shown below lists the results of these analyses. In Table, descriptions within [ ] in a line of the Heat resistance test indicate changes in appearance.

As shown in the following Table 7, excluding Comparative Examples 4-1 and 4-2 in which no sealing member was formed due to appearance of cracks or poor curing, luminance of the semiconductor light-emitting devices obtained in each example and each comparative example has improved compared with that prior to formation of the sealing members (semiconductor light-emitting device members).

Also, as shown in the following Table 7, the semiconductor light-emitting device members of Examples 4-1 to 4-3 satisfying requirements of the present invention lost less weight when heated rapidly, made cracks less likely to occur, and volatilized less amount of contained cyclic compound than the semiconductor light-emitting device members of Comparative Example 4-1 in which no $D^2$ cyclic compound is contained and the degree of crosslinking is not adjusted, Comparative Examples 4-2 and 4-3 containing a large amount of cyclic material, and Comparative Examples 4-4 and 4-5 that are commercially available semiconductor light-emitting device members. Therefore, according to the present invention, reliable semiconductor light-emitting device members that have high heat resistance, excel in UV resistance, and are less likely to cause poor connection when mounted together with elements having electric contact can be provided.

TABLE 7

| | Example 4-1 | Example 4-2 | Example 4-3 | Comparative example 4-1 | Comparative example 4-2 | Comparative example 4-3 | Comparative example 4-4 | Comparative example 4-5 |
|---|---|---|---|---|---|---|---|---|
| 405 nm luminance improvement rate (%) | 146 | 139 | 135 | —(*) | —() | 115(*) | 130 | 132 |
| Molar ratio of silicon corresponding to D'' compounds to a total of silicon | 39 | 49 | 94 | 0 | —(**) | 55 | 99.9≤ | 0 |
| Total molar ratio of silicon corresponding to $D^2$ cyclic compound in trimers and tetramers to a total of silicon | 8.6 | 12.3 | 4 | 0 | —(**) | 21 | 0 | 0 |
| Silicon content (weight %) | 42 | 40 | 38 | 43 | —(**) | 39 | 35 | 0 |
| Transmittance (%) | 80≤ | 80≤ | 80≤ | —(*) | —() | —(*) | 70 | 80≤ |
| UV test | No change | No change | No change | —(*) | —() | (*)No change | No change | Yellowing |
| Weight change during heat test (%) [Appearance] | −2.6 [No crack] | −2.6 [Crack appearance in parts] | −8.0 [No crack] | —(*) | —(**) | −5.0 [A large amount of cracks broke the sample] | −10.2 [Elasticity lost and crack appearance in parts] | −15.0 [Blackening] |

(*)Not measurable due to appearance of a large amount of cracks
(**)The liquid phase separated into two layers and would not be homogeneous. Not measurable because the sample was not cured at 150° C.
(***)No transparent cured body could be obtained due to a large amount of foaming.

INDUSTRIAL APPLICABILITY

Uses of the semiconductor light-emitting device member in the present invention are not particularly limited and can suitably be utilized for various uses such as members (sealing compounds) for sealing semiconductor luminous elements. Among others, the semiconductor light-emitting device member in the present invention can particularly suitably be used as sealing compounds or light extracting films for blue LEDs or near-ultraviolet LEDs and phosphor support material for high power white LEDs using luminous elements such as blue LEDs and near-ultraviolet LEDs as a light source.

The present invention has been described using specific aspects thereof, but it is clear to a person skilled in the art that the present invention can be modified in various ways without departing from the spirit and scope of the present invention.

This application is based on Japanese Patent Application (No. 2005-047742) filed on Feb. 23, 2005, Japanese Patent Application (No. 2005-086305) filed on Mar. 24, 2005, Japanese Patent Application (No. 2005-165921) filed on Jun. 6, 2005, Japanese Patent Application (No. 2005-276754) filed on Sep. 22, 2005, Japanese Patent Application (No. 2005-276755) filed on Sep. 22, 2005, and Japanese Patent Application (No. 2005-276783) filed on Sep. 22, 2005 and the entire contents of which are hereby incorporated by reference.

What is claimed is:

1. A semiconductor light-emitting device member, wherein
    (A) in a solid state Si-nuclear magnetic resonance spectrum, the semiconductor light-emitting device member comprises
        (a) at least one peak whose peak top position is in an area of a chemical shift of −40 ppm or more and 0 ppm or less, and whose full width at half maximum is 0.3 ppm or more and 3.0 ppm or less, and
        (b) at least one peak whose peak top position is in an area of the chemical shift of −80 ppm or more and less than −40 ppm, and whose full width at half maximum is 0.3 ppm or more and 5.0 ppm or less,
    (B) silicon content is 20 weight % or more, and
    (C) a hardness measured value (Shore A) by durometer type A is 5 or more and 90 or less.

2. The semiconductor light-emitting device member according to claim 1, further comprising:
    inorganic oxide particles.

3. The semiconductor light-emitting device member according to claim 2, further comprising:
    inorganic oxide particles.

4. A method for manufacturing the semiconductor light-emitting device member according to claim 1, comprising:
    drying a condensation polymer obtained by performing hydrolysis and polycondensation of a compound represented by the following formula (1) and/or an oligomer thereof;

$$M^{m+}X_nY^1_{m-n} \quad (1)$$

wherein
    M represents at least one element selected from silicon, aluminum, zirconium, and titanium,
    X represents a hydrolyzable group,
    $Y^1$ represents a monovalent organic group,
    m represents an integer of 1 or greater representing a valence of M, and
    n represents an integer of 1 or greater representing a number of X groups, where m≥n;
    wherein the hydrolysis and polycondensation are performed in the presence of a solvent and the process of drying the resultant condensation polymer has a first drying process in which a liquid condensation polymer is obtained by substantially removing the solvent at a temperature equal to or below a boiling point of the solvent and a second drying process in which the condensation polymer is dried at the temperature equal to or above the boiling point of the solvent.

5. The method of claim 4, wherein the hydrolysis and polycondensation are performed in the presence of an organometallic compound catalyst.

6. A method for manufacturing the semiconductor light-emitting device member according to claim 2, comprising:
    drying a condensation polymer obtained by performing hydrolysis and polycondensation of a compound represented by the following formula (1) and/or an oligomer thereof;

$$M^{m+}X_nY^1_{m-n} \quad (1)$$

wherein
    M represents at least one element selected from silicon, aluminum, zirconium, and titanium,
    X represents a hydrolyzable group,
    $Y^1$ represents a monovalent organic group,
    m represents an integer of 1 or greater representing a valence of M, and
    n represents an integer of 1 or greater representing a number of X groups, where m≥n;
    wherein the hydrolysis and polycondensation are performed in the presence of a solvent and the process of drying the resultant condensation polymer has a first drying process in which a liquid condensation polymer is obtained by substantially removing the solvent at a temperature equal to or below a boiling point of the solvent and a second drying process in which the condensation polymer is dried at the temperature equal to or above the boiling point of the solvent.

7. The method of claim 6, wherein the hydrolysis and polycondensation are performed in the presence of an organometallic compound catalyst.

8. A semiconductor light emitting device comprising at least one semiconductor light-emitting device member according to claim 1.

9. The semiconductor light-emitting device according to claim 8, wherein the device has a luminescent color selected from the group consisting of white and yellow.

10. The semiconductor light-emitting device according to claim 9, wherein the luminescent color is white, and the device has a luminous efficiency of 20 lm/W or more.

11. The semiconductor light-emitting device according to claim 9, wherein the luminescent color is white, and the device has an average color rendering performance index Ra of 80 or more.

12. A semiconductor light-emitting device member, wherein
    (A) in a solid state Si-nuclear magnetic resonance spectrum, the semiconductor light-emitting device member comprises
        (a) at least one peak whose peak top position is in an area of a chemical shift of −40 ppm or more and 0 ppm or less, and whose full width at half maximum is 0.3 ppm or more and 3.0 ppm or less, and
        (b) at least one peak whose peak top position is in an area of the chemical shift of −80 ppm or more and less than −40 ppm, and whose full width at half maximum is 0.3 ppm or more and 5.0 ppm or less,
    (B) silicon content is 20 weight % or more, and
    (C) light transmittance on a luminous wavelength of 350 nm or more and 500 nm or less with a film thickness of 0.5 mm is 80% or more.

13. The semiconductor light-emitting device member according to claim 12, further comprising:
    inorganic oxide particles.

14. A method for manufacturing the semiconductor light-emitting device member according to claim 12, comprising:
drying a condensation polymer obtained by performing hydrolysis and polycondensation of a compound represented by the following formula (1) and/or an oligomer thereof;

$$M^{m+}X_nY^1_{m-n} \quad (1)$$

wherein
M represents at least one element selected from silicon, aluminum, zirconium, and titanium,
X represents a hydrolyzable group,
$Y^1$ represents a monovalent organic group,
m represents an integer of 1 or greater representing a valence of M, and
n represents an integer of 1 or greater representing a number of X groups, where m≥n;
wherein the hydrolysis and polycondensation are performed in the presence of a solvent and the process of drying the resultant condensation polymer has a first drying process in which a liquid condensation polymer is obtained by substantially removing the solvent at a temperature equal to or below a boiling point of the solvent and a second drying process in which the condensation polymer is dried at the temperature equal to or above the boiling point of the solvent.

15. The method of claim 14, wherein the hydrolysis and polycondensation are performed in the presence of an organometallic compound catalyst.

16. A semiconductor light-emitting device member, wherein
(A) in a solid state Si-nuclear magnetic resonance spectrum, the semiconductor light-emitting device member comprises
  (a) at least one peak whose peak top position is in an area of a chemical shift of −40 ppm or more and 0 ppm or less, and whose full width at half maximum is 0.3 ppm or more and 3.0 ppm or less, and
  (b) at least one peak whose peak top position is in an area of the chemical shift of −80 ppm or more and less than −40 ppm, and whose full width at half maximum is 0.3 ppm or more and 5.0 ppm or less,
(B) silicon content is 20 weight % or more, and
(C) a maintenance rate of transmittance of light on a wavelength of 405 nm with a film thickness of 0.5 mm before and after leaving alone at a temperature of 200° C. for about 500 hours is 80% or more and 110% or less.

17. The semiconductor light-emitting device member according to claim 16, further comprising:
inorganic oxide particles.

18. A method for manufacturing the semiconductor light-emitting device member according to claim 16, comprising:
drying a condensation polymer obtained by performing hydrolysis and polycondensation of a compound represented by the following formula (1) and/or an oligomer thereof;

$$M^{m+}X_nY^1_{m-n} \quad (1)$$

wherein
M represents at least one element selected from silicon, aluminum, zirconium, and titanium,
X represents a hydrolyzable group,
$Y^1$ represents a monovalent organic group,
m represents an integer of 1 or greater representing a valence of M, and
n represents an integer of 1 or greater representing a number of X groups, where m≥n;
wherein the hydrolysis and polycondensation are performed in the presence of a solvent and the process of drying the resultant condensation polymer has a first drying process in which a liquid condensation polymer is obtained by substantially removing the solvent at a temperature equal to or below a boiling point of the solvent and a second drying process in which the condensation polymer is dried at the temperature equal to or above the boiling point of the solvent.

19. The method of claim 18, wherein the hydrolysis and polycondensation are performed in the presence of an organometallic compound catalyst.

20. A semiconductor light-emitting device member, wherein
(A) in a solid state Si-nuclear magnetic resonance spectrum, the semiconductor light-emitting device member comprises
  (a) at least one peak whose peak top position is in an area of a chemical shift of −40 ppm or more and 0 ppm or less, and whose full width at half maximum is 0.3 ppm or more and 3.0 ppm or less, and
  (b) at least one peak whose peak top position is in an area of the chemical shift of −80 ppm or more and less than −40 ppm, and whose full width at half maximum is 0.3 ppm or more and 5.0 ppm or less,
(B) silicon content is 20 weight % or more, and
(C) a maintenance rate of transmittance of light on the wavelength of 405 nm with a film thickness of 0.5 mm before and after irradiation with light having a center wavelength of 380 nm and radiant intensity of 0.4 kW/m² for about 72 hours is 80% or more and 110% or less.

21. The semiconductor light-emitting device member according to claim 20, further comprising:
inorganic oxide particles.

22. A method for manufacturing the semiconductor light-emitting device member according to claim 20, comprising:
drying a condensation polymer obtained by performing hydrolysis and polycondensation of a compound represented by the following formula (1) and/or an oligomer thereof;

$$M^{m+}X_nY^1_{m-n} \quad (1)$$

wherein
M represents at least one element selected from silicon, aluminum, zirconium, and titanium,
X represents a hydrolyzable group,
$Y^1$ represents a monovalent organic group,
m represents an integer of 1 or greater representing a valence of M, and
n represents an integer of 1 or greater representing a number of X groups, where m≥n;
wherein the hydrolysis and polycondensation are performed in the presence of a solvent and the process of drying the resultant condensation polymer has a first drying process in which a liquid condensation polymer is obtained by substantially removing the solvent at a temperature equal to or below a boiling point of the solvent and a second drying process in which the condensation polymer is dried at the temperature equal to or above the boiling point of the solvent.

23. The method of claim 22, wherein the hydrolysis and polycondensation are performed in the presence of an organometallic compound catalyst.

* * * * *